(12) United States Patent  
Sumida et al.

(10) Patent No.: US 7,085,688 B1  
(45) Date of Patent: Aug. 1, 2006

(54) NON-LINEAR CHARACTERISTIC REPRODUCING APPARATUS AND NON-LINEAR CHARACTERISTIC REPRODUCING PROGRAM STORAGE MEDIUM

(75) Inventors: Shizuo Sumida, 1-15-4, Yanonishi, Aki-ku, Hiroshima-shi, Hiroshima 736-0085 (JP); Akio Nagamatsu, 603-61, Tsu, Kamakura-shi, Kanagawa 248-0032 (JP)

(73) Assignees: Shizuo Sumida (JP); Akio Nagamatsu (JP); Ono Sokki Co., Ltd. (JP)

( * ) Notice: Subject to any disclaimer, the term of this patent is extended or adjusted under 35 U.S.C. 154(b) by 0 days.

(21) Appl. No.: 09/551,867

(22) Filed: Apr. 18, 2000

(30) Foreign Application Priority Data

Oct. 22, 1999 (JP) ............................. 11-301246

(51) Int. Cl.  
    G06F 17/50 (2006.01)  
    G06F 3/00 (2006.01)

(52) U.S. Cl. .............................. 703/2; 703/14; 700/31; 702/189

(58) Field of Classification Search .................... 703/2, 703/14; 706/21, 41; 700/29, 31, 37, 38, 700/52, 189  
See application file for complete search history.

(56) References Cited

U.S. PATENT DOCUMENTS

| | | | | |
|---|---|---|---|---|
| 5,153,923 A | * | 10/1992 | Matsuba et al. | 382/158 |
| 5,268,834 A | * | 12/1993 | Sanner et al. | 700/31 |
| 5,519,605 A | * | 5/1996 | Cawlfield | 700/31 |
| 5,619,432 A | * | 4/1997 | Chandler | 702/189 |
| 5,627,768 A | * | 5/1997 | Uhlmann et al. | 702/109 |
| 5,652,713 A | * | 7/1997 | Chandler | 702/190 |
| 5,835,682 A | * | 11/1998 | Broomhead et al. | 706/14 |
| 5,847,952 A | * | 12/1998 | Samad | 700/48 |
| 5,963,888 A | * | 10/1999 | Uhlmann et al. | 702/109 |
| 6,199,019 B1 | * | 3/2001 | Iino et al. | 702/35 |
| 6,453,308 B1 | * | 9/2002 | Zhao et al. | 706/21 |
| 6,564,176 B1 | * | 5/2003 | Kadtke et al. | 702/189 |
| 6,850,871 B1 | * | 2/2005 | Barford et al. | 703/2 |

OTHER PUBLICATIONS

Nagamatsu et al., "A New Approach on Modeling for Product Development (The Basic Concept of Functional Model)", JSME International Journal, Series C, vol. 42, No. 1, (1999), pp. 131-138 (with Full English Translation, pp. 234-239).

(Continued)

*Primary Examiner*—Thai Phan  
(74) *Attorney, Agent, or Firm*—Nixon Peabody LLP; Jeffrey L. Costellia

(57) ABSTRACT

The present invention relates to a non-linear characteristic reproducing apparatus wherein a non-linear transformation processing is applied to a state quantity to be outputted. A non-linear behavior of products and parts is reproduced through modeling.

[Solving means] there are provided a non-linear characteristic reproducing unit for receiving an estimated observation quantity at the subsequent sampling time of an input state quantity and determining a normalized estimated value in which an estimated value is normalized by an estimated observation quantity at the subsequent sampling time, and a state quantity transformation unit for transforming the input state quantity at the subsequent sampling time to the output state quantity at the subsequent sampling time in accordance with a non-linear operation based on the a normalized estimated value determined in the non-linear characteristic reproducing unit.

37 Claims, 80 Drawing Sheets

OTHER PUBLICATIONS

Nagamatsu et al., "A New Approach on Modeling for Product Development (Expansion and Unification)", JSME International Journal, Series C, vol. 42, No. 4, (1999), pp. 108-115 (with Full English Translation, pp. 907-913).

Sumida et al., "A New Approach on Modeling for Product Development (Nonlinear System 1 Basic Element)", vol. 65, No. 632, (1999), pp. 99-106 (with English Translation, 13 pages).

Sumida et al., "Modeling for Functional Expression of Rotary Apparatus (1st Report, Clutch and Brake)", vol. 65, No. 635, (1999), pp. 1-8.

Hiramatsu et al., "Modeling for Functional Expression of Rotary Apparatus (2nd Report, Planetary Gear Train)", vol. 65, No. 638, (1999), pp. 44-51.

Nagamatsu et al., "A New Approach on Modeling for Functional Development of Dynamic System", 4th International Conference on Motion and Vibration Control—Proceedings, vol. 1, Zurich, Switzerland, Aug. 25-28, 1998, pp. 299-303.

Nagamatsu et al., "A New Approach on Modelling for Virtual Prototype of the Automobile", 32nd ISATA: Advances in Automotive and Transportation Technology and Practice for the 21st Century, Vienna, Austria, Jun. 14-18, 1999, pp. 83-89.

Hiramatsu et al., "An Approach on Modeling for Functional Development of Automobile", SAU Technical Paper Series 2000-01-0123, Mar. 6-9, 2000, pp. 59-71.

Sumida et al., "Modeling of Virtual Prototype, Part I", No. 95-1, (1995), pp. 421-422.

Sumida et al., "Modeling of Virtual Prototype, Part II", No. 96-1, (1996), pp. 381-382.

Nagamatsu et al., "New Concept of Modeling for Simulation and Optimization of Function and Efficiency of Machines", No. 972-1, (1997), pp. 103-104.

Sumida et al., "Hierarchial Functional Model for Automobile Development", Technical Notes/JSAE Review 19, (1998), pp. 169-179 (with English Translation, pp. 368-371).

Sumida et al., "A New Approach on Modeling for Product Development (Nonlinear System 1 Basic Element)", vol. A, No. 99-71, (1999), pp.157-160 (with English Translation, 5 pages).

Sumida et al., "An Approach on Modeling for Product Development (Expansion and Unification)", vol. B, No. 98-8 I, Aug. 17-20, 1998, pp. 797-798.

Nagamatsu et al., "An Approach on Modeling for Functional Expression of Mechanical System", SICE '99, Jul. 28-30, 1999, pp. 99-100 (with concise English Explanation).

Nagamatsu et al., "Approach of Modeling for Aiding Product Development of Automobile (A Study on Construction of Virtual Prototype)", No. 30-00, (2000), pp. 1-4.

Sumida et al., "Modeling for Functional Expression of Rotary Apparatus (1st Report, Clutch and Brake)", vol. 65, No. 635, (1999), pp. 1-8 (*with Full English Translation*).

* cited by examiner

| SYMBOLS NAME | | SYMBOL | REMARK |
|---|---|---|---|
| STATE QUANTITY | ENERGY | ⇒E | ENERGY INPUT AND OUTPUT DIRECTION |
| | POTENTIAL QUANTITY | → | VOLTAGE, VELOCITY, RATE OF FLOW, etc. |
| | FLOW QUANTITY | ⇒ | CURRENT, POWER, PRESSURE, etc. |
| OPERATOR | ADDITION | $A, B \to \circ \to C$ | $C = A + B$ |
| | MULTIPLICATION | $A, B \to \otimes \to C$ | $C = A \times B$ |
| | BRANCH (DISTRIBUTION) | $A \to \bullet \to A, A$ | $A = A = A$ |
| | SIGN TRANSLATION | $A \to \ominus \to B$ | $B = -A$ |
| | INVERSION | $A \to \oslash \to B$ | $B = 1/A$ |
| | INTEGRAL | $A \to \triangleright \to B$ | $B = \int A\, dt$ |
| | DIFFERENTIATION | $A \to \triangleleft \to B$ | $B = dA/dt$ |
| CHARACTERISTIC | FACTOR TRANSLATION | $A \to \boxed{R} \to B$ | $B = R \times A$  ($R$ :FACTOR) |
| | CHARACTERISTIC TRANSLATION | $A \to \boxed{P} \to B$ | $B = P \times A$  ($P$ : CHARACTERISTIC) |
| | SIDE LOAD | $(A) \to B$ | $B = A$  ($A$ : STATE QUANTITY) |
| | COORDINATE FACTOR | $A \to \otimes \to B$ ; $C \leftarrow \otimes \leftarrow D$ | $B = \Phi A$ ; $\Phi^{-1} D = C$  ($\Phi$ : FACTOR) |
| COEFFICIENT | OBSERVATION POINT | $A \to \to B, A$ | $B = A$  ($B$ : OBSERVATION VALUE OF A) |
| | FUNCTIONAL MODEL ELEMENT | $A_p \to \boxed{\text{FUNCTION NAME}} \to B_p$ ; $A_f \leftarrow \boxed{} \leftarrow B_f$ | $A_p, B_p$ : POTENTIAL QUANTITY ; $A_f, B_f$ : FLOW QUANTITY |
| | STORAGE STATE QUANTITY (INTERNAL ENERGY) | $B \to \to C$ ; $A \to \to A$ | $B =$ (INTERNAL TEMP. SET VALUE OF A) ; $C =$ (INTERNAL TEMP. OBSERVATION) (POTENTIAL QUANTITY) |
| | ENERGY OBSERVATION | $A \to \boxed{R} \to B$ ; $\to C$ | $C = AB$ or $A^2 R$ ($A,B$ : POTENTIAL/FLOW QUANTITY) |

Fig.78

| QUANTITY | | | OPERATION-CHARACTERISTIC VALUE (SIGNAL OTHER THAN STATE QUANTITY) |
|---|---|---|---|
| | OPERATION QUANTITY | ———▷ | OPERATION-CHARACTERISTIC VALUE (SIGNAL OTHER THAN STATE QUANTITY) |
| | SUBSTITUTION QUANTITY | ---------▷ | SUBSTITUTION OF CHARACTERISTIC FACTOR·SIDE LOAD |
| LOGICAL OPERATOR (FOR FUNCTIONAL MODEL USE) | ESTIMATED OBSERVATION QUANTITY | $A$ ——▷$B$ / ▷$A$ | $B_{(k+1)} = A_{(k+1)}$ <br> B OBSERVES VALUE OF SAMPLING PERIOD (k+1) BEFORE PRESENT (k) |
| | TIME OBSERVATION | $A$ —▷⟨T⟩—▷$B$ | NORMAL: A = 1 OR 0 <br> STORE EXECUTION TIME time WHEREIN A BECOMES 1 AND MAINTAIN THE SAME |
| | NC SWITCH (NORMALLY ON) | $C$ ——┐ <br> $A$ —▷◇—▷$B$ | NORMAL: C = 0 <br> $if\ (C=0)\ then\ (B=A)\ else\ (B=0)$ |
| | NO SWITCH (NORMALLY OFF) | $C$ ——┐ <br> $A$ —▷◆—▷$B$ | NORMAL: C = 0 <br> $if\ (C=1)\ then\ (B=A)\ else\ (B=0)$ |
| | LOGICAL PRODUCT | $A$ —▷⟩—▷$C$ <br> $B$ —▷ | $C = \min(A, B)$ <br> (SMALLER ONE OF INPUTS A AND B IS SET TO C) |
| | LOGICAL SUN | $A$ —▷⟩—▷$C$ <br> $B$ —▷ | $C = \max(A, B)$ <br> (LARGER ONE OF INPUTS A AND B IS SET TO C) |
| NON-LINEAR OPERATOR (FOR MECHANICAL MODEL USE) | ABSOLUTE VALUE | $A$ —▷①—▷$B$ | $B = |A|$ |
| | SIGNAL | $A$ —▷⊕—▷$B$ | $B = A/|A|$ |
| | SQUARE | $A$ —▷⊗—▷$B$ | $B = A$ |
| | INITIALIZATION (INTEGRAL) | $A$ —▷▷—▷$B$ <br> $C$ ------┘ | $if\ (C=0)\ then\ B = \int A dt$ <br> $else\ B = 0$ |
| | CONVOLUTION INTEGRAL | $A$ —▷▷—▷$B$ | |
| | SAMPLING | $A$ —▷◇—▷$B$ <br> $C$ ------┘ | $B_{(k)} = A_{(k-C)}$ <br> (INPUT C IS TIMING OF SAMPLING) <br> $B_{(k)} = A_{(k-1)}$ <br> (OMITTED INPUT C) |
| | CONDITIONAL DECISION | $A$ —▷⟨Cond⟩—▷$B$ | $if\ (Cond)\ then\ (B=1)\ else\ (B=0)$ <br> (Cond: CONDITION DECISION FORMULA) |
| | FUNCTION | $A$ —▷⟨fnc()⟩—▷$B$ | $B = fnc(A)$ <br> (fnc(): FONCTION NAME/SYMBOL) |
| | OPERATION | ⟨$A$⟩—▷$B$ | $A = B$ (A: SIGNAL) |

Fig.79

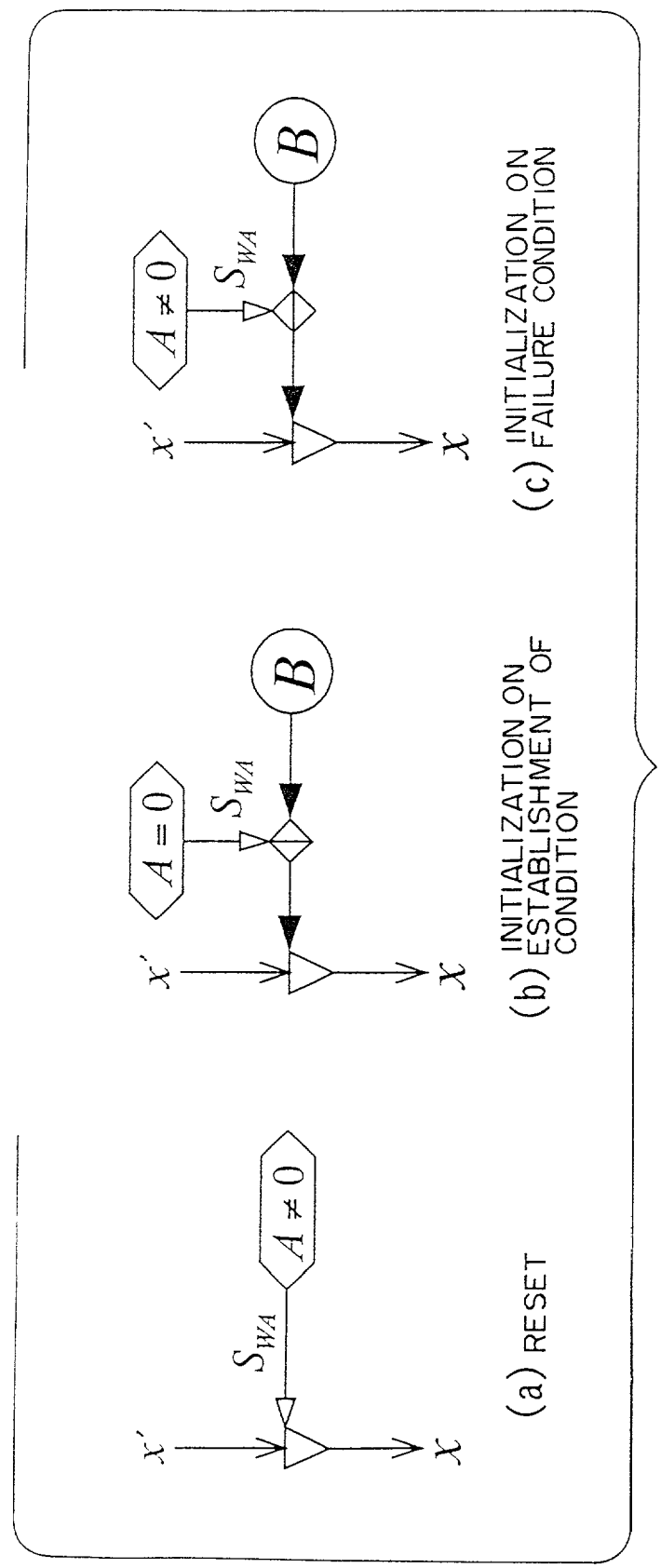

(a) LOGICAL PRODUCT
(b) SWITCH ELEMENT

NON-LINEAR CHARACTERISTIC REPRODUCING APPARATUS AND NON-LINEAR CHARACTERISTIC REPRODUCING PROGRAM STORAGE MEDIUM

BACKGROUND OF THE INVENTION

1. Field of the Invention

The present invention relates to a non-linear characteristic reproducing apparatus for performing a simulation in which a non-linear transformation is applied to a state quantity and then outputted, and a non-linear characteristic reproducing program storage medium storing therein a non-linear characteristic reproducing program which causes a computer to operate as a non-linear characteristic reproducing apparatus.

2. Description of the Related Art

The great majority of products and components, which are an object of design and development, includes a non-linear characteristic. This is a subject which cannot be avoided throughout all the processes of a product development from planning via a design to a test of trial manufacture. However, the non-linearity, which has an effect on all parts of the product development, has two aspects one of which is an obstacle to the product development and another effective, and has very important meaning. With respect to the aspect which is an obstacle to the product development, it is a cause of the uncertain phenomenon and in many cases it happens that the uncertain phenomenon has a bad effect on a function of manufactured goods and deteriorates its performance and reliability. Thus, such a non-linearity has to be removed or has to avoid an influence on manufactured goods. Next, with respect to the effective aspect of the non-linearity, it often happens that the non-linearity is utilized actively on purpose as means of creation and implementation of functions and characteristics, such as a non-linear spring, a semiconductor, a link mechanism and clutch mechanism, which are not be realized by use of the linearity. In this case, application of the non-linearity is indispensable for implementation of the function and achievement of the performance.

To provide a model, there is a need to reproduce faithfully the non-linearity. However, most of the conventional techniques for providing a model, for example, the finite element method, is originally developed for a linear system. Therefore, generally it is difficult and troublesome to deal with the non-linearity in accordance with the conventional techniques for providing a model. Consequently, in the conventional product model, it is usual that the non-linearity is omitted from beginning, or alternatively the non-linearity is dealt with as the equivalent linearity in which the non-linearity is approximated or averaged. In the event that the non-linearity greatly effects on the performance, or in the event that the non-linearity is utilized to implement the necessary function, hitherto it was obliged to use the numerical processing method which is complicated and lacking of generality, so alternatively we had to cope with those cases individually in accordance with intuition and experience of a skilled engineer. This makes it difficult to provide a model. And also this is a primary factor to prevent a computer from being utilized for a product development. Indeed an actual product is involved in various types of complicated non-linearity, and thus it is difficult to solve those various types of non-linearity in accordance with a common theory.

SUMMARY OF THE INVENTION

In view of the foregoing, it is an object of the present invention to provide a non-linear characteristic reproducing apparatus for reproducing a non-linear behavior of manufactured goods and components on a simulation, and a non-linear characteristic reproducing program storage medium storing therein a non-linear characteristic reproducing program which causes a computer to operate as a non-linear characteristic reproducing apparatus.

To achieve the above-mentioned object, the present invention provides first non-linear characteristic reproducing apparatus wherein upon receipt of a predetermined first state quantity, a non-linear transformation processing is applied to the entered first state quantity so that a second state quantity is generated and outputted, said non-linear characteristic reproducing apparatus comprising:

a state quantity transformation unit for linear-transforming the first state quantity to the second state quantity every sampling time in accordance with a transformation parameter set up; and a non-linear characteristic reproducing unit for determining a transformation parameter for transformation at a subsequent sampling time in accordance with an estimated observation quantity at the subsequent sampling time of at least one state quantity of the first state quantity and the second state quantity or a state quantity derived from said one state quantity to set the determined transformation parameter to said state quantity transformation unit.

In the first non-linear characteristic reproducing apparatus according to the present invention, it is acceptable that said non-linear characteristic reproducing unit receives the estimated observation quantity and one or more variables as well, and determines the transformation parameter in accordance with the estimated observation quantity and one or more variables thus received.

Alternatively, it is acceptable that said non-linear characteristic reproducing unit receives the estimated observation quantity and one or more variables as well, and determines a plurality of second state quantities in accordance with one variable.

In the first non-linear characteristic reproducing apparatus according to the present invention, it is preferable that said non-linear characteristic reproducing unit determines in form of the transformation parameter a normalized estimation value in which an estimation value of the second state quantity at the subsequent sampling time is normalized with the estimated observation quantity. In this case, it is preferable that said non-linear characteristic reproducing unit the estimation value of the second state quantity at the subsequent sampling time is divided or differentiated with an absolute value of the estimated observation quantity, so that the estimated observation quantity is determined in form of the transformation parameter.

In the first non-linear characteristic reproducing apparatus according to the present invention, it is preferable that said non-linear characteristic reproducing apparatus is an apparatus for reproducing characteristics of a non-linear spring, said state quantity transformation unit performs a transformation between a velocity difference on both ends of the non-linear spring and a variation of load of the non-linear spring, and said non-linear characteristic reproducing unit determines a transformation parameter for performing transformation between the velocity difference on both ends of the non-linear spring as an object of a characteristic reproduction and the variation of load of the non-linear spring at a subsequent sampling time in accordance with an estimated observation quantity at the subsequent sampling time of the velocity difference on both ends of the non-linear spring to set the determined transformation parameter to said state quantity transformation unit.

Alternatively, in the first non-linear characteristic reproducing apparatus according to the present invention, it is preferable that said non-linear characteristic reproducing apparatus is an apparatus for reproducing characteristics of an air spring, said state quantity transformation unit performs a transformation between a deformation velocity of the air spring and a variation of an internal pressure of the air spring, and said non-linear characteristic reproducing unit determines a transformation parameter for performing transformation between the deformation velocity of the air spring as an object of a characteristic reproduction and the variation of the internal pressure of the air spring at a subsequent sampling time in accordance with an estimated observation quantity at the subsequent sampling time of the deformation velocity of the air spring to set the determined transformation parameter to said state quantity transformation unit.

Still alternatively, in the first non-linear characteristic reproducing apparatus according to the present invention, it is preferable that said non-linear characteristic reproducing apparatus is an apparatus for reproducing characteristics of a link mechanism, said state quantity transformation unit transforms a value of velocity or angular velocity of a supporting point portion of the link mechanism, and said non-linear characteristic reproducing unit determines a transformation parameter for transforming the value of velocity or angular velocity of the supporting point portion of the link mechanism as an object of a characteristic reproduction at a subsequent sampling time in accordance with an estimated observation quantity at the subsequent sampling time of velocity or angular velocity applied to the supporting point portion of the link mechanism to set the determined transformation parameter to said state quantity transformation unit.

In this case, it is acceptable that said state quantity transformation unit transforms a value of velocity or angular velocity of the supporting point portion of the link mechanism, and also a value of force or torque applied to the supporting point portion, using the same parameter as that used for transformation of the value of velocity or angular velocity of the supporting point portion of the link mechanism, said parameter being set by said non-linear characteristic reproducing unit.

Further in the first non-linear characteristic reproducing apparatus according to the present invention, it is preferable that said non-linear characteristic reproducing apparatus is an apparatus for reproducing characteristics of an object moving while involving a friction, said state quantity transformation unit performs a transformation between a force applied to the object and a moving velocity of the object, and said non-linear characteristic reproducing unit determines a transformation parameter for performing transformation between the force applied to the object as an object of a characteristic reproduction and the moving velocity of the object at a subsequent sampling time in accordance with an estimated observation quantity at the subsequent sampling time of the moving velocity of the object to set the determined transformation parameter to said state quantity transformation unit.

In this case, it is acceptable that said non-linear characteristic reproducing unit determines a frictional force applied to the object in form of the transformation parameter to set the determined transformation parameter to said state quantity transformation unit, and said state quantity transformation unit performs a transformation between the force applied to the object and the moving velocity of the object, in a case where a force, in which the frictional force set by said state quantity transformation unit is subtracted from the force applied to the object, is applied to an object in which an effect of the frictional force is neglected.

In this case, it is acceptable that said non-linear characteristic transformation unit comprises: a kinetic friction generating unit for determining a kinetic frictional force applied to the object as an object of a characteristic reproduction at a subsequent sampling time in accordance with an estimated observation quantity at the subsequent sampling time of the moving velocity of the object; a static friction generating unit for determining a static frictional force applied to the object as an object of a characteristic reproduction at a subsequent sampling time in accordance with an estimated observation quantity at the subsequent sampling time of the force applied to the object; and a frictional force selection unit for selecting one frictional force between the dynamic frictional force generated in said kinetic friction generating unit and the static frictional force generated in said static friction generating unit in accordance with the estimated observation quantity at the subsequent sampling time of the moving velocity of the object to set the selected frictional force to said state quantity transformation unit.

Further, in this case, it is acceptable that said kinetic friction generating unit determines a kinetic frictional force different in value in accordance with an estimated observation quantity at the subsequent sampling time of the moving velocity of the object.

In the first non-linear characteristic reproducing apparatus according to the present invention, it is preferable that said non-linear characteristic reproducing apparatus is an apparatus for reproducing characteristics of a variable inertia moment mechanism in which an inertia moment is varied in accordance with an angular velocity, said state quantity transformation unit performs a transformation between a torque applied to the variable inertia moment mechanism and an angular velocity of the variable inertia moment mechanism, and said non-linear characteristic reproducing unit determines a transformation parameter for performing transformation between the torque applied to the variable inertia moment mechanism as an object of a characteristic reproduction and an angular acceleration velocity of the variable inertia moment mechanism at a subsequent sampling time in accordance with an estimated observation quantity at the subsequent sampling time of the angular velocity of the variable inertia moment mechanism to set the determined transformation parameter to said state quantity transformation unit.

In this case, it is acceptable that said variable inertia moment mechanism as an object of a characteristic reproduction has a translational member translating in a radius direction in accordance with a centrifugal force, and said non-linear characteristic reproducing unit comprises: a rotational translation transformation unit for determining a centrifugal force applied to the translational member in accordance with an estimated observation quantity at a subsequent sampling time of the angular velocity of the variable inertia moment mechanism; and a translational motion reproducing unit for reproducing a translational motion of the translational member by the centrifugal force determined by said rotational translation transformation unit, and said non-linear characteristic reproducing unit determines a transformation parameter according to the translational motion of the translational member reproduced by said translational motion reproducing unit to set the determined transformation parameter to said state quantity transformation unit.

To achieve the above-mentioned object, the present invention provides a second non-linear characteristic reproducing apparatus comprising a linear model unit for reproducing characteristics of a linear system, and a non-linear model unit for determining, upon receipt of an estimated observation quantity at a subsequent sampling time of at least one state quantity of a first state quantity and a second state quantity, which are in a relation of mutually non-linear transformation, or a state quantity derived from said one state quantity, from said linear model unit, a transformation parameter used for a linear transformation at the subsequent sampling time between the first state quantity and the second state quantity, wherein an operation of determining the transformation parameter at the subsequent sampling time in said non-linear model unit and a linear operation including a linear transformation between the first state quantity and the second state quantity using the transformation parameter at the subsequent sampling time determined in said non-linear model unit, in said linear model unit are alternatively repeated.

In the second non-linear characteristic reproducing apparatus according to the present invention, it is acceptable that said non-linear model unit has a plurality of non-linear transformation units for determining, upon receipt of an estimated observation quantity at a subsequent sampling time of at least one state quantity of a first state quantity and a second state quantity, which are in a relation of mutually non-linear transformation and at least one of which is different in type, or a state quantity derived from said one state quantity, a transformation parameter used for a linear transformation at the subsequent sampling time between the first state quantity and the second state quantity.

In the second non-linear characteristic reproducing apparatus according to the present invention, it is preferable that said non-linear characteristic reproducing apparatus is an apparatus for reproducing characteristics of Geneva mechanism, said linear model unit performs linear transformations including a linear transformation of angular velocity-to-angular velocity between master section and slave section of the Geneva mechanism, and a linear transformation of torque-to-torque between master section and slave section of the Geneva mechanism, and said non-linear model unit has a non-linear transformation unit for determining a transformation parameter including information as to whether master section and slave section of the Geneva mechanism are connected to one another at the subsequent sampling time, said information being used for both the linear transformation of angular velocity-to-angular velocity between master section and slave section of the Geneva mechanism and the linear transformation of torque-to-torque between master section and slave section of the Geneva mechanism, at a subsequent sampling time of an angle of the master section of the Geneva mechanism, in accordance with an estimated observation quantity at the subsequent sampling time.

In the second non-linear characteristic reproducing apparatus according to the present invention, it is preferable that said non-linear characteristic reproducing apparatus is an apparatus for reproducing characteristics of a liquid residue warning lamp in which a lamp and a thermistor are connected in series, said linear model unit performs linear transformations including a transformation between a voltage applied to the lamp and a current conducting through the lamp and a transformation between a voltage applied to the thermistor and a current conducting through the thermistor, and said non-linear model unit has a first non-linear transformation unit for determining a resistance of the thermistor at a subsequent sampling time of a consumed power of the thermistor in accordance with an estimated observation quantity at the subsequent sampling time.

To achieve the above-mentioned object, the present invention provides a third non-linear characteristic reproducing apparatus comprising:

a logical decision unit for receiving one or more variables, and determining a logical value at a subsequent sampling time, selected among from a plurality of discrete values in accordance with the received one or more variables; and a state quantity selecting unit for receiving a predetermined input state quantity and outputting at the subsequent sampling time an output state quantity in which a relation between the input state quantity and the output state quantity is changed over to a relation according to the logical value at the subsequent sampling time determined by said logical decision unit.

Here, the above-mentioned "plurality of discrete values" may be, for example, binary ('0' and '1') or ternary ('0' and '1' and '−1').

Further, the above-mentioned "the first state quantity is changed over" implies that the first state quantity is changed over to various states, for example, a selection between passage and block of the first state quantity in the event that the logical value is expressed by the binary, and for example, a selection among forward flow, reverse flow and flow stop of the first state quantity in the event that the logical value is expressed by the ternary.

In a third non-linear characteristic reproducing apparatus according to the present invention, it is acceptable that said state quantity selecting unit outputs at the subsequent sampling time an output state quantity in which a relation between the input state quantity and the output state quantity is changed over to a connection relation according to the logical value at the subsequent sampling time determined by said logical decision unit.

Alternatively it is acceptable that said state quantity selecting unit integrates the input state quantity and outputs as an output state quantity, and in a case where the logical value at the subsequent sampling time determined by said logical decision unit is a predetermined logical value, said state quantity selecting unit outputs an output state quantity which is changed over to an initial value at the subsequent sampling time.

Further, it is acceptable that said logical decision unit determines a logical value at a subsequent sampling time, selected among from a plurality of discrete values in accordance with an estimated observation quantity at the subsequent sampling time of a plurality of input state quantities, and said state quantity selecting unit receives the plurality of input state quantities and outputs at the subsequent sampling time in form of an output state quantity an input state quantity selected in accordance with the logical value at the subsequent sampling time determined by said logical decision unit.

In the third non-linear characteristic reproducing apparatus according to the present invention, it is preferable that said non-linear characteristic reproducing apparatus is an apparatus for reproducing characteristics of a mechanism including two members having a relative movement possible state and a relative movement impossible state, said logical decision unit determines a logical value representing whether said two members are in the relative movement possible state or the relative movement impossible state in accordance with an estimated observation quantity at a subsequent sampling time of a relative position of said two members or a state quantity derived from the relative position of said two members, and said state quantity selecting unit changes over a relation between a relative moving velocity and a distribution of force of said two members.

In the third non-linear characteristic reproducing apparatus according to the present invention, it is preferable that said non-linear characteristic reproducing apparatus is an apparatus for reproducing characteristics of a clutch mechanism including two members having a relatively slid sliding state and a mutually connected connecting state, said logical decision unit determines a logical value representing whether said two members are in the sliding state or the connecting state in accordance with an estimated observation quantity at a subsequent sampling time of a relative angular velocity of said two members, and said state quantity selecting unit changes over a relation between a relative angular velocity and a distribution of torque of said two members.

Further, in the third non-linear characteristic reproducing apparatus according to the present invention, it is preferable that said non-linear characteristic reproducing apparatus is an apparatus for reproducing characteristics of a brake mechanism for applying a braking energy to a driving shaft, said logical decision unit determines a logical value representing whether the driving shaft is in a rotating state or a stationary state in accordance with an estimated observation quantity at a subsequent sampling time of a torque which a brake receives from the driving shaft, and said state quantity selecting unit changes over a braking torque to be applied to the driving shaft.

In the third non-linear characteristic reproducing apparatus according to the present invention, it is preferable that said non-linear characteristic reproducing apparatus is an apparatus for reproducing characteristics of an automatic-reset mechanism in which a spring is effected on a movable member, and when application of an external force to the movable member is removed, the movable member is automatically reset to an initial state by an effect of the spring, said automatic-reset mechanism having a stopper to limit a movable range of the movable member, said logical decision unit determines a logical value representing whether the movable member interferes with the stopper in accordance with an estimated observation quantity at a subsequent sampling time of a moving position of the movable member, and said state quantity selecting unit changes over a relation between velocity or angular velocity of the movable member and force or torque to be applied to the movable member.

To achieve the above-mentioned object, the present invention provides fourth non-linear characteristic reproducing apparatus wherein upon receipt of a predetermined first state quantity, a second state quantity changed over to a non-linearity according as the received first state quantity is in a predetermined state is generated, said non-linear characteristic reproducing apparatus comprising:

a state variation estimation unit for predicting a state quantity variation width during a period from a present sampling time to a subsequent sampling time of the first state quantity;

a state deviation detection unit for determining a deviation between a value at the present sampling time of the first state quantity and a decision value for deciding whether the first state quantity is in a predetermined state;

a stable state decision unit for determining a logical value to be selected from among a plurality of discrete values, predicting a non-linear variation at a subsequent sampling time in accordance with a comparison of the state quantity variation width predicted by said state variation estimation unit with the deviation determined in said state deviation detection unit; and a state quantity selecting unit for outputting the second state quantity changed over in accordance with the logical value determined in said stable state decision unit.

In the fourth non-linear characteristic reproducing apparatus according to the present invention, it is acceptable that said state deviation detection unit determines a deviation between a value at the present sampling time of the first state quantity and a decision value for deciding whether the first state quantity is in a predetermined state, said decision value being varied in accordance with positive or negative of the state quantity variation width predicted in said state variation estimation unit.

To achieve the above-mentioned object, the present invention provides a fifth non-linear characteristic reproducing apparatus comprising:

a linear model unit for reproducing characteristics of a linear system, including a state quantity transformation unit for linear-transforming a first state quantity to a second state quantity in accordance with a transformation parameter set up; and a non-linear model unit for generating, upon receipt of an estimated observation quantity at a subsequent sampling time of a predetermined first observation state quantity from said linear model unit, the transformation parameter in accordance with the received estimated observation quantity and setting the generated transformation parameter on said state quantity transformation unit, wherein said non-linear model unit comprises:

a slow change reproducing unit for receiving from said linear model an observation quantity or an estimated observation value of a predetermined second observation state quantity identical to or different from the first observation state quantity, to generate a slow change state quantity reflecting characteristic of a first non-linear system offering a relatively slow behavior change in accordance with the observation quantity or the estimated observation value of the second observation state quantity; and a characteristic generating unit for generating a transformation parameter reflecting characteristic of a second non-linear system offering a relatively rapid behavior change in accordance with the estimated observation value at a subsequent sampling time of the first observation state quantity derived from said linear model unit and the slow change state quantity generated in said slow change reproducing unit and setting up the generated transformation parameter on said state quantity transformation unit.

In this case, it is preferable that said slow change reproducing unit comprises:

a stationary value setting up unit for determining a stationary value, after passage of an infinite time, of the slow change state quantity assuming that a state of said linear model unit is maintained, in accordance with the observation quantity or the estimated observation value of the second observation state quantity; and a normalization response unit for generating the slow change state quantity reflecting characteristic of the first non-linear system, which is to be transferred to said characteristic generating unit, in accordance with a stationary value of the slow change state quantity determined in said stationary value setting up unit, and a known normalized time change characteristic of the slow change state quantity in the first non-linear system.

in this case, it is preferable that said non-linear characteristic reproducing apparatus is an apparatus for reproducing characteristics of a system having an element which is varied in a resistance value in accordance with a temperature variation, said state quantity transformation unit sets up a transformation parameter representative of the resistance value and performs a transformation between a voltage applied to the element having the resistance value and a current conducting through the element, said stationary value setting up unit determines a stationary value, after passage of an infinite time, of a temperature of the element assuming that an energy to be consumed in the element is maintained, in accordance with the estimated observation quantity at a subsequent sampling time of the energy to be consumed in the element, said normalization response unit determines a temperature of the element in accordance with a stationary value of the temperature of the element determined in said stationary value setting up unit, and a known normalized step response curve representative of a time variation of the temperature of the element to a variation of an energy to be consumed in the element, and said characteristic generating unit generates a transformation parameter representative of the resistance value of the element in accordance with the temperature determined in said normalization response unit and sets up the generated transformation parameter on said state quantity transformation unit.

In this case, it is acceptable that said normalization response unit determines a temperature of the element in accordance with an observation quantity of an ambient temperature.

Incidentally, for example, velocity and angular velocity or force and torque are determined according as the mechanism and the like as an object of reproduction is a translational system or a rotational system. Consequently, in any of the present invention as mentioned above, even if it is not clearly stated, force is a concept including torque, torque is a concept including force, velocity is a concept including angular velocity, angular velocity is a concept including velocity, position is a concept including rotational angle. Other physical quantity is also interpreted in a similar fashion.

To achieve the above-mentioned object, the present invention provides a first non-linear characteristic reproducing program storage medium storing a non-linear characteristic reproducing program which causes a computer to operate as a non-linear characteristic reproducing apparatus wherein upon receipt of a predetermined first state quantity, a non-linear transformation processing is applied to the entered first state quantity so that a second state quantity is generated and outputted, wherein said non-linear characteristic reproducing program storage medium stores a non-linear characteristic reproducing program comprising:

a state quantity transformation unit for linear-transforming the first state quantity to the second state quantity every sampling time in accordance with a transformation parameter set up; and a non-linear characteristic reproducing unit for determining a transformation parameter for transformation at a subsequent sampling time in accordance with an estimated observation quantity at the subsequent sampling time of at least one state quantity of the first state quantity and the second state quantity or a state quantity derived from said one state quantity to set the determined transformation parameter to said state quantity transformation unit.

To achieve the above-mentioned object, the present invention provides a second non-linear characteristic reproducing program storage medium storing a non-linear characteristic reproducing program which causes a computer to operate as a non-linear characteristic reproducing apparatus for reproducing characteristics of a system including a non-linear system, wherein said non-linear characteristic reproducing program storage medium stores a non-linear characteristic reproducing program comprising:

a linear model unit for reproducing characteristics of a linear system, and a non-linear model unit for determining, upon receipt of an estimated observation quantity at a subsequent sampling time of at least one state quantity of a first state quantity and a second state quantity, which are in a relation of mutually non-linear transformation, or a state quantity derived from said one state quantity, from said linear model unit, a transformation parameter used for a linear transformation at the subsequent sampling time between the first state quantity and the second state quantity, wherein an operation of determining the transformation parameter at the subsequent sampling time in said non-linear model unit and a linear operation including a linear transformation between the first state quantity and the second state quantity using the transformation parameter at the subsequent sampling time determined in said non-linear model unit, in said linear model unit are alternatively repeated.

To achieve the above-mentioned object, the present invention provides a third non-linear characteristic reproducing program storage medium storing a non-linear characteristic reproducing program which causes a computer to operate as a non-linear characteristic reproducing apparatus for reproducing characteristics of a system including a non-linear system, wherein said non-linear characteristic reproducing program storage medium stores a non-linear characteristic reproducing program comprising:

a logical decision unit for receiving one or more variables, and determining a logical value at a subsequent sampling time, selected among from a plurality of discrete values in accordance with the received one or more variables; and a state quantity selecting unit for receiving a predetermined input state quantity and outputting at the subsequent sampling time an output state quantity in which a relation between the input state quantity and the output state quantity is changed over to a relation according to the logical value at the subsequent sampling time determined by said logical decision unit.

To achieve the above-mentioned object, the present invention provides a fourth non-linear characteristic reproducing program storage medium storing a non-linear characteristic reproducing program which causes a computer to operate as a non-linear characteristic reproducing apparatus wherein upon receipt of a predetermined first state quantity, a second state quantity changed over to a non-linearity according as the received first state quantity is in a predetermined state is generated, wherein said non-linear characteristic reproducing program storage medium stores a non-linear characteristic reproducing program comprising:

a state variation estimation unit for predicting a state quantity variation width during a period from a present sampling time to a subsequent sampling time of the first state quantity;

a state deviation detection unit for determining a deviation between a value at the present sampling time of the first state quantity and a decision value for deciding whether the first state quantity is in a predetermined state;

a stable state decision unit for determining a logical value to be selected from among a plurality of discrete values, predicting a non-linear variation at a subsequent sampling time in accordance with a comparison of the state quantity variation width predicted by said state variation estimation unit with the deviation determined in said state deviation detection unit; and a state quantity selecting unit for outputting the second state quantity changed over in accordance with the logical value determined in said stable state decision unit.

To achieve the above-mentioned object, the present invention provides a fifth non-linear characteristic reproducing program storage medium storing a non-linear characteristic reproducing program which causes a computer to operate as a non-linear characteristic reproducing apparatus for reproducing characteristics of a system including a non-linear system, wherein said non-linear characteristic reproducing program storage medium stores a non-linear characteristic reproducing program comprising:

a linear model unit for reproducing characteristics of a linear system, including a state quantity transformation unit for linear-transforming a first state quantity to a second state quantity in accordance with a transformation parameter set up; and a non-linear model unit for generating, upon receipt of an estimated observation quantity at a subsequent sampling time of a predetermined first observation state quantity from said linear model unit, the transformation parameter in accordance with the received estimated observation quantity and setting the generated transformation parameter on said state quantity transformation unit, wherein said non-linear model unit comprises:

a slow change reproducing unit for receiving from said linear model an observation quantity or an estimated observation value of a predetermined second observation state quantity identical to or different from the first observation state quantity, to generate a slow change state quantity reflecting characteristic of a first non-linear system offering a relatively slow behavior change in accordance with the observation quantity or the estimated observation value of the second observation state quantity; and a characteristic generating unit for generating a transformation parameter reflecting characteristic of a second non-linear system offering a relatively rapid behavior change in accordance with the estimated observation value at a subsequent sampling time of the first observation state quantity derived from said linear model unit and the slow change state quantity generated in said slow change reproducing unit and setting up the generated transformation parameter on said state quantity transformation unit.

Incidentally, while the first to fifth non-linear characteristic reproducing program storage media of the present invention are described above on the basic style, the non-linear characteristic reproducing programs stored in the non-linear characteristic reproducing program storage medium according to the present invention includes all aspects implementing all types of first to fifth non-linear characteristic reproducing program storage media of the present invention.

As mentioned above, according to the present invention, it is possible to reproduce a non-linear behavior of products and parts through modeling.

BRIEF DESCRIPTION OF THE DRAWINGS

FIG. 78 is a view showing main symbols for functional model.

FIG. 79 is a view showing symbols for non-linearity.

FIG. 80 is a view showing initialization of an integration amount (symbol).

DETAILED DESCRIPTION OF PREFERRED EMBODIMENTS

Figure 1:
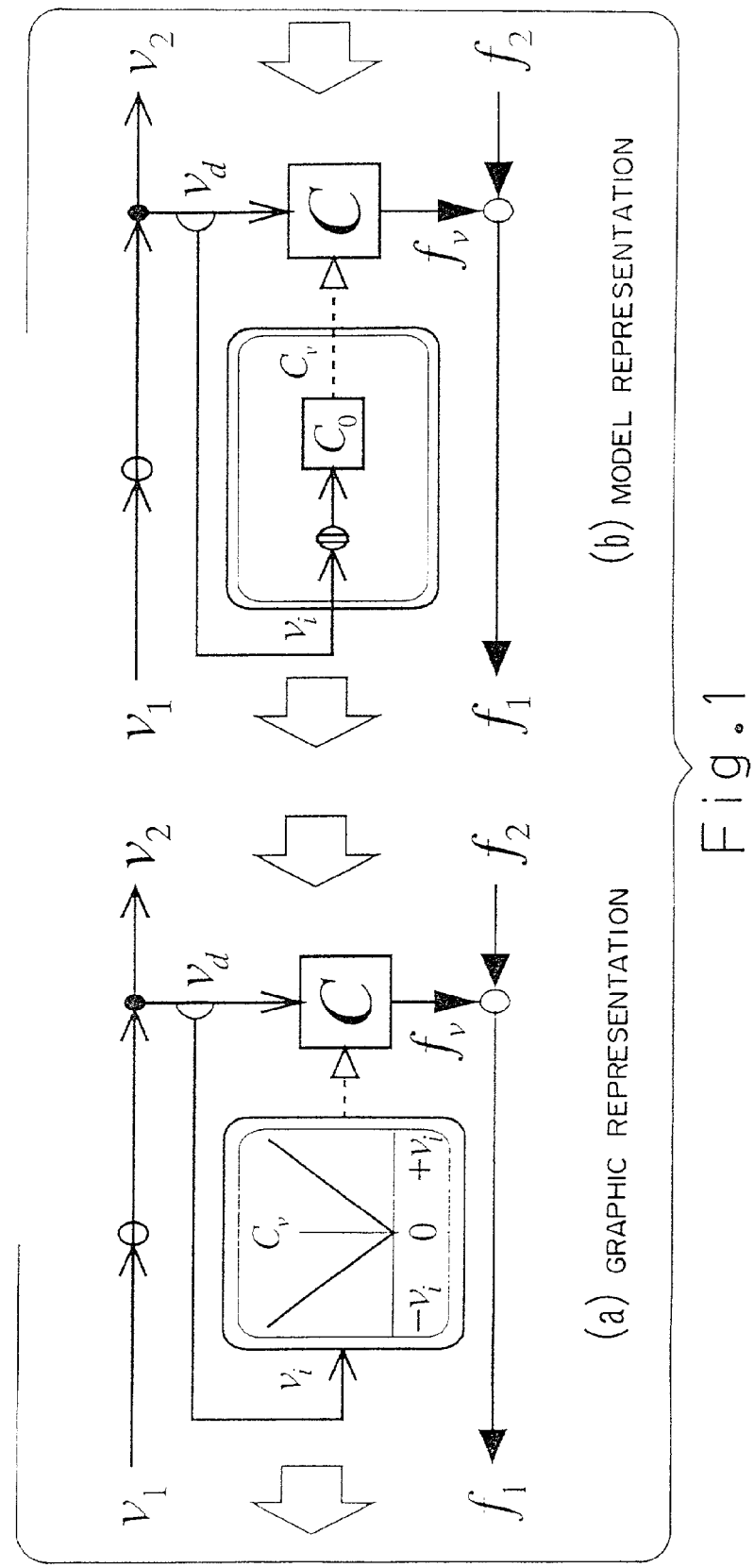
FIG. 1 is a view showing functional and mechanistic models of a running resistance.

Hereinafter, there will be described non-linearity and the basic concept of the present invention, and then embodiment of the present invention will be described.

A non-linearity is an extremely general property in such a degree that all systems, machines and structures, which are utilized all over the world, include the non-linearity.

For example, as the non-linearity relating to characteristics and state of quantity models, there may be concerned an existing place, a generating cause and a dependence factor. Phenomenon and behavior of the non-linearity are associated with all sorts and conditions, and are difficult to be grasped and to be dealt with in its entirety.

① With respect to the existing place, the non-linearity exists in many places, for example, inside material, coupling section and junction section of parts, an engagement, a bearing, a gear, an electromagnet, a semiconductor, etc.

② With respect to the generating cause, it is classified into two parts of substances and mediums, and of mechanisms and structures. The former includes non-linear characteristics such as rigidity, damping, electric resistance and magnetism, and the later includes a structural non-linear characteristic such as a universal joint, clearance, backlash and friction.

③ With respect to the dependence factor, this factor may be classified to one, for example, a running resistance and an air spring, which depends on a state quantity such as a displacement, a velocity, a current and a voltage, and one which depends on an environment such as a temperature and a humidity, one which depends on a geometric structure such as an oscillating mechanis, and one which depends on a structural separation and coupling such as a backlash and a switch.

With respect to these various types of non-linearity, hitherto there has been introduced and explicated many non-linear theories and models. These present invention is to provide a system of applying the explicated non-linear theories and models to products and components.

A model of a product or a component, which include a non-linear system, comprises of course linear and non-linear models. Of the linear and non-linear models, the linear mode is implemented in accordance with a linear theory. In this case, it is a condition that the linear mode can be expressed by a mathematical model capable of being handled by a lineax algebra. On the other hand, with respect to the non-linear function, upon taking these linear properties into consideration, there is a need to implement a model from the following two aspects.

One of the two aspects is to implement a model concerned with the non-linear behavior, in which a characteristic, a factor and an attached load (parameter in a lump) are affected by state quantity and change from linear constants in processes wherein features and details of mechanisms and physical phenomena of products and components are clarified in form of their functions. This non-linearity is affected by also an influence of an external environment such as atmospheric pressure and a temperature by which the system is suffered. Here such a non-linearity is referred to as a non-linear parameter.

Another of the two aspects is a non-linearity caused by structures and mechanisms of products and components, for example, a structural non-linearity in which a compression spring becomes a rigid-body with a bottom, and a structural non-linearity in which when a clutch for a mobile car is joining, an engine is integrated with a car body, and when the clutch is opening, both the engine and the car body moves separately each other. This non-linearity is a model of non-linearity in which the parameter and the model itself are changed in such a manner that the state quantity inside the model is directly connected or disconnected. Here such a non-linearity is referred to as a structural non-linearity.

Thus, from the above, the non-linear models can be classified to the non-linear parameter in which a parameter value is varied in accordance with the state quantity, and the structural non-linearity in which a model structure is varied in accordance with connection and disconnection of the state quantity.

(Technique of Implementing a Model of Non-Linearity)
(1) A Mechanism Model

In order to implement a model of non-linearity, it is possible to implement non-linearity of the model in such a manner that a mechanistic model for implementing a partial model of a decision process of characteristics is attached and a result is substituted for a parameter of a linear model. The mechanistic model for altering a non-linear parameter value is established in form of a partial model independent from a main linear model, and there is a need to provide independently the associated mathematical model. With respect to the non-linear parameter, it is handled in form of the linear parameter in the linear model and it is set in a state that the linear logic is applicable. With respect to the non-linear model, necessary accuracy and reproducibility are varied in accordance with purpose of the use. Thus, there is a need to use a plurality of models in different ways even for the same non-linearity. Therefore, it is necessary for the mechanistic model that a recombination of a model is permitted in a manner of nesting system.

(2) Switch Element

With respect to implementation of a model of a structural non-linearity, it is possible to implement the model of the structural non-linearity in such a manner that an element, which serves as a switch for performing a connection and disconnection operation of the state quantity, is incorporated into the model. This switch element directly operates the state quantity of the model. Thus, it is possible to consider that the switch element is one of parameters which determine a nature of the model. Of course, the switch element is dealt with as a variable which is the same as a co-efficient having values of "0" or "1" in the linear mathematical model. When the value is given by "1", the switch element serves to connect the state quantity, and when the value is given by "0", the switch element serves to disconnect the state quantity.

This switch element needs a mechanistic model for a condition decision (formula) in which the predicted next state quantity is used to operate the switch. The decision is performed in such a manner that an operating quantity of "0" or "1" is generated from a predicted observation quantity predicted with the state of the model in the subsequent sampling time, and the switch element is operated (substituted) with this operation quantity in a manner that the internal connection is recombined before execution of the model through the operation of the switch element. Thus, the system and the associated mathematical model can be dealt with as the linearity even if the model is of the structural non-linearity.

(3) Model Including Non-Linearity

From the above, a technique of implementing a model of non-linearity is classified as follows. One is that a mechanistic model is incorporated into a parameter included in a linear model so that the linear model is changed to a model which performs a non-linear behavior. In the transient characteristic of this model, the characteristic value of the system has a continuity owing to a non-linear parameter which continuously changes, so the response is varied continuously. The other is that the switch element is included in the model of the structural non-linearity by a method in which a mechanistic model for predicting the subsequent state is incorporated to provide a non-linear structure for the model. In the transient characteristic of this model, the characteristic value of the system has discontinuity owing to connection and disconnection of the model structure by the switch element, so the response involves jumping phenomenon.

From the above, the functional model is dealt with as the liner model regardless of linearity and non-linearity, and components to manufactured goods and up to the internal physical phenomenon can be modeled with greater accuracy and reproducibility. Further, as the mechanistic model is independent of a model to which a linear theory is applied, it is possible to incorporate thereinto many models utilized in the conventional product development, such as a statistical model, a recurrence model, an empirical formula, a fuzzy model and a neural network. In this manner, a non-linear model makes it possible to implement a model in a wider use, with which a non-linear theory, an engineering theory, a model, a stored technology, etc. are applied to such as structure, and mechanism common to products and components, physical phenomena and obstacle phenomena. Of course, it is possible to reproduce all of those contents by an execution with a computer.

(4) Implementation of Nonlinearity of Parameters

Figure 8:
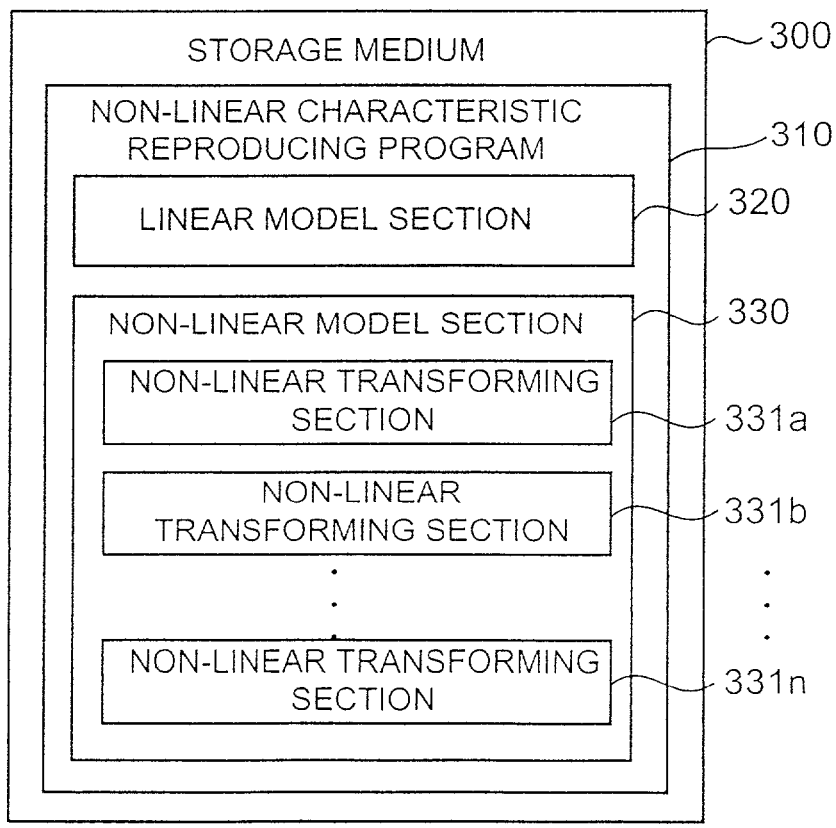
FIG. 8 is a typical illustration showing a structure of a non-linear characteristic reproducing program stored in a storage medium.

It is known that a loss characteristic $C_0$ due to wind to a mobile car in running has a running resistance force $f_v$ proportional to the square of the velocity $v_d$. That is, this is expressed by the equation $f_v = C_0 v_d^2$. When this equation is expressed by the product of the velocity $v_d$, it is possible to divide the equation into a linear equation of $f_v = C_0 v_d$ and a non-linear loss characteristic $C_v C_0 v_d$ which is proportional to the velocity $v_d$. In this relation, the equation is an equation representative of the entire system in form of the linearity, and the later is an equation representative of the non-linear loss characteristic. Thus, both the equations are associated with one another by an observation quantity $v_i = v_d$ wherein $v_i$ is observed quantity of the velocity $v_d$, and a coupling condition equation $C = C_v$ wherein $C_v$ is substituted for C. FIG. 8 shows above-mentioned relation expressed by functional and mechanistic models.

FIG. 1 shows a functional model in which input and output state quantity of running velocities $v_1 \cdot v_2$ and driving resistance forces $f_1 \cdot f_2$ is provided with a loss characteristic C, and a mechanistic model in which an observation quantity $V_i$ is put into a box to generate a non-linear loss characteristic $C_v$. The mechanistic model is expressed by a graph and a model. Part (a) of FIG. 1 is a graph in which the non-linear loss characteristic $C_v$ proportional to the absolute value of the observation quantity $v_i$ of the velocity is expressed where abscissa (X axis) denotes the velocity $v_i$, and the ordinate (Y axis) denotes the non-linear loss characteristic $C_v$. Part (b) of FIG. 1 is an example of the same content as the part (a) of FIG. 1 wherein the non-linear loss characteristic $C_v$ is expressed in form of a model with symbols shown in FIGS. 78 and 79. Both the models are completely the same as the fundamental function element of the linear phase difference loss characteristic, except the mechanistic model of the non-linear loss characteristic $C_v$. Incidentally, here, it is silent as to the estimated observation quantity is not mentioned, and its detail will be described later.

The coupling condition of incorporating the mechanistic model into the functional model shown in FIG. 1 is given by the following mathematical model.

$$\begin{bmatrix} f_1 \\ v_2 \\ v_d \end{bmatrix} = \begin{bmatrix} -C & 1 \\ -1 & 0 \\ -1 & 0 \end{bmatrix} \begin{bmatrix} v_1 \\ f_2 \end{bmatrix} \\ v_i = v_d \\ C = C_v \quad (1)$$

In eq. (1), the first line denotes a government equation of the functional model, the second line denotes a coupling condition equation for the observation quantity, and the third line denotes a coupling condition equation in which a loss characteristic is substituted.

The mechanistic model incorporated into the functional model is given by the following mathematical model.

$$C_v = C_0 |v_i| \quad (2)$$

It is possible to incorporate into the government equation of the first line of the eq. (1) the mathematical model of the mechanistic model, which determines the non-linear parameter of eq. (2), through the coupling condition equations on the second and the third lines of the eq. (1).

(5) Modeling by the Non-Linear Theory

Let us consider further implementation of a model of the above-mentioned non-linear parameter. According to the example shown in FIG. 1, the non-linear loss characteristic $C_v$ proportional to the velocity $v_i$ in eq. (12) is provided as the mechanistic model, and the equation is divided utilizing the fact that the loss of the running wind is proportional to the square of the velocity. However, such an example is rear on the actual non-linear model. Therefore, there is desired such a usually used general method that the non-linear model is transformed directly to the mechanism model. As this idea, the non-linear model is divided or differentiated by the state quantity applied to the non-linear parameter before execution of the computation. Thus, it is possible to implement a device modeling of the mechanistic model. By way of example, representation of the model of FIG. 1 according to this method offers the mechanistic model shown in FIG. 2. Incidentally, with respect to the dynamic frictional force $F_T$ shown in FIG. 2, it will be described later.

Figure 2:
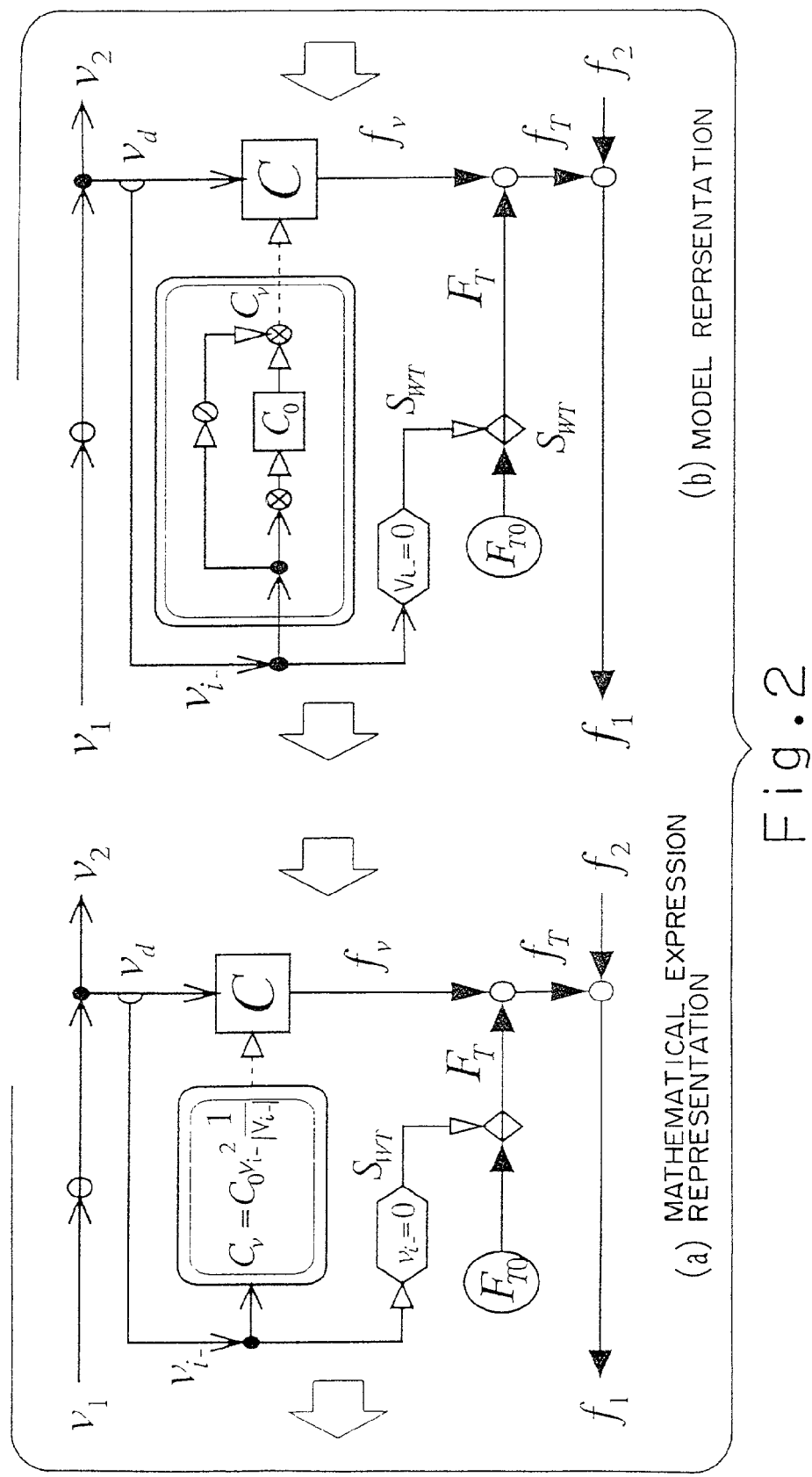
FIG. 2 is a view showing functional and mechanistic models of a kinetic frictional force and a running resistance.

With respect to the mechanistic models shown in FIG. 2 in form of a frame, part (a) of FIG. 2 shows a mathematical expression representation and part (b) of FIG. 2 shows a model representation, wherein an estimated observation quantity $v_{i\_}$ at the subsequent sampling time of the velocity $V_d$ is applied to both the models. When $f_v = C_0 V_{i\_}^2$, which is an equation of force of a running wind resistance of the part (a) of FIG. 2, is generalized and expressed with a function $f_v = \text{fnc}(V_{i\_})$, force $f_v$ of the running wind resistance of part (a) and part (b) of FIG. 2 is expressed by the following mathematical model.

$$f_v = \left( fnc(v_{i\_}) \frac{1}{|v_{i\_}|} \right) v_d \\ v_{i\_} = 2v_{d(k)} - v_{d(k-1)} \quad (3)$$

In eq. (3), the upper side is the force $f_v$ of the running wind resistance expressed by the function wherein the equational expression in the parentheses denotes the mechanistic model, and the lower side is the equation of the estimated observation quantity $v_{i\_}$ of the velocity $V_d$. The estimated observation quantity $v_{i\_}$ is an approximate value by a discrete system for estimating a velocity $V_{d(k+1)}$ at the subsequent sampling time using the velocity difference between the velocity $V_{d(k)}$ at the present sampling time and the velocity $V_{d(k-1)}$ at the previous sampling time. The absolute value of the estimated velocity $v_{i\_}$ is the estimated observation quantity $v_{i\_}$ of the input velocity $V_d$ of the non-linear loss characteristic C. Allowance of the application of the transformation of eq. (3) is limited to characteristics, factors and side loads. The method is the same also in the case that plural state quantities are inputted to the mechanistic model shown in FIG. 2.

The mechanistic model shown in FIG. 2 can be represented by the following mathematical model.

$$\begin{bmatrix} f_1 \\ v_2 \\ v_i \end{bmatrix} = \begin{bmatrix} -C & 1 & F_{T0}S_{WT} \\ -1 & 0 & 0 \\ -1 & 0 & 0 \end{bmatrix} \begin{bmatrix} v_1 \\ f_2 \\ 1 \end{bmatrix} \Biggr\} \quad (4)$$
$$v_{i\_} = v_d \Biggr\}$$
$$C = C_v$$

In eq. (4), the upper side denotes the government equation, and the lower side denotes the coupling condition equation between the functional model and the mechanistic model. The mechanistic model of the function represented by the upper portion of eq. (3) may be expressed by the following mathematical model.

$$C_v = C_0 v_i^2 \frac{1}{|v_{i\_}|} \quad (5)$$

(6) Modeling of Structural Non-Linearity

Next, the model of a tire kinetic frictional force $F_T$ appearing at the lower side of FIG. 2 is a model of a structural non-linearity in which a condition decision $S_{WT}$ predicts stop and run of a car from the estimated observation quantity $v_{i\_}$ to operate a switch element $S_{WT}$ so that a side load of a kinetic frictional force $F_{T0}$ is controlled. In this structural non-linearity, when the velocity $v_{i\_}$ is 0, the condition decision $S_{WT}$ is 1 so that the switch element $S_{WT}$ turns off, and thus the side load $F_{T0}$ is disconnected. On the other hand, when the velocity $v_{i\_}$ is 0, the side load $F_{T0}$ is connected. The result is added to the force $f_v$ of the running wind resistance in form of the tire kinetic frictional force $F_T$.

The condition decision equation and the tire kinetic frictional force are expressed as follows.

$$f(v_{i\_} = 0) \text{ then } (S_{WT} = 1) \text{ else } (S_{WT} = 0) \Biggr\} \quad (6)$$
$$F_T = S_{WT} F_{T0}$$

In eq. (6), the upper side denotes the condition decision equation, and the lower side denotes the tire kinetic frictional force which is the same as one incorporated into the equation appearing at the upper side of eq. (4).

Here, there will be supplemented a method of condition decision taking a decision of the zero velocity in eq. (13) by way of example. In the condition decision, it often happens that a zero value or and a designation value of the state quantity are provided for a decision. It is difficult for the actual simulation including a calculation error to determine mathematically this decision. In some cases, a failure of determination causes an oscillation of the state quantity in synchronism with a sampling period. For example, in eq. (6), even if a velocity within a certain range is set up to be zero so that the calculation error can be avoided, there will occur an oscillation phenomenon owing to an alteration of the sampling period, or increment or decrement of the acceleration. As one of methods of avoiding this problem, there is a method of predicting and deciding a stability of a velocity to zero on the basis of the velocity $V_{d(k)}$ at the present time (k), the velocity difference $\Delta v_d$ from the previous sampling time (k−1), and the velocity $V_{d(k+1)}$ at the subsequent sampling time (k+1). This condition decision is expressed as follows.

$$\Delta v = v_{d(k)} - v_{d(k-1)} \Biggr\} \quad (7)$$
$$\text{if } (|v_{d(k)} - V_{TH}| \le |\Delta v|) \text{ then } (S_{WT} = 1) \text{ else } (S_{WT} = 0)$$

In eq. (7), the upper side denotes the velocity difference from the previous sampling time, and the lower side denotes the condition decision equation, where $V_{d(k)}$ is a velocity at the present time; $V_{TH}$, a criterion value; $V_{d(k-1)}$, a velocity at the previous sampling time; and $\Delta v$, a velocity difference from the previous sampling time. With respect to $S_{WT}$ appearing at the lower side, when a condition is satisfied in a decision condition of the velocity 0, $S_{WT}$=1, or else $S_{WT}$=0. Incidentally, it is effective that the criterion value for the zero velocity is given by $V_{TH}$=0. The algorithm for a decision decides whether the velocity difference $\Delta v$ is associated with a state that the criterion value $V_{TH}$ is intervened between the velocity $V_{d(k)}$ at the present time and the velocity $v_{d(k+1)}$ at the subsequent sampling time. That is, it is decided whether the velocity $V_{d(k)}$ at the present time is within a range wherein the velocity difference $\Delta v$ is established as the criterion width. Consequently, according to the condition decision of operating a switch element while a velocity stop and a convergence state to a target value are decided, since those are converged while the decision width is sequentially reduced, it is possible to obtain the convergent state less in the residual between the criterion value and the decided state quantity. And also it is possible to converge an oscillation occurring in synchronism with a sampling period taking the decided value as a boundary.

For the condition decision, there is used usually a method in which some latitude is allowed for the criterion value to stabilize the decision result. In the event that some latitude is allowed for the criterion in the condition decision appearing at the lower side of eq. (7), the following equation is given.

$$\text{if } (S_{WT} = 0) \cap (|v_{d(k)} - V_{SH}| \le |\Delta v|) \quad \text{then } (S_{WT} = 1) \Biggr\} \quad (8)$$
$$\text{else if } (S_{WT} = 1) \cap (|v_{d(k)} - V_{SL}| \le |\Delta v|) \text{ then } (S_{WT} = 0)$$

In eq. (8), $V_{SH}$ denotes the upper limit of the criterion, and $V_{SL}$ denotes the lower limit of the criterion. The remaining is the same as eq. (7). With respect to the decision result of the eq. (8), in the event that the velocity is smaller than the upper limit $V_{SH}$ of the criterion (velocity up), when the velocity reaches the upper limit value $V_{SH}$ or larger, the decision result is given by $S_{WT}$=1. And, in the event that the velocity is larger than the lower limit $V_{SL}$ of the criterion (velocity down), when the velocity reaches the lower limit value $V_{SL}$ or smaller, the decision result is given by $S_{WT}$=0.

(7) Inappropriate Model Representation

Next, there will be given an example of device modeling in which a non-linear parameter is not appropriate.

Figure 3:
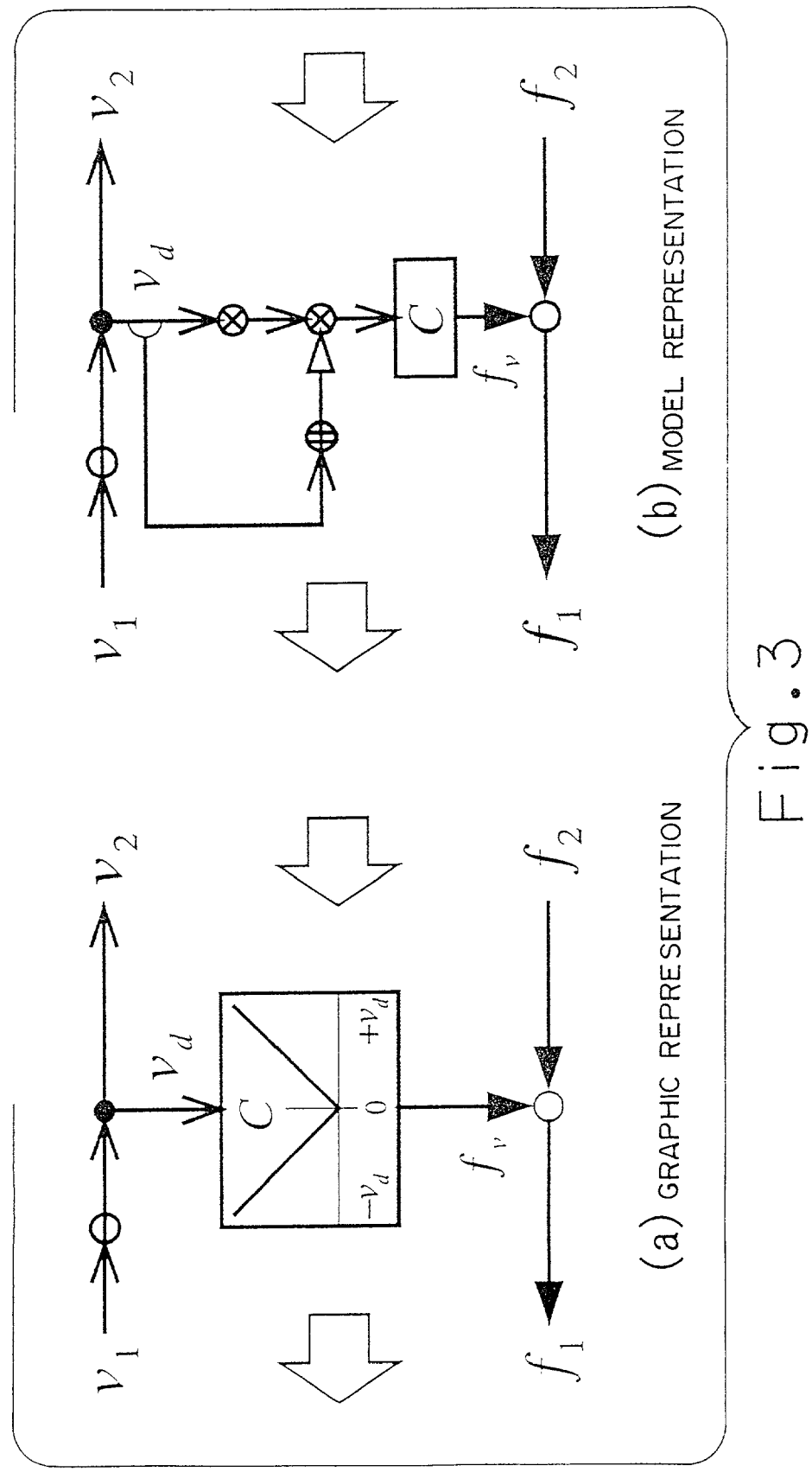
FIG. 3 is a view showing a functional model of a running resistance.

FIG. 3 shows an example of device modeling wherein the non-linear loss characteristic C shown in FIG. 1 is given directly as a non-linearity with use of the state quantity in a functional model. The government equation of this model is given by the following expression.

$$\left.\begin{array}{l} f_1 = Cv_d^2\left(\dfrac{v_d}{|v_d|}\right) + f_2 \\ v_2 = -v_1 \end{array}\right\} \quad (9)$$

The functional model in FIG. 3 becomes eq. (9) which directly operates the state quantity, and becomes an unusual mathematical model representative of a non-linearity inherent to a running resistance. Thus, it is difficult to represent such a mathematical model by a linear government equation. Further, regarding products and components having many types of non-linearity as their inherent functions, it is almost impossible to solve their coupling physical phenomena directly with the mathematical model. This is considered as a limit of the conventional non-linear model.

For example, comparing eqs.(1) and (2) with eq. (9), eqs.(1) and (2) are divided into the expression parts of the non-linearity and of the linearity, even if the same model is concerned. Thus, it is possible to solve the equation through a substitution of each state quantity in plural linearity expressions. On the other hand, in case of the eq. (9), the expression part of the non-linearity and the expression part of the linearity are mixed in one equation. Thus, it is difficult to solve the equation through a substitution of each state quantity of plural non-linearity expressions.

In this manner, for modeling of the device with the non-linearity, there are several ways of methods of expression even if function and behavior are same. However, it would be understood that direct insertion of non-linear model into linear model limits device modeling. In order to avoid this limitation, it is important that the functional model and the government equation are modeled in form of the linearity and the non-linearity to be inserted into this functional model is modeled separately as the independent mechanistic model. The device modeling, which fails to satisfy this condition, is associated with the following problems.

① It is difficult to solve mathematically products goods and components in which plural of non-linearities are involved.

② A linear theory cannot be applied to the government equation.

③ A model of a non-linear parameter cannot be recombined in a manner of nesting system.

④ A functional model and a model with a non-linear parameter cannot be standardized.

Figure 10:
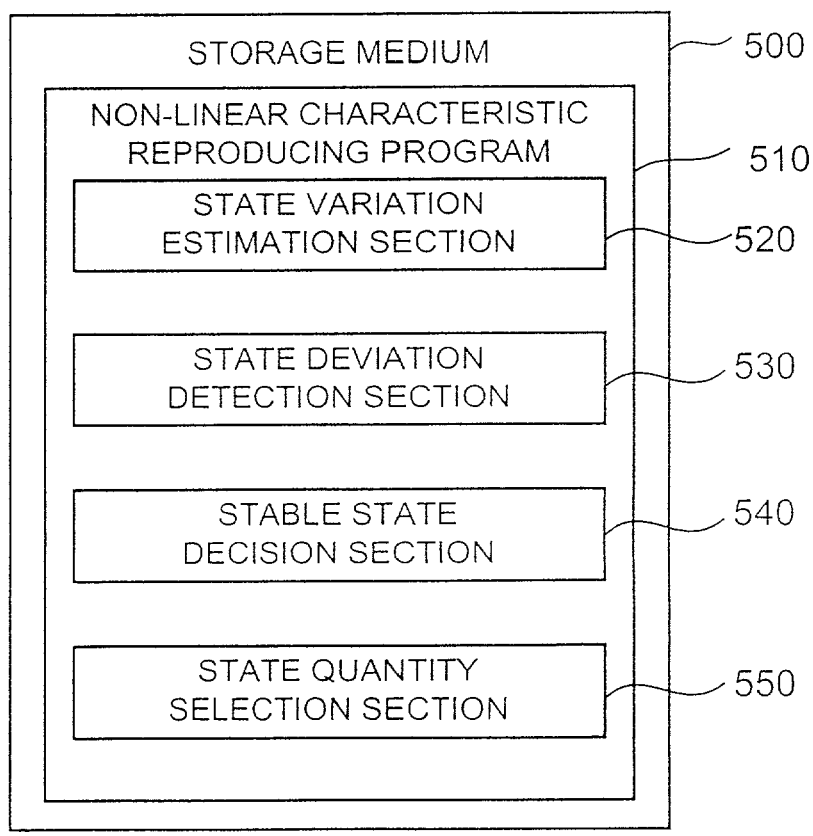
FIG. 10 is a typical illustration showing a structure of a non-linear characteristic reproducing program stored in a storage medium.

From the above, the model shown in the parts (a) and (b) of FIG. 10 is an example of a device modeling, which is inappropriate as the functional model.

However, with respect to the representation shown in the parts (a) and (b) of FIG. 3, the following uses are applicable with a consideration for processing the representation on a software basis.

① The uses of a flow diagram and an explanatory view for simplifying a complicated system to visually understanding of the whole.

② Expression means for simplifying a functional model used repeatedly in a development field.

③ Symbols for symbolizing functional models and parameters including a non-linearity.

(8) Running Resistance Model of a Car

Figure 4:
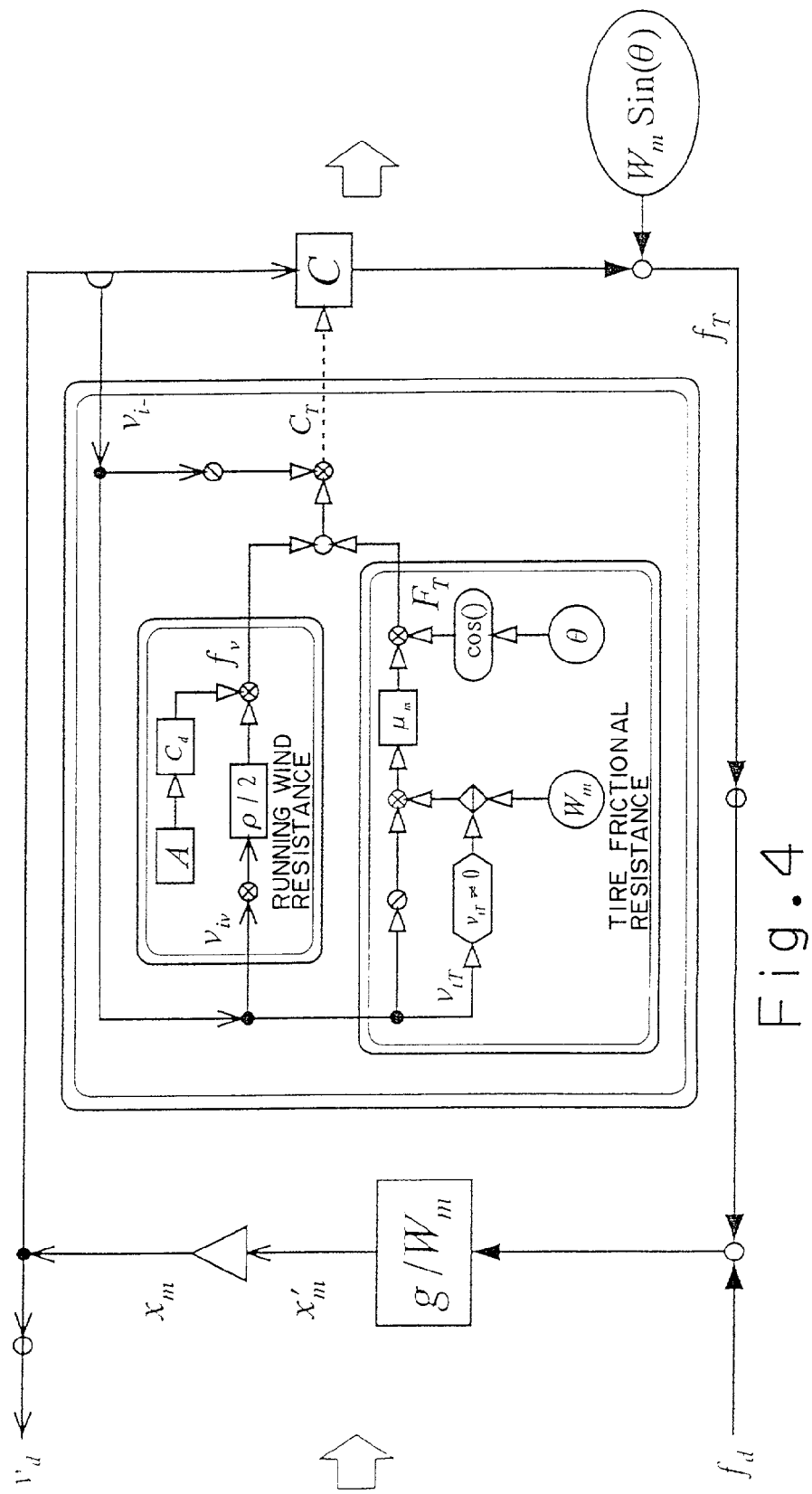
FIG. 4 is a view showing a functional model in which a hierarchical structure is expressed by a relation of inclusion.

The functional model shown in FIG. 2 is an example in which a structural non-linear model of the dynamic frictional force $F_T$ is added to the non-linear loss characteristic $C_v$ shown in FIG. 1 so that a running resistance is improved in accuracy. The non-linear loss characteristic CV and the dynamic frictional force FT of the tire shown in FIG. 2 are running loads which are important in deciding running performance and fuel efficiency of a mobile car. More in detail, this may be expressed by the following equation.

$$f_T = \dfrac{1}{2}\rho C_d A v_d^2 + \mu_m W_m \cos(\theta) + W_m \sin(\theta) \quad (10)$$

where ρ denotes air density; $C_d$ coefficient of air resistance; A frontal projected area; $\mu_m$ coefficient of rolling resistance; $W_m$ weight of vehicle; and θ an angle of inclination. In this equation, the first term denotes a force $f_v$ by the running wind, the second term denotes a dynamic frictional force $F_T$ of a tire, and the third term denotes a force of an up-and-down slope by a weight. When the first and second terms of the eq. (10) are rearranged with the absolute value of the velocity $v_d$ after the example of the eq. (3) to make up the whole into one mechanistic model in form of equivalent non-linear loss characteristic $C_T$. Functional and mechanistic models, wherein mass $W_m/g$ of a mobile car is added to this mechanistic model, is shown in FIG. 4 where $v_d$ denotes velocity of the car; $f_d$ driving force; $f_T$ force of running resistance; and $x_m$ internal state quantity.

FIG. 4 shows a mechanitic model of equivalent non-linear loss characteristic $C_T$ in which a hierarchical structure developed below is expressed by a relation of inclusion. This model incorporates into the lower portion thereof a mechanistic model for reproducing a potential quantity of the running wind load $f_v$ and the kinetic frictional force $F_T$ so as to form the mechanistic model in which the running wind load $f_v$ and the dynamic frictional force $F_T$ are added and then combined to the upper portion of the model and the equivalent non-linear loss characteristic $C_T$, which is transformed after the example of eq. (10), is substituted for C. It is understood that the mechanistic model of FIG. 4 is developed vertically and horizontally into systematic device modeling.

The government equation and the coupling condition equation of the mechanistic model of FIG. 4 are as follows.

$$\left.\begin{array}{l} \begin{bmatrix} 0 \\ v_d \end{bmatrix} = \begin{bmatrix} -\dfrac{W_m}{g} & -C & 1 & -W_m \sin(\theta) \\ 0 & -1 & 0 & 0 \end{bmatrix} \begin{bmatrix} x'_m \\ x_m \\ f_d \\ 1 \end{bmatrix} \\ v_{i_-} = v_d \\ C = C_v \end{array}\right\} \quad (11)$$

The mechanistic model of FIG. 4 can be expressed by the following mathematical model.

$$\left.\begin{aligned}
v_{i\_} &= x_m + \int_0^{t_{smp}} x'_m \, dt \\
v_{i\_} &= v_{iv} = v_{iT} \\
f_v &= \frac{1}{2}\rho C_d A v_{iv}^2 \\
F_T &= \mu_m W_m \cos(\theta) S_{WT} \\
C_T &= (f_v + F_T)\frac{1}{|V_{i\_}|}
\end{aligned}\right\} \quad (12)$$

In eq. (12), the first line denotes an estimated velocity $v_i$; the second line a coupling condition equation for distributing the entered estimated velocity $v_i$ to the subordinate mechanistic model; the third line an equation for reproducing a force $f_v$ of a running wind resistance; the fourth line a dynamic frictional force $F_T$ of a tire; and the fifth line an equivalent non-linear loss characteristic $C_T$. With respect to variables of eq. (12), $v_I$ denotes an observation quantity of a velocity $V_d$; $S_{WT}$ a condition decision of the upper side of eq. (6); $v_{iv}$ a velocity entered to a mechanistic model of a running wind resistance developed on a subordinate basis; and $V_{iT}$ a velocity entered to a mechanistic model of a tire frictional resistance developed on a subordinate basis.

As shown in FIG. 4, the mechanistic model can be unified to a single mechanistic model, including the structural non-linearity including a switch element. This shows that as far as the non-linearity of the same function is concerned, it is regarded as one system, and it is possible to systematize the system through a vertical development in its entirety.

Hereinafter, there will be described embodiments of the present invention.

According to the embodiments of the present invention, described hereinafter, each of the embodiments comprises a computer and a program for causing the computer to operate as a non-linear characteristic reproducing apparatus according to one embodiment of the present invention. First, the computer will be explained, and then the function of the non-linear characteristic reproducing apparatus according to one embodiment of the present invention, which is implemented by the computer, will be explained.

Figure 5:
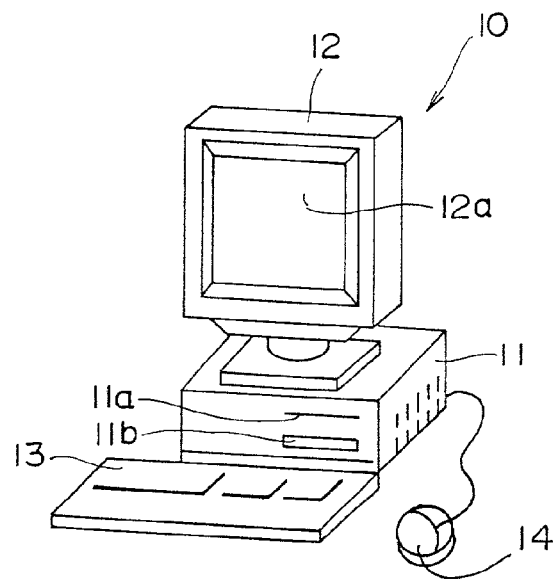
FIG. 5 is a perspective view of a computer in which a non-linear characteristic reproducing apparatus according to one embodiment of the present invention is implemented.

FIG. 5 is a perspective view of a computer in which a non-linear characteristic reproducing apparatus according to one embodiment of the present invention is implemented.

A computer 10 comprises: a main frame 11 incorporating thereinto a CPU, a main memory, a hard disk, a communication board, etc.; a display unit 12 for displaying images and a character string on a display screen 12a in accordance with the main frame 11; a key board 13 for inputting a user's instruction to the computer 10; and a mouse 14 for designating an optional position on the display screen 12a to enter an instruction according to an icon or the like displayed on the position at the time of the designation.

The main frame 11 of the computer 10 is provided with an FD loading slot 11a and a CDROM loading slot 11b for loading a floppy disk and a CDROM (not illustrated in FIG. 5, see FIG. 6), respectively. Inside the main frame 11, there is incorporated a floppy disk drive and a CDROM drive for driving and accessing the floppy disk and the CDROM loaded through the FD loading slot 11a and a CDROM loading slot 11b, respectively.

Here, the CDROM loaded onto the computer 10 stores the non-linear characteristic reproducing program referred to the present invention. The CDROM is loaded into the main frame 11 through the CDROM loading slot 11b so that the non-linear characteristic reproducing program stored in the CDROM is installed into a hard disk of the computer 10 by the CDROM drive. When the non-linear characteristic reproducing program installed into the hard disk of the computer 10 is started, the computer 10 operates as one embodiment of the non-linear characteristic reproducing apparatus according to the present invention.

Therefore, the CDROM storing the non-linear characteristic reproducing program corresponds to one embodiment of the non-linear characteristic reproducing program storage medium according to the present invention.

The non-linear characteristic reproducing program stored in the CDROM is installed into a hard disk of the computer 10 in the manner as mentioned above. In this case, the hard disk, into which the non-linear characteristic reproducing program is installed, also corresponds to one embodiment of the non-linear characteristic reproducing program storage medium according to the present invention.

Further, in the event that the non-linear characteristic reproducing program is down loaded onto a floppy disk and the like, the floppy disk and the like, which store the non-linear characteristic reproducing program down loaded, also correspond to one embodiment of the non-linear characteristic reproducing program storage medium according to the present invention.

Figure 6:
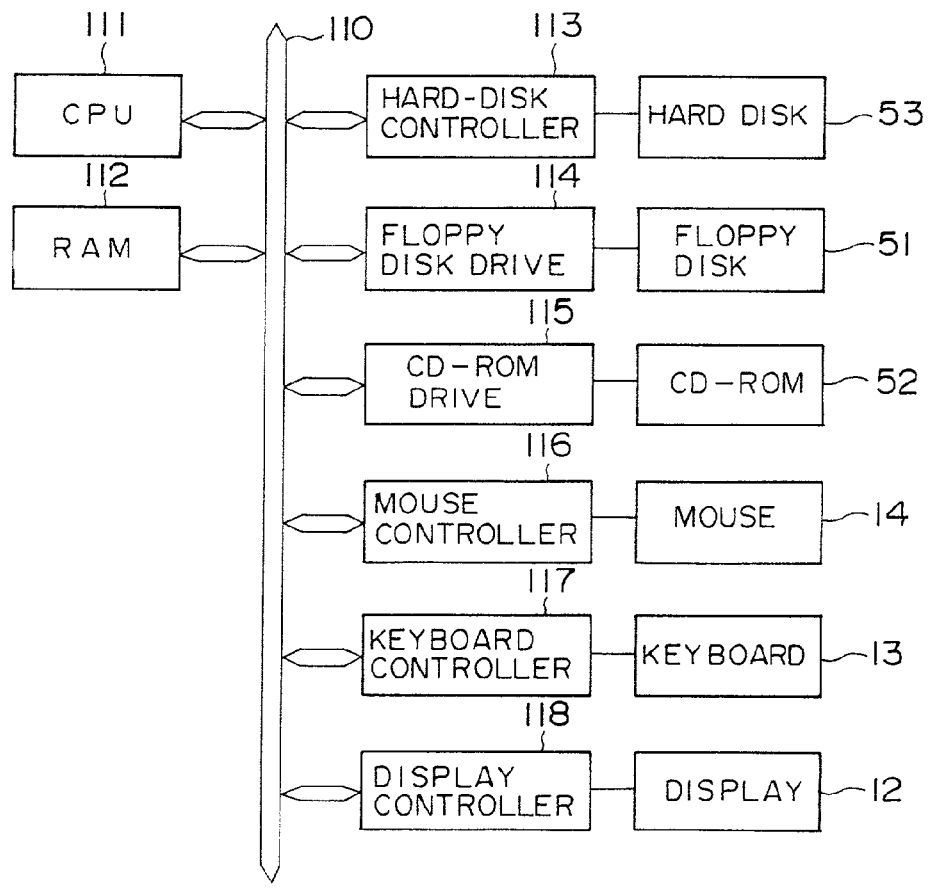
FIG. 6 is a schematic diagram showing a hardware structure of the computer shown in FIG. 5.

FIG. 6 is a schematic diagram showing a hardware structure of the computer shown in FIG. 5.

Here, the computer comprises a central processing unit (CPU) 111, a RAM 112, a hard-disk controller 113, a floppy disk drive 114, a CDROM drive 115, a mouse controller 116, a keyboard controller 117 and a display controller 118. They are mutually connected via a bus 110.

The floppy disk drive 114 and the CDROM drive 115, onto which the floppy disk 51 and the CDROM 520 are loaded, respectively, as mentioned above referring to FIG. 5, access the floppy disk 51 and the CDROM 52, respectively.

Here, there are further shown a hard disk 53 to be accessed by the hard-disk controller 113, a mouse 14 to be controlled by the mouse controller 116, a keyboard 13 to be controlled by the keyboard controller 117, and a display unit 12 to be controlled by the display controller 118.

Each of FIGS. 7 to 11 is a typical illustration showing a structure of a non-linear characteristic reproducing program stored in a storage medium.

In FIGS. 7 to 11, storage media 200, 300, 400, 500 and 600, are representative of the above-mentioned CDROM, hard disk, floppy disk and the like.

Figure 7:
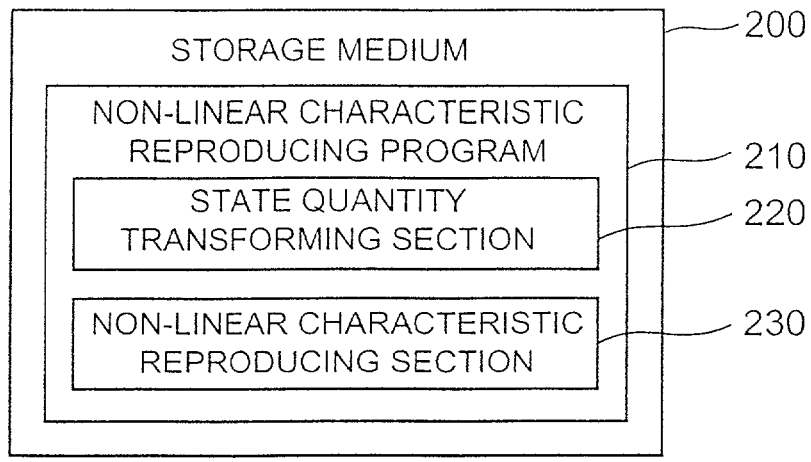
FIG. 7 is a typical illustration showing a structure of a non-linear characteristic reproducing program stored in a storage medium.

FIG. 7 shows an embodiment of a first non-linear characteristic reproducing program storage medium. The storage medium 200 stores a non-linear characteristic reproducing program 210 having a state quantity transforming section 220 and a non-linear characteristic reproducing section 230. The non-linear characteristic reproducing program 210 causes the computer to serve as a non-linear characteristic reproducing apparatus which receives a predetermined first state quantity and outputs a second state quantity by applying the non-linear characteristic reproducing process to the first state quantity.

Here, the a state quantity transforming section 220 performs a linear formation from the first state quantity to the second state quantity for each sampling time in accordance with a transformation parameter set up. The non-linear characteristic reproducing section 230 determines a transformation parameter for transformation of at least one of the first state quantity and the second state quantity, or a state quantity derived from at least one of the first state quantity and the second state quantity at the subsequent sampling time in accordance with the estimated observation quantity at the subsequent sampling time, and sets the transformation parameter thus determined to the state quantity transforming section 220. In some case, the non-linear characteristic reproducing section 230 may receive the estimated observation quantity and one or more variables as well and determine a transformation parameter in accordance with the entered estimated observation quantity and one or more variables.

Specifically, in the non-linear characteristic reproducing section 230, a standardized estimation value, in which an estimation value of the second state quantity at the subsequent sampling time is standardized with the above-mentioned estimated observation quantity, is determined in form of the transformation parameter. More specifically, in the non-linear characteristic reproducing section 230, an estimation value of the second state quantity at the subsequent sampling time is subjected to a division or a differential with the absolute value of the above-mentioned estimated observation quantity, so that the estimated observation quantity can be determined in form of the transformation parameter.

This non-linear characteristic reproducing section 230 is, as will be described later, preferably applied to reproductions of, for example, a characteristic of a non-linear spring, a characteristic of an air spring, a characteristic of a link mechanism, a characteristic of an object which moves involving friction, and a characteristic of a mechanism for variable moment of inertia in which moment of inertia is varied in an angular velocity.

FIG. 8 shows an embodiment of a second non-linear characteristic reproducing program storage medium. A storage medium 300 stores therein a non-linear characteristic reproducing program 310 having a linear model section 320 and a non-linear model section 330. The non-linear model section 330 constituting the non-linear characteristic reproducing program 310 has non-linear transforming sections 331a, 331b . . . 331n. The number of non-linear transforming sections is according to the way. In some case, it happens that the non-linear characteristic reproducing program has only one non-linear transforming section. FIG. 8 shows a general case of the use of a plurality of non-linear transforming sections.

The non-linear characteristic reproducing program 310 causes the computer to serve as a non-linear characteristic reproducing apparatus for reproducing characteristics of systems including a non-linear system. The linear model section 320 reproduces characteristics of a linear system. The non-linear model section 330 obtains from the linear model section 320 an estimated observation quantity at the subsequent sampling time with respect to at least one of a first state quantity and a second state quantity, which are mutually in a relation of a non-linear transformation, or a state quantity derived from said at least one of the first state quantity and the second state quantity, and determines a transformation parameter used in a linear transformation at the subsequent sampling time between the first state quantity and the second state quantity. An operation for determining the transformation parameter at the subsequent sampling time by the non-linear model section 330, and a linear operation including a linear transformation between the first state quantity and the second state quantity using the transformation parameter at the subsequent sampling time obtained by the non-linear model section 330 are alternately repeated.

The non-linear transforming sections 331a, 331b . . . 331n, which constitute the non-linear model section 330, are portions dealing with a first state quantity and a second state quantity which are mutually in a relation of a non-linear transformation and are different in sort of a state quantity of at least one of the first state quantity and the second state quantity. Each of the non-linear transforming sections 331a, 331b . . . 331n obtains an estimated observation quantity at the subsequent sampling time with respect to at least one of the first state quantity and the second state quantity, which are dealt with by the associated non-linear transforming section, or a state quantity derived from said at least one of the first state quantity and the second state quantity, and determines a transformation parameter used in a linear transformation at the subsequent sampling time between the first state quantity and the second state quantity.

The non-linear characteristic reproducing program 310 is, as will be described later, preferably used in, for example, reproducing of characteristics of Geneva mechanism and reproducing of characteristics of a liquid residue warning lamp wherein a lamp is connected in series with a thermistor.

Figure 9:
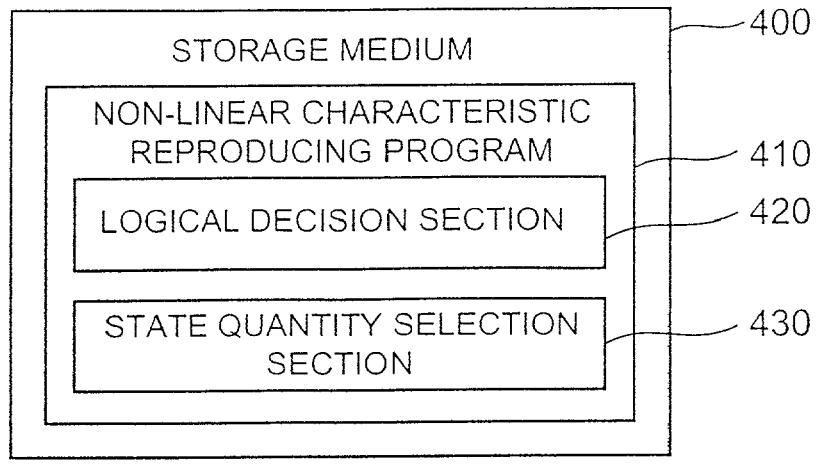
FIG. 9 is a typical illustration showing a structure of a non-linear characteristic reproducing program stored in a storage medium.

FIG. 9 shows one embodiment of a third non-linear characteristic reproducing program storage medium. A storage medium 400 stores therein a non-linear characteristic reproducing program 410 having a logical decision section 420 and a state quantity selection section 430. The non-linear characteristic reproducing program causes the computer to serve as a non-linear characteristic reproducing apparatus for reproducing characteristics of systems including a non-linear system.

The logical decision section 420 receives one or more variables and determines a logical value at the subsequent sampling time, which is selected from among a plurality of discrete values, in accordance with the one or more variables entered.

The state quantity selection section 430 receives a predetermined input state quantity and outputs an output state quantity in which at the subsequent sampling time, a relation between the input state quantity and the output state quantity is switched into a relation according to the logical value at the subsequent sampling time which is determined by the logical decision section 420.

In some case, the state quantity selection section 430 outputs at the subsequent sampling time an output state quantity in which a connection relation between the input state quantity and the output state quantity is switched into a connection relation according to the logical value at the subsequent sampling time which is determined by the logical decision section 420. Or alternatively, in some case, the state quantity selection section 430 outputs an integrated input state quantity in form of an output state quantity. In this case, in the event that the logical value at the subsequent sampling time, which is determined by the logical decision section 420, is a predetermined logical value, the state quantity selection section 430 outputs at the subsequent sampling time an output state quantity which is changed over to the initial value.

Further, in some case, the logical decision section 420 determines a logical value at the subsequent sampling time selected among from a plurality of discrete values in accordance with an estimated observation quantity at the subsequent sampling time for a plurality of input state quantities. And the state quantity selection section 430 receives the plurality of input state quantities and outputs at the subsequent sampling time as an output state quantity an input state quantity selected according to the logical value at the subsequent sampling time determined by the logical decision section 420.

This non-linear characteristic reproducing program 410 is, as will be described later, preferably applied to reproductions of, for example, a characteristic of a mechanism including two members having a relative movement possible state and a relative movement impossible state, a characteristic of a clutch mechanism including two members having a slipping state of relatively slipping and a connecting state of mutually connecting, a characteristic of a brake mechanism for applying a braking energy to a drive shaft, and a characteristic of an automatic-reset mechanism in which when a spring is effected on a movable member so that an application of the external force to the movable member is released, the movable member is automatically reset to the initial state by the effect of the spring, said automatic-reset mechanism being provided with a stopper for restricting a movable range of the movable member.

FIG. 10 shows one embodiment of a fourth non-linear characteristic reproducing program storage medium. A storage medium 500 stores therein a non-linear characteristic reproducing program 510 having a state variation estimation section 520, a state deviation detection section 530, a stable state decision section 540 and a state quantity selection section 550.

The non-linear characteristic reproducing program causes the computer to serve as a non-linear characteristic reproducing apparatus for receiving a predetermined first state quantity and outputting a second state quantity in which the second state quantity is changed over to a non-linearity of one according as the first state quantity is in a predetermined state.

The state variation estimation section 520 performs a prediction of a state quantity variation width of the first state quantity during a period from the present sampling time to the subsequent sampling time.

The state deviation detection section 530 determines a deviation between a value of the first state quantity at the present sampling time and a decision value for determining whether the first state quantity is in a predetermined state.

The stable state decision section 540 determines a logical value, which is selected among from a plurality of discrete values, predicting a variation of the non-linearity at the subsequent sampling time in accordance with size between the state quantity variation width predicted by the variation estimation section 520 and the deviation determined by the state deviation detection section 530.

The state quantity selection section 550 outputs the second state quantity changed over in accordance with the logical value determined by the stable state decision section 540.

Here, in some case, the state deviation detection section 530 determines a deviation between a value of the first state quantity at the present sampling time and a decision value for determining whether the first state quantity is in a predetermined state, the decision value being varied in accordance with positive and negative of the state quantity variation width predicted by the variation estimation section 520.

Figure 11:
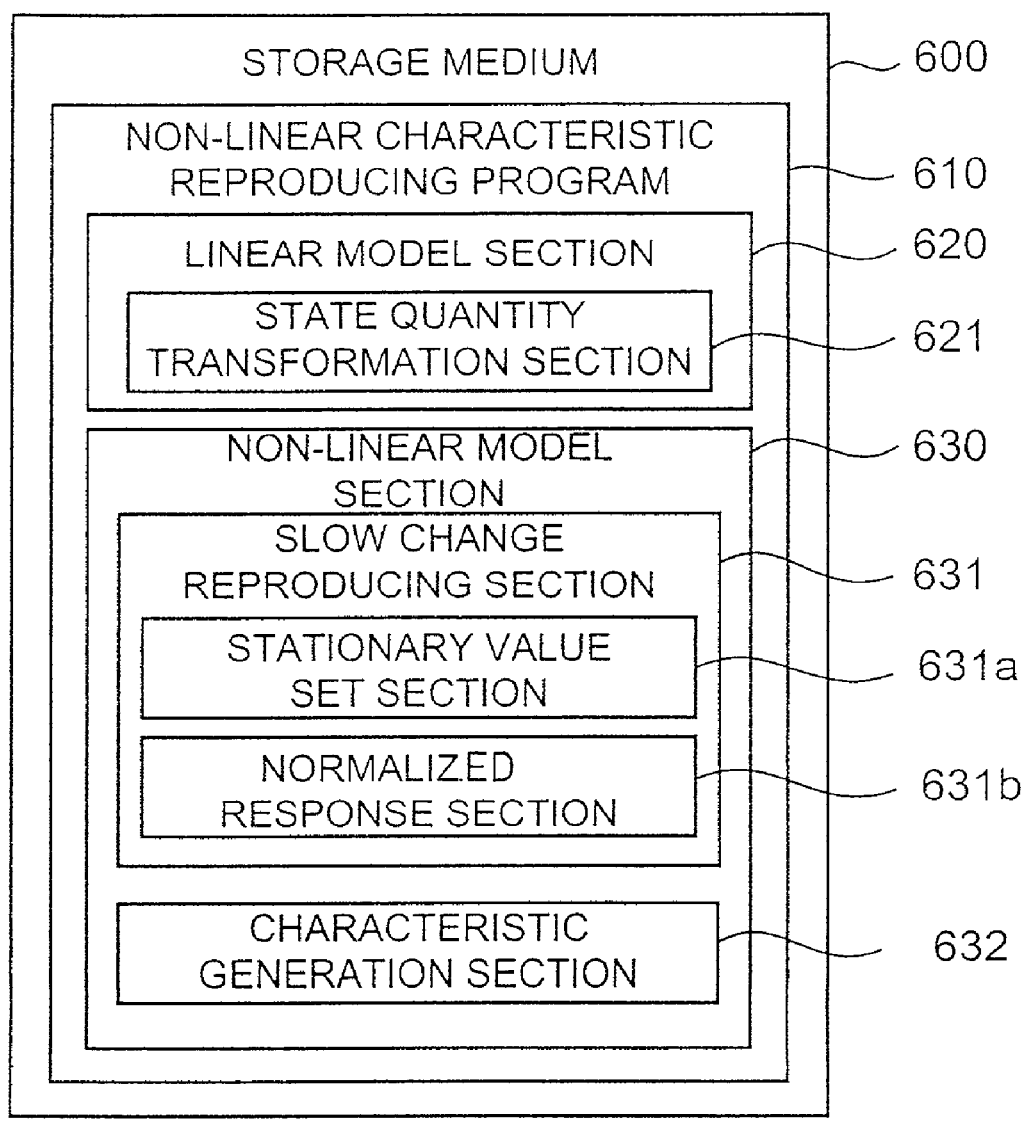
FIG. 11 is a typical illustration showing a structure of a non-linear characteristic reproducing program stored in a storage medium.

FIG. 11 shows one embodiment of a fifth non-linear characteristic reproducing program storage medium. A storage medium 600 stores therein a non-linear characteristic reproducing program 610 having a linear mode section 620 and a non-linear model section 630. The non-linear characteristic reproducing program 610 causes the computer to serve as a non-linear characteristic reproducing apparatus for reproducing characteristics of systems including a non-linear system.

The linear mode section 620 reproduces characteristics of a linear system, and includes a state quantity transformation section 621 for linear-transforming a first state quantity to a second state quantity in accordance with the transformation parameter set up.

The non-linear model section 630 obtains from the linear mode section 620 an estimated observation quantity at the subsequent sampling time of a predetermined observation state quantity to generate a transformation parameter in accordance with the estimated observation quantity, and sets the transformation parameter thus generated to the state quantity transformation section 621. The non-linear model section 630 comprises a slow change reproducing section 631 and a characteristic generation section 632. According to the present embodiment, the slow change reproducing section 631 comprises a stationary value set section 631a and a normalization response section 631b.

The slow change reproducing section 631 obtains from the linear mode section 620 observation quantity or estimated observation quantity of a predetermined second observation state quantity, which is the same as the first observation state quantity or different from the first observation state quantity, and generates a slow change state quantity reflecting characteristics of a first non-linear system representative of a relatively slow behavior change in accordance with the observation quantity or estimated observation quantity of the second observation state quantity.

Of the slow change reproducing section 631, the stationary value set section 631a determines a stationary value of the slow change state quantity after infinite time elapsed in the event that the state of the linear mode section 620 is continued, in accordance with the observation quantity or estimated observation quantity of the second observation state quantity. And the normalization response section 631b generates the slow change state quantity reflecting characteristics of a-first non-linear system, which is to be transferred to the characteristic generation section 632, in accordance with the stationary value of the slow change state quantity determined by the stationary value set section 631a, and the known normalized time variation characteristic of the slow change state quantity in the first non-linear system.

The characteristic generation section 632 generates a transformation parameter reflecting characteristics of a second non-linear system representative of relatively rapid behavior change in accordance with the estimated observation quantity of the first observation state quantity at the subsequent sampling time, which is obtained from the linear mode section 620, and the slow change state quantity generated by the slow change reproducing section 631, and then sets the generated transformation parameter to the state quantity transformation section 621.

The non-linear characteristic reproducing program 610 is preferably used, for example, in reproductions of characteristics of a system having a device which varies in resistance value in accordance with temperature variation.

Next, there will be explained various functions as a non-linear characteristic reproducing apparatus of the present invention, which is implemented in the computer shown in FIG. 5, when the non-linear characteristic reproducing programs shown in FIGS. 7–11 are installed in the computer.

For functional blocks, which will be explained hereinafter, the same names as functional blocks (software components) on a software shown in FIGS. 7–11 are used. It is noted, however, that each of the functional blocks as the non-linear characteristic reproducing apparatus, which will be explained hereinafter, denotes a complex of a functional block on a software for implementing the associated function and a structural element on a hardware. On the other hand, each of the functional blocks on a software shown in FIGS. 7–11 denotes a software (an application software), excepting a hardware, an operation system, etc., of elements for implementing the associated function.

Figure 12:
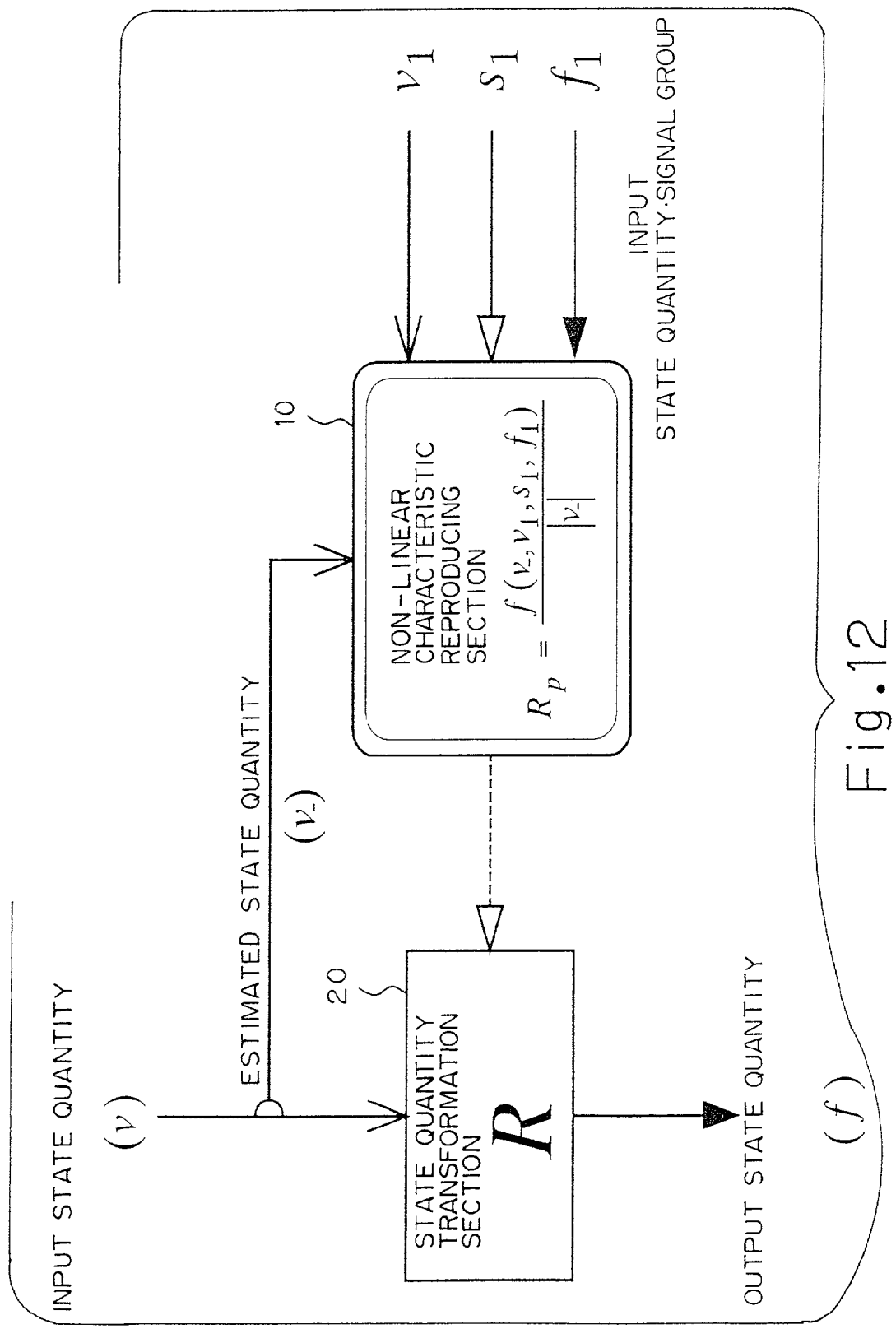
FIG. 12 is a principle explanatory view of a first non-linear characteristic reproducing apparatus according to an embodiment of the present invention.

FIG. 12 is a principle explanatory view of a first non-linear characteristic reproducing apparatus according to an embodiment of the present invention. Incidentally, FIG. 12 is a view useful for understanding the principle of the first non-linear characteristic reproducing apparatus of the present invention, and the first non-linear characteristic reproducing apparatus of the present invention is not restricted to FIG. 12 and the associated description.

In the right side of FIG. 12, a state quantity transformation section R denotes characteristic values such as a coefficient of resistance, an electric capacity, mass, a coefficient of link-transfer, and input and output state quantities v and f denote state quantities such as voltage, velocity, force and current. The state quantity transformation section R transfers the input state quantity v to the output state quantity f. The non-linear characteristic reproducing section appearing at the right side of FIG. 12 receives an estimated observation quantity v_ (an outline half-circle symbol on a colored background) at the subsequent sampling time of the input state quantity v applied to the state quantity transformation section, and in addition external state quantities $V_1$ and $f_1$ and an external signal $S_1$. These input state quantities cause the non-linear characteristic reproducing section to generate an estimated value $f\_ = (v\_, v_1, S_1, f_1)$ of the output state quantity at the subsequent sampling time. The output state quantity is divided or differentiated with the estimated observation quantity v_to generate a prediction value of characteristic $R_p$ of the state quantity transformation section at the sampling time. The characteristic $R_p$ is substituted for the state quantity transformation section R (an arrow of the dot line), and then a calculation for the whole system model into which the state quantity transformation section is incorporated is carried out. Repeatedly executing this operation for each sampling time makes it possible to reproduce non-linear physical phenomena and behavior of products and components in form of time recording data.

(Explanation of Examples)

1. Flow Storage Element (Conical Spring)

(1) Functional Model

Figure 13:
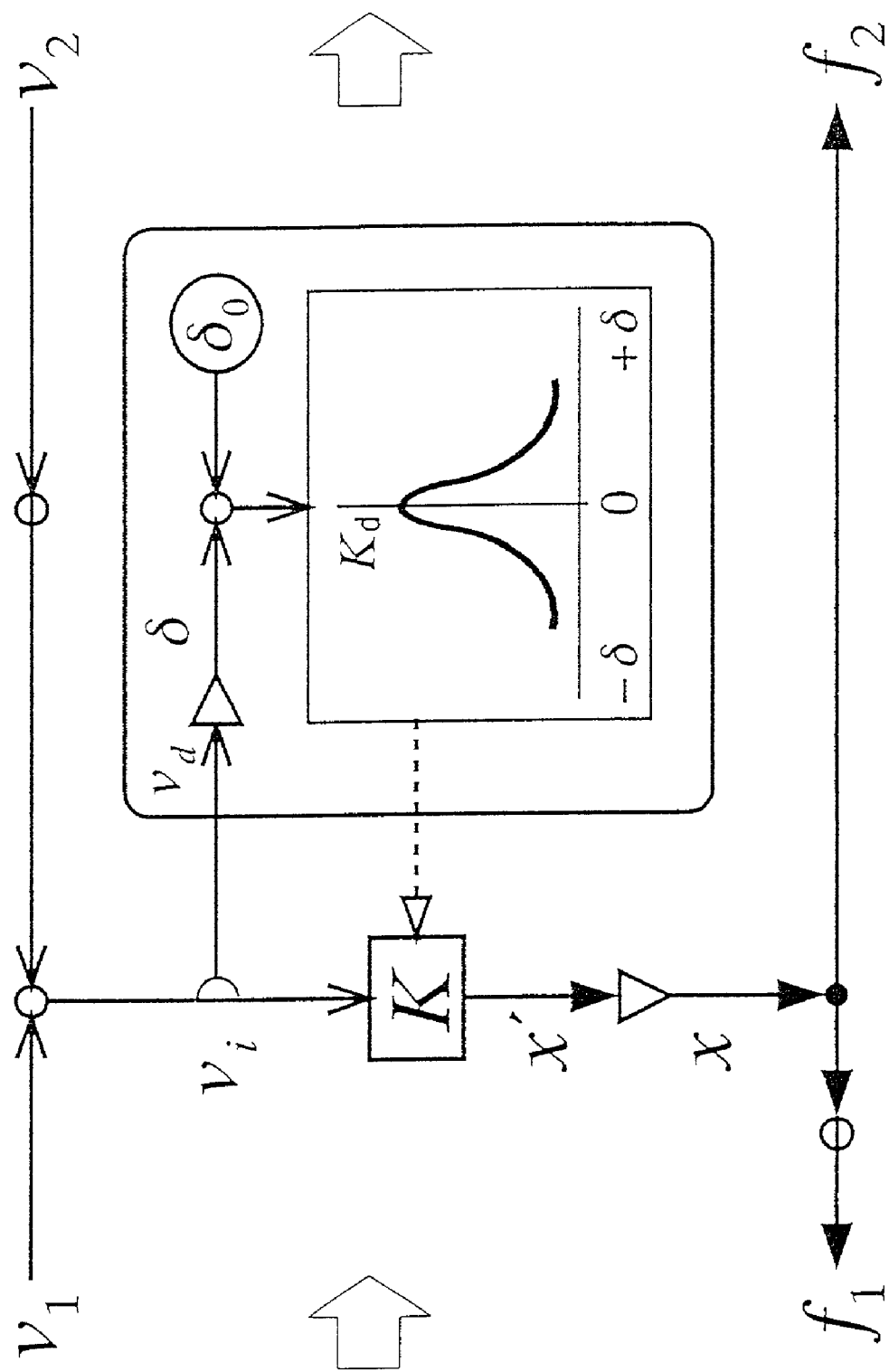
FIG. 13 is a view showing a non-linear parameter of a flow storage element.

FIG. 13 shows an example of a mechanistic model in which with respect to a linear flow storage element (fundamental functional element), stiffness of a spring varying according to quantity of deformation is given with a graphical representation. FIG. 13 shows the linear mechanistic model where $v_1$ and $v_2$ denote velocity, $f_1$ and $f_2$ denote an external force, and x denotes an internal state quantity. $v_i$ denotes a deformation velocity differential of the spring. The mechanistic model incorporated into FIG. 13 is a graph showing that stiffness $K_d$ of the spring is a function of a quantity of deformation δ. This graph can represent a linear spring to a non-linear spring. $δ_0$ in FIG. 13 denotes a quantity of deformation generating an offset load.

A flow storage element characteristic can be expressed by the following government equation and coupling condition equation.

$$\begin{bmatrix} 0 \\ f_1 \\ f_2 \end{bmatrix} = \begin{bmatrix} -K & 0 & 1 & -1 \\ 0 & -1 & 0 & 0 \\ 0 & 1 & 0 & 0 \end{bmatrix} \begin{bmatrix} x' \\ x \\ v_1 \\ v_2 \end{bmatrix} \Bigg\} \quad (13)$$

$$\left. \begin{aligned} v_d &= V_i \\ K &= K_d \end{aligned} \right\}$$

The mechanistic model of stiffness of the spring shown in FIG. 13 can be expressed by the following mathematical model.

$$\left. \begin{aligned} δ &= \int v_d dt \\ K_d &= fnc(δ + δ_0) \end{aligned} \right\} \quad (14)$$

In FIG. (14), the first line denotes a deformation δ, and fnc (a) on the second line denotes a function determining stiffness $K_d$ of a non-linear spring.

(2) Mechanistic Model (Non-Linear Spring Model)

Figure 14:
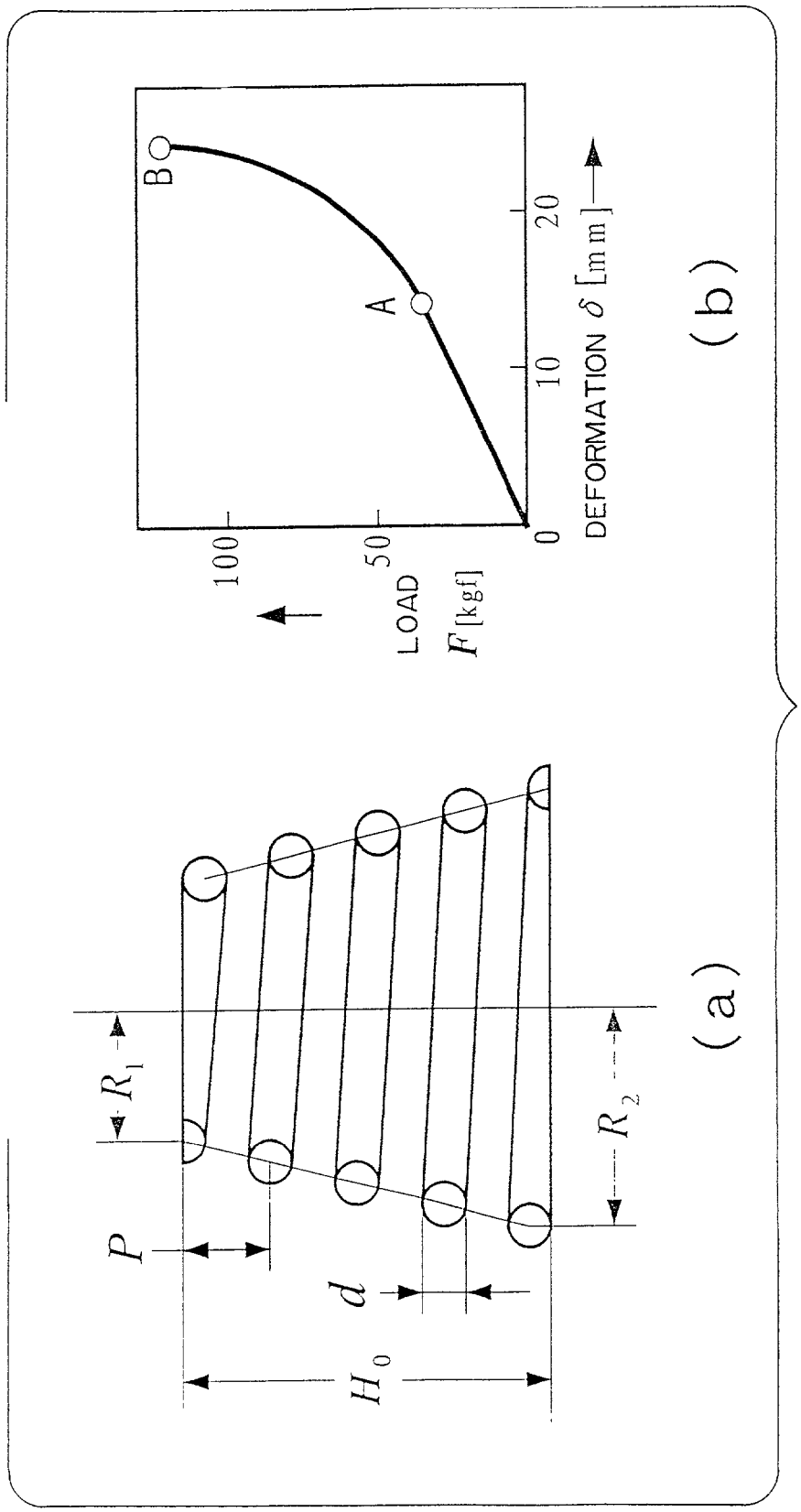
FIG. 14 is a view showing a structure of a conical spring and a load characteristic.

As a typical example of a non-linear spring, there is a conical spring. Part (a) of FIG. 14 shows a structure of a conical spring wound at constant pitch. Part (b) of FIG. 14 shows a graph representative of a relation between deformation δ and load F. Regarding symbols in the figure, $H_0$ denotes a free length; $R_1$ an effective radius on a small side; $R_2$ an effective radius on a large side; d a diameter of a coil; and P a pitch of the coil. The spring is defined with winding number n of a free length and modulus G of transverse elasticity.

According to the conical spring shown in the part (a) of FIG. 14, a torsion moment on the side associated with a larger diameter is large and it is more easily deformed, and thus a contact of the coils is sequentially initiated from the end larger in diameter. In the part (b) of FIG. 14, regarding the spring characteristic, a relation between deformation δ and load F offers proportion during a range 0 to A before the contact of the coils, and the effective winding number is reduced during a range A to B after the contact of the coils, so that the load F to the deformation δ is increased. And finally, on the point B the smaller diameter end contacts to offer a bottom-projection so as to form rigid body.

With respect to this conical spring, a relational expression is referred from the well known reference. Between the load F and the deformation δ, the following relation is applied.

<Spring Load and Deformation Before Contact (Linear Area)>

$$δ = \frac{16n}{Gd^2}(R_2^2 + R_1^2)(R_2 + R_1)F \quad (15)$$

<Spring Load and Deformation after Contact (Non-Linear Area)>

$$\left.\begin{aligned} R &= R_2 - (R_2 - R_1)\frac{n'}{n} \\ d' &= d\sqrt{1 - \left(\frac{R_2 - R_1}{nd}\right)^2} \\ F &= \frac{Gd^4}{64R^3}(p - d') \\ \delta &= \frac{n}{R_2 - R_1}\left\{\frac{16(R^4 - R_1^4)}{Gd^4}F + (p - d')(R_2 - R)\right\} \end{aligned}\right\} \quad (16)$$

Equation(16) represents a non-linear area after contact. In eq. (16), the first line denotes an approximate expression of an average radius R when the n'-th coil from $R_2$ side contacts, the second line denotes a central distance d' in the vertical direction between the contacted coils, and the third and fourth lines denotes a relation between the load F and the deformation δ. From equations of the conical spring of eqs.(15) and (16), a device modeling is performed on the mechanistic model to be incorporated into FIG. 13.

The respective expressions of eq. (16) are rearranged and the linear expression of eq. (15) is given in form of a non-linear expression with a load ratio Φ. In this case, the following equations are provided.

$$F = K\frac{1}{\Phi}\delta \quad (17)$$

$$K = \frac{Gd^2}{16n(R^2 + R_1^2)(R_2 + R_1)} \quad (18)$$

$$\Phi = \left\{1 - \frac{4}{(R_2 - R_1)}\frac{R^3(R_2 - R)}{(R^2 + R_1^2)(R + R_1)}\right\}\frac{1}{d^2} \quad (19)$$

Equation (17) represents load-deformation characteristics of the conical spring. With respect to stiffness K of the spring in the linear area, R of eq. (18) is $R_2$, and the load ratio of eq. (18) is given by Φ=1. In the non-linear area, effective radiuses R are sequentially determined for each contacted coil from the first line of eq. (16), and the effective radiuses R thus determined is substituted for R of eqs.(18) and (19). A relation between the load F to the deformation δ, which is determined in accordance with the above-mentioned method, is previously computed, and stiffness $K_d$ of the spring, which is determined through deformation δ retrieval by integration of estimated velocity $V_{d\_}$, is substituted for K of the functional model. The functional and mechanistic models representative of this relation is shown in FIG. 15.

Figure 15:
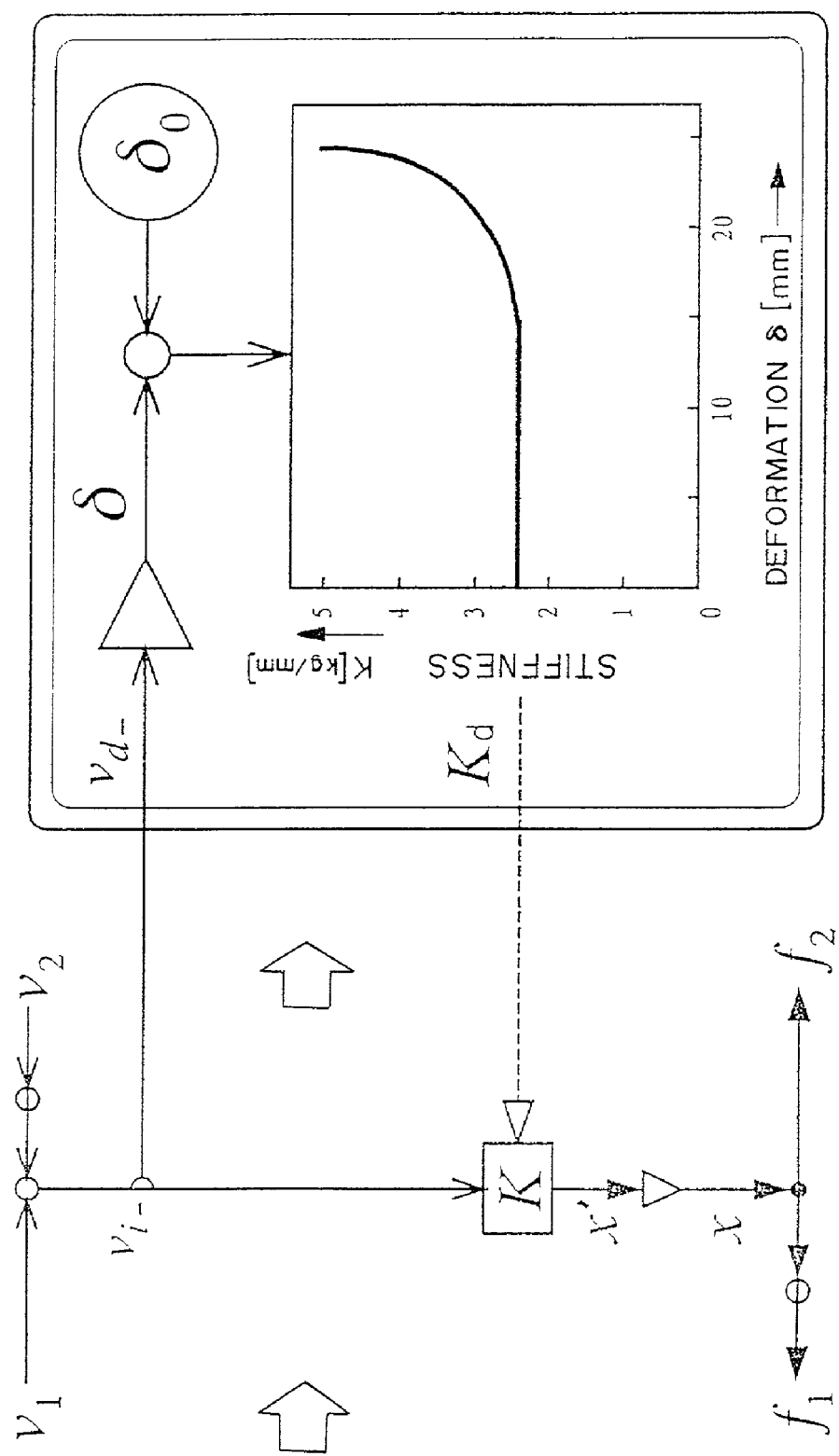
FIG. 15 is a view showing a functional model of a conical spring.

FIG. 15 shows one in which the mechanistic model of the conical spring is substituted for the functional model of FIG. 13. The functional on the second line of eq. (14) is replaced by a function to stiffness K of the spring from the deformation δ.

2. Example of Device Modeling of an Air Spring

By way of example of a fluid system, there is performed a device modeling of a pneumatic cylinder simulating a compression and expansion process of a car engine. Incidentally, modeling of the internal energy (temperature energy) caused by compression and expansion is omitted.

Figure 16:
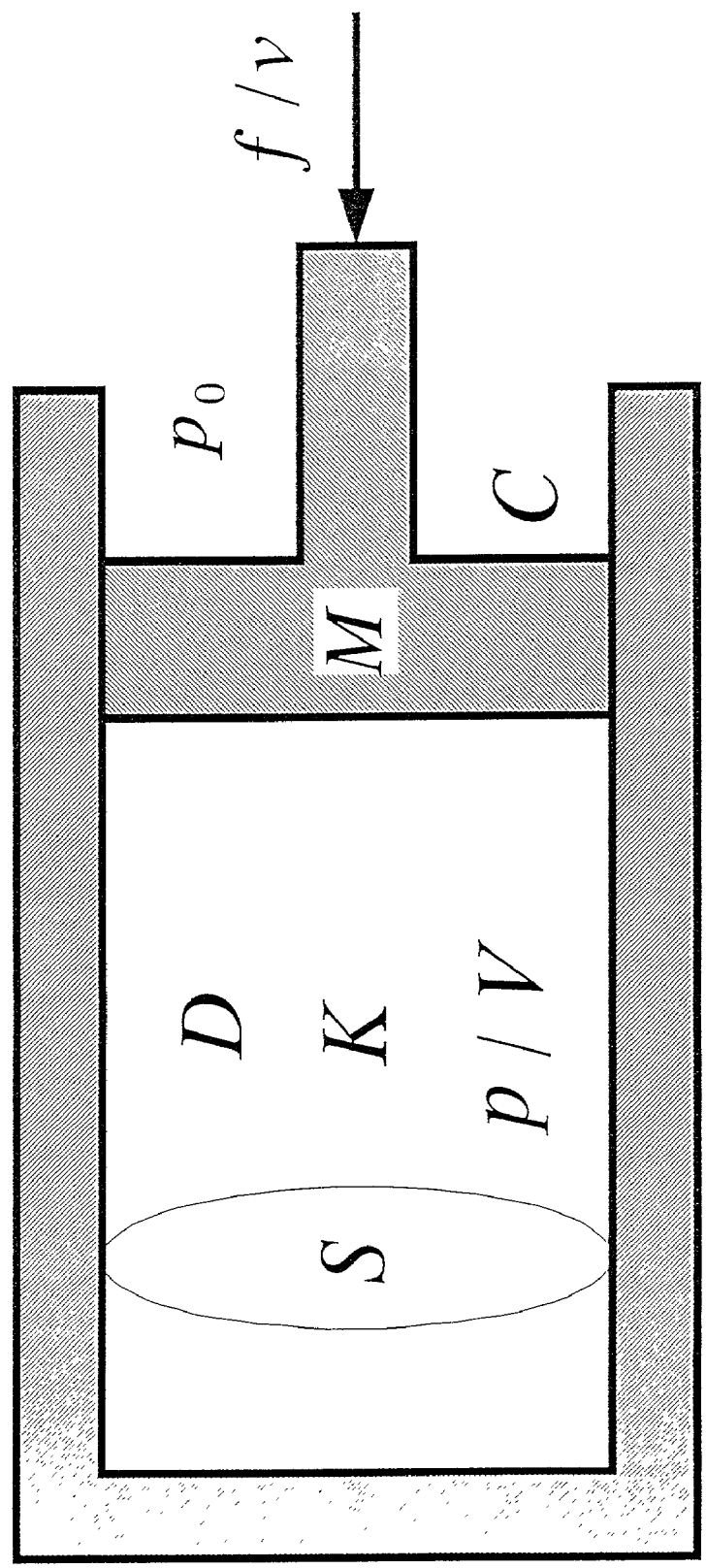
FIG. 16 is a view showing a structural model of a pneumatic cylinder.

In FIG. 16, $p_0$ denotes an atmospheric pressure; S a cross-sectional area of a cylinder; M mass of a piston; C a coefficient of viscosity resistance; K stiffness of an air spring; D a coefficient of internal damping; f a piston external force; v a piston velocity; P a cylinder internal pressure; and V a cylinder volume. In FIG. 16, the external force f is effected on a piston, so that the piston velocity v and the associated cylinder volume change $\Delta V_p$ occur whereby the cylinder internal pressure p generates. The cylinder internal pressure p effects as the reaction force in form of stiffness K of an air spring. The rise of the internal pressure involves the temperature rise inside the cylinder, so that the thermally expanded volume increase component becomes a part of the internal pressure rise component. The raised temperature is radiated in accordance with the coefficient of internal damping D so that the thermally expanded volume increase component is decreased. Heat insulation and heat radiation of the cylinder is effected in accordance with the coefficient of internal damping D. Incidentally, the initial state of the cylinder volume is set to a cylinder volume $V_0$ in which the internal pressure p is equal to the atmospheric pressure $p_0$.

(1) Functional Model

Figure 17:
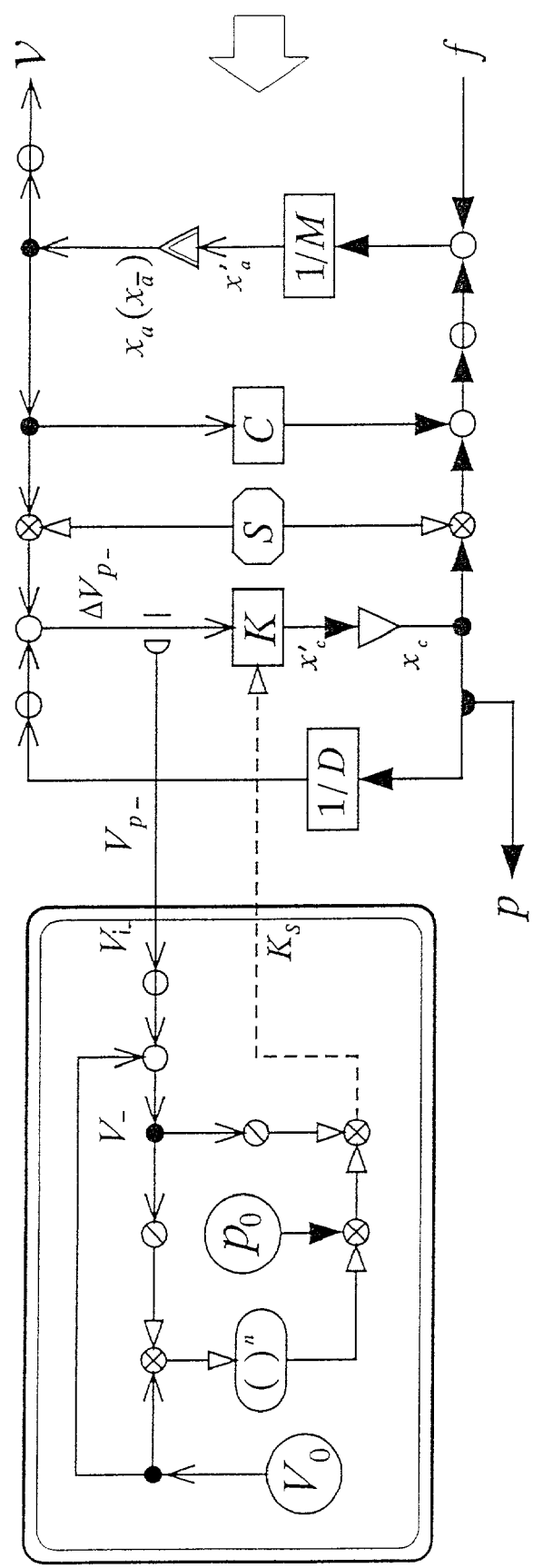
FIG. 17 is a view showing a functional model of a pneumatic cylinder.

Compression and expansion process of the piston, which summarizes this relation, is represented by a functional model shown in FIG. 17. Heat insulation and heat radiation of the cylinder is effected in accordance with the coefficient of internal damping D. According to the functional model shown in FIG. 17, a mechanistic model of an air spring is incorporated into a flow storage element (fundamental functional element). A mechanistic model of temperature rise will be omitted.

FIG. 17 is one for determining a cylinder volume (an estimated accumulation observation quantity) where P denotes an observation quantity of an internal pressure of a cylinder; $V_{P\_}$ a double integration mark; and $x_{aa}$ a movement distance of a piston.

In FIG. 17, the government equation, the coupling condition and the estimated observation quantity are given by the following equation in order.

$$\left.\begin{aligned} \begin{bmatrix} 0 \\ 0 \\ 0 \\ v \\ p \end{bmatrix} &= \begin{bmatrix} -M & 0 & -C & -S & 1 & 0 \\ 0 & -\frac{1}{K} & S & -\frac{1}{D} & 0 & 0 \\ 0 & 0 & -1 & 0 & 0 & 0 \\ 0 & 0 & 0 & 1 & 0 & 0 \\ 0 & 0 & S & 0 & 0 & 0 \end{bmatrix} \begin{bmatrix} x'_a \\ x'_c \\ x_{aa} \\ x_a \\ x_c \\ f \\ 1 \end{bmatrix} \\ \Delta V_{i\_} &= \Delta V_{P\_} \\ K &= K_S \end{aligned}\right\} \quad (20)$$

In eq. (20), on the upper side, first and second lines denote a state equation; the third line a state equation of a storage observation quantity where $x_{aa}$ denotes a movement distance (a storage potential quantity) of a piston; the fourth line an input and output equation; and the fifth line an equation of an observation quantity of pressure in a cylinder. The lower side denotes a coupling condition equation to be connected with a mechanistic model where $K_s$ denotes stiffness of an air spring in the mechanistic model, and $V_{i\_}$ denotes volume of a movement distance of a piston.

(2) Mechanistic Model (Air Spring Model)

Modeling of the mechanistic model shown in FIG. 17 is as follows.

First, the cylinder volume V determined by a movement quantity of the piston shown in FIG. 17 is expressed by the following equation.

$$V_{p\_} = \left(Sx_{aa} - \frac{1}{D}x_c\right)t_{smp} \quad (21)$$
$$V = V_U - (Sx_{aa} + \Delta V_{p\_})$$

In eq. (21), the upper side denotes an estimated storage observation quantity of a volume change, and the lower side denotes an estimated observation quantity of volume of the cylinder. Incidentally, $t_{smp}$ denotes a sampling period.

Next, a relation between the pressure p in a state of compression and the volume V is expressed in form of the polytropic change by the following equation where n is an index.

$$p = p_0\left(\frac{V_0}{V}\right)^n \quad (22)$$

In eq. (22), stiffness $K_s$ of an air spring is varied as the index n determining the polytropic change in accordance with the following selection of the index n.

n=0: isobaric change

1: isothermal change

Λ: adiabatic change (K is ratio of specific heats)

∞: isovolume change

The non-linear parameter, in which eq. (22) is transformed, is expressed by the following equation.

$$\Delta p_c = x'_c = K_s \Delta V_{p\_} \quad (23)$$
$$K_s = P_0\left(\frac{V_0}{V}\right)^n \frac{1}{\Delta V_{p\_}}$$

In eq. (23), the upper side denotes a linear equation representative of a relation between a cylinder pressure variation $\Delta p$ and a volume change $\Delta V_{p\_}$ with an air spring stiffness $K_S$, and the lower side denotes a non-linear equation of an air spring stiffness $K_S$ in the volume V from eq. (22). Both the equations causes the model to offer a relation in which the linearity and the non-linearity are separated and are independent one another.

The air spring stiffness $K_S$ can be determined by means of differentiating eq. (23) with the volume change. As the numerical computation, there are known a method in which eq. (23) is directly used, and a method in which the Taylor expansion is adopted. The former is adaptive when a pressure change between $P_0$ and P is little. The later is suitable for an approximate expression when the pressure change between $P_0$ and P is large. When the former is expressed by the discrete equation where the presence is given by the present sampling time (k) and the subsequent sampling time (k+1), eq. (23) is expressed as follows.

$$\Delta p_{(k+1)} = K_{S(k+1)}\Delta V_{p(k+1)\_} \quad (24)$$
$$K_{S(k+1)} = p_0\left(\frac{V_0}{V_{(k+1)}}\right)^n \frac{1}{\Delta V_{p(k+1)\_}}$$

In eq. (24), $V_{(k+1)}$ denotes the estimated volume, and $\Delta V_{p(k+1)\_}$ denotes the volume change. The Taylor expansion of eq. (24) is expressed as follows.

$$K_S = P_0 V_0^n \left\{(n+0)\left\{\frac{\Delta V_{p(k+1)\_}^0}{1!V_{(k+1)}^{n+1}} + (n+1)\left\{\frac{\Delta V_{p(k+1)\_}^1}{2!V_{(k+1)}^{n+2}} + \ldots (n+j)\left\{\frac{\Delta V_{p(k+1)\_}^{j-1}}{(j+1)!V_{(k+1)}^{n+j+1}} + \ldots\right\}\right\}\right\}\right\} \quad (25)$$

Here, j denotes degree of the expansion and is expressed by 0·1·2·3 . . . .

(3) Result of Simulation

Figure 18:
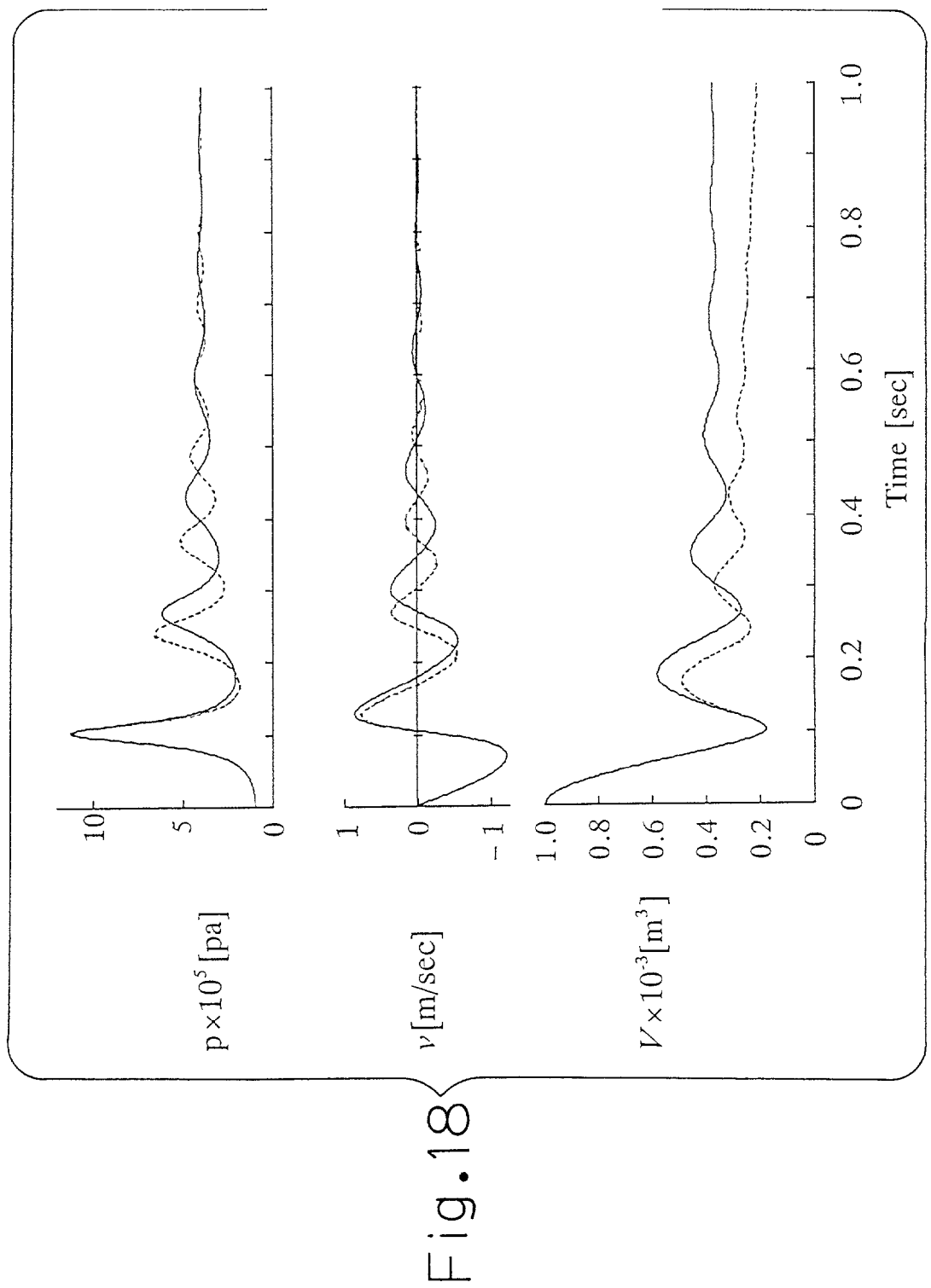
FIG. 18 is a view showing a simulation result of a pneumatic cylinder.
Figure 19:
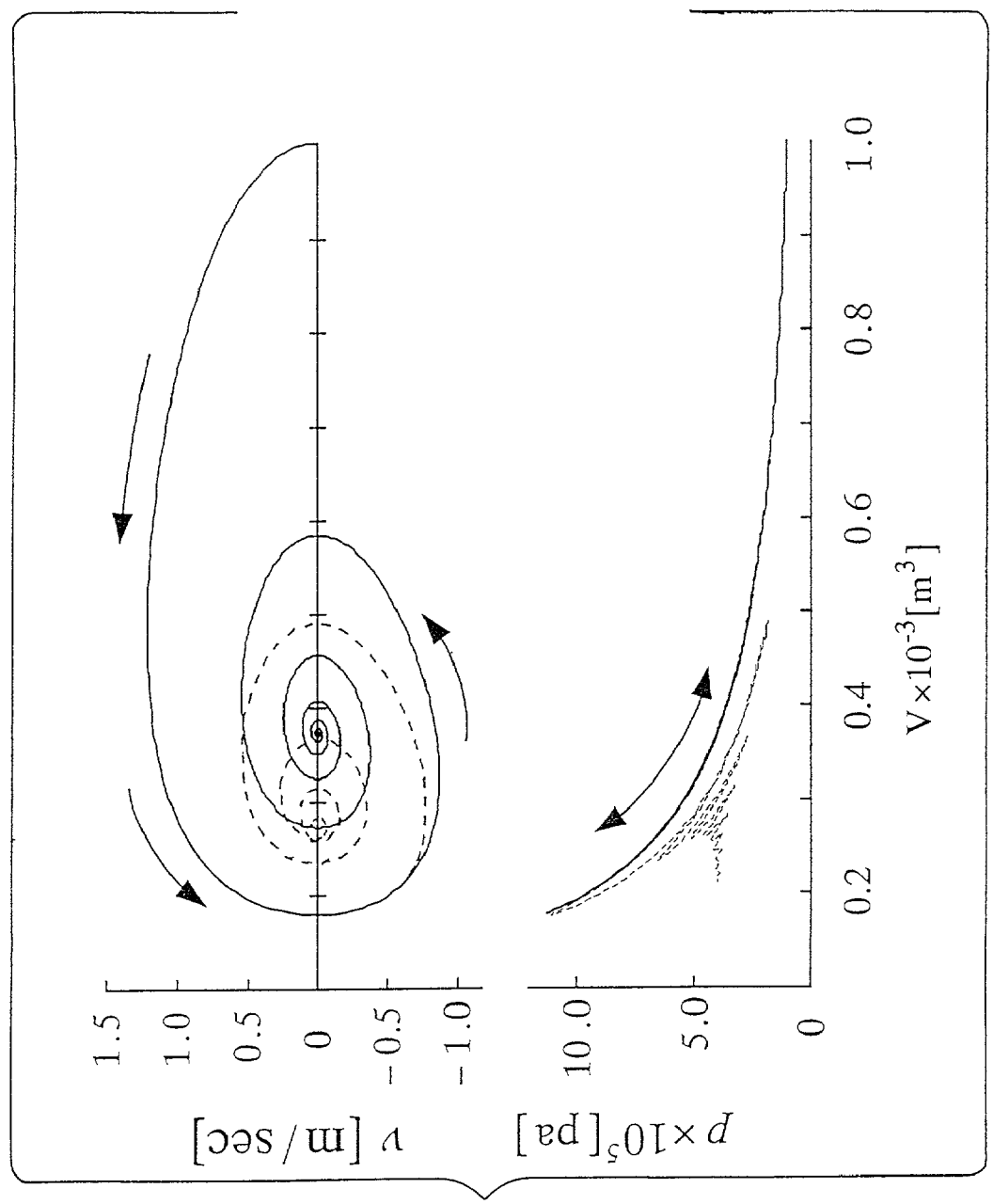
FIG. 19 is a view showing a P-V·v-V diagram of a pneumatic cylinder.

A result of simulation, as to the functional model of FIG. 17, which is performed with characteristic values of table 1, is shown in FIGS. 18 and 19. Incidentally, with respect to the spring stiffness $K_S$, eq. (25) is applied.

TABLE 1 characteristic values of pneumatic cylinder

| characteristic name | symbol | unit | characteristic value |
|---|---|---|---|
| mass | M | [kg] | 100.0 |
| coefficient of viscosity esistance resistance | C | [N/(m/s)] | 1000.0 |
| coefficient of internal damping | D | [N/(m/s)] | 3 × 10⁹ |
| ratio of specific heat | K |  | 1.4 |
| cross-sectional area | S | [m²] | 0.01 |
| cylinder volume | V₀ | [m³] | 0.001 |
| atmospheric pressure | p₀ | [Pa] | 0.1 × 10⁶ |

FIG. 18 shows time history variations of the respective state quantities. FIG. 19 is a view showing P-V and v-V diagrams representative of a relation between the cylinder volume V and the pressure P. In these both diagrams, a solid line denotes the heat insulating state wherein coefficient of internal damping D=0, and a dotted line denotes the heat radiation wherein D=3×10⁹ [N/(m/s)]. The simulation was performed on a process in which the external step force f of 3000 [N] is applied so that the non-linear damping oscillation converges. In FIG. 18, the upper side represents a response characteristic of an internal pressure p [pa] of a cylinder; the middle a response characteristic of a piston velocity v [m/sec]; and the lower side a response characteristic of a cylinder volume V [m³]. As the common mater of those characteristics, it is understood that the damping oscillation waves are associated with a distortion owing to a non-linearity of a spring stiffness K [$p_a/m^3$] of air. In the heat radiation state, there appears a volume change due to the heat shrinkage from the cylinder volume V [m³].

In FIG. 19, the upper side represents a relation of convergent process between the cylinder volume V [m³] and the piston velocity V [m/sec], in which the center of converging spiral is the stationary state. The lower side represents a relation between the cylinder volume V [m³] and the internal pressure p [pa] of a cylinder, in which it indicates that a spring stiffness of air is of a non-linear characteristic. In the heat radiation state, it is understood that the volume change due to the heat shrinkage occurs regardless of pressure.

3. Coefficient Element (Oscillating Mechanism)

As the typical example of the non-linear coefficient element, there is a link mechanism. Incorporating a mechanistic model, wherein a coefficient of the coefficient element (basic functional element) is given with a non-linearity, makes it possible to implement modeling of the non-linear coefficient. By way of example of the modeling, there will be discussed an oscillation mechanism for converting the rotary motion shown in FIG. 20 into the oscillation motion.

Figure 20:
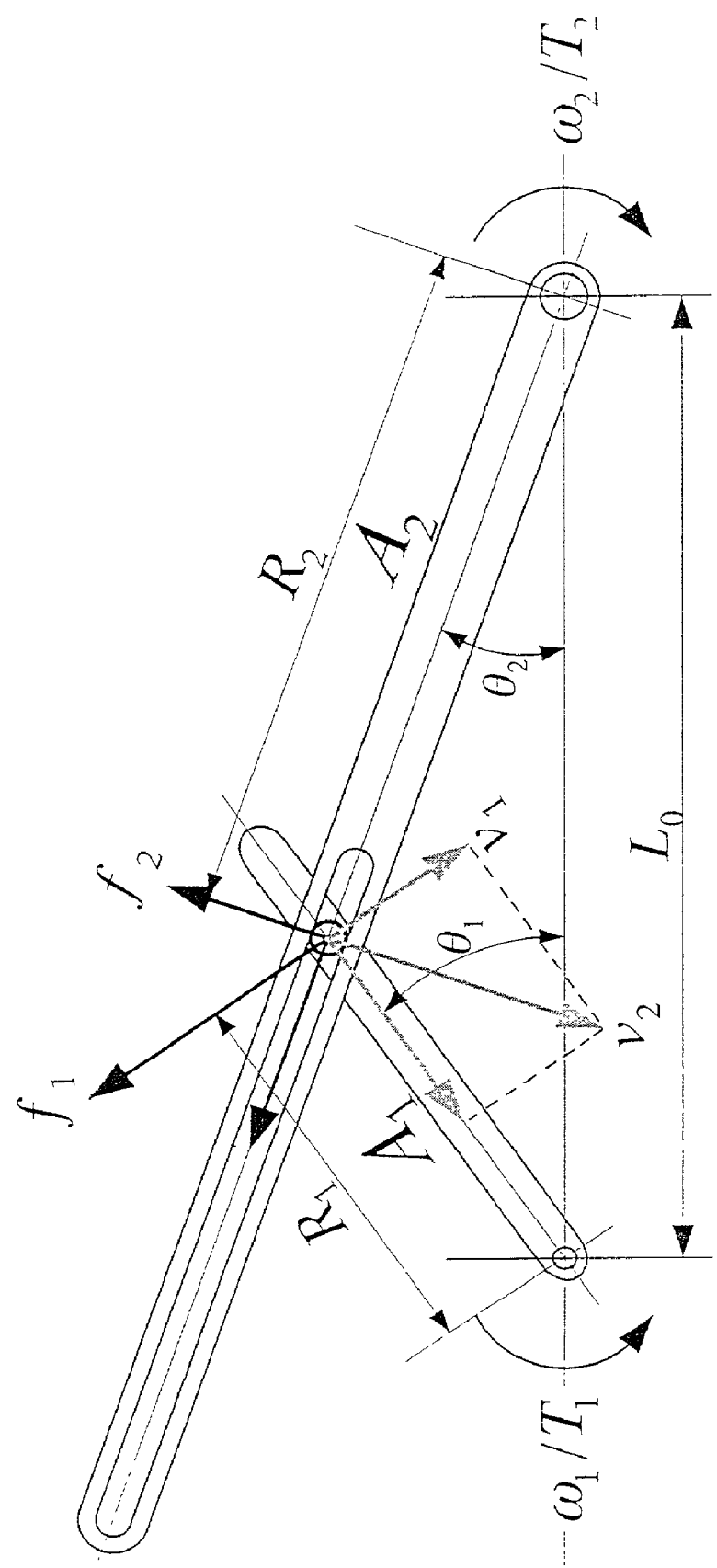
FIG. 20 is a view showing a structural model of an oscillating mechanism.

FIG. 20 is a view showing a structural model of an oscillating mechanism comprising a rotational arm $A_1$ and an oscillation arm $A_2$. Where R denotes an arm length (radius); θ a rotational angle; f an effective force on a coupling point; v a velocity of a coupling point; T a torque; and ω an angular velocity. The suffixes 1 and 2 imply the rotational node and the oscillation node, respectively. $L_0$ denotes a distance between the respective rotary centers. While $R_1$ is constant, $R_2$ is variable together with motion. Incidentally, both the arms are treated as rigid bodies, and inertia moment and the rotary resistance are neglected.

(1) Functional Model

In modeling, a functional model, wherein a coefficient of the basic function element is given by the non-linear transfer factor Φ, is expressed by the following equation.

$$\left. \begin{array}{l} T_2 = \Phi T_1 \\ \omega_1 = \Phi \omega_2 \end{array} \right\} \quad (26)$$

Next, there is performed modeling of a mechanistic model to be incorporated into the non-linear transfer factor Φ of eq. (26). The mechanistic model of the oscillation mechanism is different in the non-linear transfer factor Φ according as a rotational angle for determining the coefficient is a rotational angle $θ_1$ of the rotational arm $A_1$ or a rotational angle $θ_2$ of the oscillation arm $A_2$. The non-linear transfer factors $Φ_a$ and $Φ_b$, which are associated with the rotational angles $θ_1$ and $θ_2$, respectively, are in a mutually reciprocal relation.

(2) Mechanistic Model 1 (Oscillation Model of Rotational Node Input)

Figure 21:
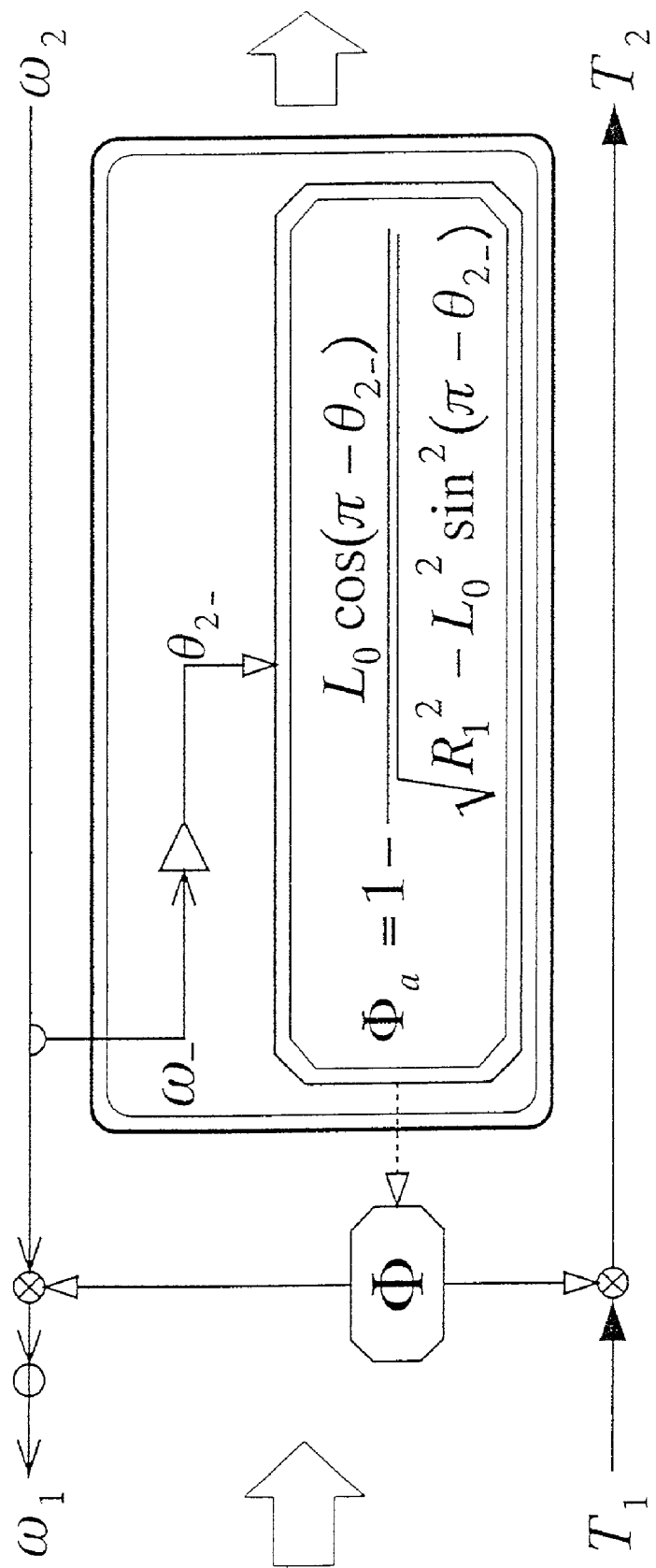
FIG. 21 is a view showing a functional model of an oscillating mechanism.

FIG. 21 shows a functional model in which a mechanistic model for determining a non-linear transfer factor $Φ_a$ with an angular velocity $ω_2$ of an oscillation arm $A_2$, incorporated. Incidentally, $ω\_$ of the mechanistic model denotes an estimated angular velocity, and $θ_{2\_}$ denotes an estimated angle.

Government equation and coupling condition equation of FIG. 21 are expressed by the following equation.

$$\left. \begin{array}{l} \begin{bmatrix} \omega_1 \\ T_2 \end{bmatrix} = \begin{bmatrix} 0 & -\Phi_a \\ \Phi_a & 0 \end{bmatrix} \begin{bmatrix} T_1 \\ \omega_2 \end{bmatrix} \\ \omega = \omega_2 \\ \Phi = \Phi_a \end{array} \right\} \quad (27)$$

A non-linear transfer factor $Φ_a$ of FIG. 21 is expressed by the following equation.

$$\left. \begin{array}{l} \theta_{2\_} = \int \omega\_ dt \\ \Phi_a = 1 - \dfrac{L_0 \cos(\pi - \theta_{2\_})}{\sqrt{R_1^2 - L_0^2 \sin^2(\pi - \theta_{2\_})}} \end{array} \right\} \quad (28)$$

In eq. (28), the upper side denotes an estimated rotational angle $θ_{2\_}$ of the oscillation arm $A_2$, and the lower side denotes the non-linear transfer factor $Φ_a$. Incidentally, with respect to the lower side of eq. (28), since all the parameters represent shapes, FIG. 21 shows a shape model with an octagonal frame. When the right side denominator of eq. (28) is 0, the oscillation arm $A_2$ offers the maximum oscillation rotational angle $θ_{2\_max}$, and the non-linear transfer factor $Φ_a$ is ∞. The maximum oscillation rotational angle $θ_{2\_max}$ is expressed by the following equation.

$$\theta_{2\_max} = \sin^{-1}\left(\dfrac{R_1}{L_0}\right) \quad (29)$$

Incidentally, at that time, the oscillation arm length $R_2$ is expressed by the following equation, in which the upper side is expressed with a rotational angle $θ_1$ of the rotational arm $A_1$, and the lower side is expressed with a rotational angle $θ_2$ of the oscillation arm.

$$\begin{array}{l} R_2 = \sqrt{L_0^2 + R_1^2 - 2 L_0 R_1 \cos \theta_1} \\ \phantom{R_2} = L_0 \cos(\theta_2) - \sqrt{R_1^2 - L_0^2 \sin^2(\theta_2)} \end{array} \quad (30)$$

Equations (28) and (30) can be easily introduced from a geometric relation of the mechanism shown in FIG. 20, a load of the coupling point and a velocity vector.

(3) Mechanistic Model 2 (Oscillation Model of Oscillation Arm Input)

Figure 22:
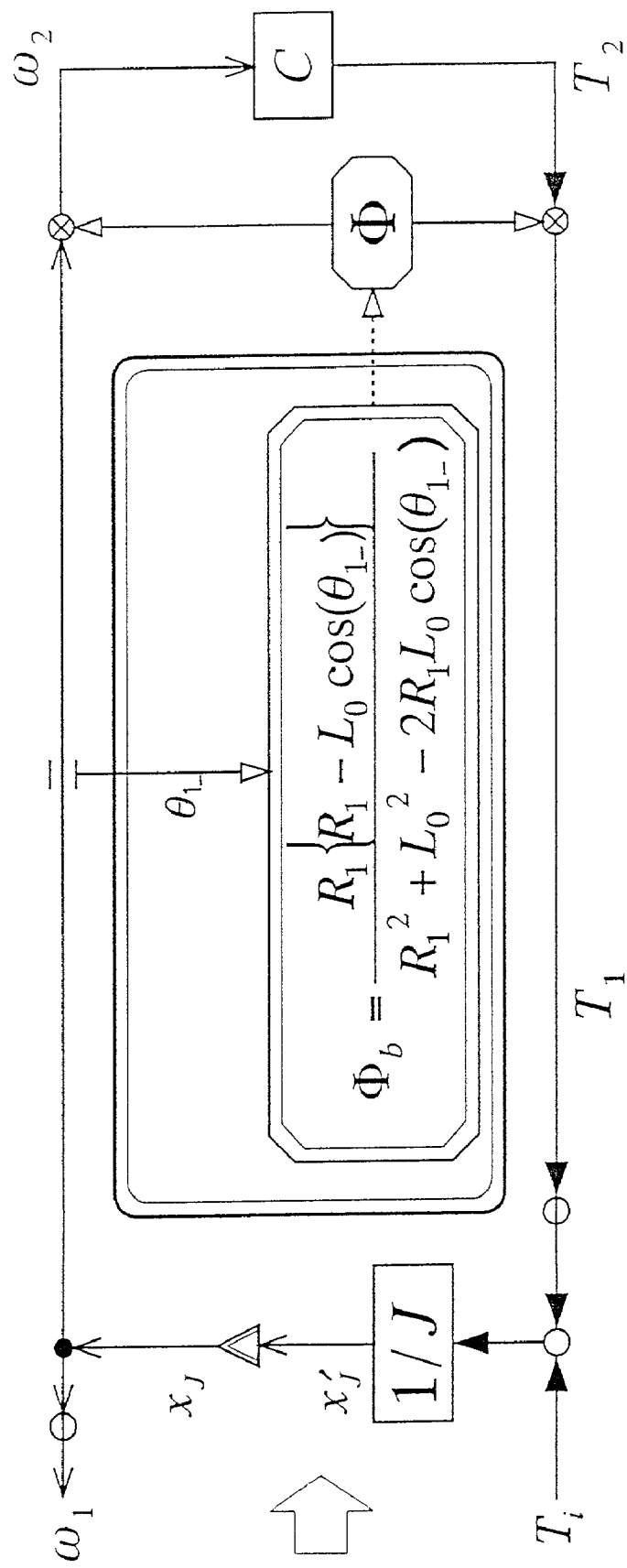
FIG. 22 is a view showing a functional model of an oscillating mechanism.

Next, FIG. 22 shows a functional model into which a non-linear transfer factor $Φ_b$, wherein an angular velocity $ω_1$ of the rotational arm $A_1$ is adopted in form of observation quantity, is incorporated. Incidentally, FIG. 22 is in a duality with FIG. 21. In FIG. 22, an inertia moment J and an additional function of coefficient C of resistance are connected to a rotational arm $A_1$ at the driving side and an oscillation arm $A_2$ at the load side, respectively. From the exterior, torque $T_i$ is applied to the inertia moment J to output the angular velocity $ω_i$.

The functional model of FIG. 22 can be expressed by the following domination equation and coupling condition equation.

$$\begin{bmatrix} 0 \\ \omega_1 \\ \omega_2 \\ T_2 \\ 0 \\ \theta_{1\_} \end{bmatrix} = \begin{bmatrix} -J & -\Phi_b^2 C & 1 & 0 & 0 \\ 0 & -1 & 0 & 0 & 0 \\ 0 & \Phi_b & 0 & 0 & 0 \\ 0 & \Phi_b C & 0 & 0 & 0 \\ 0 & 0 & 0 & -1 & 1 \\ t_{smp}^2 & t_{smp} & 0 & 0 & 1 \end{bmatrix} \begin{Bmatrix} x'_J \\ x_J \\ T_i \\ x'_{BB} \\ x_{BB} \end{Bmatrix} \quad (31)$$

$$\left.\begin{aligned} \omega &= \omega_1 \\ \Phi &= \Phi_b \end{aligned}\right\}$$

Figure 42:
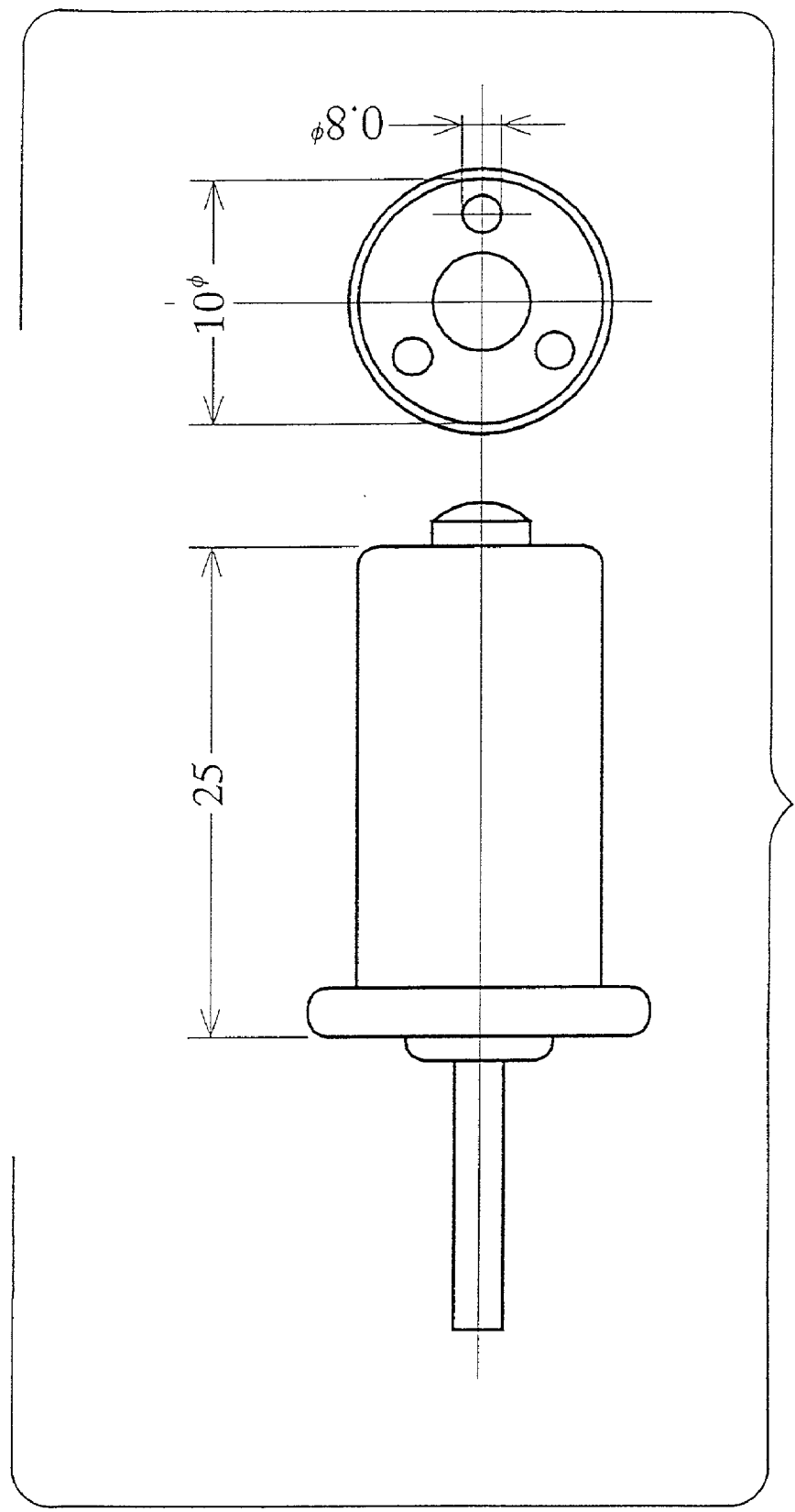
FIG. 42 is a perspective view of a thermistor.

In eq. (31), first and second lines denote a state equation and an input and output equation, third and fourth lines denote observation equations, and fifth and sixth lines denote estimated observation equations for a rotational angle $\theta_1$. In eq. (31), $X'_{BB}$ and $X_{BB}$ denote internal storage observation quantity of an angular velocity $\omega_1$. A mechanistic model of a non-linear transfer factor $\Phi_b$ of FIG. 42 is expressed by the following equation.

$$\Phi_b = \frac{R_1^2 - R_1 L_0 \cos(\theta_{1\_})}{R_1^2 + L_0^2 - 2R_1 L_0 \cos(\theta_{1\_})} \quad (32)$$

The lower side of eq. (32) denotes, similar to eq. (28), a shape model.

(4) Result of Simulation

Figure 23:
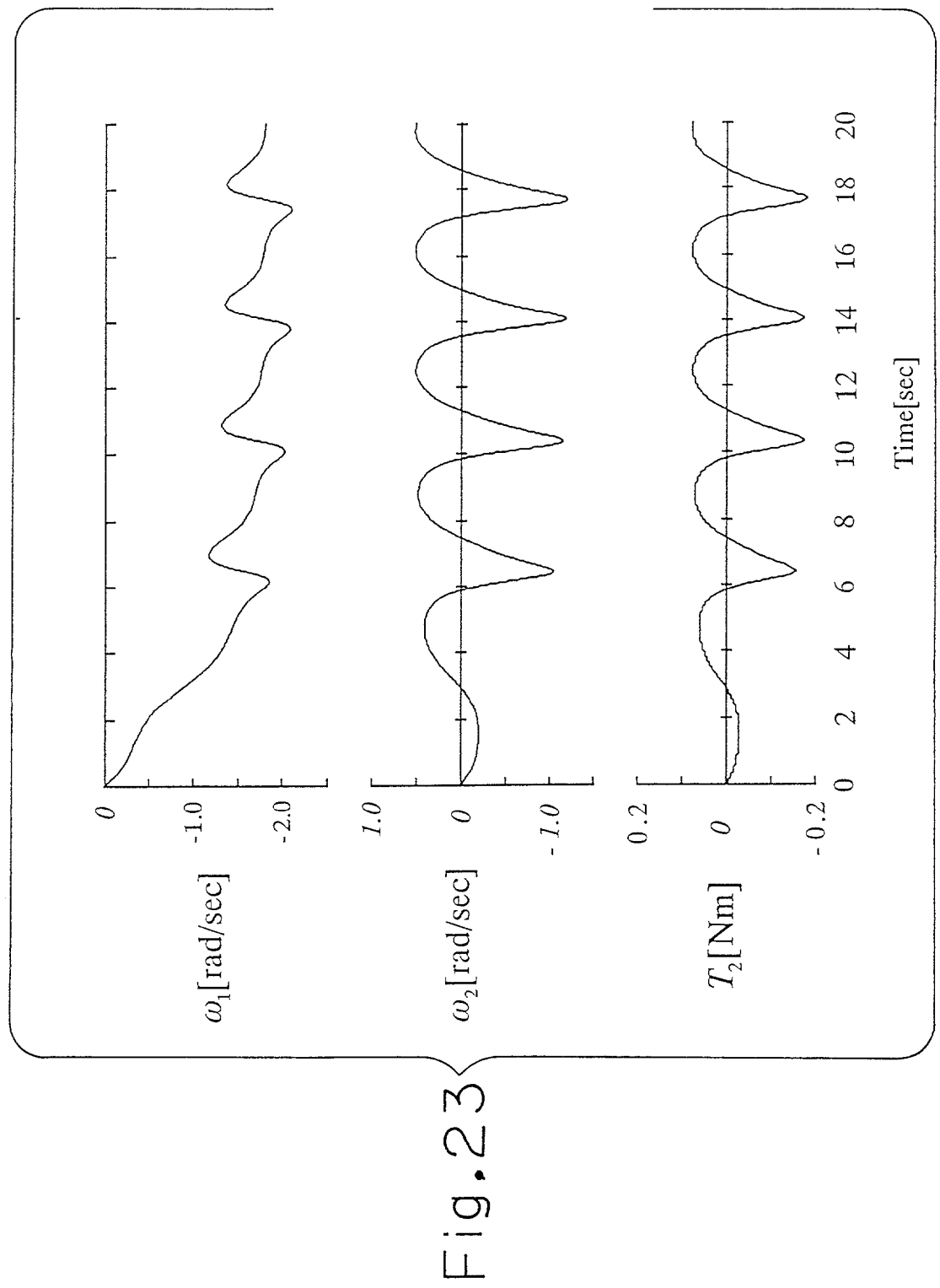
FIG. 23 is a view showing a simulation result of an oscillating mechanism.
Figure 24:
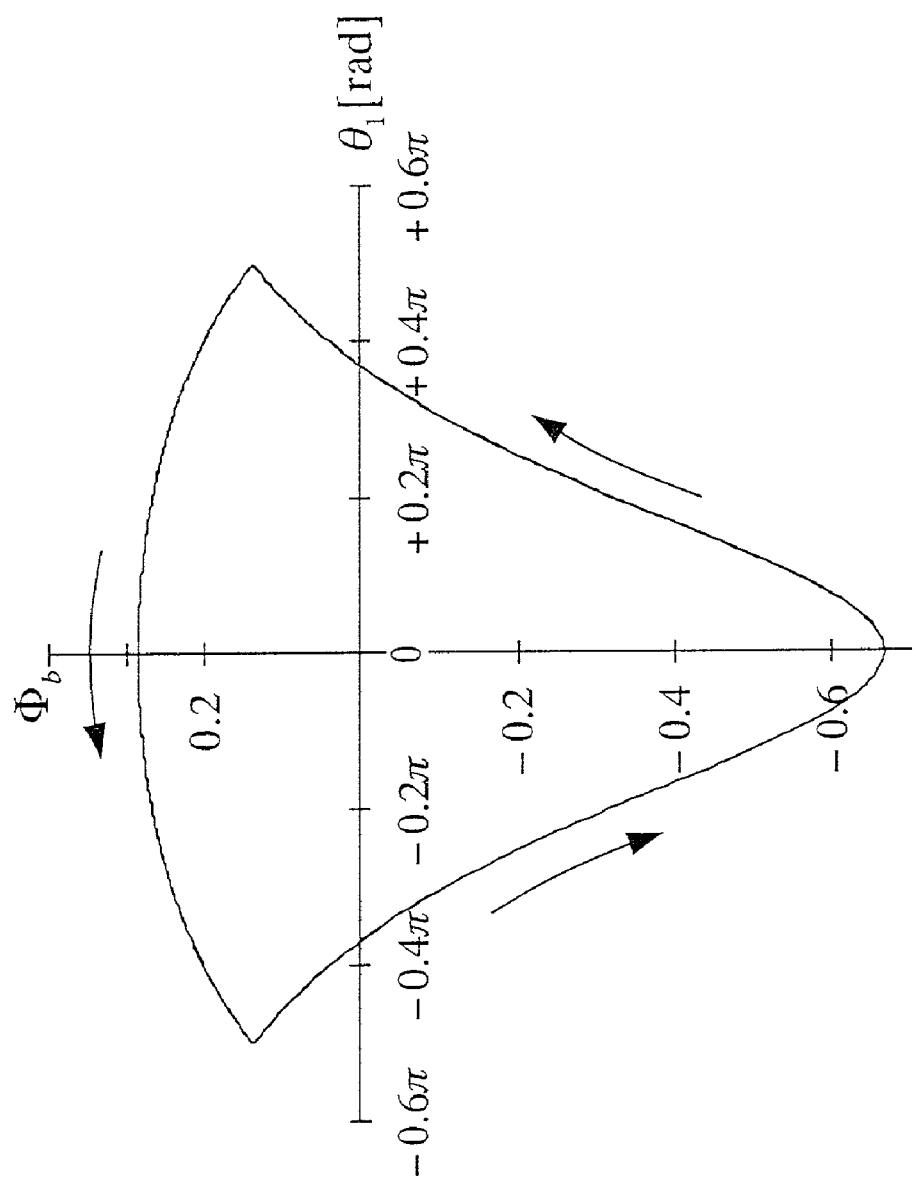
FIG. 24 is a view showing an angular characteristic of a non-linear transfer factor $\Phi_b$.

Next, a result of a simulation, wherein characteristic values of an oscillating mechanism of table 2 are applied to the functional model of FIG. 22, is shown in FIGS. 23 and 24.

TABLE 2 characteristic values of oscillating mechanism

| characteristic name | symbol | unit | characteristic value |
|---|---|---|---|
| inertia moment | M | [N/m$^2$] | 0.1 |
| coefficient of resistance | C | [N/(m/s)] | 0.3 |
| radial of rotational arm | R$_1$ | [m] | 0.02 |
| distance between centers of rotation | L$_0$ | [m] | 0.05 |

FIG. 23 shows a response characteristic where step torque T$_I$ of 0.05 [Nm] is applied. In FIG. 23, the upper side denotes an angular velocity $\omega_1$ [rad/sec] of the rotational arm, the middle denotes an angular velocity $\omega_2$ [rad/sec] of the oscillating node, and the lower side denotes a torque T$_2$ [Nm] of the oscillating node. The respective state quantities are associated with a waveform having a distortion by a non-linear coefficient $\Phi_b$.

FIG. 24 is a diagram of a transmission characteristic to an angle of a non-linear coefficient $\Phi_b$. A distortion of the state quantity of FIG. 23 is determined by the transmission characteristic shown by this diagram. The arrow in the figure denotes a change direction of the non-linear transfer factor $\Phi_b$ when the rotational arm A$_1$ rotates counterclockwise.

4. Example of Modeling of Friction

Figure 25:
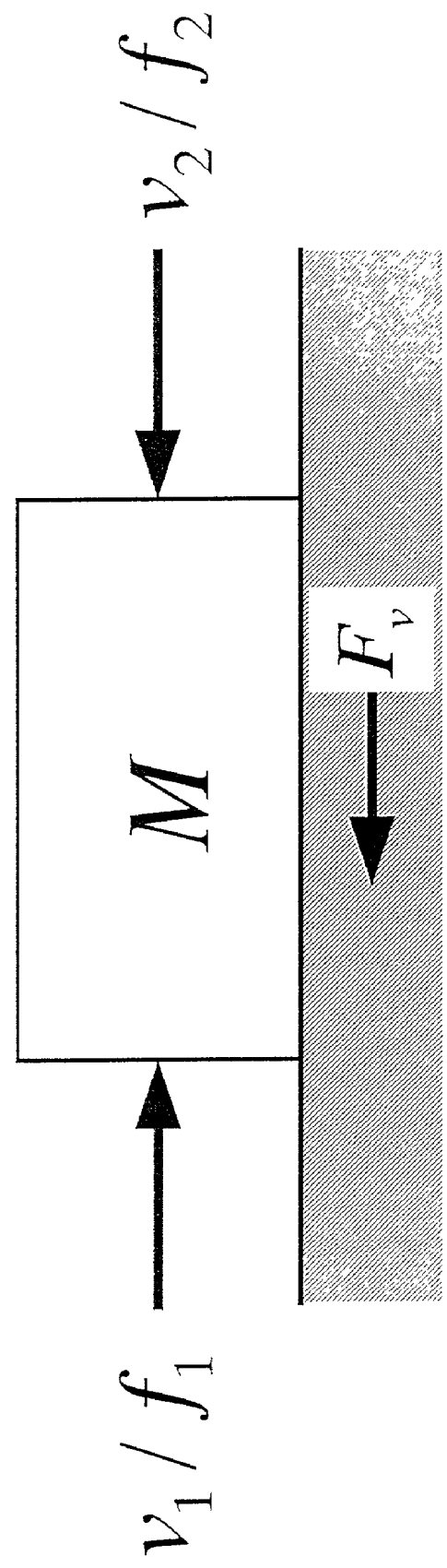
FIG. 25 is a view showing a structural model of friction.

Friction is a typical example of a non-linear side load. FIG. 25 shows a mechanistic model of friction in which a frictional force F$_v$ is effected on mass M. FIG. 25 shows a structural model of mass M which moves on a plane at velocity $v_1 \cdot v_2$ while external force $f_1 \cdot f_2$ is effected by a frictional force F$_v$. The frictional force F$_v$ consists of a stationary frictional force F$_s$ which is to be a constant and a dynamic frictional force F$_M$ which is to be a function of velocity.

(1) Functional Model

Figure 26:
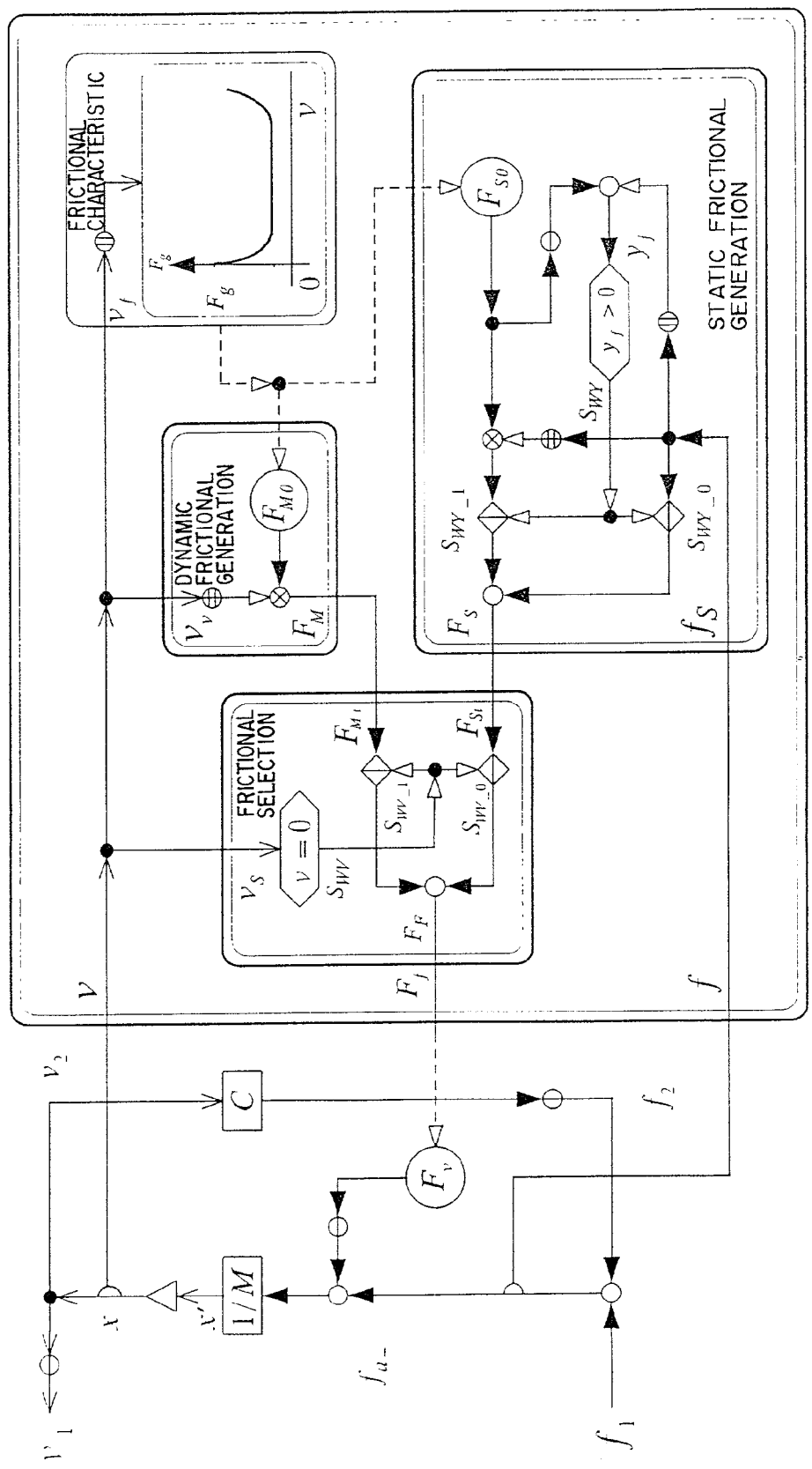
FIG. 26 is a view showing a functional model of friction.

FIG. 26 shows a functional model in which a side load F$_v$ generating a frictional force is applied to mass M of the potential storage element. A mechanistic model generating a frictional force is incorporated into the side load F$_v$. The mechanistic model shown in FIG. 26 generates a frictional force F$_f$ generated from velocity (internal state quantity) of mass M and an estimated observation quantity of an acceleration force f$_a$. In the output velocity V$_2$ side, coefficient C of resistance generating reaction f$_2$ is added in form of a load.

A government equation and a coupling condition equation for the functional model, which are determined from FIG. 26, are expressed by the following equation.

$$\begin{bmatrix} 0 \\ v_1 \\ f_2 \\ f_{a\_} \end{bmatrix} = \begin{bmatrix} -M & -C & 1 & -F_v \\ 0 & -1 & 0 & 0 \\ 0 & C & 0 & 0 \\ 0 & -C & 1 & 0 \end{bmatrix} \begin{Bmatrix} x' \\ x \\ f_1 \\ 1 \end{Bmatrix} \quad (33)$$

$$\left.\begin{aligned} v &= x \\ f &= f_{1\_} + f_{2\_} \\ F_f &= F_v \end{aligned}\right\}$$

In eq. (33), from the top in order, the first line denotes a government equation; the second line an input and output equation; and third and fourth lines estimated observation equations for reaction f$_2$ of coefficient of resistance and an acceleration force f$_{a\_}$. In the coupling condition equation of the lower side of eq. (33), the first line denotes quantity of an observation of velocity; the second an estimated acceleration force to be applied to mass; and the third a frictional force.

In the mechanistic model of FIG. 26, the lower side shows a model for generating a static frictional force F$_s$; the upper center a model for generating a kinetic frictional force F$_M$; the left end a model for selectively outputting quantity F$_f$ of substitution between the static frictional force F$_s$ and the kinetic frictional force F$_M$ A$_t$ the right end, a characteristic of the kinetic frictional force F$_M$ depending on velocity is incorporated on a graphic representation basis. In the event that the kinetic frictional force F$_M$ is a constant value regardless of the velocity v, no graph is needed. The graph of the frictional characteristic shows that the frictional force varies from the high static frictional force to the low kinetic frictional force, and it is possible to reproduce stitching phenomenon on a frictional surface and an oscillation phenomenon wherein the frictional change of the time-lapse area is regarded as the negative resistance.

(2) Mechanistic Model (Frictional Model)

Selection between the static frictional force F$_s$ and the kinetic frictional force F$_M$ is performed in accordance with a determination condition S$_{wv}$ of the velocity v. In selection, on the stop state of S$_{wv}$=0, the static frictional force F$_s$ is selected, and on the moving state of S$_{wv}$=1, the kinetic frictional force $F_M$ is selected. The mechanistic model is expressed by the following equation.

$$\left.\begin{array}{l} \text{if } (v_s = 0) \text{ then } (S_{WV} = 0) \text{ else } (S_{WV} = 1) \\ F_i = F_{Mi}S_{\text{WV}\_1} + F_{Si}S_{\text{WV}\_0} \end{array}\right\} \quad (34)$$

On the second line of eq. (34), $F_{Mi}$ denotes a kinetic frictional force; $F_M$ and $F_{si}$ a static frictional force; and $F_s$ and $V_s$ velocity. Suffixes 0 and 1 of switch variables denote an NO switch side and an NC switch side of a selection switch, respectively. The determination condition equation at the upper side of eq. (34) is expressed by the following equation in accordance with a determination method of converging it to zero.

$$\text{if } (|v_{S(k)}| < |v_{S(k)} - v_{S(k-1)}|) \text{ then } (S_{WV} = 0) \text{ else } (S_{WV} = 1) \quad (35)$$

In eq. (35), $v_{S(k)}$ denotes the present velocity; $v_{S(k\_}1)$ the velocity before one sampling period; and $\Delta v$ a velocity change width determined from these. A determination result of condition determination $S_{WV}$ is the same as eq. (34).

Next, there will be introduced a mathematical model of generating the static frictional force $F_s$. The static frictional force $F_s$ is associated with two behaviors. One of the two behaviors is concerned with such a matter that in the event that the acceleration force $f_s$ is not more than the static frictional force $F_s$, the static frictional force $F_s$ balanced with the static frictional force $F_s$ is applied to mass M in form of reaction force so that the stop state is kept. Another is concerned with such a matter that when the acceleration force $f_s$, which is not less than the static frictional force $F_M$ is applied, the kinetic frictional force $F_M$ is immediately selected so that mass M is activated. At that time, since the mass is in the stop state, a direction (code) of the kinetic frictional force $F_M$ is the same direction (code) as the acceleration force $f_s$, and the side load $F_v$ offers a negative value to be a reaction force with respect to the mass M. Selection between both the behaviors is performed in accordance with an operation of a condition decision $S_{WY}$ for difference $Y_f = |f_s - F_{s0}|$ between the acceleration force $f_s$ and the side load $F_{s0}$. In selection, the balance state of the stop is expressed by $S_{WY} = 0$ so that the acceleration force $f_s$ side is selected, and the moving instant is expressed by $S_{WY} = 1$ so that the side load $F_{S0}$ side is selected. This mechanistic model is expressed by the following equation.

$$\left.\begin{array}{l} \text{if } \{(|f_S| - F_{S0}) > 0\} \text{ then } (S_{WY} = 1) \text{ else } (S_{WY} = 0) \\ F_S = f_S S_{\text{WV}\_0} + F_{S0}S_{\text{WV}\_1}\left(\frac{f_S}{|f_S|}\right) \end{array}\right\} \quad (36)$$

The reason why the acceleration force $f_s$ on the second line of eq. (36) is divided by $|f_s|$ is that a direction (code) of friction is determined. Finally, modeling is performed on a mechanistic model for generating the kinetic friction $F_M$. The kinetic frictional force $F_M$ is generated in such a manner that a code of velocity $v_v$ is added to the side load $F_{M0}$ of the kinetic frictional force.

This mechanistic model is expressed by the following equation.

$$F_M = F_{M0}\left(\frac{v_v}{|v_v|}\right) \quad (37)$$

The static frictional force $F_{S0}$ of the eq. (36) and the kinetic frictional force $F_{M0}$ of eq. (37) need a software to be determined through a graphic retrieval by velocity v or a mathematical model.

The above-mentioned mechanistic models are coupled by the following coupling condition equation.

$$\left.\begin{array}{l} v = v_S = v_v = v_f \\ F_M = F_{Mi} \\ F_S = F_{Si} \\ F_{S0} = F_{M0} = F_g \\ f = f_S \\ F_f = F_F \end{array}\right\} \quad (38)$$

(3) Result of Simulation

Figure 27:
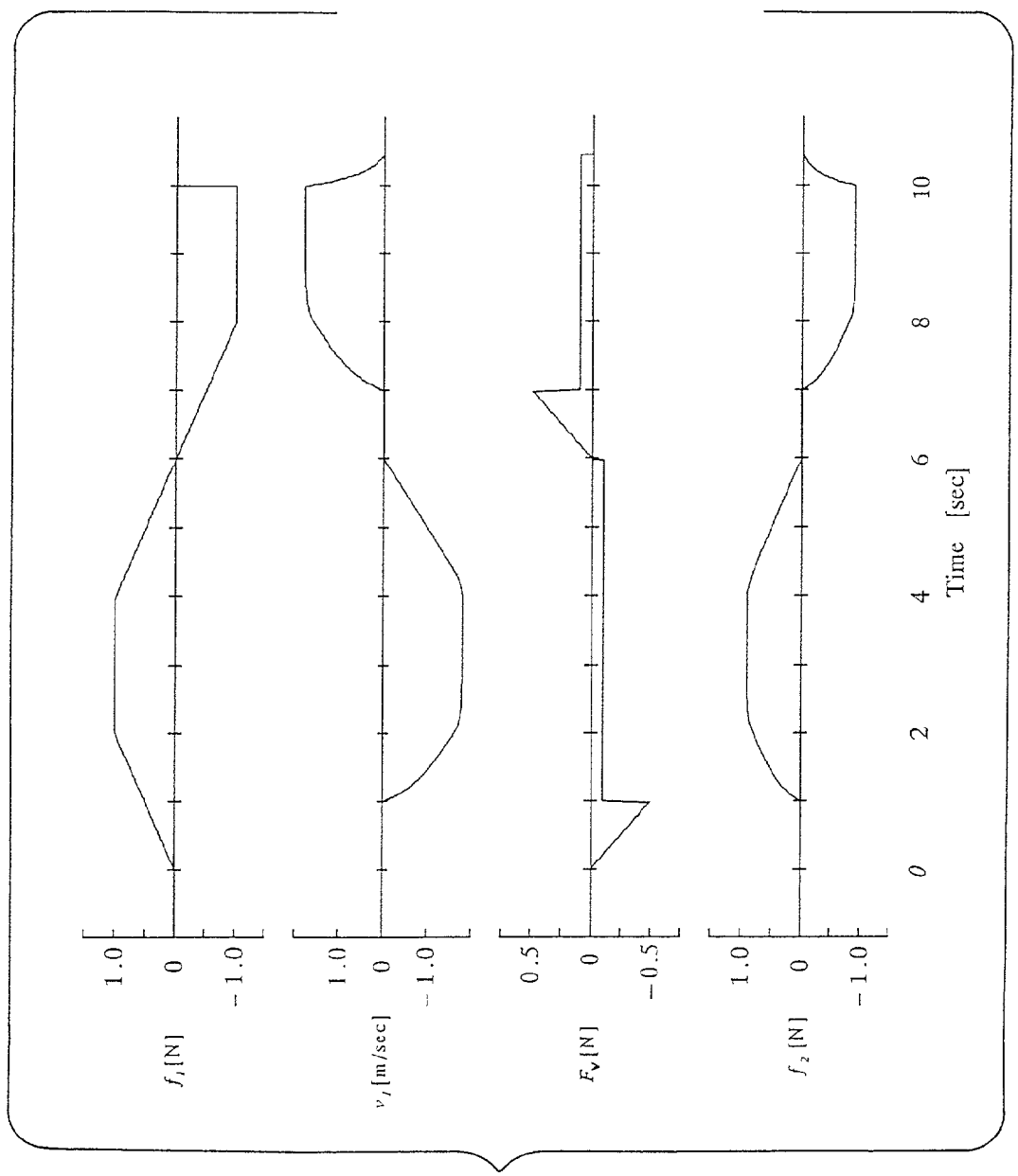
FIG. 27 is a view showing a simulation result of friction.

FIG. 27 is a view showing a result of a simulation which is performed on the functional model with the characteristic values shown in table 3. Incidentally, a decision of velocity v=0 was performed in accordance with eq. (35), and the kinetic frictional force $F_{M0}$ was constant.

TABLE 3

| characteristic values of friction | | | |
|---|---|---|---|
| characteristic name | symbol | unit | characteristic value |
| mass | M | [kg] | 0.1 |
| coefficient of resistance | C | [N/(m/s)] | 0.5 |
| static friction force | $F_{SO}$ | [N] | 0.5 |
| kinetic frictional force | $F_{MO}$ | [N] | 0.1 |

In the simulation, the external force f rising at 0.5 [N/sec] per unit time is applied up to 1 [N], and the external force up to −1 [N] is applied at the same variation rate from 0.4 [sec] and the external force is removed at 10 [sec]. In FIG. 27, the first denotes an external force $f_1$ [N]; the second a velocity $v_1$; the third a frictional force $F_v$ [N] applied in form of a side load in the third; and the fourth a reaction $f_2$ of resistance coefficient C. Incidentally, the frictional force $F_v$ and the reaction $f_2$ denote quantity of observation.

In FIG. 27, applying the external force $f_1$ slowly causes the static frictional force $F_v$ to occur to cancel the external force $f_1$ so that mass M does not move. From the point of 1 [sec], the external force $f_1$ exceeds the frictional force $F_v$ so that the mass M starts to move. Thus, a certain kinetic frictional force $F_v$ generates and it reaches the stationary state. From the point of 4 [sec], the external force $f_1$ slowly downs, and from 6 [sec] or so, again the static frictional force $F_v$ generates so that the mass M temporarily. Further, when the external force $f_1$ is applied in the opposite direction, the mass M starts to move in the opposite direction so that the kinetic frictional force $F_v$ generates. Finally, the external force $f_1$ is removed, the mass M is lowered in velocity $v_1$ to be stopped. In stopping, velocity due to the force of inertia of the mass M appears in form of reaction $f_2$ via the coefficient C of resistance, while the static frictional force $F_v$ generates, and the mass M stops after a while. After the stop, the frictional force $F_v$ disappears.

5. Potential Storage Element (Variable Moment of Inertia)

Figure 28:
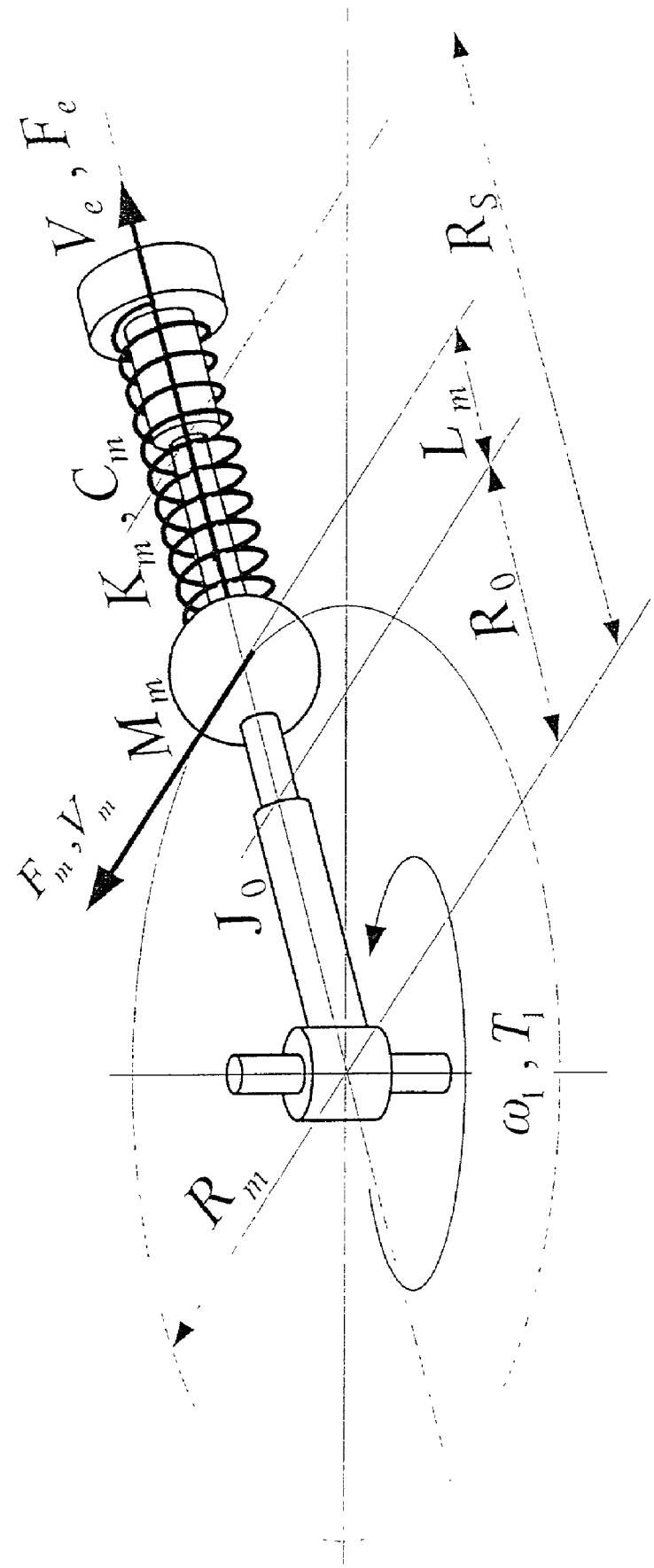
FIG. 28 is a view showing a structural model of the variable moment of inertia.

As a mechanism in which moment of inertia offers a non-linearity, there is a mechanical element such as a centrifugal governor and a centrifugal clutch. FIG. 28 is a view showing such a mechanical element by way of example.

In FIG. 28, torque $T_1$, where a direction shown in the figure is defined as the forward rotation, is effected to generate an angular velocity $\omega_1$. The rotational system shown in FIG. 28 is a structural model into which a system where a movable mass $M_m$ receives a centrifugal force to be translated is incorporated. The movable mass $M_m$ rotates on the circumference of the radius $R_m$, so that the centrifugal force $F_e$ acts on the movable mass $M_m$ to move outside at velocity $V_e$. According to this rotational system, when the system rotates, upon receipt of torque $T_1$, at the angular velocity $\omega_1$, velocity of the movable mass $M_m$ in the circumference direction is given by $V_m$, and force of inertia in the circumference direction is given by $F_m$. The lower limit (stop position) of the rotational radius $R_m$ of the movable mass $M_m$ is expressed by $R_0$. In the translational system, a rotation of the movable mass $M_m$ causes the centrifugal force $F_e$ to be generated, so that the movable mass $M_m$ moves by $L_m$ at velocity $V_e$ to offer a rotational radius $R_m$, while receiving a resistance force of a coefficient $C_m$ of viscosity resistance against stiffness $K_m$ of a spring. Variation of this rotational radius $R_m$ causes moment J of inertia of a rotational system to be varied. When the movable mass $M_m$ moves to the radius $R_S$, it contacts with a stopper of stiffness $K_S$ and stops. Where $J_0$ denotes moment of inertia of a suspension frame excepting the movable mass $M_m$, stiffness $K_m$ of the spring has no mass. Incidentally, stiffness of stop position $R_0$ is not considered.

(1) Functional Model

Figure 29:
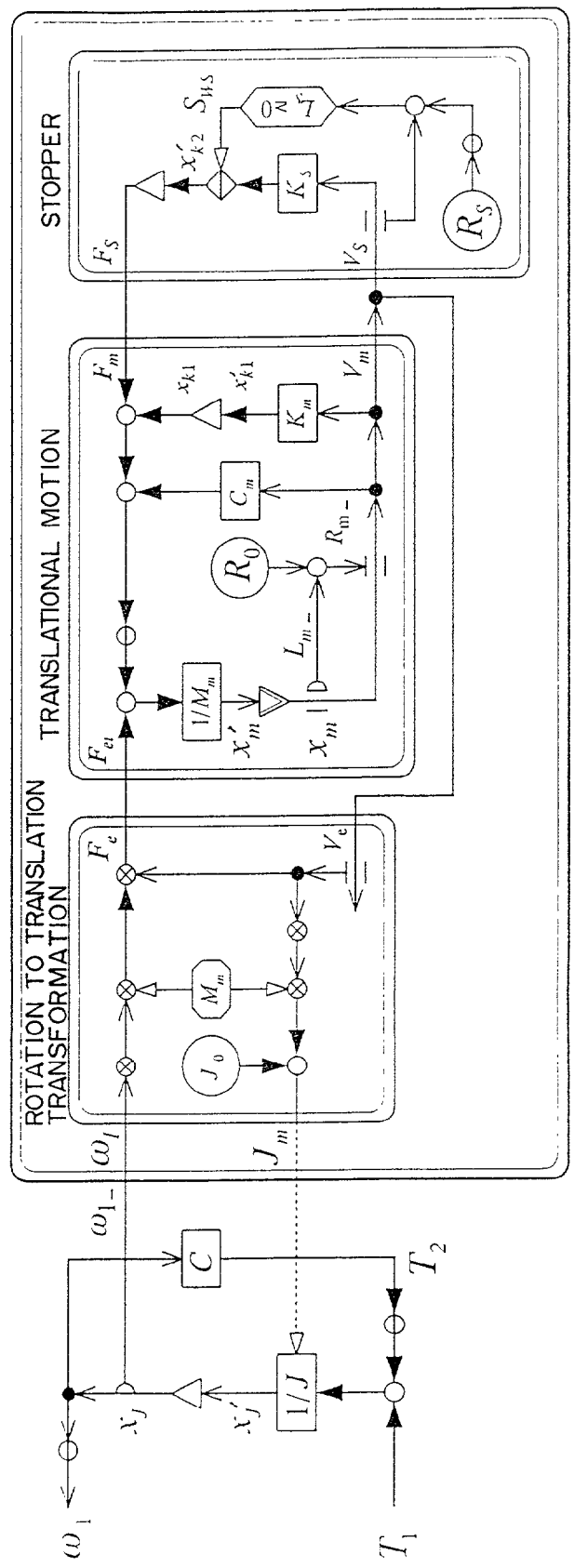
FIG. 29 is a view showing functional and mechanistic models of the variable moment of inertia.

An aspect of the mechanism of a variable moment of inertia resides in the point that mass M causes the moment J of inertia to be changed by the centrifugal force $F_e$. Consequently, the basic structure of the functional model has a mechanistic model wherein moment $J_m$ of inertia to which variable correspondence of a moving distance $L_m$ of the movable mass $M_m$ moved by the centrifugal force $F_e$ due to the observation quantity of the estimated angular velocity $\omega_{1-}$ of the rotational system is added, is substituted for moment J of inertia of a potential storage element (a basic functional element). And this mechanistic model includes a functional model of the movable mass $M_m$ moving by the centrifugal force $F_e$. FIG. 29 shows functional and mechanistic models for a rotational shaft representative of this relation. In FIG. 29, a coefficient C of viscosity resistance is added to the basic element of the potential storage element. Further, in FIG. 29, an output potential system of the mass $M_m$ includes a potential quantity of moving velocity $V_m$ and a storage potential quantity of rotational radius $R_m$.

Government equation and coupling condition of the functional model shown in FIG. 29 are expressed by the following equation.

$$\begin{bmatrix} 0 \\ \omega_1 \end{bmatrix} = \begin{bmatrix} -J & -C & 1 \\ 0 & -1 & 0 \end{bmatrix} \begin{bmatrix} x'_J \\ x_J \\ T_1 \end{bmatrix} \quad (39)$$

$$\left. \begin{array}{l} \omega_I = \omega_{1-} \\ J = J_m \end{array} \right\}$$

(2) Mechanistic Model (Centrifugal Force Model)

The mechanistic model comprises a rotation to translation transformation for coupling a rotational system with a translational system, a translational motion of a movable mass Mm, and a function of a stopper of the movable mass $M_m$, which determines the rotational radius $R_m$ of the movable mass $M_m$.

First, the mechanistic model of the rotation to translation transformation is expressed by the following mathematical model.

$$\left. \begin{array}{l} F_e = R_m M_m \omega_{I-}^2 \\ J_m = M_m R_m^2 + J_0 \end{array} \right\} \quad (40)$$

In eq. (40), the upper side denotes centrifugal force $F_e$ of the movable mass $M_m$ by the rotational system, and the lower side denotes moment $J_m$ of inertia varying in accordance with the centrifugal force.

The functional model, wherein the movable mass $M_m$ is subjected to the translational motion in accordance with the centrifugal force $F_e$, is the following government equation.

$$\begin{bmatrix} 0 \\ 0 \\ V_e \end{bmatrix} = \begin{bmatrix} -M_m & 0 & -C_m & -1 & 1 \\ 0 & -\dfrac{1}{K_m + K_S S_{WS}} & 1 & 0 & 0 \\ 0 & 0 & 1 & 0 & 0 \end{bmatrix} \begin{bmatrix} x'_m \\ x'_k \\ x_m \\ x_k \\ F_e \end{bmatrix} \quad (41)$$

$$\begin{bmatrix} 0 \\ L_{m-} \end{bmatrix} = \begin{bmatrix} 0 & -1 & 1 & 0 \\ t_{smp}^2 & 0 & t_{smp} & 1 \end{bmatrix} \begin{bmatrix} x'_m \\ x'_L \\ x_m \\ x_{LL} \end{bmatrix}$$

In eq. (41), the upper side denotes the government equation of the translational motion in which $K_m$ and $K_S$ in FIG. 29 are unified through an addition coupling of the integration quantity. And the lower side denotes an estimated observation quantity in which the storage potential quantity of the movable mass $M_m$ is expressed by the moving distance $L_m$. Incidentally, $t_{smp}$ is a sampling period.

From eq. (41), the estimated observation quantity of the rotational radius $R_m$ is expressed by the following equation.

$$R_m = R_0 + L_m \quad (42)$$

Finally, the stopper for limiting movement of the movable mass $M_m$ is expressed by the following equation.

$$\left. \begin{array}{l} L_S = R_S - R_m \\ \text{if } (L_S \geq 0) \text{ then } (S_{WS} = 1) \text{ else } (S_{WS} = 0) \end{array} \right\} \quad (43)$$

In eq. (43), condition determination at the time when it is in contact with the stopper is given by the non-contact state $S_{WS}=0$, and the contact state $S_{WS}=1$.

The coupling condition of assembling these mechanistic models in form of the whole mechanistic model is expressed by the following equation.

$$\left. \begin{array}{l} V_e = V_m = V_S \\ F_e = F_{ei} \\ F_m = F_S \end{array} \right\} \quad (44)$$

(3) Result of Simulation

Figure 30:
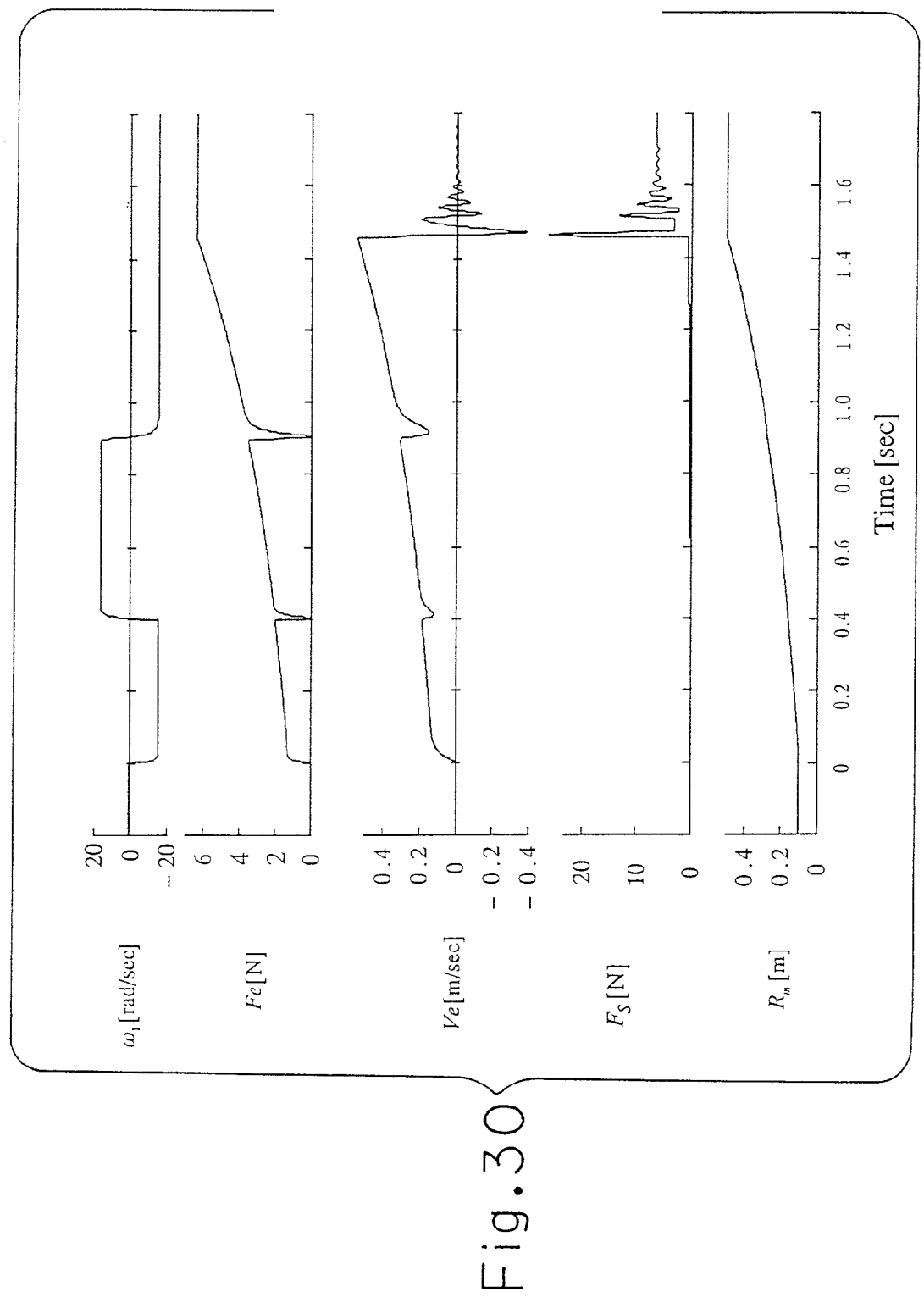
FIG. 30 is a view showing a simulation result of the variable moment of inertia.

A result of the simulation performed on the functional model of FIG. 29 using the characteristic values shown in table 4 is shown in FIG. 30.

TABLE 4 characteristic values of variable moment of inertia

| characteristic name | symbol | unit | characteristic value |
| --- | --- | --- | --- |
| rotational system | | | |
| inertia moment (suspension frame) | $J_0$ | [N/sec$^2$/rad] | 0.01 |
| coefficient of viscosity resistance | C | [N/(m/sec)] | 2.5 |
| translational system | | | |
| movable mass | $M_m$ | [N/sec$^2$/m] | 0.2 |
| coefficient of viscosity resistance | $C_m$ | [N/(m/sec)] | 10.0 |
| stiffness | $K_m$ | [N/m] | 2.0 |
| stopper stiffness | $K_s$ | [N/m] | $1.0 \times 10^4$ |
| rotational radius lower limit | $R_0$ | [m] | 0.1 |
| rotational radius upper limit | $R_s$ | [m] | 0.5 |

In FIG. 30, according to the simulation, first, input torque $T_1=20$ [N] is applied, after 0.4 [sec] torque $T_1=-20$ [N] is applied in the opposite direction to rotate it reversely, and after 0.9 [sec] torque $T_1=20$ [N] is applied in forward direction, and about 1.45 [sec] it contacts with the stopper. In FIG. 30, regarding results, from the top in turn the first denotes an angular velocity $\omega_1$ [rad/sec] of the rotational system; the second a centrifugal force $F_e$ [N] acting on the movable mass $M_m$; the third a moving velocity $V_e$ [m/sec]; the fourth spring and stopper stiffness force $F_S$ [N], and the fifth a rotational radius $R_m$ [m] of the movable mass $M_m$.

In the simulation result, selection of input torque $T_1$ causes the centrifugal force $F_e$ of the movable mass $M_m$ to be 0 in an instant and again return. While the moving velocity $V_e$ is lowered in an instant of selection, it returns so as to continue to move. This is independent of the rotational direction. When the rotational radius $R_m$ offers 0.5 [m], the movable mass $M_m$ contacts with the stopper. In the contact state, repulsion due to a collision causes damping oscillation to be generated on moving velocity $V_e$ and force $F_s$ of $K_S$ of a stopper stiffness. At that time the damping oscillation wave is flat on the lower side. It is understood that this is a repulsion force in an instant that the movable mass $M_m$ contacts with the stopper.

Figure 31:
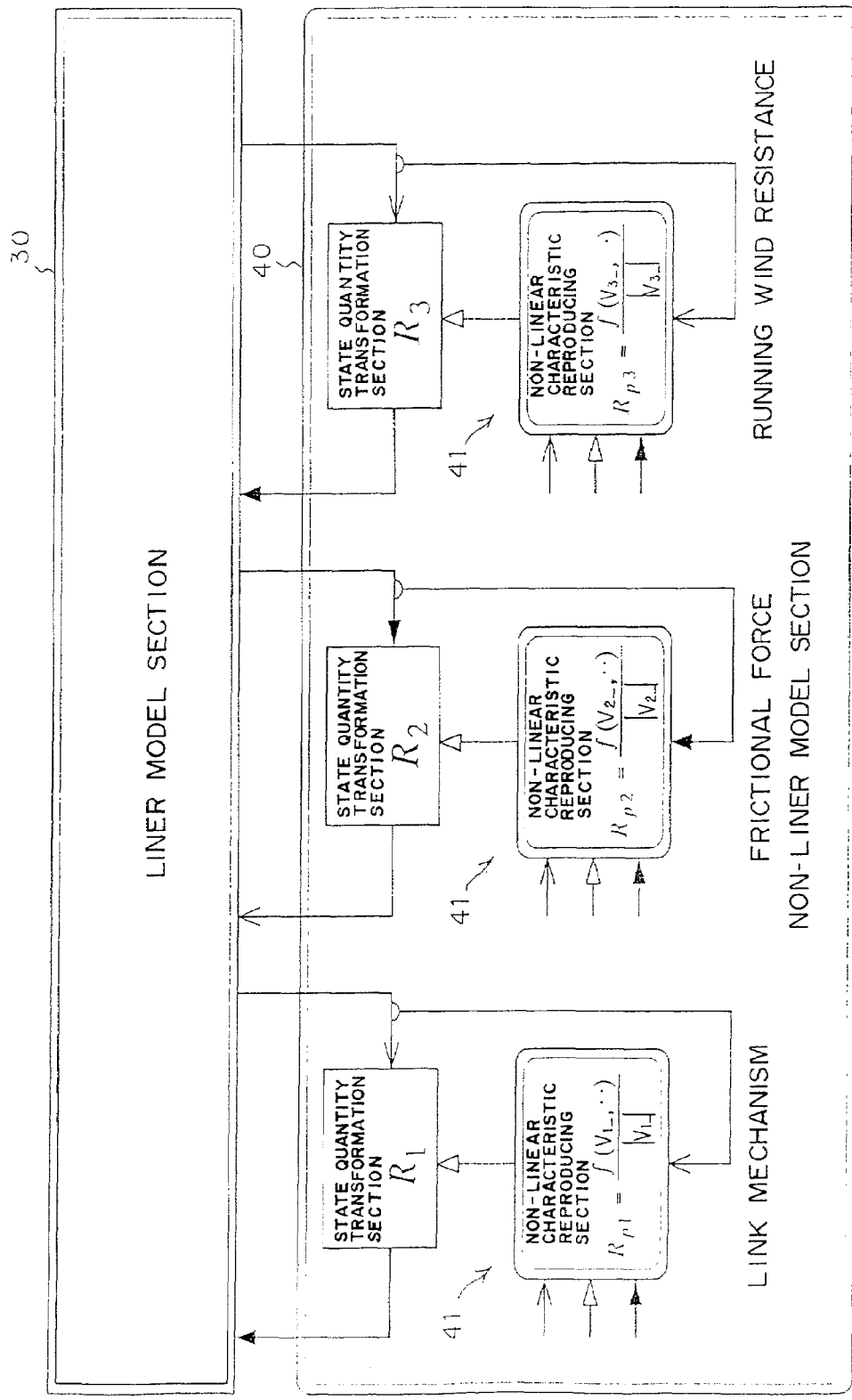
FIG. 31 is a principle explanatory view of a second non-linear characteristic reproducing apparatus according to an embodiment of the present invention.

FIG. 31 is a principle explanatory view of a second non-linear characteristic reproducing apparatus according to an embodiment of the present invention. FIG. 31 is a view for easily understanding the principle of the second non-linear characteristic reproducing apparatus according to the present invention, and thus the second non-linear characteristic reproducing apparatus according to the present invention is not confined to FIG. 31 and the associated explanation.

FIG. 31 shows a model structure in the event that the concept of the first non-linear characteristic reproducing apparatus according to the present invention is applied to the whole system. According to the conventional modeling of a non-linearity, an output state quantity such as characteristics and coefficients is controlled by functional values of input state quantity such as an exponent, a logarithm and a square. Consequently, it is difficult to solve a plurality of non-linear physical phenomena through a mathematical model integration. However, the use of this method makes it possible to execute computation regarding characteristic values of the state quantity transformation sections $R_1$, $R_2$ and $R_3$ as being linear, at the moment of execution of the whole system model, since the parameters (characteristics, coefficients and attached load) for producing non-linear physical phenomena are set up through determination of prediction values of the state quantity transformation sections $R_1$, $R_2$ and $R_3$ prior to execution of the computation.

(Explanation of Examples)

6. Geneva Mechanism (1) Basic Function

Figure 32:
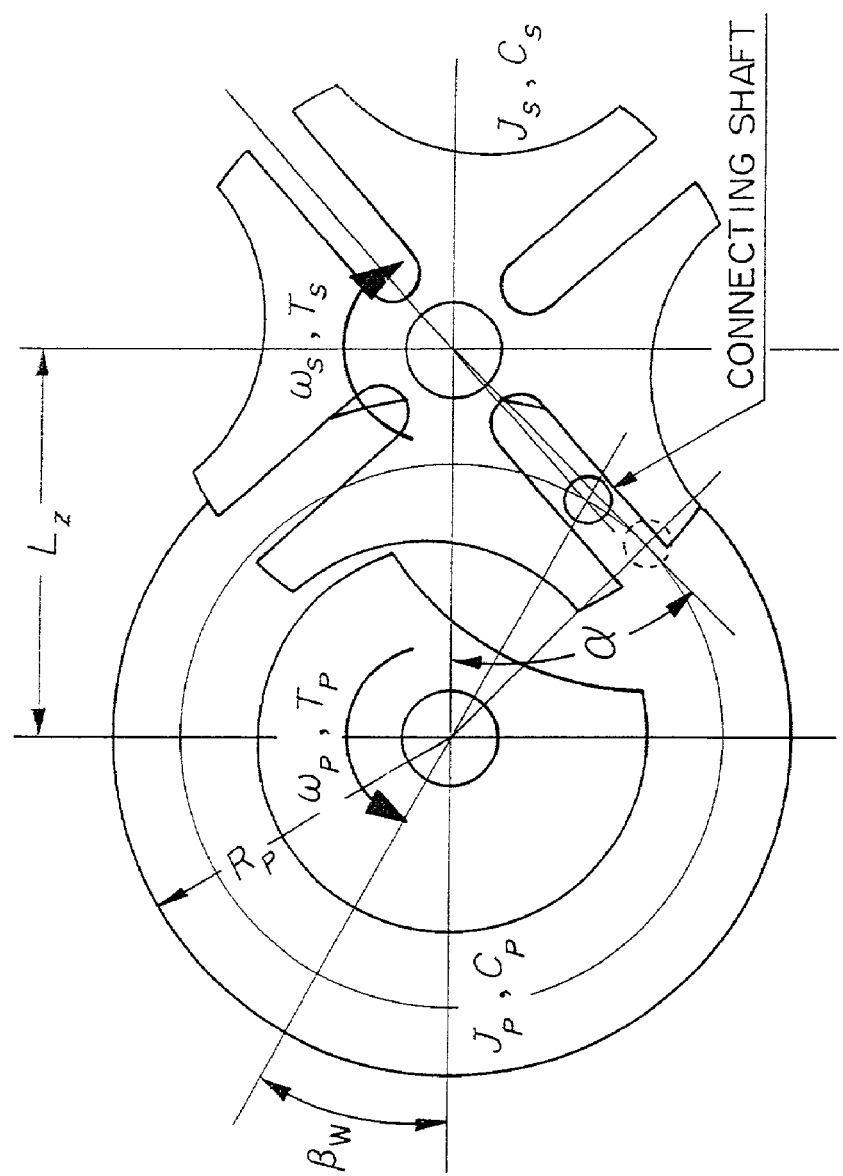
FIG. 32 is a view showing a structural model of the Geneva mechanism.

As one of the mechanical elements to which an oscillating link mechanism is applied, there is a Geneva mechanism for performing a sampling action for a feed controlling device or the like. The Geneva mechanism comprises a master section and a slave section. The master section is associated with a rotational arm of the oscillating link mechanism. The slave section is provided with a groove opening on the circumference side in association with an oscillating arm. A connecting shaft of the master section is engaged with the groove of the slave section so that rotation of the master section causes the slave section to intermittently perform a stop and a rotational motion. FIG. 32 shows the Geneva mechanism.

The Geneva mechanism of FIG. 32 is given with torque $T_p \cdot T_s$ and angular velocity $\omega_p \cdot \omega_s$ on the master section and the slave section, respectively, and is provided with moment of inertia $J_p \cdot J_s$ and coefficient of viscosity resistance $C_p \cdot C_s$ on the master section and the slave section, respectively. In FIG. 32, $L_z$ denotes a distance between the nodes, and $R_p$ denotes a rotational radius of a connecting shaft. In application of the rotational torque $T_p$ to the master section, when a rotational angle $\beta_w$ of the connecting shaft of the master section is placed at the position of a connecting angle—$\alpha$ of the connecting groove of the slave section, both the elements are engaged with one another to drive the slave section. And when the slave section rotates to the connecting angle $2\alpha$, the slave section is disconnected and stopped. In the stopped state, a semicircular shape of cut-out of the slave section and a circular member of the master section are engaged with one another, so that the slave section cannot be rotated. Incidentally, the number of intermittent operations of the slave section to one rotation of the master section is determined by the number N of connecting grooves provided on the slave section.

(2) Functional Model (Geneva Model)

Figure 33:
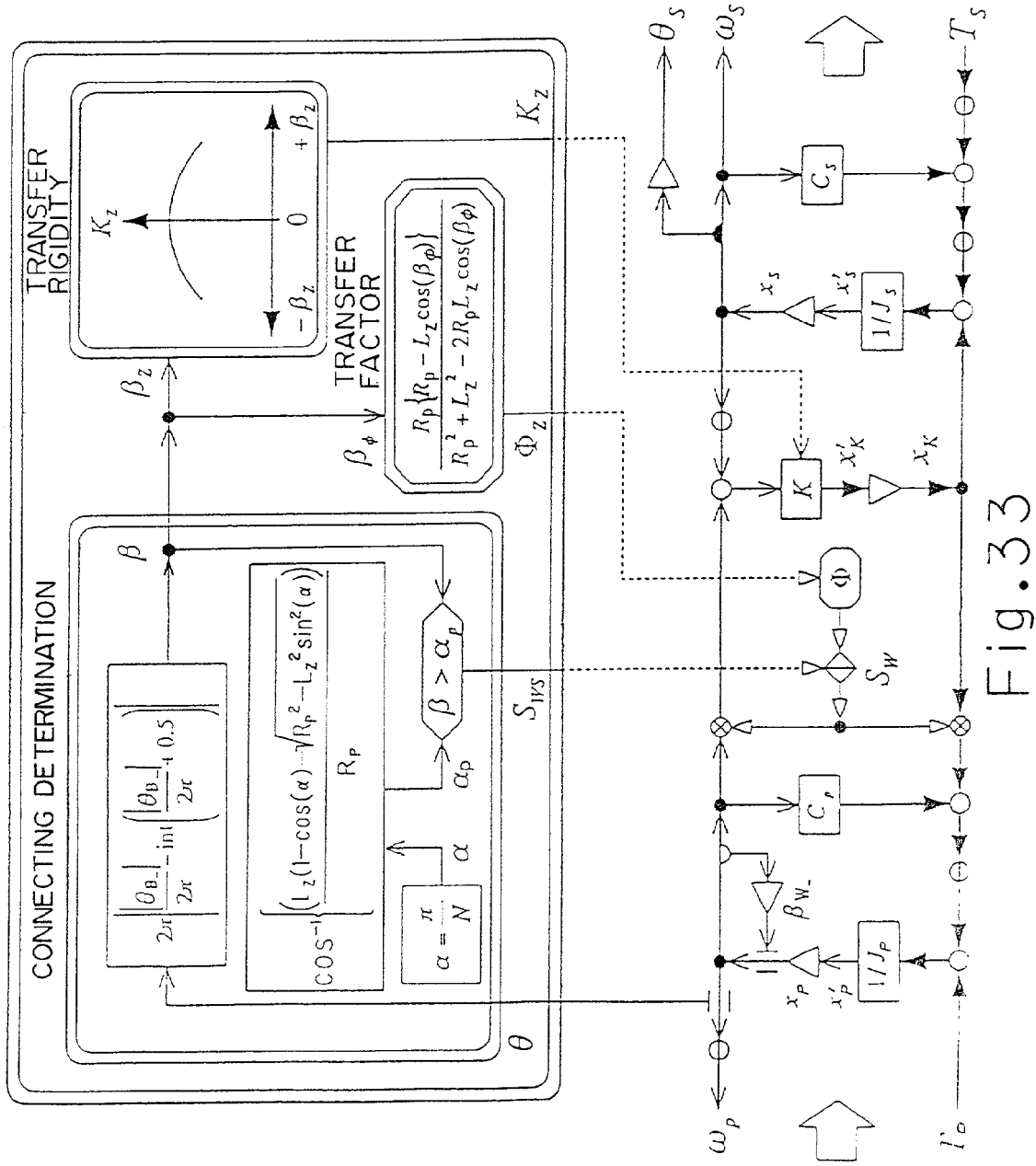
FIG. 33 is a view showing functional and mechanistic models of the Geneva mechanism.

FIG. 33 shows function and mechanistic models in which the structure of FIG. 32 is subjected to modeling. In FIG. 33, $T_p$ and $\omega_p$ denote drive torque and rotational angular velocity of the master section, respectively, $T_s$ and $\omega_s$ denote drive torque and rotational angular velocity of the slave section, respectively, and an observation quantity $\theta_s$ denotes a rotational angle of the slave section. In the functional model of FIG. 33, the master section is provided with moment of inertia $J_p$ and coefficient $C_p$ of viscosity resistance, and the slave section is provided with moment of inertia $J_s$ and coefficient $C_s$ of viscosity resistance. The angular velocity $\omega_p$ of the master section is applied via a transfer factor $\phi$ to the non-linear stiffness K, and then to the slave section through conversion to torque. The torque is returned via the transfer factor $\phi$ to the master section in form of a load torque. The government equation of the functional model of FIG. 33 is expressed by the following equation. In FIG. 33, x denotes an internal state quantity.

$$\begin{bmatrix} 0 \\ 0 \\ 0 \\ 0 \\ \omega_p \\ \omega_S \\ \theta_S \end{bmatrix} = \begin{bmatrix} -J_p & 0 & 0 & 0 & -C_p & -\Phi S_W & 0 & 0 & 1 & 0 \\ 0 & -\frac{1}{K} & 0 & 0 & \Phi S_W & 0 & -1 & 0 & 0 & 0 \\ 0 & 0 & -J_s & 0 & 0 & 1 & -C_s & 0 & 0 & -1 \\ 0 & 0 & 0 & 1 & 0 & 0 & 1 & 0 & 0 & 0 \\ 0 & 0 & 0 & 0 & -1 & 0 & 0 & 0 & 0 & 0 \\ 0 & 0 & 0 & 0 & 0 & 0 & -1 & 0 & 0 & 0 \\ 0 & 0 & 0 & 0 & 0 & 0 & 0 & 1 & 0 & 0 \end{bmatrix} \begin{bmatrix} x'_p \\ x'_K \\ x'_S \\ x'_\theta \\ x_p \\ x_K \\ x_S \\ x_\theta \\ T_p \\ T_S \end{bmatrix} \quad (45)$$

The mechanistic model of FIG. 33 is of a structural non-linearity. Consequently, the rotational angle $\beta_w$ of the master section is determined in form of an estimated observation quantity, and included in an output potential quantity of moment of inertia $J_p$. The rotational angle $\beta_w$ is expressed by the following equation.

$$\beta_{w\_} = \int x_{p\_} dt \quad (46)$$

The coupling condition equation for causing the mechanistic model to be nesting in the functional model is expressed by the following equation.

$$\left.\begin{aligned} \beta_{w\_} &= \theta_{B\_} \\ \Phi_Z &= \Phi \\ K_Z &= K \\ S_{WS} &= S_W \end{aligned}\right\} \quad (47)$$

(3) Mechanistic Model (Intermittent Motion Model)

The mechanistic model incorporated into the model of FIG. 33 includes a function of a coupling condition $S_{ws}$ of determining a rotational angle $\beta_w$ of the master section to decide a connection with the slave section, a function of determining a connecting stiffness $K_z$ in the connection, and a function of determining transfer factor $\phi_z$ between the master section and the slave section. These subordinate mechanisms are subjected to a horizontal expansion in accordance with the following coupling condition equation.

$$\beta = \beta_Z = \beta_{100} \quad (48)$$

(a) Mechanistic Model (Connection Deciding Model)

From the coupling condition equation (47), the estimated rotational angle $\beta_{w\_}$ of eq. (46) is inputted to the mechanistic model in form of the estimated rotational angle $\theta_{B\_}$. The estimated rotational angle $\theta_{B\_}$ is able to be transformed in an angular range of $0\sim 2\pi$ in form of the rotational angle of the slave section. The $\beta$ is inputted into the respective mechanistic models in accordance with eq. (48).

$$\beta = 2\pi \left| \frac{|\theta_{B\_}|}{2\pi} - \text{int}\left(\frac{|\theta_{B\_}|}{2\pi} + 0.5\right) \right| \quad (49)$$

In eq. (49), int (a) denotes a function of cutting off a decimal part of value 'a' and deriving an integer part. In the structure model of FIG. 32, a connection angle $\alpha$ for connection of the slave section to rotation of the master section is determined in accordance with the number N of connecting grooves of the slave section to the connecting shaft of the master section. The equation is as follows.

$$\alpha = \frac{\pi}{N} \quad (50)$$

In eq. (50), The connection angle $\alpha_p$ of the master section to the connection angle $\alpha$ of the slave section can be expressed by the following equation from the geometric structure of FIG. 32.

$$\alpha_p = \cos^{-1}\left\{\frac{L_Z}{R_P}\left(\sin^2(\alpha) + \sqrt{\left(\frac{R_P}{L_Z}\cos(\alpha)\right)^2 - \left(\frac{1}{2}\sin(2\alpha)\right)^2}\right)\right\} \quad (51)$$

In eq. (51), in the event that the rotational angle $\beta$ is within a range $\pm\alpha_p$ a of the connection angle, the master section and the slave section are connected with each other. Consequently, the condition decision $S_{ws}$ of determining the connection state is expressed by the following equation.

if $(\beta > \beta_p)$ then $(S_{WS}=0)$ else $(S_{WS}=1)$ \quad (52)

In eq. (52), $S_{ws}=1$ denotes a connecting state; $S_{ws}=0$ a non-connecting state.

(b) Mechanistic Model (Transfer Factor Model)

Next, the transfer factor $\phi_z$ between the master section and the slave section in the connecting state is associated with the equation of the link mechanism identical with the oscillating mechanism, and thus is determined by a shaft-to-shaft distance $L_z$ of the master section and the slave section, a rotational radius $R_p$ of the connecting shaft of the master section, and the rotational angle $\beta$ of the master section. The mathematical model is expressed by the following equation.

$$\Phi_z = \frac{R_p^2 - R_p L_z \cos(\beta_\phi)}{R_p^2 + L_z^2 - 2R_p L_z \cos(\beta_\phi)} \quad (53)$$

In eq. (53), the transfer factor $\phi_z$ shows that at the time of non-connection the switch variable $S_w$ shown in FIG. 33 becomes 0 so that the master section and the slave section are disconnected from one another.

(c) Mechanistic Model (Transfer Stiffness Model)

The non-linear rigidity K between the master section and the slave section is a combination of stiffness of the master section, stiffness of the slave section and stiffness of the contact. The non-linear stiffness K in connection offers stiffness via the connecting shaft of the master section and the connecting groove of the slave section, and can be represented by a function of the rotational angle $\beta_w$ of the master section. In the non-connection, the non-linear stiffness K offers stiffness of the top of the connecting groove of the slave section, the circular configuration of the master section and the contact point. When stiffness is large, it is possible to deal with the non-linear stiffness K as constant.

(4) Result of Simulation

Figure 34:
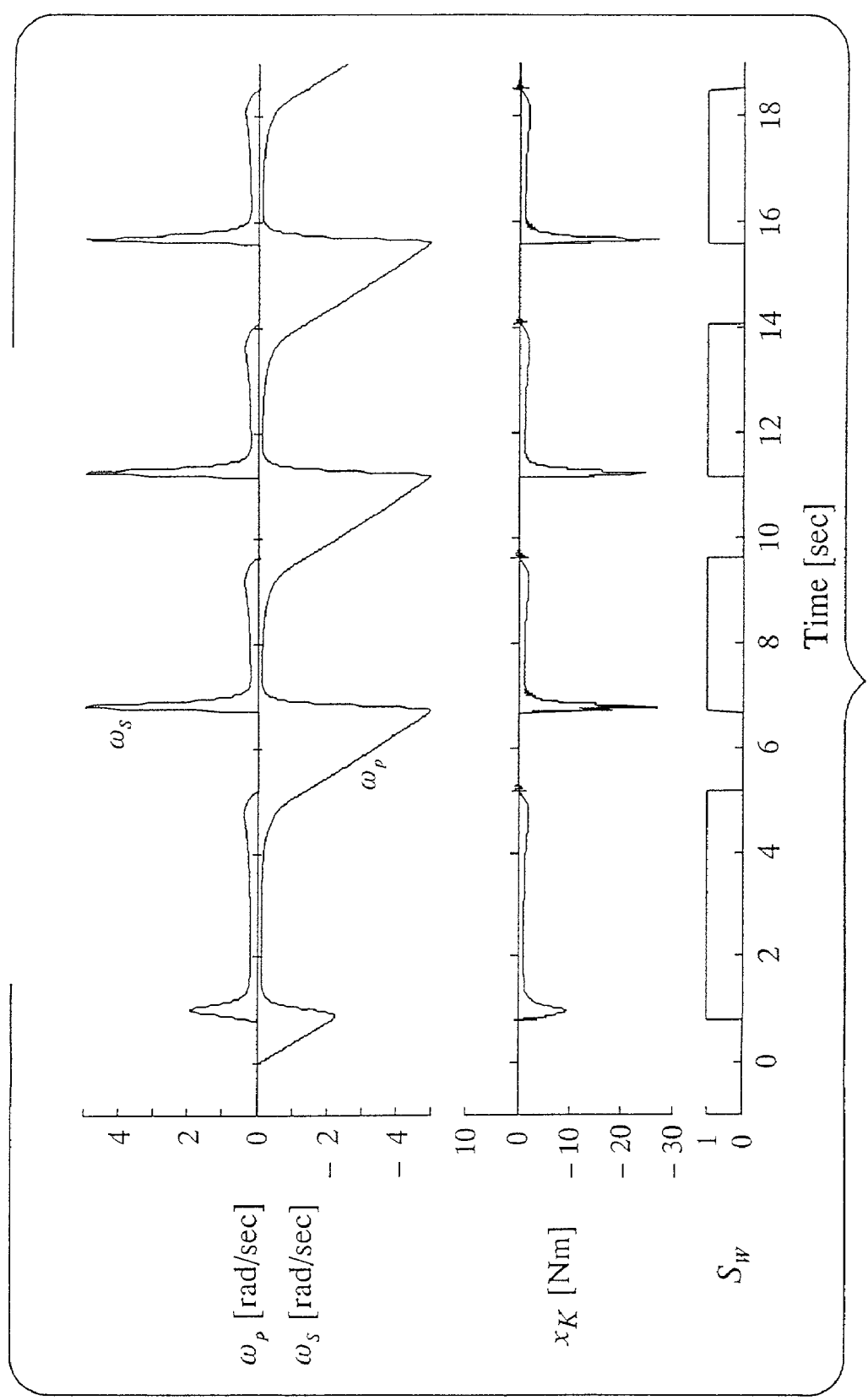
FIG. 34 is a view showing a simulation result (1) of the Geneva mechanism.
Figure 35:
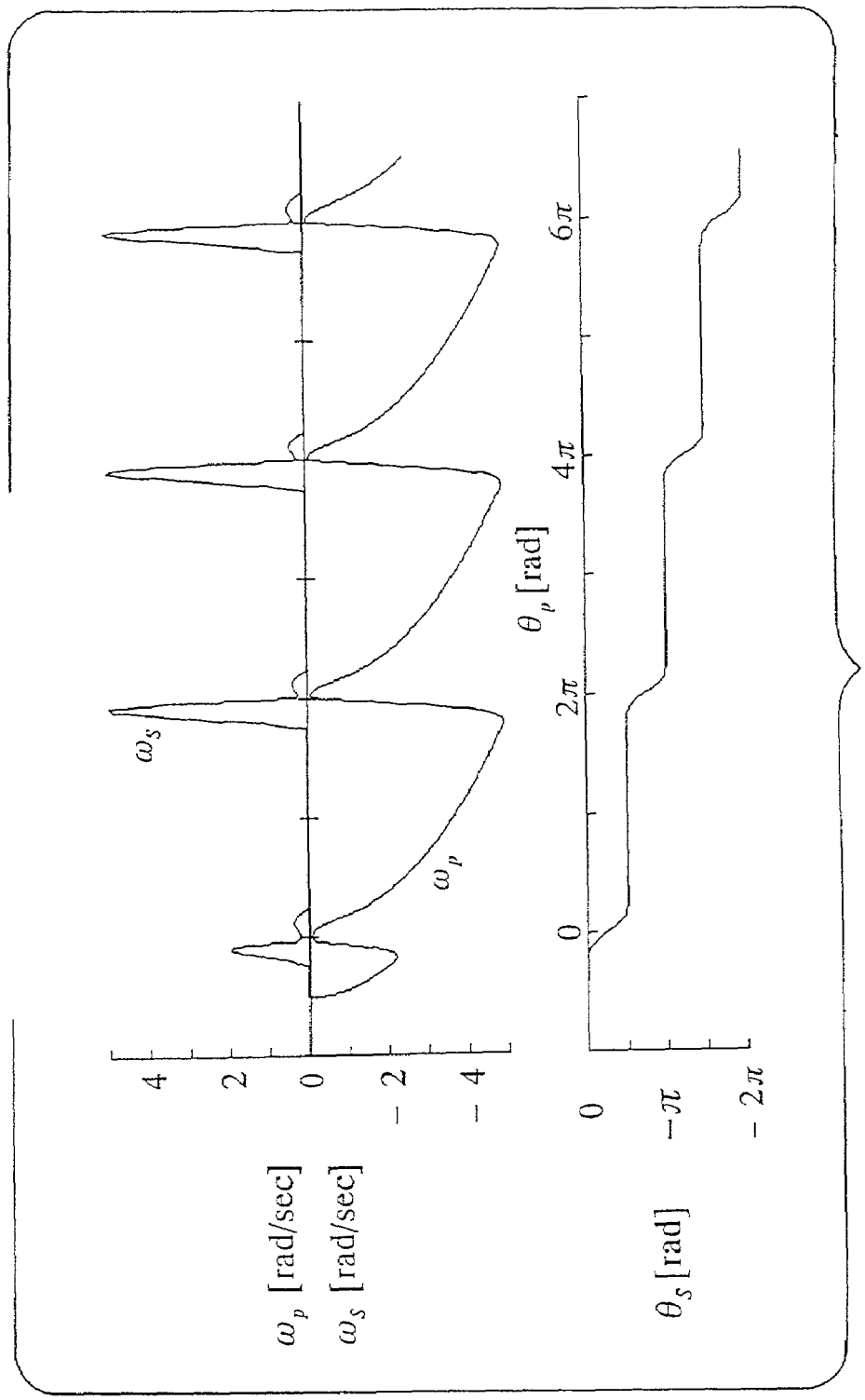
FIG. 35 is a view showing a simulation result (2) of the Geneva mechanism.

FIGS. 34 and 35 show results of a simulation in which the simulation for functional and mechanistic models is performed using characteristics of table 5.

TABLE 5

| | CHARACTERISTIC NAME | SIMBOL | UNIT | CHARACTERISTIC VALUE |
|---|---|---|---|---|
| MASTER SECTION | MOMENT OF INERTIA | $J_p$ | [Kgm$^2$] | 1.0 |
| | COEFFICIENT OF VISCOSITY RESISTANCE | $C_p$ | [Nmsec/rad] | 0.1 |
| | ROTATIONAL RADIUS | $R_p$ | [m] | 0.566 |
| SLAVE SECTION | MOMENT OF INERTIA | $J_s$ | [Kgm$^2$] | 0.2 |
| | COEFFICIENT OF VISCOSITY RESISTANCE | $C_s$ | [Nmsec/rad] | 5.0 |
| | NUMBER OF CONNECTION GROOVE | N | | 4.0 |
| CONNECTION | TRANSFER STIFFNESS AT CONNECTION | $K_z$ | [rad/Nm] | $1.0 \times 10^4$ |
| | SHAFT-TO-SHAFT DISTANCE | $L_z$ | [m] | 0.8 |

In FIG. 34, the result is represented as a time history. In FIG. 35, the horizontal axis represents the rotational angle $\beta_w$ of the master section. In FIG. 34, from the top in turn, $\omega_p$ and $\omega_s$ [red/sec] denote angular velocities of the master section and the slave section, respectively; $x_K$ [Nm] a torque of the non-linear stiffness K; and $S_w$ a condition determination. In FIG. 35, the horizontal axis denotes the rotational angle $\beta_w$ [rad] of the master section. With respect to the vertical axis, at the upper side, $\omega_p$ and $\omega_s$ [red/sec] denote the angular velocity in a similar fashion to FIG. 34, and at the lower side, $\theta_s$ [rad] denotes the rotational angle. The simulation is associated with a result in the event that 2.7 [Nm] is applied to the drive torque $T_p$ of the master section on a step basis, and the load torque $T_s$ is not applied to the slave section.

In FIG. 34, when the connection is established through the switch variable $S_w=1$, the master section drives the slave section, so that the angular velocity $\omega_p$ of the master section is remarkably lowered because the slave section becomes the load. At that time, the angular velocity of the slave section rapidly rises. However, lowering of the master section in the angular velocity involves lowering of the angular velocity $\omega_s$ on the slave section. And the torque $x_K$ of the non-linear stiffness K generates slightly an oscillation owing to an impact of the connection. While the slave section stops on the condition of condition decision $S_w=0$ at the time of the connection termination, a slight oscillation is generated on the torque $x_K$ owing to an impact of the stop.

From FIG. 35, it is understood that the rotational angular $\theta_s$ of the slave section intermittently operates in unit of $\pi/2$ every a rotation ($2\pi$) of the master section, and in the non-connection the rotational angle is maintained.

7. Modeling of a Residue Warning Lamp

According to a complicated system of general products and parts, it is permitted that a slow transient response is regarded as a non-linear in which a stationary characteristic (static characteristic) is slowly changed, and is replaced approximately by a mechanistic model to be incorporated into a linear functional model of a high speed response. As an example, there is raised a residue warning lamp utilizing a contactless switch of a negative characteristic resistance.

(1) Principle of Detection of Liquid Level

Figure 36:
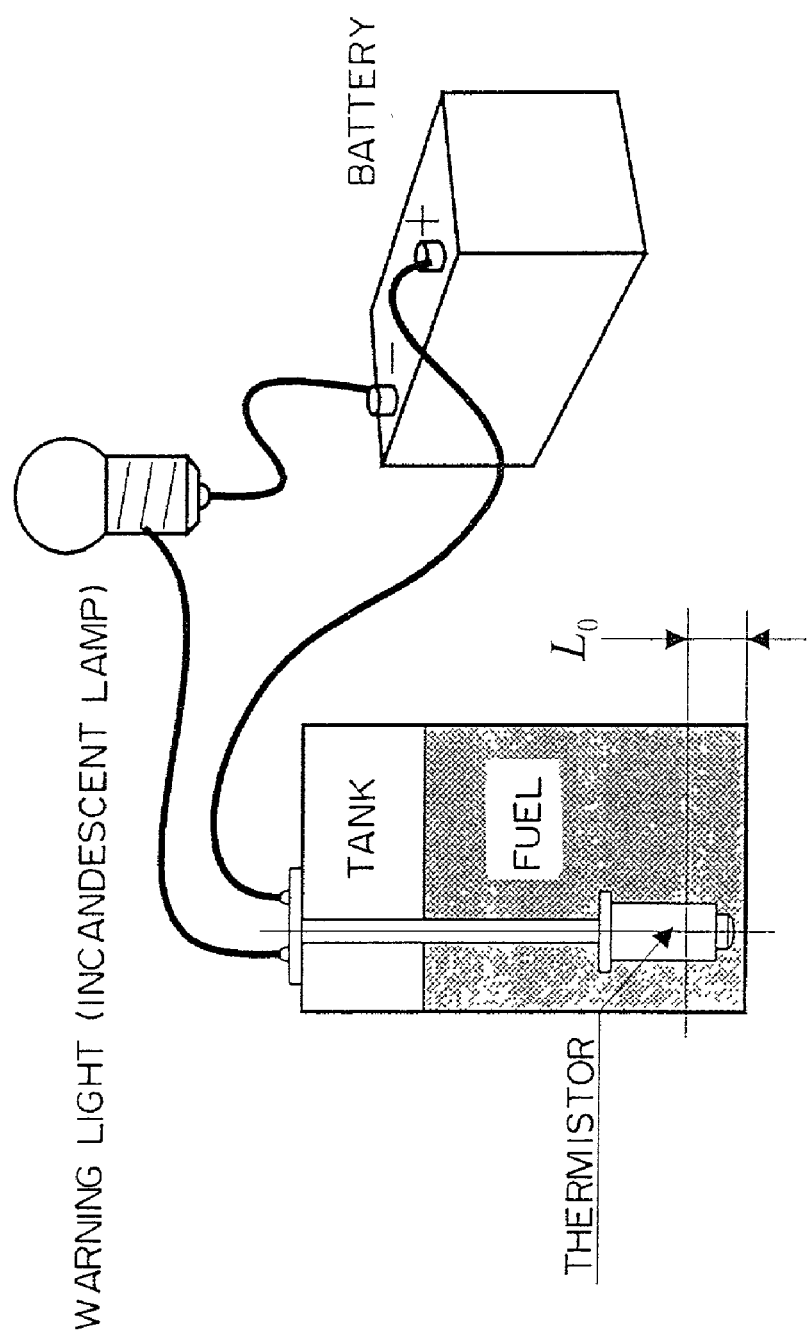
FIG. 36 is an illustration showing a constitution of a residue warning lamp.

FIG. 36 shows a part constitution of a residue warning lamp and its connection. The operation of the residue warning lamp is associated with a very simple system in which when a height of a liquid level in a tank shown in FIG. 36 is above $L_O$, the warning lamp turns off, and when it is below $L_O$, the warning lamp turns on. The used thermistor is a device which varies in a resistance value in accordance with temperature. Such a device is a general non-linear resistance element which is widely used in an electronic circuit and a temperature measurement system. This system is required in a functional aspect of preventing a flicker of the warning lamp due to shaking of a liquid level caused by start and stop of a car and jolting of a car, and an aspect of quality of high reliability along with a low cost. These requirements are satisfied by utilization of the non-linear characteristic of the thermistor.

Figure 37:
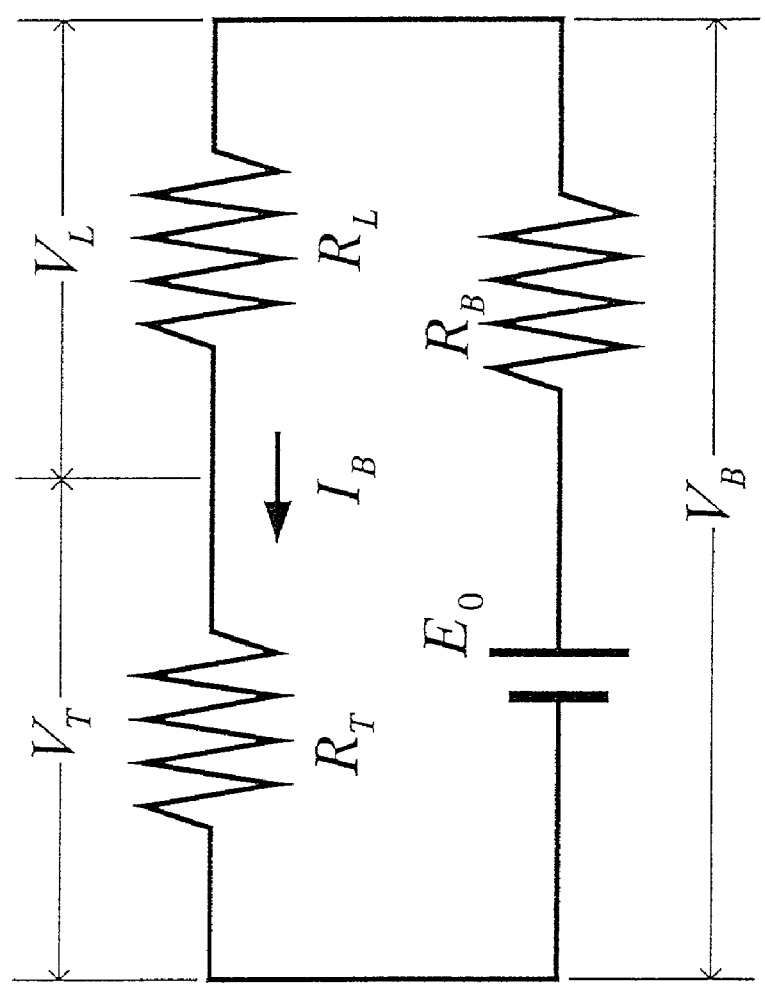
FIG. 37 is a circuit diagram of an electric circuit of a residue warning lamp.

FIG. 37 is a circuit diagram of an electric circuit of a system of the residue warning lamp.

In FIG. 37, $R_B$ denotes an internal resistance of a battery; $E_O$ an internal electromotive force of the battery; $R_L$ a resistance of the warning lamp; and $R_T$ a resistance of the thermistor. These elements are connected in series. With respect to state quantities, $V_B$ denotes a power source voltage; $V_L$ a terminal voltage of the warning lamp; $V_T$ a terminal voltage of the thermistor; and $I_B$ a current common to these three parts.

Figure 38:
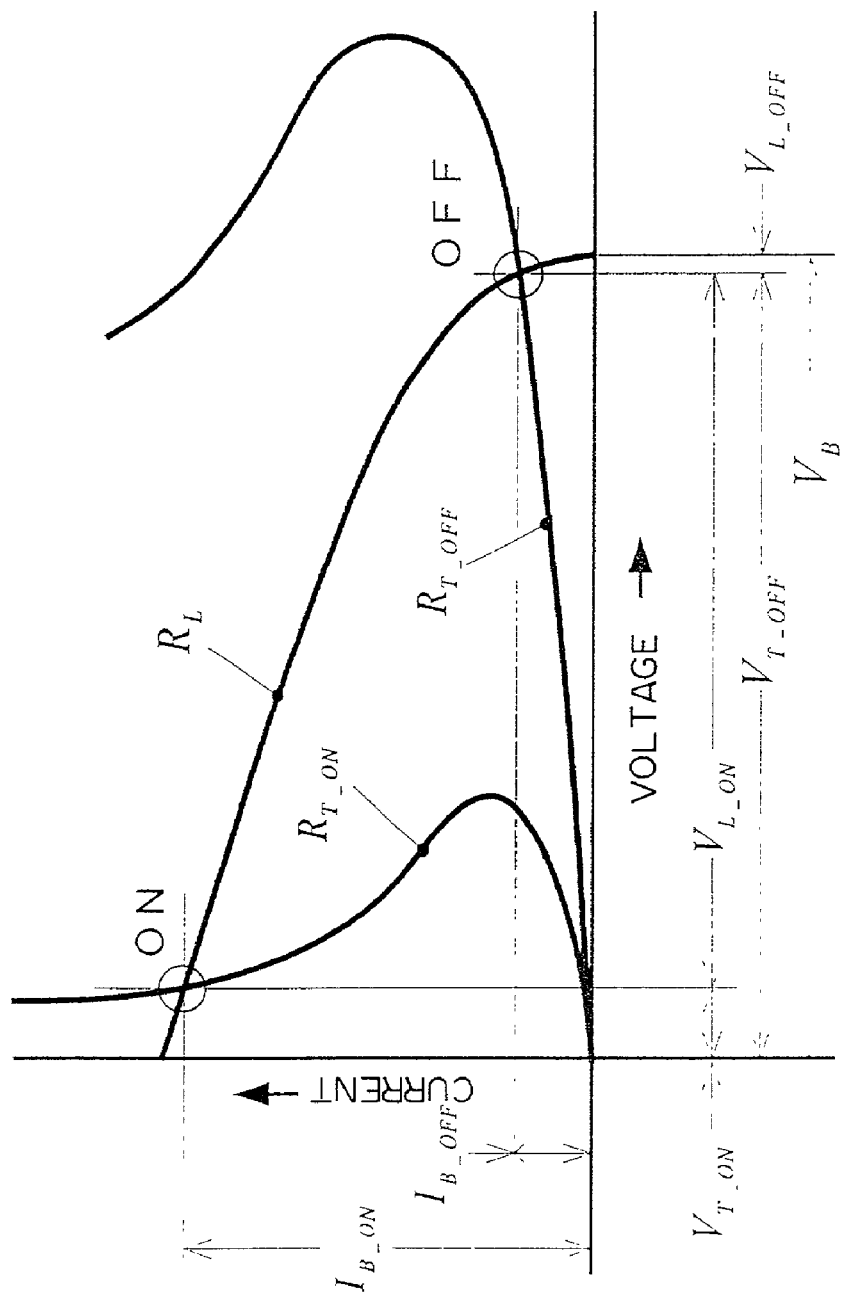
FIG. 38 is a view showing characteristics of a contactless switch to a resistance variation.

Prior to modeling of the residue warning lamp, there will be simply described an operation of a contactless switch in which a thermistor resistance $R_T$ operates a warning lamp resistance $R_L$ of the load. FIG. 38 shows voltage-current characteristics of $R_T$ and $R_L$ and the relation.

In FIG. 38, it is considered that voltage $V_L$ of resistance $R_L$ is a voltage drop from the power supply voltage $V_B$, and there is shown voltage-current characteristics in the opposite direction in which the original point is shifted to point $V_B$ on the voltage axis. A cross point of $R_T$ and $R_L$ offers current $I_B$ conducting in the circuit. The left side of the cross point represents a voltage $V_T$ to be applied to the thermistor, and the right side to $V_B$ represents a voltage $V_L$ to be applied to the warning lamp. The thermistor resistance $R_T$ has a resistance characteristic that it is larger at a low temperature and smaller at a high temperature. Thus, the thermistor serves as a switch wherein the cross point of $R_{T\_OFF}$, which is larger in resistance value, offers an off-state, and the cross point of $R_{T\_ON}$, which is smaller in resistance value, offers an on-state. Both the resistors are connected in series with one another. Thus, in the off-state, the current $I_{B\_OFF}$ denotes a leakage current; $V_{T\_}$OFF a cut-off voltage by the thermistor; and $V_{L\_OFF}$ a turn-off voltage of the warning lamp. In a similar fashion, in the on-state, a current $I_{B\_ON}$ denotes a turn-on current; V T_ON a voltage drop of the thermistor; and $V_{L\_}$ON a turn-on voltage of the warning lamp.

In the thermistor, as shown in FIG. 37, a current $I_B$ always conducts through the warning lamp, so that consumed power $W_T$ of $V_T I_B$ or $I_B^2 R_T$ causes a self-heat generation to occur.

This involves a temperature rise. In the event that the liquid level is high, the thermistor is in liquid, and thus the generated heat is cooled by the surrounding liquid, so that the thermistor resistance $R_T$ becomes large and thereby offering the off-state in which a circuit current $I_B$ is small. When the liquid level is lowered, so that the thermistor appears, the thermistor is not cooled. Accordingly, the temperature rises, so that the thermistor resistance $R_T$ is lowered. Thus, an increment of the circuit current $I_B$ causes the consumed power $W_T$ to be increased to generate a heat. Further, lowering of $R_T$ causes an increment of $I_B$ whereby a thermal runaway occurs. In the thermal runaway, owing to the suppression of the circuit current $I_B$ by the resistance $R_L$ of the warning lamp, the terminal voltage $V_T$ of the thermistor becomes smaller according to transition to the on-state, so that the consumed power $W_T$ is lowered and whereby the on-state is maintained at the balancing point of self-heat generation and heat radiation of the thermistor. Here, the resistance $R_L$ of the warning lamp has a non-linearity of the positive characteristic that when the voltage is low, the resistance is small, and when the voltage is high, the resistance is large, contrary to the thermistor as shown in FIG. 38. In the residue warning lamp, the non-linearity of both the static characteristic and the negative characteristic is utilized to implement the off-state in which a leakage current is less and the on-state in which a voltage drop is less. With respect to the flicker of the display as mentioned above, the flicker is prevented by utilizing the response delay to the temperature of the thermistor transiting between ON/OFF.

(2) Functional Model

Figure 39:
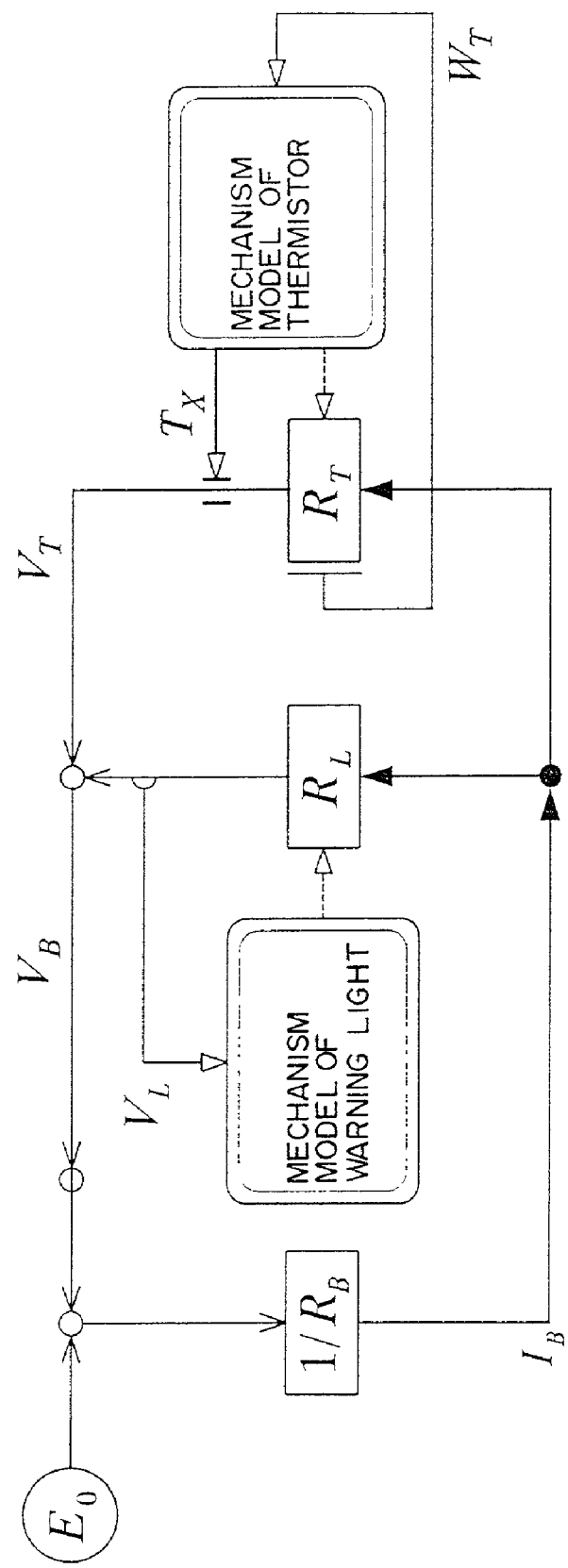
FIG. 39 is a view showing a functional model of a residue warning lamp.

FIG. 39 shows a functional model in which the above-mentioned contents are rearranged to implement a device modeling and a mechanistic model is incorporated.

In FIG. 39, a battery is a current supply for supplying a current through an internal resistance $R_B$ in accordance with a difference between a source voltage $E_0$ and a terminal voltage $V_B$. A resistance $R_L$ of the warning lamp has a mechanism depending on a voltage, and a thermistor resistance $R_T$ has a mechanism depending on a consumed power. The temperature rise $T_x$ due to the self-heat generation is included in the output potential quantity of the thermistor. Details of the respective mechanistic models will be described later.

A mathematical model is derived from FIG. 39 as follows.

The mathematical model of the battery is expressed by the following equation.

$$I_B = \frac{1}{R_B}(E_0 - V_B) \quad (54)$$

The respective terminal voltages of a series circuit for the warning lamp and the thermistor is expressed by the following equation.

$$V_B = (R_L + R_T) I_B \quad (55)$$

$$\left. \begin{array}{l} V_T = R_T I_B \\ V_L = R_L I_B \end{array} \right\} \quad (56)$$

A result of substitution of eqs. (54), (55) and (56) for one another and rearrangement is as follows.

$$I_B = \frac{1}{R_B + R_L + R_T} E_0 \quad (57)$$

$$\left. \begin{array}{l} V_T = \dfrac{R_T}{R_B + R_L + R_T} E_0 \\ V_L = \dfrac{R_L}{R_B + R_L + R_T} E_0 \end{array} \right\} \quad (58)$$

From eqs. (57) and (58), the government equation of the residue warning lamp is expressed by the following equation.

$$\begin{bmatrix} I_B \\ V_T \\ V_L \end{bmatrix} = \begin{bmatrix} G_0 E_0 \\ R_T G_0 E_0 \\ R_L G_0 E_0 \end{bmatrix} [1] \quad (59)$$

where $G_0$ denotes a overall conductance of the whole system expressed by the following equation.

$$G_0 = \frac{1}{R_b + R_T + R_L} \quad (60)$$

Equation (59) is a stationary characteristic constituted of an observation equation having no state equation and input/output equation.

(3) Mechanistic Model (a) Mechanistic Model of a Warning Lamp

As the warning lamp, there is used an automotive incandescent lamp where rated voltage is 12 [V] and rated power is 1.4 [W]. Table 6 shows specifications.

TABLE 6 specification of warning lamp

| characteristic name | symbol | unit | characteristic value |
|---|---|---|---|
| warning lamp: | | | |
| power | $W_L$ | [W] | 1.4 |
| voltage | $V_L$ | [V] | 14.0 |
| current | $I_B$ | [A] | 0.1 ± 0.01 |
| flux of light | $\Phi_L$ | [lm] | 90.4 |
| size: | | | |
| length | L | [mm] | 19.5 |
| width | W | [mm] | 11.3 |
| height | H | [mm] | 11.0 |

It is known that voltage-current characteristic is expressed by the following equation.

$$\frac{I_B}{I_S} = \left(\frac{V_L}{V_S}\right)^n \quad (61)$$

In eq. (61), $V_S$ denotes a reference voltage to set up characteristics, $I_S$ denotes a reference current in the reference voltage $V_S$. From eq. (61), a non-linear resistance of warning and the like can be introduced as follows.

$$\frac{I_B}{I_S} = \frac{V_L}{V_S}\left(\frac{V_L}{V_S}\right)^{n-1} \quad (62)$$

A non-linear resistance, in which eq. (62) is rearranged in accordance with Ohm's law, is expressed by the following equation.

$$R_L = R_S\left(\frac{V_S}{V_L}\right)^{n-1} \quad (63)$$

Where $R_S$ denotes a reference resistance in the reference voltage $V_S$, and is expressed by the following equation.

$$R_S = \frac{V_S}{I_S} \quad (64)$$

Figure 40:
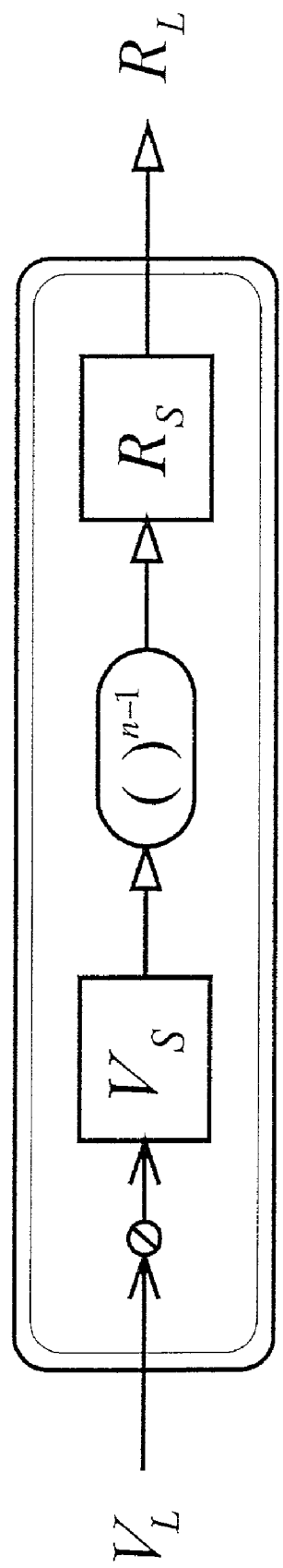
FIG. 40 is a view showing a functional model of a residue warning lamp.

FIG. 40 shows a mechanical resistance of a non-linear resistance $R_L$ of eq. (64).

Figure 41:
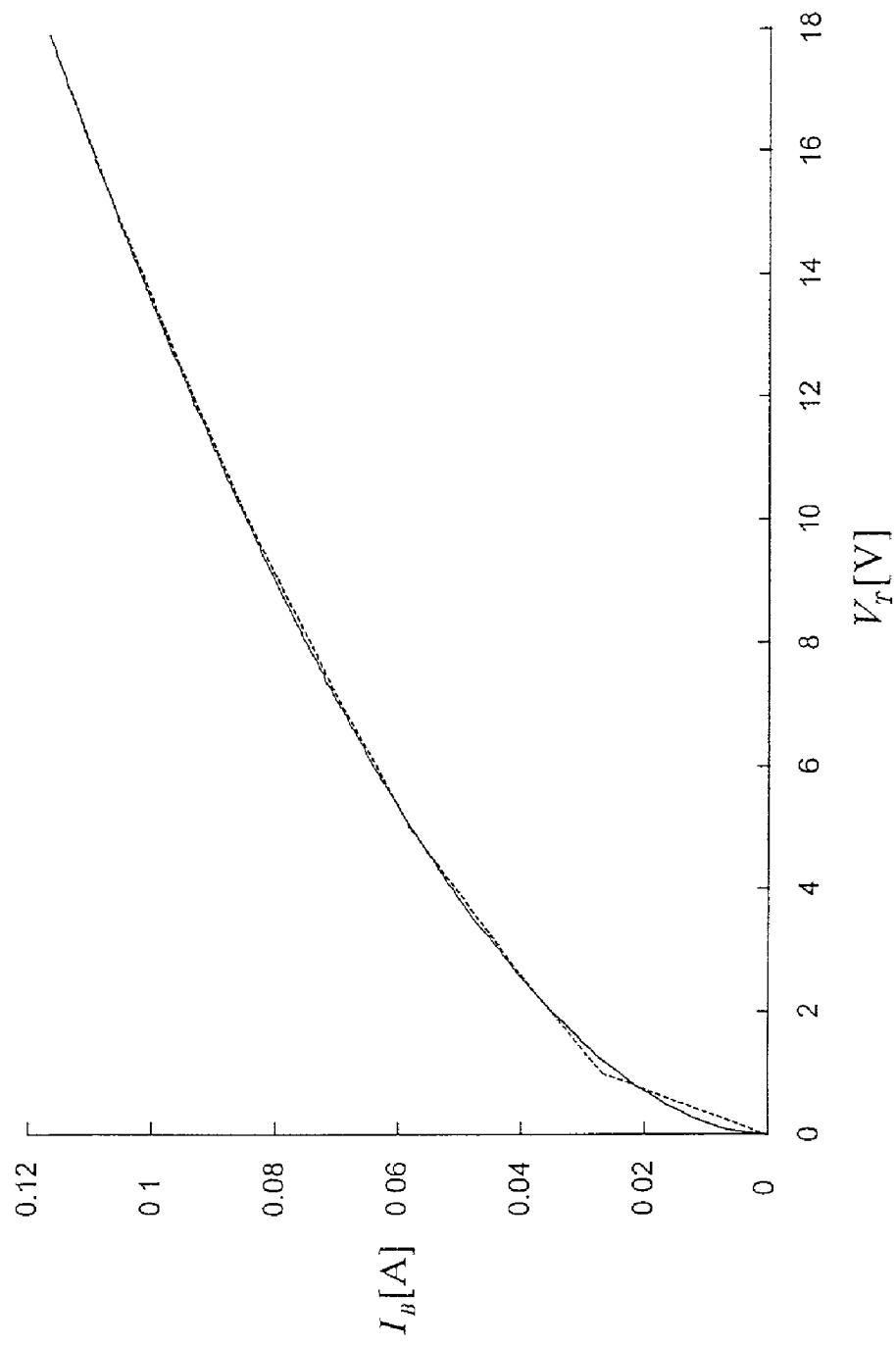
FIG. 41 is a view showing voltage-current characteristic model of a warning lamp.

Now let us determine the resistance $R_L$ Of the warning lamp and the multiplier factor n from eq. (63) and the measured values of the voltage and the current, respectively. FIG. 41 shows a result of measurement where a dot line denotes measured values, and a solid line denotes a computed value. From this result, the multiplier factor n determined by least squares method is n≈0.55, and the reference current, where the reference voltage $V_S$=14 [V], is $I_S$=0.102 [A].

(b) Mechanistic Model of Negative Characteristic Resistance Element

Figure 43:
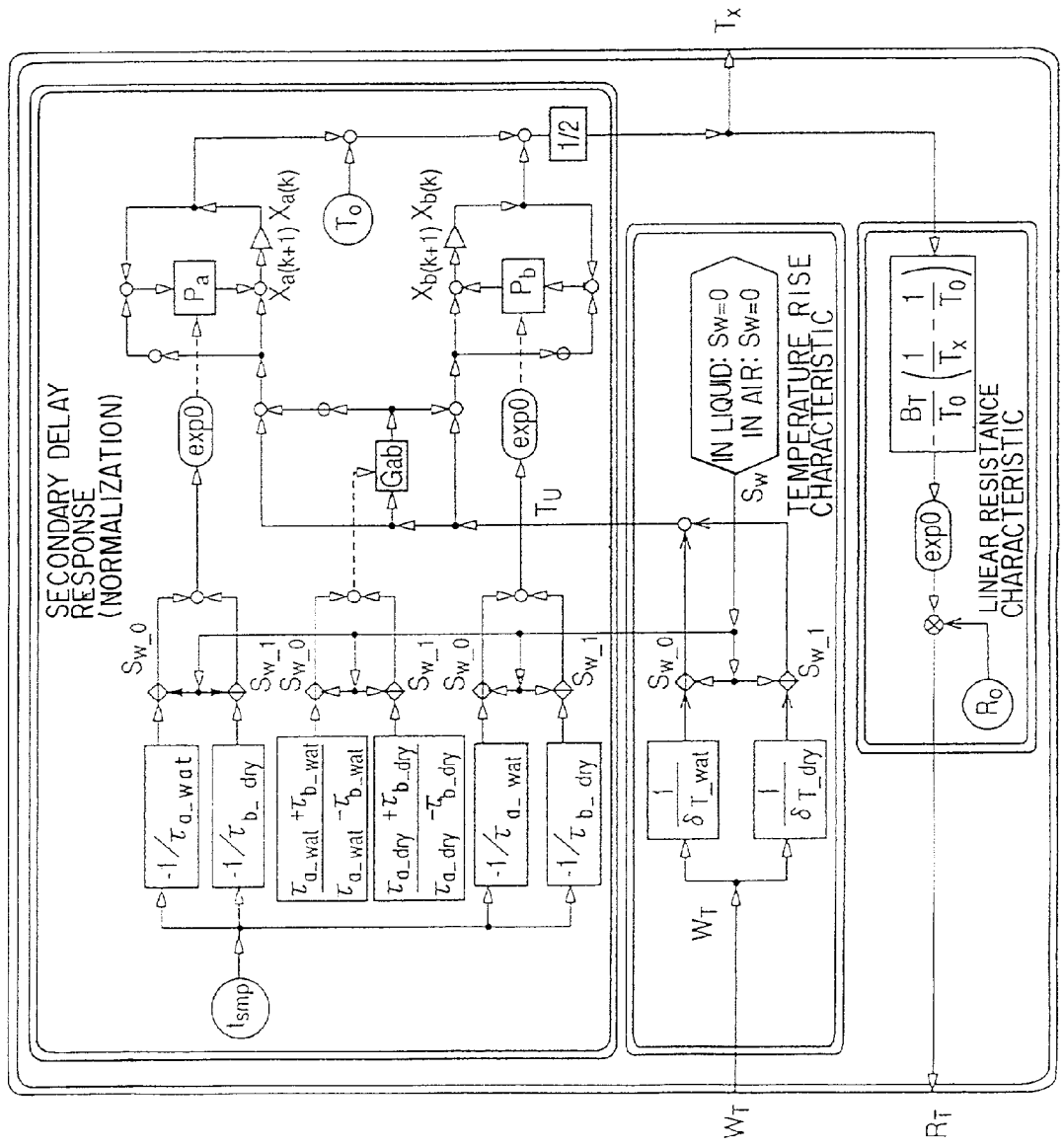
FIG. 43 is a view showing a mechanistic model of a thermistor.

FIG. 42 is a perspective view of a thermistor. FIG. 43 is a view showing a mechanistic model of the thermistor.

The thermistor shown in FIG. 42 is housed in a cylindrical metallic case having three apertures through which liquid flows.

In FIG. 43, a necessary mathematical model is introduced from the characteristic equation to implement modeling. The non-linear resistance characteristic of the thermistor is expressed by the following equation depending on a temperature.

$$R_T = R_0 \exp\left(B_T\left(\frac{1}{T_X} - \frac{1}{T_0}\right)\right) \quad (65)$$

In eq. (65), $T_0$ denotes a reference temperature; $B_T$ a B constant to determine a thermistor characteristic; $R_0$ a reference resistance in the reference temperature $T_0$; and $T_x$ a used temperature.

The rising temperature $T_U$ due to the self-heat generation of the thermistor is expressed by the following equation with heat dissipation factor $\delta_T$ and consumed power $W_T$.

$$T_U = \frac{W_T}{\delta_T} + T_0 \quad (66)$$

From the functional model of FIG. 39, the consumed power $W_T$ of the thermistor is expressed by the following equation.

$$W_T = I_B V_T \quad (67)$$
$$= I_B^2 R_T$$

While it is possible to determine a resistance value $R_T$ from the temperature rise due to the consumed power $W_T$ of the thermistor in accordance with eqs. (65) (66) and (67), these equations are of a stationary state after the temperature rise. For this reason, from the heat time constant (a dry state) of the thermistor, established is modeling of the response characteristic associated with the situation that the thermistor moves in liquid near the practical use state and in the air. This state is concerned with two conditions one of which is a state wherein the thermistor is dried from the wet, and another is the opposite state. In view of this situation, a transient model of the secondary delay is applied considering delay of rising up. As an equation of the secondary delay, the following discrete equation, which is normalized in range of 0–1 in a similar fashion to that of the temperature rise model as aforementioned, is used.

$$\begin{aligned} X_{a(k+1)} &= P_a X_{a(k)} + (1 - P_a)\frac{1 - G_{ab}}{2}T_{U(k)} \\ X_{b(k+1)} &= P_b X_{b(k)} + (1 - P_b)\frac{1 + G_{ab}}{2}T_{U(k)} \\ T_{x(k)} &= X_{a(k)} + X_{b(k)} \end{aligned} \quad (68)$$

Equation (68) is a secondary response characteristic equation in which two primary delay of discrete equations interfere with one another. In eq. (68), $P_a \cdot P_b$ denote discrete system inherent values having values of the range of 0~1, and $G_{ab}$ denotes a factor of distributing two primary delay of inputs. Equation is as follows.

$$\begin{aligned} P_a &= \exp\{-t_{smp}/\tau_a\} \\ P_b &= \exp\{-t_{smp}/\tau_a\} \\ G_{ab} &= \frac{\tau_a + \tau_b}{\tau_a - \tau_b} \end{aligned} \quad (69)$$

In eq. (69), t sap denotes a sampling period, and $\tau_a$ and $\tau_b$ denote a time constant.

Between a case where the thermistor is picked up from liquid to the air and a case where the thermistor is entered from the air into liquid, the heat radiation is different owing to the difference in the way of wetness, and thus, of course, also the response characteristic is different. In view of the foregoing, $\delta_T$ of eq. (66) and $\tau_a$, $\tau_b$ of eq. (69) are changed over between the liquid and the air. A switch element for selecting between the two states is denoted by $S_W$. $\delta_T$, $\tau_a$, and $\tau_b$, wherein the liquid and the air are identified by wat and dry of a subscript suffix, respectively, are expressed by the following equation.

$$\left.\begin{array}{l}\tau_a = \tau_{a\_wat}S_{W\_0} + \tau_{a\_dry}S_{W\_1} \\ \tau_b = \tau_{b\_wat}S_{W\_0} + \tau_{b\_dry}S_{W\_1} \\ \delta_T = \delta_{T\_wat}S_{W\_0} + \delta_{T\_dry}S_{W\_1}\end{array}\right\} \quad (70)$$

In the switch element of eq. (70), the liquid is denoted by $S_{W\_0}=1$ and $S_{W\_1}=0$, and the air is denoted by $S_{W\_0}=0$ and $S_{W\_1}=1$.

(4) Result of Simulation

Figure 44:
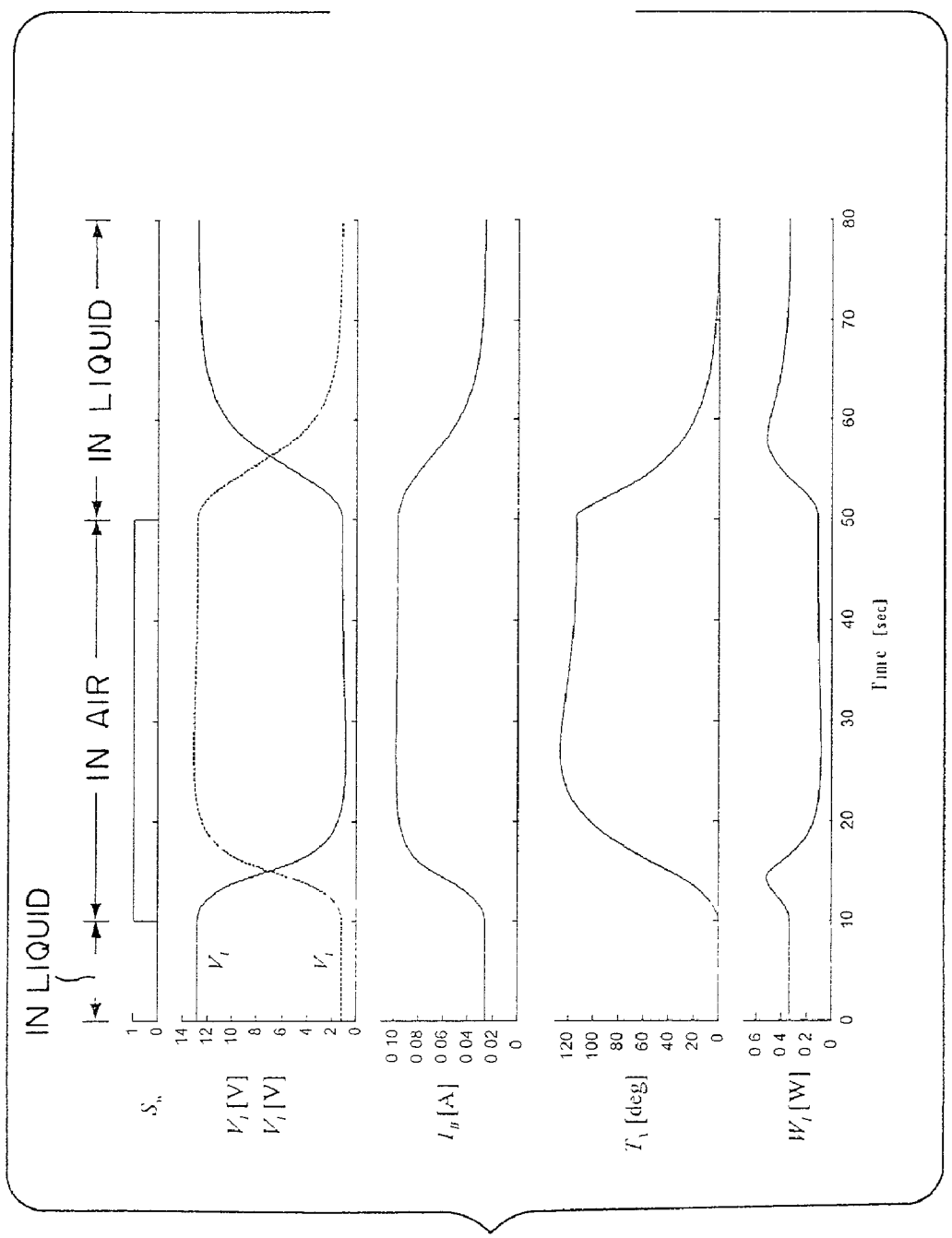
FIG. 44 is a view showing step response characteristics of a residue warning lamp.
Figure 45:
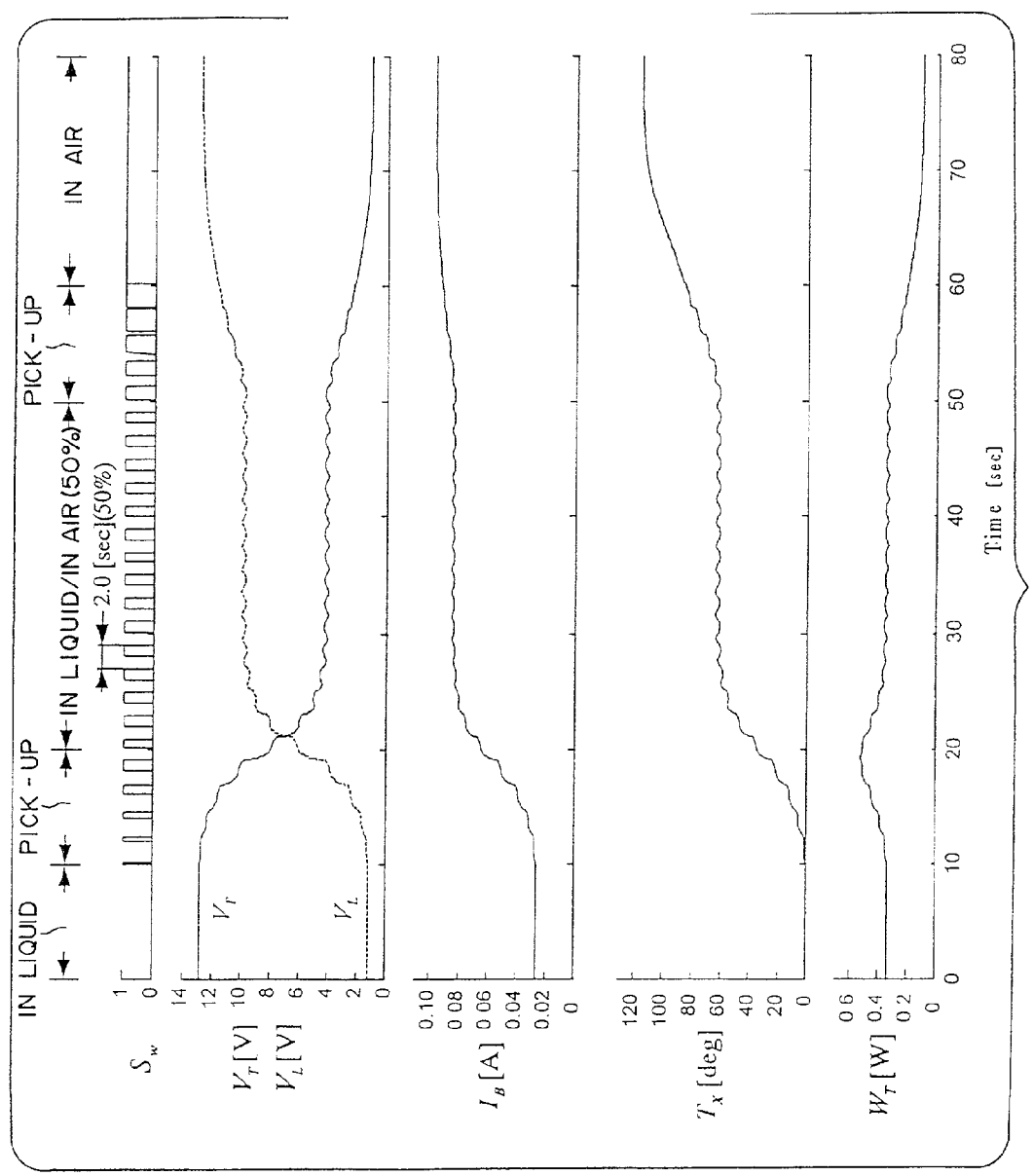
FIG. 45 is a view showing response characteristics of a liquid level oscillation.

A simulation of a residue warning lamp is performed in such a manner that the characteristic values of table 7 are applied to equation of the functional and mechanistic model. FIGS. 44 and 45 show the result of such a simulation.

TABLE 7

CHARACTERISTIC VALUE OF RESIDUAL QUANTITY WARNING LIGHT

| | CHARACTERISTIC NAME | SIMBOL | UNIT | CHARACTERISTIC VALUE |
|---|---|---|---|---|
| WARNING | REFERENCE VOLTAGE | $V_s$ | [V] | 14.0 |
| LIGHT | REFERENCE CURRENT | $I_s$ | [A] | 0.102 |
| | NON-LINEAR FACTOR | n | | 0.55 |
| THIRMISTOR | REFERENCE TEMPERATURE | $T_0$ | [K] | 298.0 |
| | REFERENCE RESISTANCE | $R_0$ | [$\Omega$] | 500.0 |
| | B-CONSTANT | $B_T$ | [K] | 4000.0 |
| | COEFFICIENT OF HEAT RADIATION (LIQUID) | $\delta_{T\_wa}$ | [W/deg] | 1.1 |
| | COEFFICIENT OF HEAT RADIATION (AIR) | $\delta_{T\_dry}$ | [W/deg] | 0.001 |
| | TIME CONSTANT (a) | $\tau_{a\text{-wat}}$ | [sec] | 20.0 |
| | TIME CONSTANT (b) | $\tau_{b\text{-wat}}$ | [sec] | 4.0 |
| | TIME CONSTANT (a) | $\tau_{a\text{-dry}}$ | [sec] | 5.0 |
| | TIME CONSTANT (b) | $\tau_{b\text{-dry}}$ | [sec] | 0.8 |
| BATTERY | SOURCE VOLTAGE | $E_0$ | [V] | 14.0 |
| | INTERNAL RESISTANCE | $R_B$ | [$\Omega$] | 0.001 |

FIG. 44 is a view showing a step response in the event that the thermistor is put into the liquid and is picked up therefrom into the air. In FIG. 44, from the top in order, $S_W$ denotes a condition determination; $V_T \cdot V_L$ terminal voltages of the thermistor and warning lamp; $I_B$ a circuit current; and $T_X \cdot W_T$ temperature and consumed power of the thermistor.

FIG. 45 shows a response result of a reproduction wherein the thermistor is covered by liquid at a period of 2 [sec] owing to a vibration of the liquid level, which is expressed on a similar basis to FIG. 44. In FIG. 45, a time ratio of the dry in one period is varied at 0[%]~50[%]~100[%] and, it is continued by 30 [sec] in case of 50[%].

Figure 46:
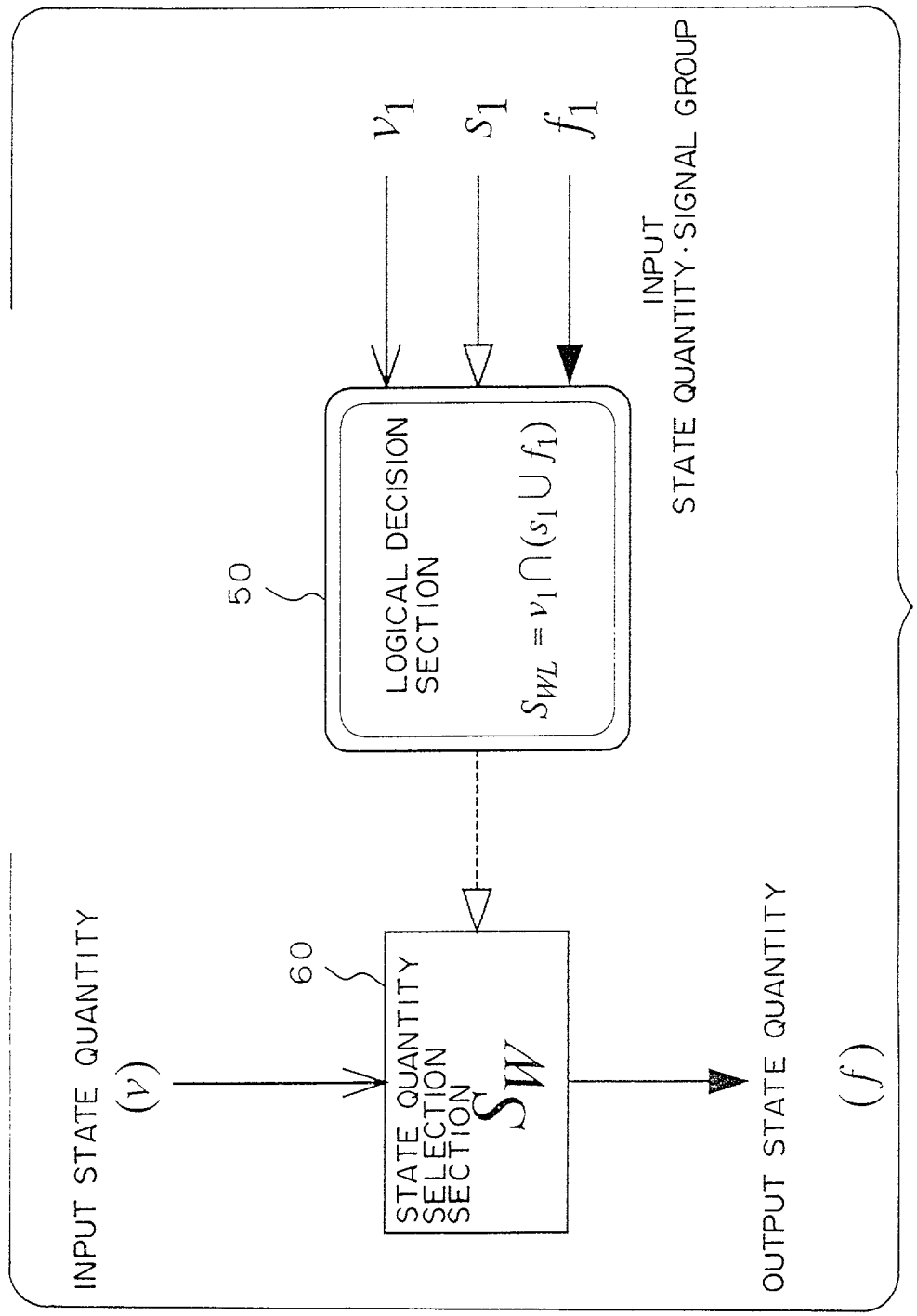
FIG. 46 is a principle explanatory view of a third non-linear characteristic reproducing apparatus according to an embodiment of the present invention.

FIG. 46 is a principle explanatory view of a third non-linear characteristic reproducing apparatus according to an embodiment of the present invention. FIG. 46 is a view for easily understanding the principle of the third non-linear characteristic reproducing apparatus according to the present invention, and thus the third non-linear characteristic reproducing apparatus according to the present invention is not confined to FIG. 46 and the associated explanation.

The apparatus of FIG. 46 comprises a state quantity selecting section (switch element) $S_W$ for performing connection and disconnection of a state quantity between input state quantity and output state quantity of the same physical quantity, and a logical decision section for generating a signal to disconnect the state quantity selecting section. The state quantity selecting section is given by a linear mathematical model represented by $f=S_W v$. A non-linear logical value $S_{WL}$ Of 0 or 1 from the logical decision section is substituted for $S_W$ of this equation. The logical decision section receives an estimated observation quantity of the subsequent sampling time in form of a state quantity to be decided, and generates a logical value to decide the next model state. Substitution of the logical value for the switch element $S_W$ of the state selection section causes the output state quantity to offer $f=0$ when the logical value is 0, and $f=v$ when the logical value is 1.

In the logical decision section of FIG. 46, $\cup$ denotes an OR logical operator, $\cap$ denotes an AND logical operator. Consequently, according to the logical expression of the logical decision section, when it is assumed that the logical 1 is given for the state quantities $v_1$ and $f_1$ being 0 or more, and the logical 0 for others, and $S_1$ is logical values 0 or 1, the logical value 1 is generated, when $S_1$ or $f_1$ is 1 and $v_1$ is 1, so that output state quantity f and input state quantity v of the state quantity selection section are connected with one another.

(Explanation of Example)

8. Example of modeling for back-lash or bottom projection

Figure 47:
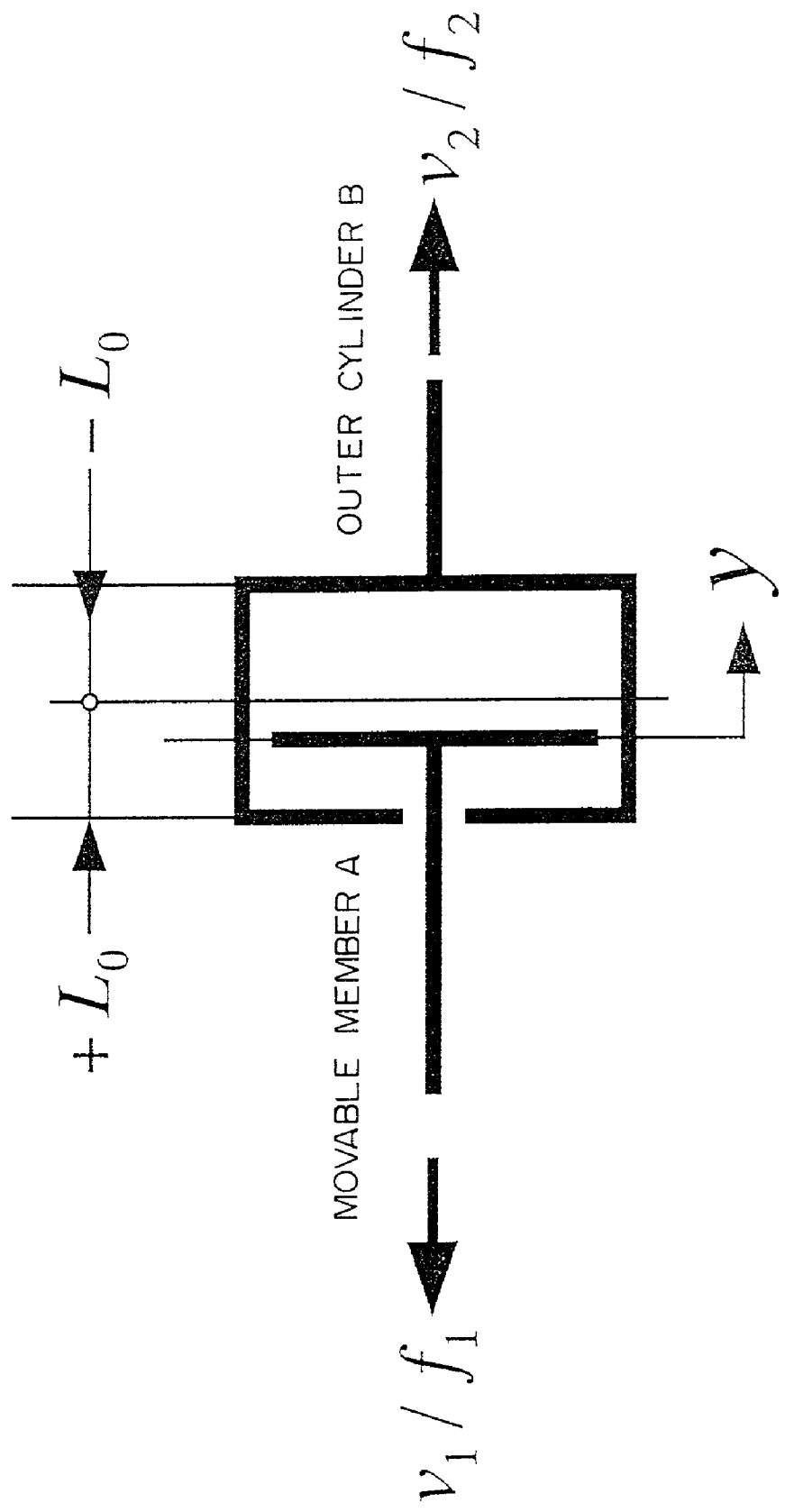
FIG. 47 is a view showing a structural model of a back-lash.

FIG. 47 is a view showing a typical structural model of a back-lash. FIG. 47 shows an example in which a movable member A having a range of $\pm L_0$ is incorporated into an outer cylinder B. Energy by velocity $v_1$ and force $f_1$ is applied to the movable member A. Likely velocity $v_2$ and force $f_2$ are applied to the outer cylinder B. Incidentally, y in FIG. 47 denotes a relative position of the movable member A wherein the center of the outer cylinder B is defined as 0.

According to the structural model in FIG. 47, at the range of $\pm L_0$ for the movable member A, the movable member A and the outer cylinder B operate independently of one another, and in exceeding the range of $\pm L_0$, both the movable member A and the outer cylinder B are united and operate as a rigid body. Consequently, it is considered that the back-lash (bottom projection) is associated with a basic function in connection and disconnection by a stiffness in which both the movable member A and the outer cylinder B are united.

Figure 48:
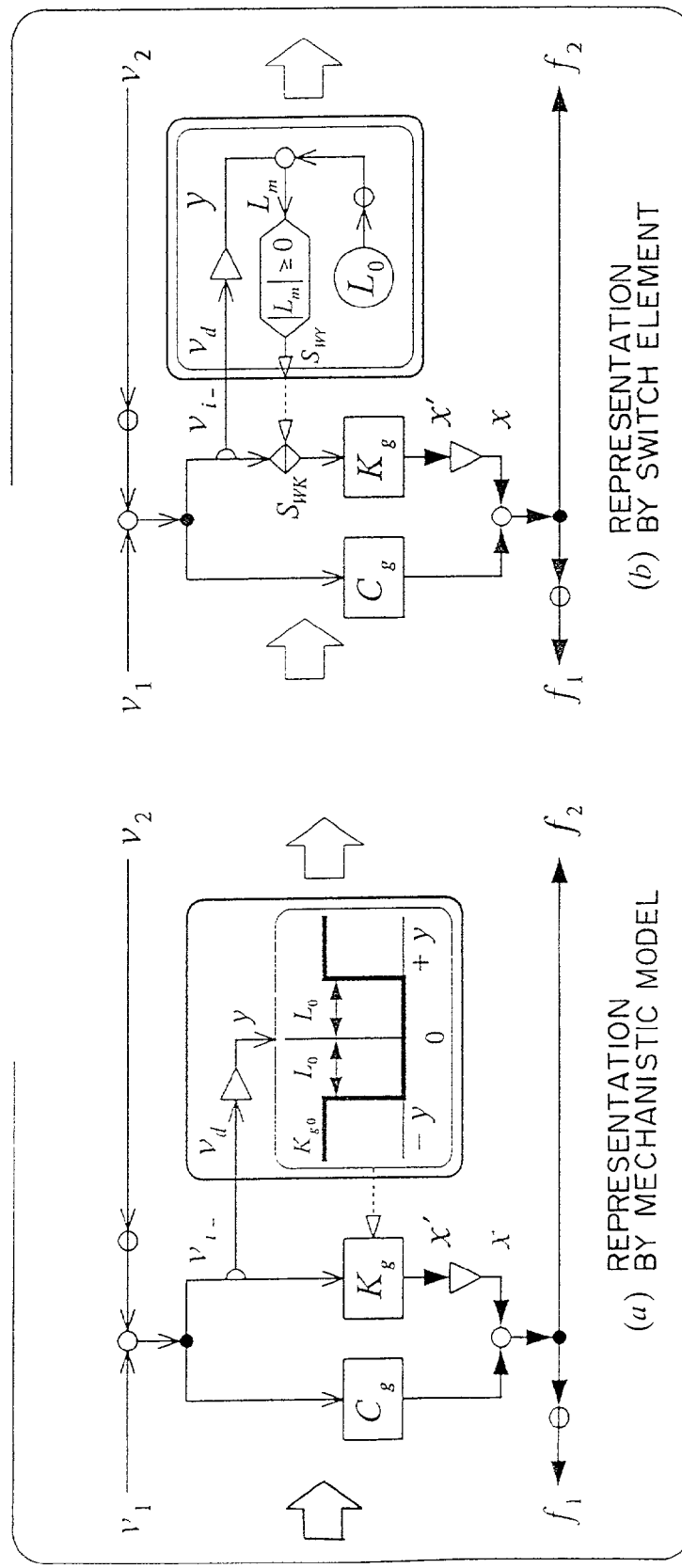
FIG. 48 is a view showing functional and mechanistic models of a back-lash.

Rearrangement of this relation to establish modeling provides a functional model of FIG. 48.

(1) Functional Model

In FIG. 48, $K_g$ denotes stiffness when contacted; $C_g$ coefficient of viscosity resistance; $v_1$ velocity difference between the movable member A and the outer cylinder B; and x internal state quantity. In FIG. 48 (a), modeling is implemented from the mechanistic model through a method of substitution of a non-linear stiffness. In FIG. 48 (b), modeling is performed in form of a structural non-linearity in which a switch element is incorporated so that $K_g$ is connected or disconnected. It is possible for the back-lash, as mentioned above, to implement modeling in accordance with any method of the mechanistic model and the structural non-linearity. However, the basic function of the back-lash is to connect and disconnect stiffness of the outer cylinder A and the movable member B. Therefore, the modeling according to the structure non-linearity of part (b) of FIG. 48 is more desirably. The reason why it is so is that in case of representation of the mechanistic model of part (a) of FIG. 48, no switch element is incorporated into the functional model and the government equation- and thus it is difficult to identify the structural non-linearity.

First, the functional model of the part (a) of FIG. 48 is expressed by the following government equation.

$$\begin{bmatrix} 0 \\ f_1 \\ f_2 \\ v_i \end{bmatrix} = \begin{bmatrix} -\frac{1}{K_g} & 0 & 1 & -1 \\ 0 & -1 & -C_g & C_g \\ 0 & 1 & C_g & -C_g \\ 0 & 0 & 1 & -1 \end{bmatrix} \begin{bmatrix} x' \\ x \\ v_1 \\ v_2 \end{bmatrix} \quad (71)$$

Next, the functional model of the part (b) of FIG. 48 is expressed by the government equation and coupling condition equation as follows.

$$\begin{bmatrix} 0 \\ f_1 \\ f_2 \\ v_i - \end{bmatrix} = \begin{bmatrix} -\frac{1}{K_g S_{WY}} & 0 & 1 & -1 \\ 0 & 1 & C_g & -C_g \\ 0 & 1 & C_g & -C_g \\ 0 & 0 & 1 & -1 \end{bmatrix} \begin{bmatrix} x' \\ x \\ v_1 \\ v_2 \end{bmatrix} \quad (72)$$

$$\left.\begin{array}{l} v_d = v_{i\_} \\ S_{WK} = S_{Wy} \end{array}\right\} \quad (73)$$

(2) Mechanistic Model(Clearance Model)

The mechanistic model in part (a) of FIG. 48 is expressed by the following equation.

$$\left.\begin{array}{l} y = \int v_d dt \\ L_m = y - L_0 \\ \text{if } (|L_m| \geq 0) \text{ then } (K_g = K_{g0}) \text{ else } (K_g = 0) \end{array}\right\} \quad (74)$$

In eq. (74), the first line denotes a relative distance y of the movable member A; the second line a distance $L_m$ between a wall of the external cylinder B and the movable member A; and the third line a stiffness $K_g$ of connection and disconnection.

The mechanistic model of part (b) of FIG. 48 can be expressed by the following equation.

$$\left.\begin{array}{l} y = \int v_{d\_} dt \\ L_m = y - L_0 \\ \text{if } (|L_m| \geq 0) \text{ then } (S_{WY} = 1) \text{ else } (S_{WY} = 0) \end{array}\right\} \quad (75)$$

In eq. (75), the first and second lines are the same as eq. (74), and the third line denotes a condition decision equation of deciding a contact of the external cylinder B with the movable member A. In the condition decision, the contact state is $S_{WY}=1$, and the non-contact state is $S_{WY}=0$. Stiffness $K_g$ is connected or disconnected in accordance with an operation of the switch element $S_{WY}$ according to the condition decision $S_{WY}$.

(3) Result of Simulation

Figure 49:
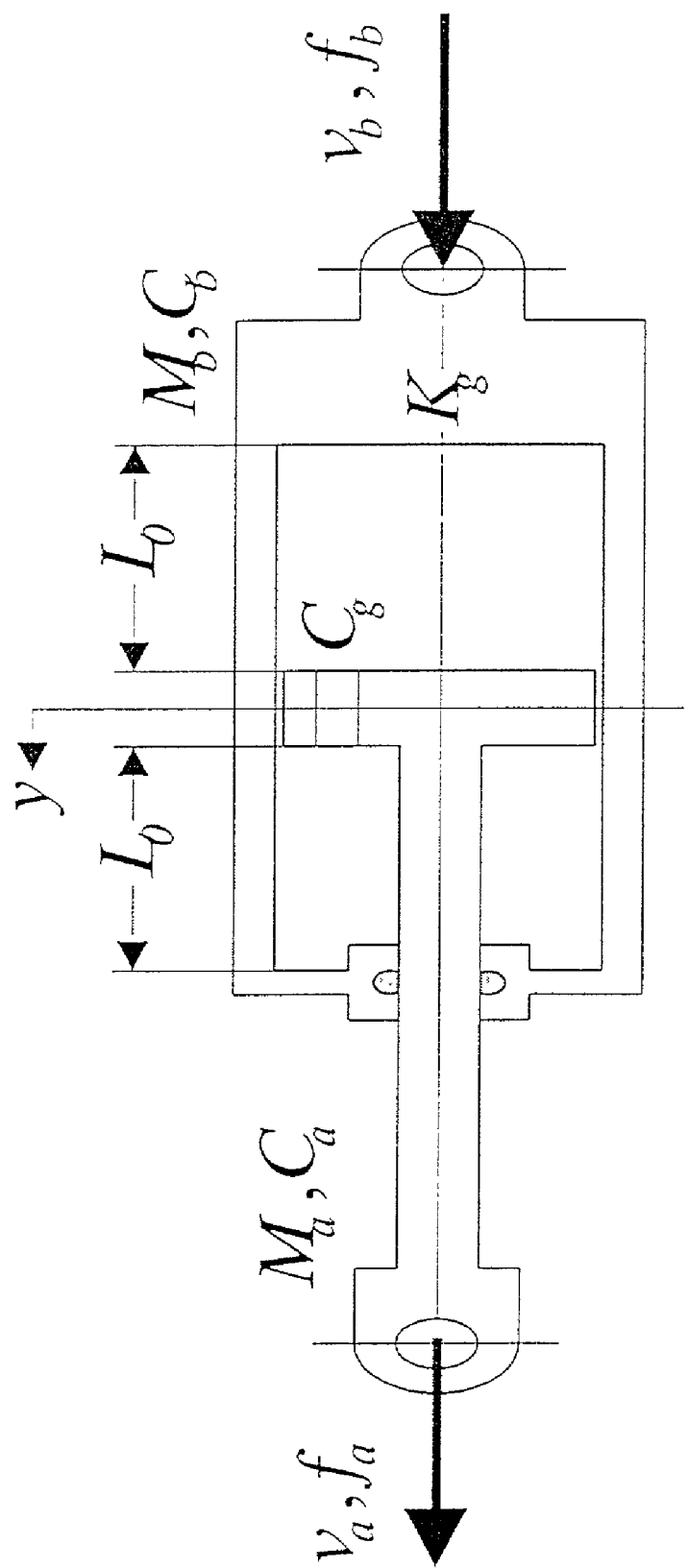
FIG. 49 is a view showing a structural model of an impact absorption damper.

As one of examples, as shown in FIG. 49, let us consider a bottom projection of an impact absorption damper according to a coefficient $C_g$ of viscosity resistance as to a cylinder in which liquid is enclosed and a piston having a small aperture. In FIG. 49, $M_a$ denotes mass of the piston; $C_a$ a coefficient of viscosity resistance of the piston; $M_b$ mass of the cylinder; and $C_b$ a coefficient of viscosity resistance of cylinder. Operational forces $f_a$ and $f_b$ of the piston and the cylinder are effected on the exterior to output velocities $v_a$ and $v_b$. Regarding others, it is the same as the functional model shown in FIG. 49.

Modeling of the structural model shown in FIG. 49 can be implemented by adding $M_a \cdot C_a \cdot M_b \cdot C_b$ in FIG. 49 to the functional model of part (b) of FIG. 48 in form of the additional function. Thus, the impact absorption damper is represented by a functional model shown in FIG. 50 wherein these additional functions are added to the functional model of part (b) of FIG. 48. Incidentally, x denotes internal state quantity.

Figure 50:
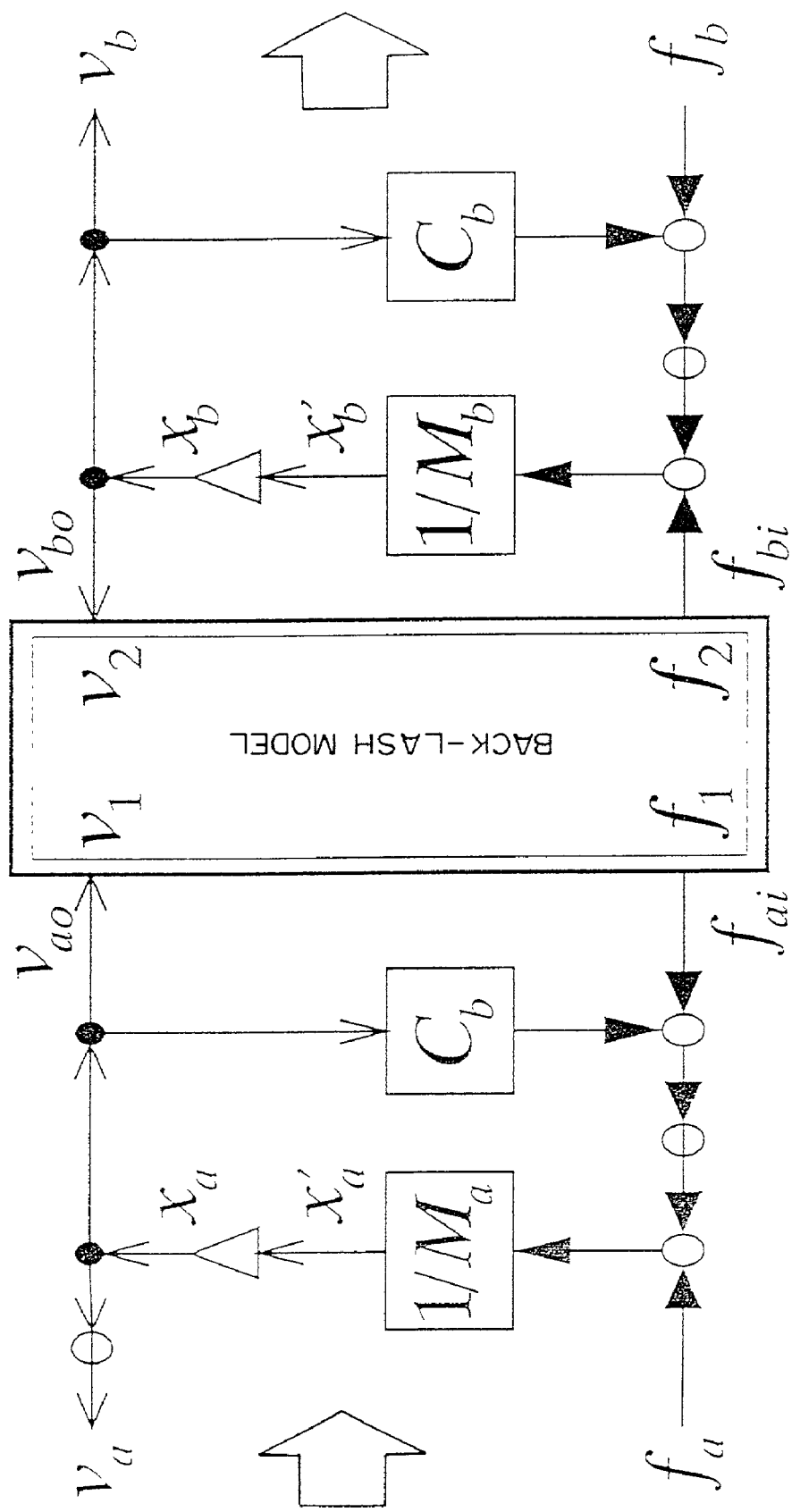
FIG. 50 is a view showing functional and mechanistic models of an impact absorption damper.

Coupling conditions of adding additional functions to both sides in FIG. 50 are expressed by the following equation.

$$\left.\begin{array}{l} v_{ao} = v_1 \\ f_1 = f_{ai} \end{array}\right\} \quad (76)$$

$$\left.\begin{array}{l} v_{bo} = v_2 \\ f_2 = f_{bi} \end{array}\right\} \quad (77)$$

When the functional model and the cylinder of the piston and back-lash are united with eq. (76) and eq. (77), the following equation is obtained.

$$\begin{bmatrix} 0 \\ 0 \\ 0 \\ v_a \\ v_b \\ f_1 \\ v_{i\_} \end{bmatrix} = \begin{bmatrix} -M_a & 0 & 0 & -(C_g+C_a) & -1 & C_g & 1 & 0 \\ 0 & -\dfrac{1}{K_g S_{WY}} & 0 & 1 & 0 & -1 & 0 & 0 \\ 0 & 0 & -M_b & C_g & 1 & C_g-C_b & 0 & -1 \\ 0 & 0 & 0 & -1 & 0 & 0 & 0 & 0 \\ 0 & 0 & 0 & 0 & 0 & 1 & 0 & 0 \\ 0 & 0 & 0 & -C_g & -1 & C_g & 0 & 0 \\ 0 & 0 & 0 & 1 & 0 & -1 & 0 & 0 \end{bmatrix} \begin{bmatrix} x'_a \\ x' \\ x'_b \\ x_a \\ x \\ x_b \\ f_a \\ f_b \end{bmatrix} \quad (78)$$

Figure 51:
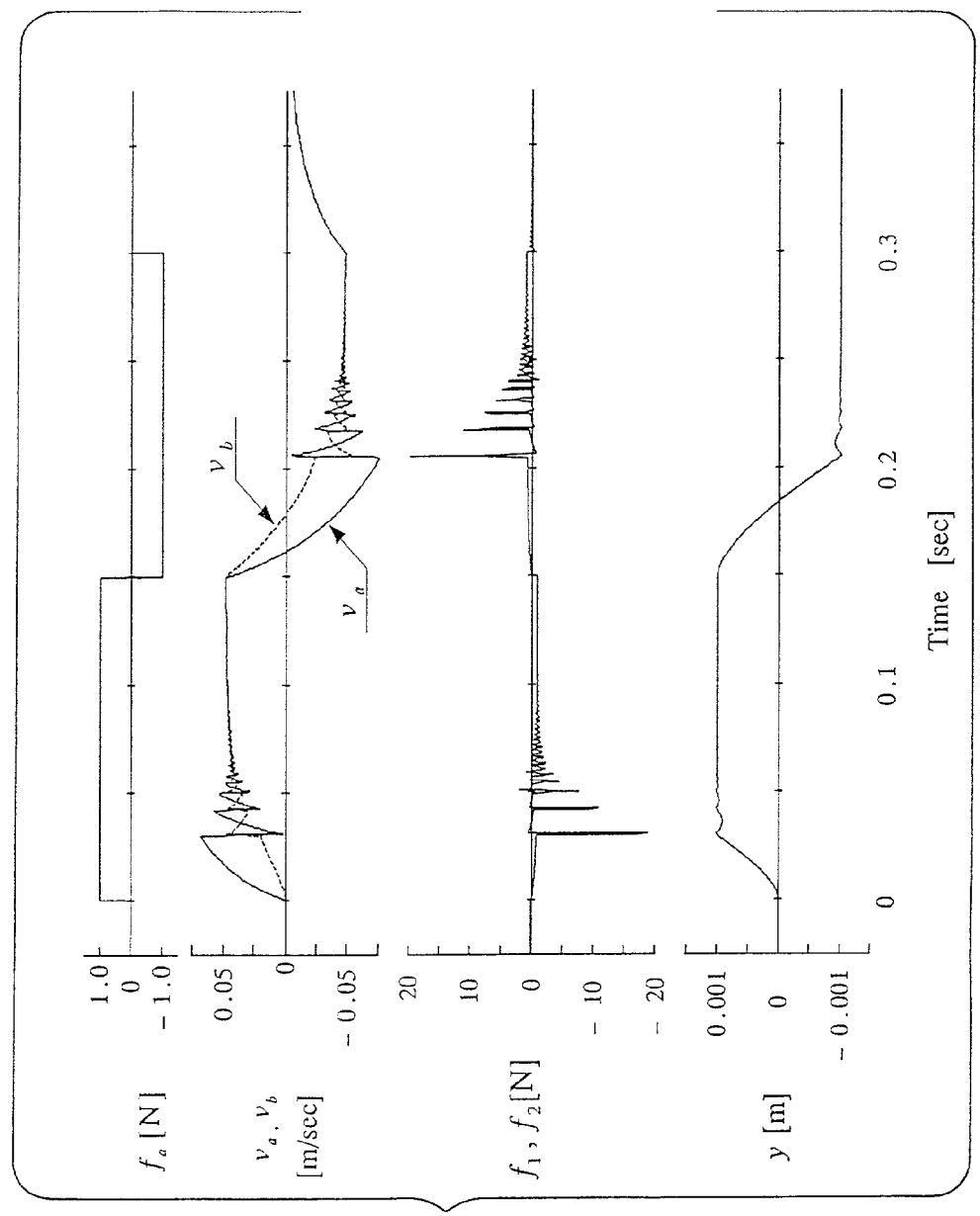
FIG. 51 is a view showing a simulation result of an impact absorption damper.

The functional and mechanistic models of an bottom projection damper shown in FIG. 50 were simulated with characteristic values shown in table 8. FIG. 51 shows a simulation result.

TABLE 8

CHARACTERISTIC VALUE OF IMPACT ABSORPTION DAMPER

| | CHARACTERISTIC NAME | SIMBOL | UNIT | CHARACTERISTIC VALUE |
|---|---|---|---|---|
| PISTON | MASS | $M_a$ | [Kg] | 0.2 |
| | COEFFICIENT OF VISCOSITY RESISTANCE | $C_a$ | [N/(msec)] | 0.5 |
| CYLINDER | MOVING MASS | $M_b$ | [Kg] | 2.0 |
| | COEFFICIENT OF VISCOSITY RESISTANCE | $C_b$ | [N/(msec)] | 10.0 |
| BACK-LASH | BOTTOM PROJECTION STIFFNESS | $K_g$ | [N/m] | $1.0 \times 10^6$ |
| CHARACTERISTIC | COEFFICIENT OF VISCOSITY RESISTANCE | $C_q$ | [N/(msec)] | 15.0 |
| | BACK-LASH WIDTH | $L_0$ | [m] | 0.001 |

In the simulation result of FIG. 51, velocity $v_a$ is reversed in positive and negative in order to compare with velocity $v_b$. The simulation of FIG. 51 is to reproduce a state that the cylinder operates in accordance with a motion of the piston to which an operational force is applied. As the operation, 1 [N] was applied to the operational force $f_a$ of the piston, and after 0.15 [sec] the operational force −1 [N] in opposite direction was applied, and finally after 0.3 [sec] the operational force was 0. At that time, the operational force $f_b$ [N] of the cylinder side was not applied. In the simulation result, from the top of FIG. 51 in order, $f_a$ [N] denotes an operational force which was applied to the piston; $v_a$ [m/sec] velocity of the piston; $v_b$ [m/sec] velocity of the cylinder; $f_1$, $f_2$ [N] force effected between the piston and the cylinder; and y [m] a relative position of the piston with respect to the cylinder. Incidentally, regarding the velocity on the second from the top, the solid line denotes the velocity $v_a$ of the piston at the driving side, and the dotted line denotes the velocity $v_b$ of the cylinder at the driven side.

In FIG. 51, from the velocities $v_a$•$v_b$ of the piston and the cylinder, they are in contact with each other about 0.03 [sec] and converges while the bottom projection is repeated, and finally after about 0.08 [sec], they are united. It is understood that at the instance of the contact, a repulsion force generates by the impact of the collision, and they converge while contact and separation are repeated. This is also understood from the variation of the impact load of force $f_1$ acting between the piston and the cylinder and the relative position y. Next, when the operational force $f_a$ is reversed, the piston contacts with a wall of the opposite side of the cylinder to show the same result. Finally, when the operational force $f_a$ is removed, the piston is united with the cylinder and stops.

9. Friction Clutch

A clutch is a basic mechanical element for smoothly connecting and disconnecting two systems. Particularly, a friction clutch mechanism is well known as a mechanical clutch for changing over a system in operation. Here, modeling on the basic function of such a clutch will be considered.

Figure 52:
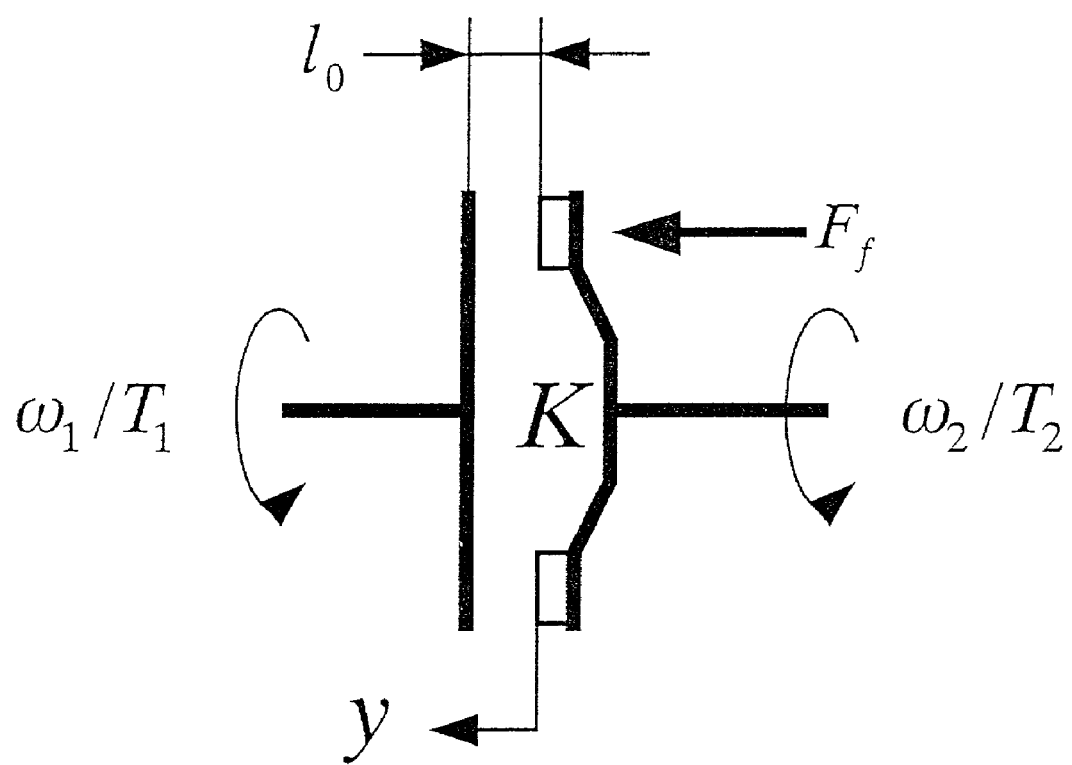
FIG. 52 is a view showing a structural model of a clutch.

In a clutch, there are two types of clutch one of which is concerned with a normally connection scheme and another a normally disconnection scheme. FIG. 52 typically shows by way of example a structure of a clutch of a normally disconnection scheme in which a clutch piece of white squares at the right side is pressed to the left by press force $F_f$ of the clutch, so that a power transmission is performed between right and left systems. Applied to the clutch is rotational energy of $\omega_1$•$T_1$ from the system of the right side, and likely rotational energy of $\omega_2$•$T_2$ from the right side. According to the clutch in which the two systems are connected, the right and left systems are united with clutch stiffness K so that the same energy is transferred between both the systems. In the sliding state, the right and left systems are connected with one another by the frictional torque of the clutch so that an angular velocity difference occurs between the right and left systems. Loss caused by the angular velocity difference and the frictional torque is consumed in form of thermal energy. In the state in which the clutch is disconnected, the right and left systems are separated and independent of one another.

(1) Basic Function

Next, the basic function of a clutch will be considered. The function of a clutch can be divided to the original functions of connection, sliding and disconnecting, and the additional functions of parameters possessed by two systems. The original functions divided to the three states can be considered as follows.

① Connection: A state that no difference in velocity exists between two systems so that the clutch does not slip.

② Sliding: A state that two systems are driven by a frictional torque of the clutch.

③ Disconnection: A state that the frictional torque is 0 so that two systems are separated.

From these three states, it is understood that sliding by the friction torque controls connection and disconnection of the clutch. This relation is shown in FIG. 53.

Figure 53:
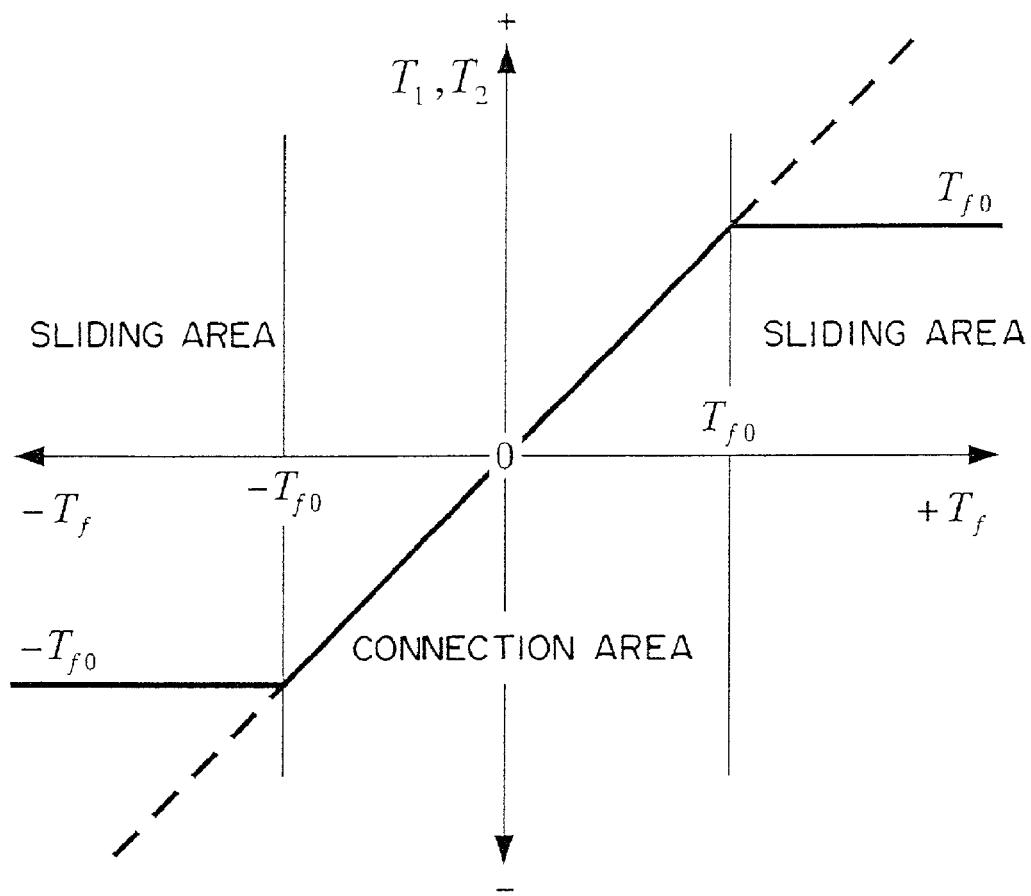
FIG. 53 is a view showing torque transfer characteristics of a clutch.

FIG. 53 is a view showing torque transfer characteristics of a clutch, where the horizontal axis denotes friction torque $T_f$ and the vertical axis denotes load torque $T_1$ $T_2$. $T_{f0}$ shown in FIG. 53 denotes a transfer torque of the clutch by friction. The transfer torque $T_{f0}$ causes the right and left systems to be united with clutch stiffness K in the area wherein the load torque $T_1 \cdot T_2$ is small, so that the clutch offers the connecting state. In other area, the load torque $T_1 \cdot T_2$ is supplied by the transfer torque $T_{f0}$, so that the clutch offers the sliding state. The transfer torque $T_{f0}$ varies in accordance with a compression force $F_f$ of the clutch, wherein when $T_{f0}=0$, load torque $T_1=T_2=0$, so that the clutch offers the disconnection state. Therefore, a relation between the connection and the sliding in FIG. 53 is controlled in accordance with a relation in magnitude between the load torque $T_1 \cdot T_2$ to be applied via the clutch to two systems and the friction torque $T_f$. For example, in the event that the load torque $T_1 \cdot T_2$ is less than friction torque $T_{f0}$, the connection is established, and in the event that the load torque $T_1 \cdot T_2$ is more than friction torque $T_{f0}$, the sliding is generated owing to the friction torque $T_{f0}$. From this operation, the clutch is concerned with the basic function such as the clutch stiffness K with which two systems are united, the transfer torque $T_{f0}$ controlling the sliding of the clutch, and change over of both the systems.

(2) Functional Model (Clutch Model)

Figure 54:
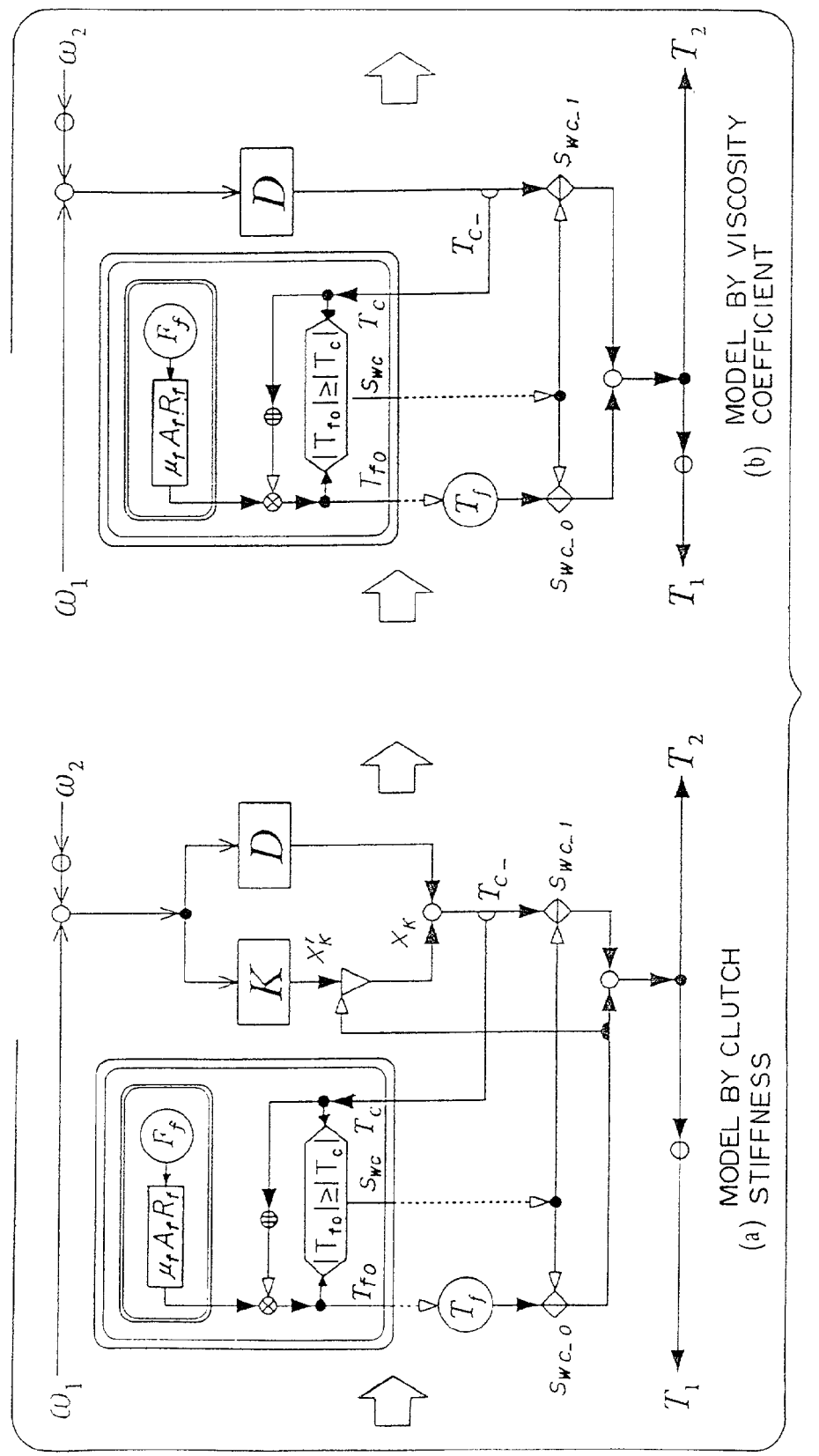
FIG. 54 is a view showing functional and mechanistic models of a clutch.

FIG. 54 shows functional and mechanistic models of a clutch which are subjected to modeling in accordance with the basic function of the clutch. FIG. 54 shows a clutch model of a scheme of normally disconnecting. Part (a) of FIG. 54 shows a clutch model connecting by the clutch stiffness K. Part (b) of FIG. 54 shows a clutch model in which the clutch stiffness K is replaced by the coefficient D of viscosity resistance to perform a low leveling. In FIG. 54, K denotes stiffness of the clutch at the time of connection; D a coefficient of viscosity resistance of a frictional piece of the clutch; $T_f$ friction torque; $T_{c\_}$ stiffness torque of the clutch; and $S_{WC}$ a switch element for selecting between $T_{c\_}$ and $T_f$. A mechanistic model for operating the clutch is incorporated into a functional model constituted of those elements. x denotes an internal state quantity. The clutch model of part (b) of FIG. 54, in which the clutch stiffness K is replaced by the coefficient D of viscosity resistance, generates a slight slip in the connecting state. While the general characteristic of the coefficient D of viscosity resistance is of linear, transforming the characteristic into a non-linearity by the mechanistic model to provide a negative coefficient of viscosity resistance makes it possible to reproduce phenomena such as abnormal vibration and abnormal sound (squeak).

Government equation of part (a) of FIG. 54 is expressed by the following equation. Incidentally, the connecting condition of the mechanistic model is omitted.

$$\begin{bmatrix} 0 \\ T_1 \\ T_2 \\ T_C \end{bmatrix} = \begin{bmatrix} -\frac{1}{K} & 0 & 1 & -1 & 0 \\ 0 & -S_{WC\_1} & -DS_{WC\_1} & DS_{WC\_1} & -T_f S_{WC\_0} \\ 0 & S_{WC\_1} & DS_{WC\_1} & -DS_{WC\_1} & T_f S_{WC\_0} \\ 0 & 1 & D & -D & 0 \end{bmatrix} \begin{bmatrix} x'_k \\ x_k \\ \omega_1 \\ \omega_2 \\ 1 \end{bmatrix} \quad (79)$$

In eq. (79), the first line denotes a state equation; second and third input and output equations; and fourth an observation equation of the clutch torque. Likely, the government equation of part (b) of FIG. 54 is expressed by the following equation in which the state equation and the internal state quantity are removed from eq. (79).

$$\begin{bmatrix} T_1 \\ T_2 \\ T_C \end{bmatrix} = \begin{bmatrix} -DS_{WC\_1} & DS_{WC\_1} & -T_f S_{WC\_0} \\ DS_{WC\_1} & -DS_{WC\_1} & T_f S_{WC\_0} \\ D & -D & 0 \end{bmatrix} \begin{bmatrix} \omega_1 \\ \omega_2 \\ 1 \end{bmatrix} \quad (80)$$

(3) Mechanistic Model (Coupling Decision Model)

Parts (a) and (b) of FIG. 54 are substantially the same mechanistic model which outputs condition decision $S_{WC}$ wherein stiffness torque $T_{c\_}$ of the clutch is given in form of an estimated observation quantity, and transfer torque $T_{f0}$ in form of substitution quantity. The contents of the mechanistic model is as follows.

The transfer torque $T_{f0}$ can be determined from equation of the following friction torque.

$$T_{f0} = \mu_f A_f R_f F_f \frac{T_{c\_}}{|T_{c\_}|} \quad (81)$$

Where $\mu_f$ denotes a coefficient of kinetic friction of a friction material; $A_f$ a sliding area of a frictional surface; $R_f$ an average radius of the frictional surface; and $F_f$ a clutch compression load, and the positive and negative of $T_{f0}$ is coincident with an estimated observation quantity $T_{c\_}$.

According to this example, there is shown a model in which a friction torque $T_f$ of the clutch is represented by a kinetic friction torque. Consequently, when the behavior of the clutch is considered in details, it is necessary to consider a variation of a friction torque due to the static friction, the kinetic friction and the frictional heat.

Next, the condition decision for deciding a sliding of the clutch and the connection state is expressed by the following equation.

$$\text{if}(|T_{f0}| \geq T_C) \text{ then } (S_{WC}=1) \text{ else } (S_{WC}=0) \quad (82)$$

In eq. (82), when transfer torque $T_{f0}$ is not less than stiffness torque $T_C$, $S_{WC}=1$ is set up to establish a connecting state, and in opposite $S_{WC}=0$ a sliding state. In the sliding state, an internal state quantity $x_k$ of the dynamic storage element is initialized in accordance with the following equation.

$$\text{if } (S_{WC}=0) \text{ then } (x_k=0) \quad (83)$$

According to the clutch model of a normally connecting scheme, there is given an equation $|T_{f0}| \leq |T_{c\_}|$ in which a decision of comparison operators of the condition decision equation (82) is reversed, and a switch element $S_{WC\_0}$ is interchanged by $S_{WC\_1}$.

(4) Result of Simulation

Drive systems and load systems of moments of inertia $J_D \cdot J_L$ and coefficients of viscosity resistance $C_D \cdot C_L$ are added to right and left of the structural model shown in FIG. 52, and this is connected to the exterior with the input torque $T_D \cdot T_L$ and the state quantity of the output angular velocity $\omega_D \cdot \omega_L$. The functional model is shown in FIG. 55.

Figure 55:
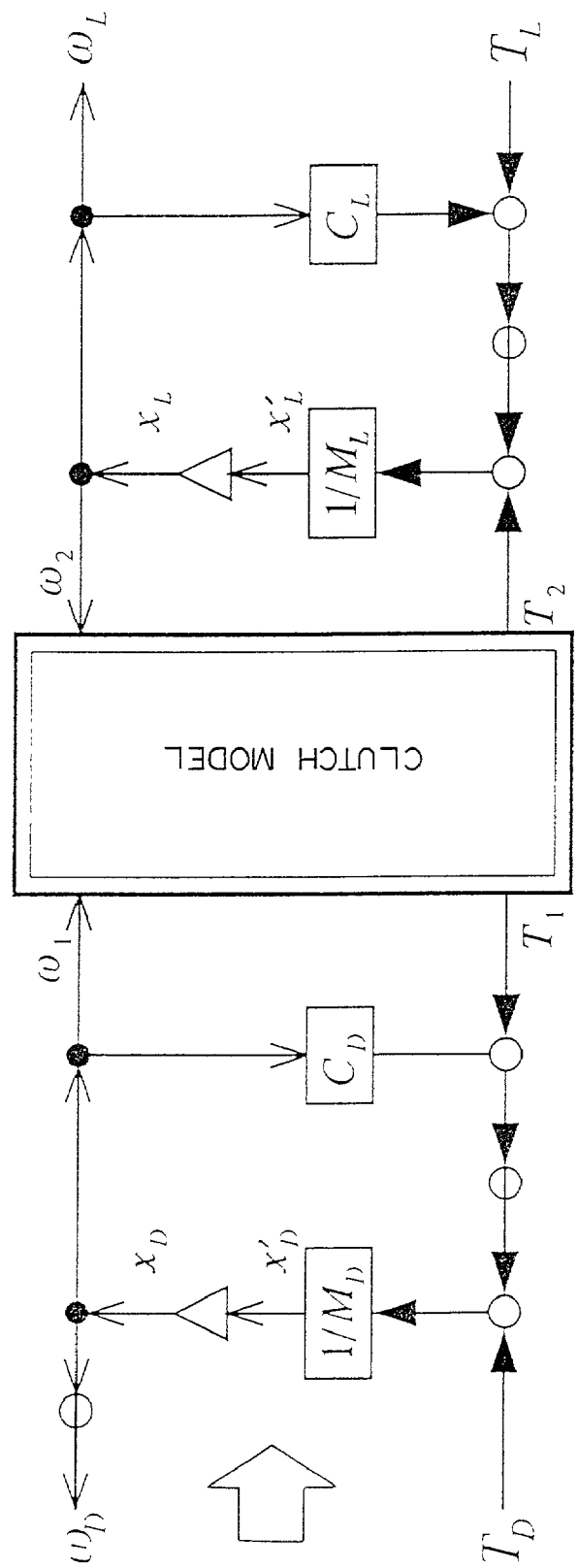
FIG. 55 is a view showing a clutch model for a simulation.

For the functional model of FIG. 55, there is used a clutch model taking into consideration the clutch stiffness of part (a) of FIG. 54. x denotes the internal state quantity. The government equation of FIG. 55 is expressed by the following equation.

$$\begin{bmatrix} 0 \\ 0 \\ 0 \\ 0 \\ \omega_D \\ \omega_L \\ T_2 \\ T_{C\_} \end{bmatrix} = \begin{bmatrix} -J_D & 0 & 0 & -(C_D + DS_{WC\_1}) & -S_{WC\_1} & DS_{WC\_1} & 1 & 0 & -T_f S_{WC\_0} \\ 0 & -\frac{1}{K} & 0 & 1 & 0 & -1 & 0 & 0 & 0 \\ 0 & 0 & -\frac{J}{L} & DS_{WC\_} & S_{WC\_1} & -(C_L + DS_{WC\_1}) & 0 & -1 & T_f S_{WC\_0} \\ 0 & 0 & 0 & -1 & 0 & 0 & 0 & 0 & 0 \\ 0 & 0 & 0 & 0 & 0 & 1 & 0 & 0 & 0 \\ 0 & 0 & 0 & DS_{WC\_1} & S_{WC\_1} & -DS_{WC\_1} & 0 & 0 & T_f S_{WC\_0} \\ 0 & 0 & 0 & D & 1 & -D & 0 & 0 & 0 \end{bmatrix} \begin{bmatrix} x'_D \\ x'_k \\ x'_L \\ x_D \\ x_k \\ x_L \\ T_D \\ T_L \\ 1 \end{bmatrix} \quad (84)$$

Figure 56:
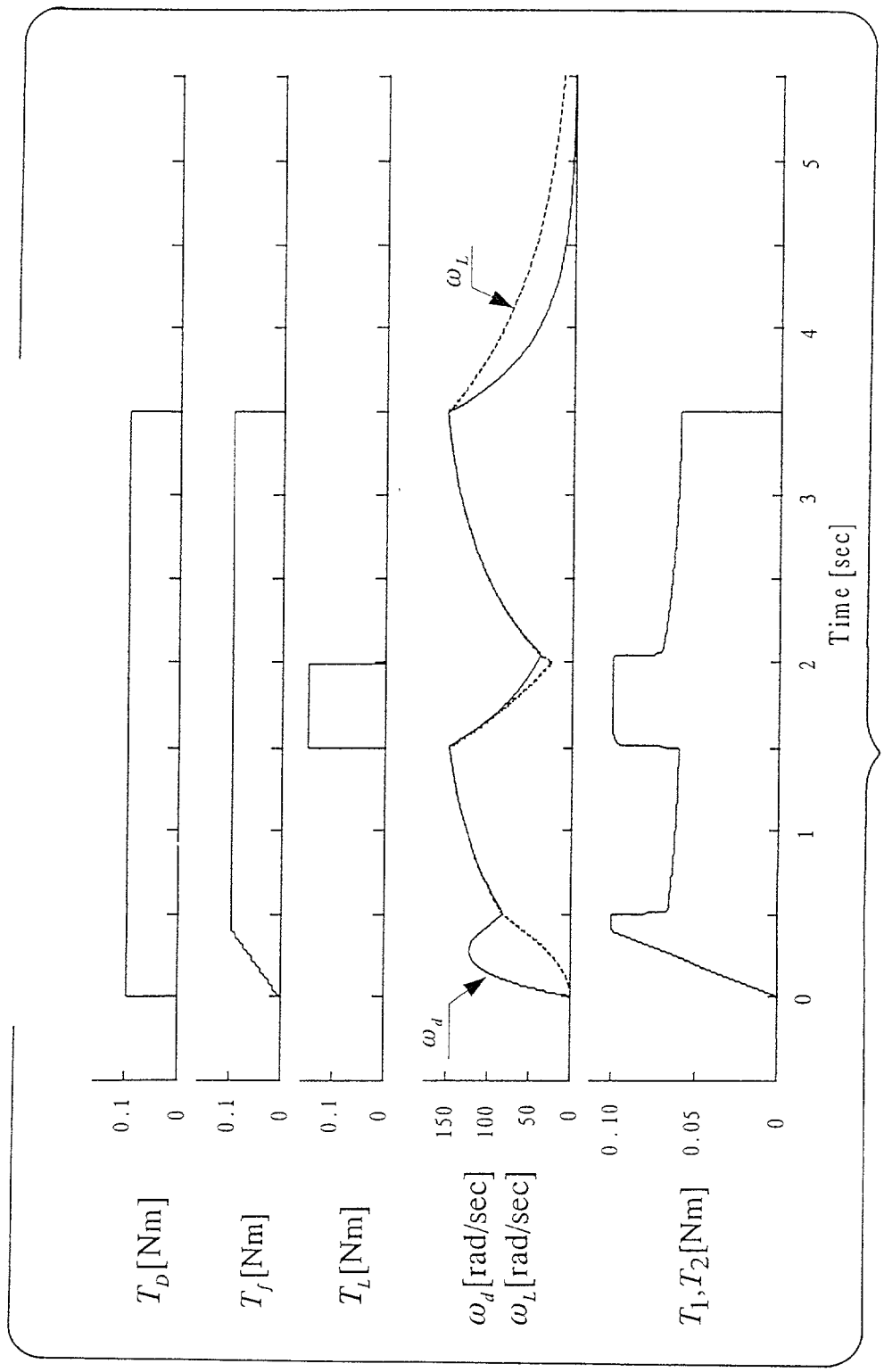
FIG. 56 is a view showing a simulation result of a clutch.

FIG. 56 shows a result of a simulation in which characteristic values of table 9 are used for the functional model of FIG. 55. Incidentally, in FIG. 56, angular velocity $\omega_D$ is reversed in positive and negative for the purpose of comparison with the velocity $\omega_L$.

TABLE 9

CHARACTERISTIC VALUE OF CLUTCH

| | CHARACTERISTIC NAME | SIMBOL | UNIT | CHARACTERISTIC VALUE |
|---|---|---|---|---|
| DRIVE SIDE | MOMENT OF INERTIA | $J_D$ | [Kgm$^2$] | 0.0001 |
| | COEFFICIENT OF VISCOSITY RESISTANCE | $C_D$ | [Nmsec/rad] | 0.00025 |
| LOAD SIDE | MOMENT OF INERTIA | $J_L$ | [Kgm$^2$] | 0.0003 |
| | COEFFICIENT OF VISCOSITY RESISTANCE | $C_D$ | [Nmsec/rad] | 0.00035 |
| CLUTCH | CLUTCH STIFFNESS | K | [rad/Nm] | 0.1 |
| | COEFFICIENT OF VISCOSITY RESISTANCE | D | [Nmsec/rad] | 0.015 |
| | CLUTCH FRICTION TORQUE | $T_f$ | [Nm] | 0.1 |

According to the simulation of FIG. 56, 0.1 [N] of torque $T_D$ is applied to a drive system, and a clutch friction torque $T_f$ is raised at 0.25 [Nm/sec] to connect the clutch. After the connection, after 1.5 [sec], load torque $T_L$=0.145 [Nm] is applied during 0.5 [sec] on a step basis to slide the clutch, and at the final 3.5 [sec] the clutch is released. In FIG. 56, from the top in order, $T_D$ [Nm] denotes torque of a driving system; $T_f$[Nm] (a side load) friction torque of the clutch; $T_L$ [Nm] torque of a load system; $\omega_D$ drive angular velocity; $\omega_L$ load angular velocity; and $T_1$ torque of the clutch.

In FIG. 56, in activation, the angular velocity $\omega_D$ of the drive system rises to increase the friction torque $T_f$ so that the load angular velocity $\omega_L$ of the load system rises too. However, the driving system is pulled in the load system halfway so that the angular velocity $\omega_D$ slow downs, and both the driving system and the load system are coincident with one another at the point of about 0.5 [sec] to offer a connecting state (engagement), so that they are united to rise in rotation. Up to the coupling, the load system is driven by the friction torque $T_f$, and the transfer torque $T_1$ of the clutch and the friction torque $T_f$ are the same as one another. After the engagement, the transfer torque $T_1$ of the clutch is replaced by torque by the clutch stiffness, and rapidly lowered.

Next, when torque $T_L$ is applied from the exterior to the load system, the torque applied to the clutch exceeds the friction torque $T_f$ so that the clutch begins to slide whereby an angular velocity difference is generated between $\omega_D$ and $\omega_L$. The load torque $T_1$ of the clutch at that time is again replaced by the friction torque $T_f$. Removal of the load torque $T_1$ causes the angular velocity difference between $\omega_D$ and $\omega_L$ to disappear, so that the clutch connecting state is established whereby the rotation rises again. Finally, when the friction torque $T_f$ is set to 0 to disconnect the clutch, the driving system and the load system are individually decelerated and stopped.

10. Friction brake

A brake is one of the basic mechanical elements for a velocity control by compulsory absorption of energy, and for absorbing a storage energy such as moment of inertia. There are many types of brake. Here a brake utilizing a frictional force will be considered.

Figure 57:
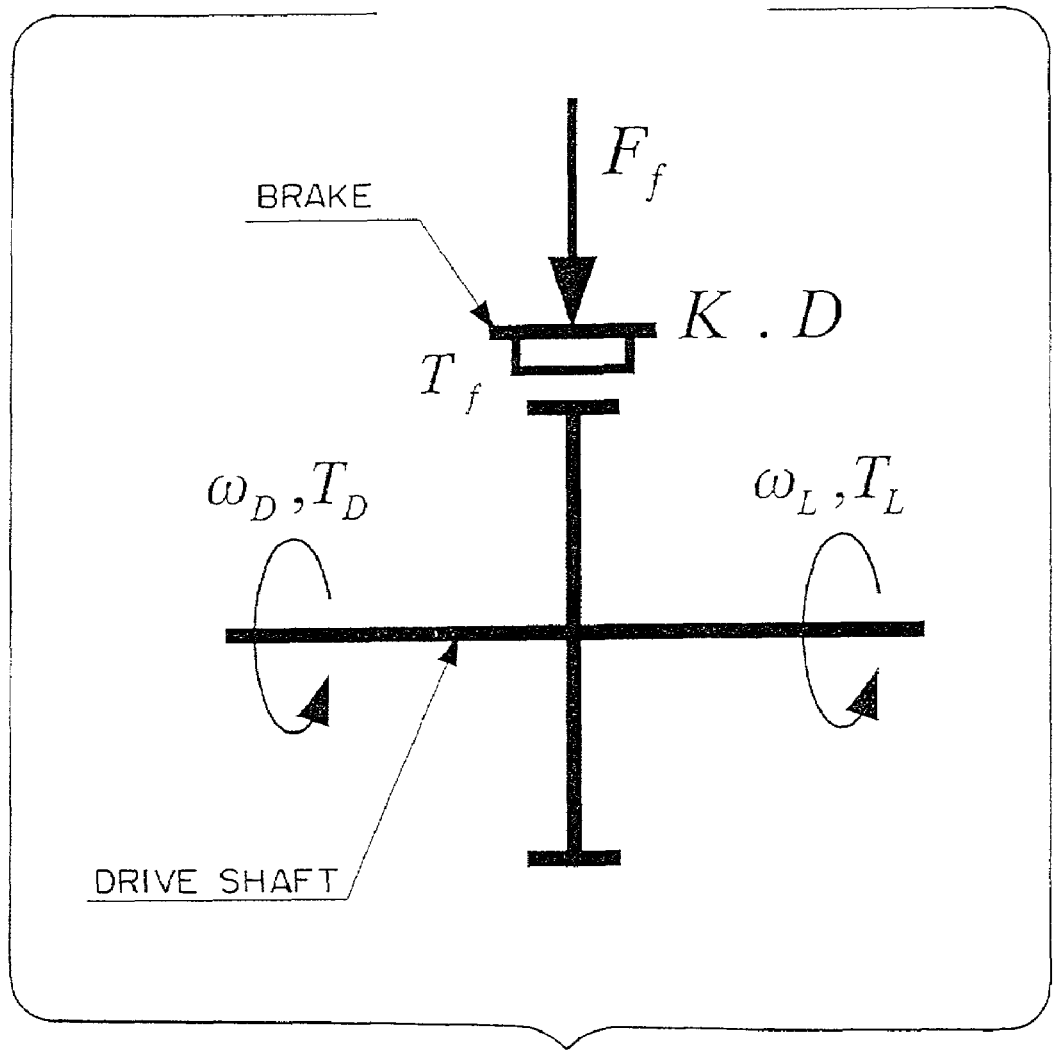
FIG. 57 is a view showing a structural model of a brake.

A friction brake controls, in a similar fashion to that of the clutch, a braking torque by a frictional force. Application of the clutch model to a brake can be implemented in such a manner that the rotating driving system are fixed on one side of the load system so that an energy consumed in sliding of the clutch is supplied to the driving system in form of a braking energy. Regarding a fixing at the load side, there are two ways. One of the two ways is a method in which stiffness is connected to the load side, or alternatively moment $M_L$ of inertia of FIG. 55 is enlarged. This is applied when an influence of the braking force on a mounting section is considered too. Another is a method in which moment $M_L$ of inertia and coefficient $C_L$ of viscosity resistance at the load side of FIG. 55 are removed and the angular velocity $\omega_2$ is set to 0. This method is applied when the braking function of the brake is considered. Here, the later brake model is considered. In view of the foregoing, modeling of the brake is effected hereinafter. FIG. 57 shows typically a structure model of a brake. In FIG. 57, the angular velocity $\omega_D$ and drive torque $T_D$ are added to the drive side of the shaft, and the angular velocity $\omega_D$ and drive torque $T_D$ are applied to the load side. Friction torque $T_F$ of the brake is effected in form of the braking torque on the shaft.

(1) Functional Model (Brake Model)

Figure 58:
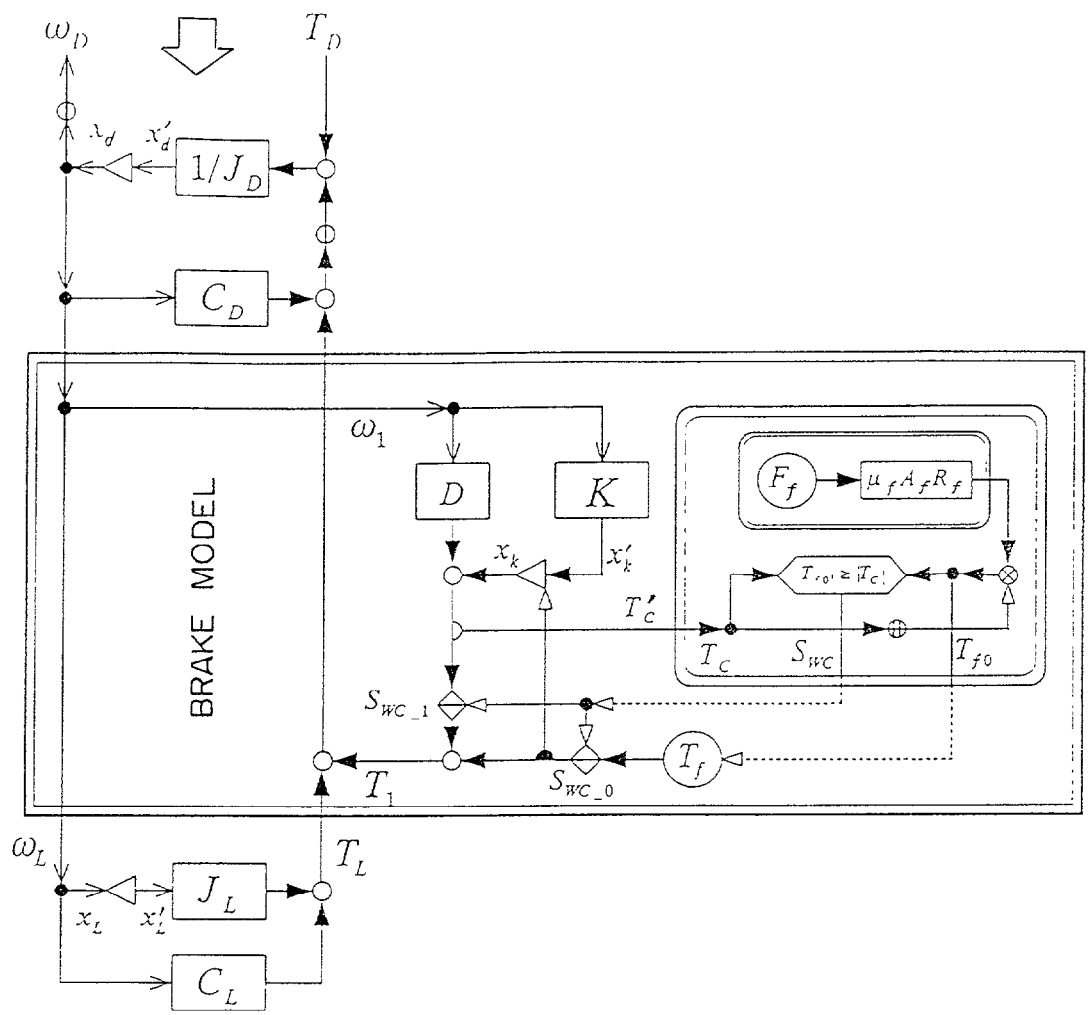
FIG. 58 is a view showing a functional model of a brake.

A brake is different from a clutch and has no function of transferring motive power, and thus serves as a model for applying a braking energy in form of a load to a braking shaft to transfer the motive power. Consequently, the brake model is a functional model in which a clutch model is placed in parallel with the model of the drive shaft. FIG. 58 shows a functional and mechanistic model of the brake.

In FIG. 58, moment of inertia $J_D$ and coefficient of viscosity resistance $C_D$ are added to the driving side of the driving shaft, and moment of inertia $J_L$ and coefficient of viscosity $C_L$ resistance are added to the load side. In FIG. 58, $\omega_1$ and $T_1$ denote angular velocity and braking torque. With respect to function of generating the braking energy, input and output state quantities $\omega_2$ and $T_2$ of the right side of FIG. 54 are removed from part (a) of FIG. 54. While the mechanistic model is almost the same as part (a) of FIG. 54 in characteristics, $\mu_f$ is replaced by a coefficient of kinetic friction of the brake pad; $A_f$ a sliding area; $R_f$ a sliding radius; $F_f$ a brake operational load.

Inertia moments $J_D$ and $J_L$ at the drive side and the load side, which are shown in FIG. 58, are the same as internal states $x_d'$ and $x_L$, respectively. Thus, it is possible to derive inertia moments $J_D+J_L$ through addition and connection of the differential quantity. The government equation, in which inertia moments $J_D$ and $J_L$ are combined, is expressed by the following equation.

Figure 59:
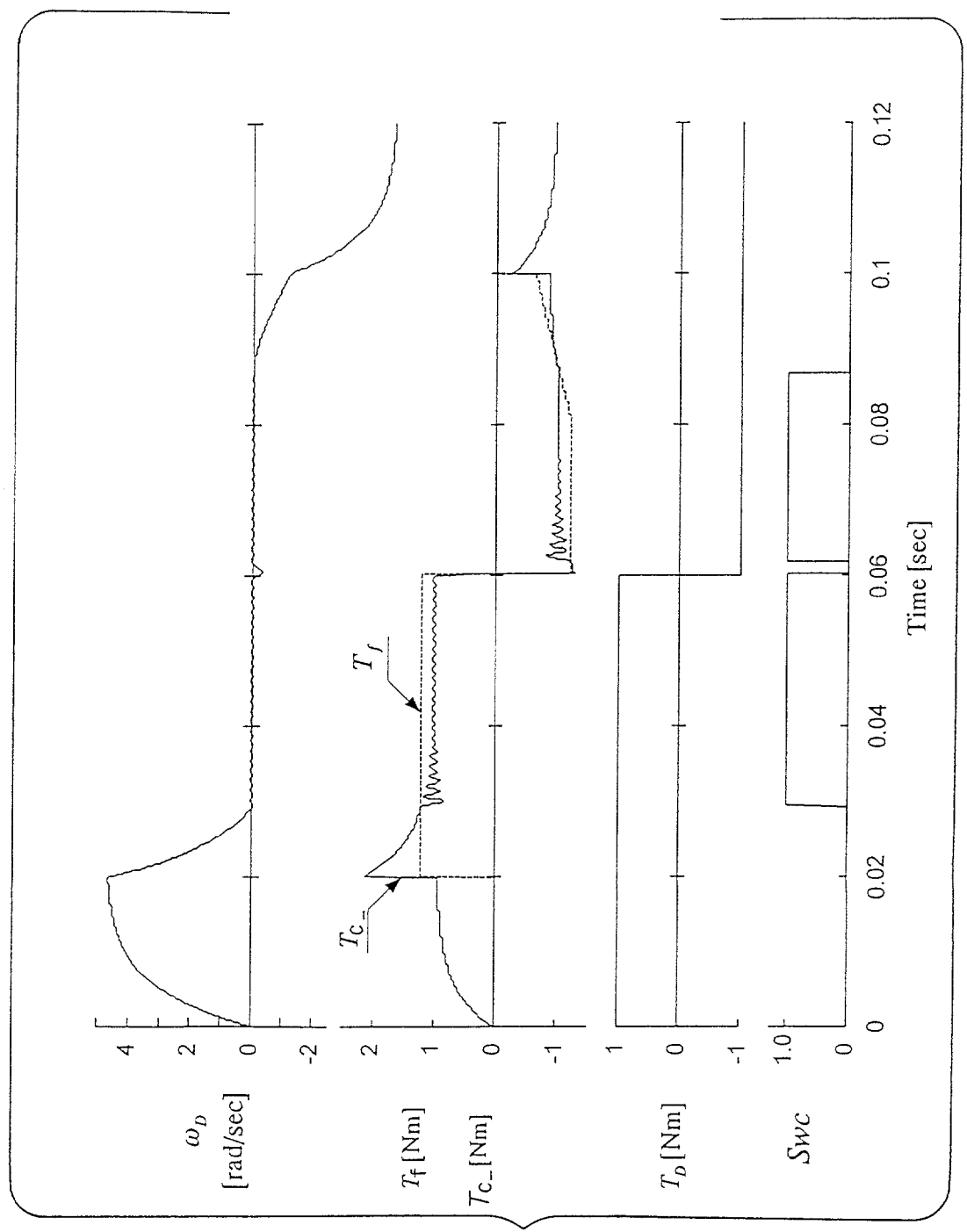
FIG. 59 is a view showing a simulation result of a brake.

In FIG. 59, from the top in order, $\omega_D$ [rad/sec] denotes an angular velocity of the driving shaft; $T_f$ [Nm] a control torque; $T_{c\_}$ [Nm] an estimated observation quantity; $T_D$ [Nm] driving torque; and $S_{WC}$ condition decision.

In execution of the simulation, at the same time of the actuation, driving torque $T_D=1$ [Nm] is applied, and at 0.02 [sec] a brake operational load $F_f=8\times10^4$ [N] is applied to effect a brake, and at 0.06 [sec] the torque is changed over to a reverse driving torque $T_D=-1$ [Nm]. And at 0.08 [sec] the brake operational load slow downs at the velocity of $F^f=2\times10^4$ [N/sec] and at 0.1 [sec] the brake is disenabled.

In FIG. 59, when the brake is effected at 0.02 [sec], the state of $T_f<T_{c\_}$ appears and thus the friction torque $T_f$ causes the brake torque to effect so that an angular velocity $\omega_D$ is decelerated. In the state of $T_f>T_{c\_}$, it is stopped compulsively by the brake. When the driving torque is reversed at 0.06 [sec], the reaction causes a slip of the brake to instantaneously appear on the angular velocity $\omega_D$ so that condition decision $S_{WC}$ immediately decides. When the brake is weakened gradually from the time point of 0.08 [sec] the brake begins to slip from the time point of $T_f<T_{c\_}$, and the angular velocity $\omega_D$ is also increased (the opposite direction). When the brake is disenabled, it is accelerated.

11. Automatic-Reset Mechanism

Figure 60:
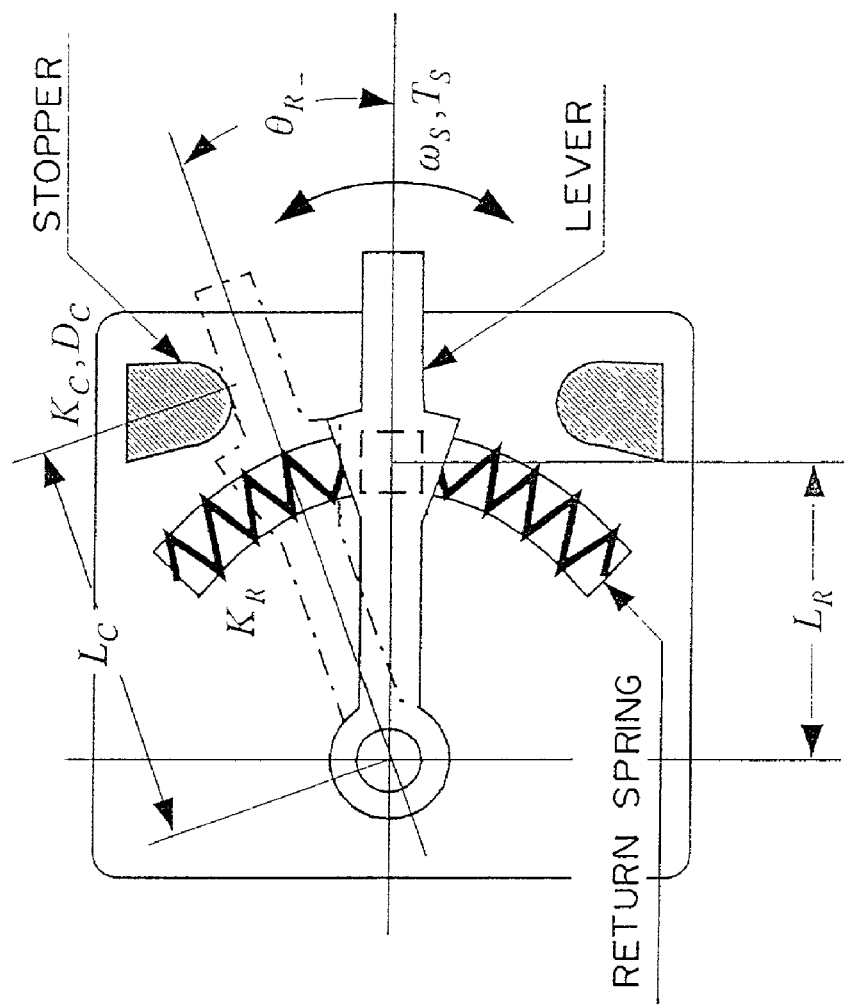
FIG. 60 is a view showing a construction of an automatic-reset mechanism.

An automatic-reset mechanism is, as shown in FIG. 60, a mechanism wherein a return torque is applied to part of a lever to return to a stop position by stiffness $K_R$ of a return $$\begin{bmatrix} 0 \\ 0 \\ 0 \\ \omega_D \\ T_1 \\ T_L \\ T_{C\_} \end{bmatrix} = \begin{bmatrix} -J_D+J_L & 0 & -(C_D+C_L+DS_{WC\_1}) & -S_{WC\_1} & 1 & -T_f S_{WC\_0} \\ 0 & -\frac{1}{K} & 1 & 0 & 0 & 0 \\ 0 & 0 & 1 & 0 & 0 & 0 \\ 0 & 0 & DS_{WC\_1} & S_{WC\_1} & 0 & T_f S_{WC\_0} \\ J_D & 0 & D_L & 0 & 0 & 0 \\ 0 & 0 & D & 1 & 0 & 0 \end{bmatrix} \begin{bmatrix} x_D' \\ x_k' \\ x_D \\ x_k \\ T_D \\ 1 \end{bmatrix} \quad (85)$$

In eq. (85), the first and second lines denote state equations; the third line an input and output equation; the fourth and fifth lines observation equations; and the sixth line an estimated observation equation. Regarding the mechanistic model, it is the same as eqs. (81) to (83) of the clutch model.

(2) Result of Simulation

FIG. 59 shows a result of a simulation in which characteristic values in table 10 are applied to the functional and mechanistic models shown in FIG. 58.

spring. This lever is controlled in an operation range in accordance with stiffness $K_C$ and viscosity resistance $D_C$ of a stopper made of rubber. Functional and mechanistic models of this mechanism are shown in FIG. 61.

Figure 61:
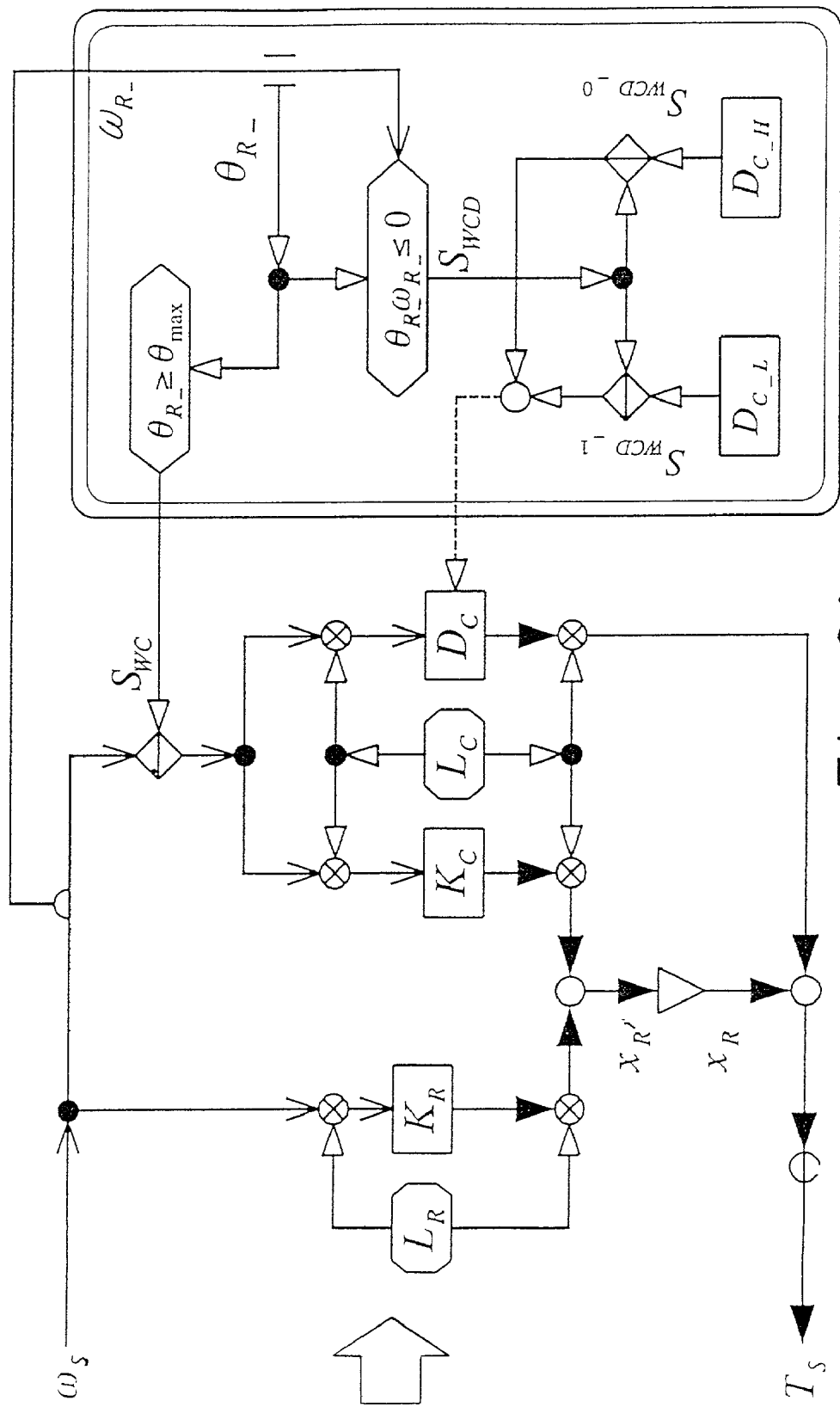
FIG. 61 is a view showing a functional model of an automatic-reset mechanism.

In FIG. 61, a pair of angular velocity $\omega_S$ and torque $T_S$ of a lever is connected to the exterior in form of input and output state quantity. With respect to the internal characteristic, the return spring is represented by stiffness $K_R$, and the rubber-made stopper is represented by stiffness $K_C$ and

TABLE 10

CHARACTERISTIC VALUE OF BRAKE

| | CHARACTERISTIC NAME | SIMBOL | UNIT | CHARACTERISTIC VALUE |
|---|---|---|---|---|
| DRIVE | MOMENT OF INERTIA | $J_D$ | [Kgm$^2$] | 0.0001 |
| SIDE | COEFFICIENT OF VISCOSITY RESISTANCE | $C_D$ | [Nmsec/rad] | 0.01 |
| LOAD | MOMENT OF INERTIA | $J_L$ | [Kgm$^2$] | 0.0001 |
| SIDE | COEFFICIENT OF VISCOSITY RESISTANCE | $C_L$ | [Nmsec/rad] | 0.02 |
| BRAKE | CLUTCH STIFFNESS | K | [rad/Nm] | $2.5 \times 10^4$ |
| | COEFFICIENT OF VISCOSITY RESISTANCE | D | [Nmsec/rad] | 0.2 |
| BRAKE | COEFFICIENT OF DYNAMIC FRICTION | $\mu_f$ | [Nm] | 0.1 |
| (MECHANISM) | SLIDING AREA | $A_f$ | [m$^2$] | $1.0 \times 10^{-3}$ |
| | SLIDING RADIUS | $R_f$ | [m] | $150.0 \times 10^{-3}$ | coefficient $D_C$ of non-linear viscosity. Distances between the rotating center of the lever acting on this and the load points are represented by sizes $L_R$ and $L_C$ shown in FIG. 60, which are factors of FIG. 61. In FIG. 61, x denotes internal state quantity.

First, the government equation of FIG. 61 is expressed by the following equation.

$$\begin{bmatrix} 0 \\ T_S \end{bmatrix} = \begin{bmatrix} -\frac{1}{K_R L_R^2 + K_C L_C^2 S_{WC}} & 0 & 1 \\ 0 & -1 & -D_C L_C^2 S_{WC} \end{bmatrix} \begin{bmatrix} x'_R \\ x_R \\ \omega_S \end{bmatrix} \quad (86)$$

Equation (86) is a state equation of one raw-one column, wherein since springs of $K_R$ and $K_C$ of FIG. 61 are connected in parallel, they are united into stiffness of a single spring to perform a low leveling.

Next, a mathematical model is determined on the mechanistic model for implementing the function of FIG. 61.

An estimated rotating angle $\theta_{R\_}$ is controlled in movement in accordance with the lever operating range $\theta_{max}$ [rad] shown in FIG. 60. This condition decision $S_{WC}$ is expressed by the following equation.

$$\text{if } (\theta_{R\_} \geq \theta_{max}) \text{ then } S_{WC}=1 \text{ else } S_{WC}=0 \quad (87)$$

Regarding the condition decision of eq. (87), when condition of $S_{WC}=1$ is applied, the lever is compulsively stopped, and when condition of $S_{WC}=0$ is applied, the lever rotates freely.

Figure 62:
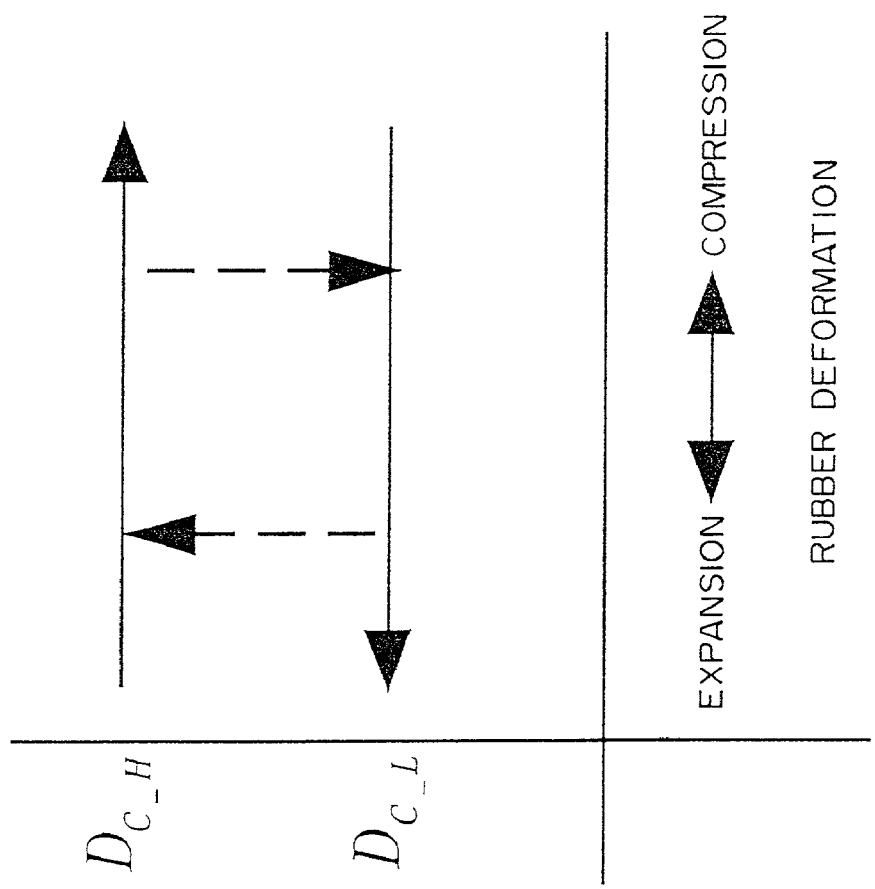
FIG. 62 is a view showing non-linear characteristics of a damping resistance factor.

Finally, it is understood through a trial examination that effecting force of the rubber-made stopper for compulsively stopping the lever is different between a compression direction and an expansion direction. So, this is represented by a non-linearity of a coefficient $D_C$ of damping resistance. It is estimated that this non-linearity is caused by the fact that while a load of the rubber effects in the compression direction, it does not so effect in the expansion direction because of a delay of the expansion. In fact, a compression stiffness $K_C$ of the rubber is also non-linear according to the deformation quantity, but this stiffness is regarded as linear modeling. FIG. 62 shows non-linear characteristics of an attenuation resistance factor $D_C$.

In FIG. 62, a damping resistance coefficient in the compression direction in a state that the lever contacts to the stopper is denoted by $D_{C\_H}$, and a damping resistance coefficient in the expansion direction is denoted by $D_{C\_L}$, and it is assumed that the damping resistance coefficient is not varied by a quantity of deformation. Modeling is implemented in such a manner that the directional property of the damping resistance coefficient is decided through an association of the forward rotation and backward rotation of the lever with the compression and expansion direction, and the damping resistance coefficients are changed over. The condition decision $S_{WCD}$ is expressed by the following equation.

$$\text{if } (\omega_R \theta_R \leq 0) \text{ then } S_{WCD}=1 \text{ else } S_{WCD}=0 \quad (88)$$

In eq. (88), $\omega_{R\_}$ determines a rotational direction of the forward rotation and the backward rotation, and when its product with $\theta_{R\_}$ is positive, the judge is compression, and when it is negative, the judge is expansion. Selection of the damping resistance coefficients $D_{C\_H}$ or $D_{C\_L}$ is performed by selection switch elements $S_{WCD\_0}$ and $S_{WCD\_1}$ which simultaneously have no states of 1 and 0. When the judge is not applied, the compression side is denoted by $S_{WCD\_0}=1$, and when the judge is applied, the expansion side is denoted by $S_{WCD\_1}=1$.

12. Rattle Device

Figure 63:
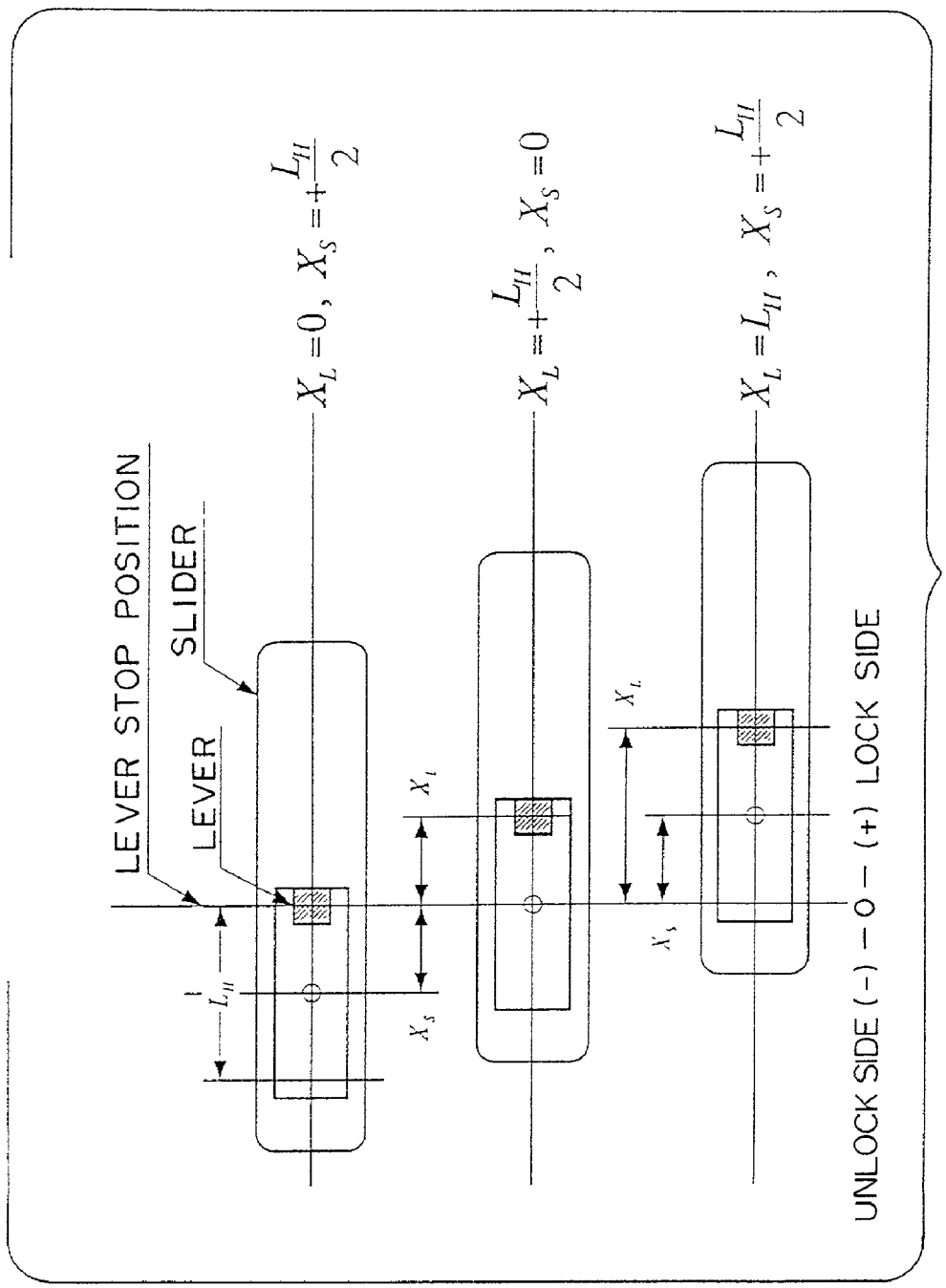
FIG. 63 is a view showing a construction of a rattle device.

A rattle device is a mechanism for preventing an interference between a manual operation from the exterior and an automatic operation by an actuator. FIG. 63 is a view showing a construction of a rattle device.

Figure 64:
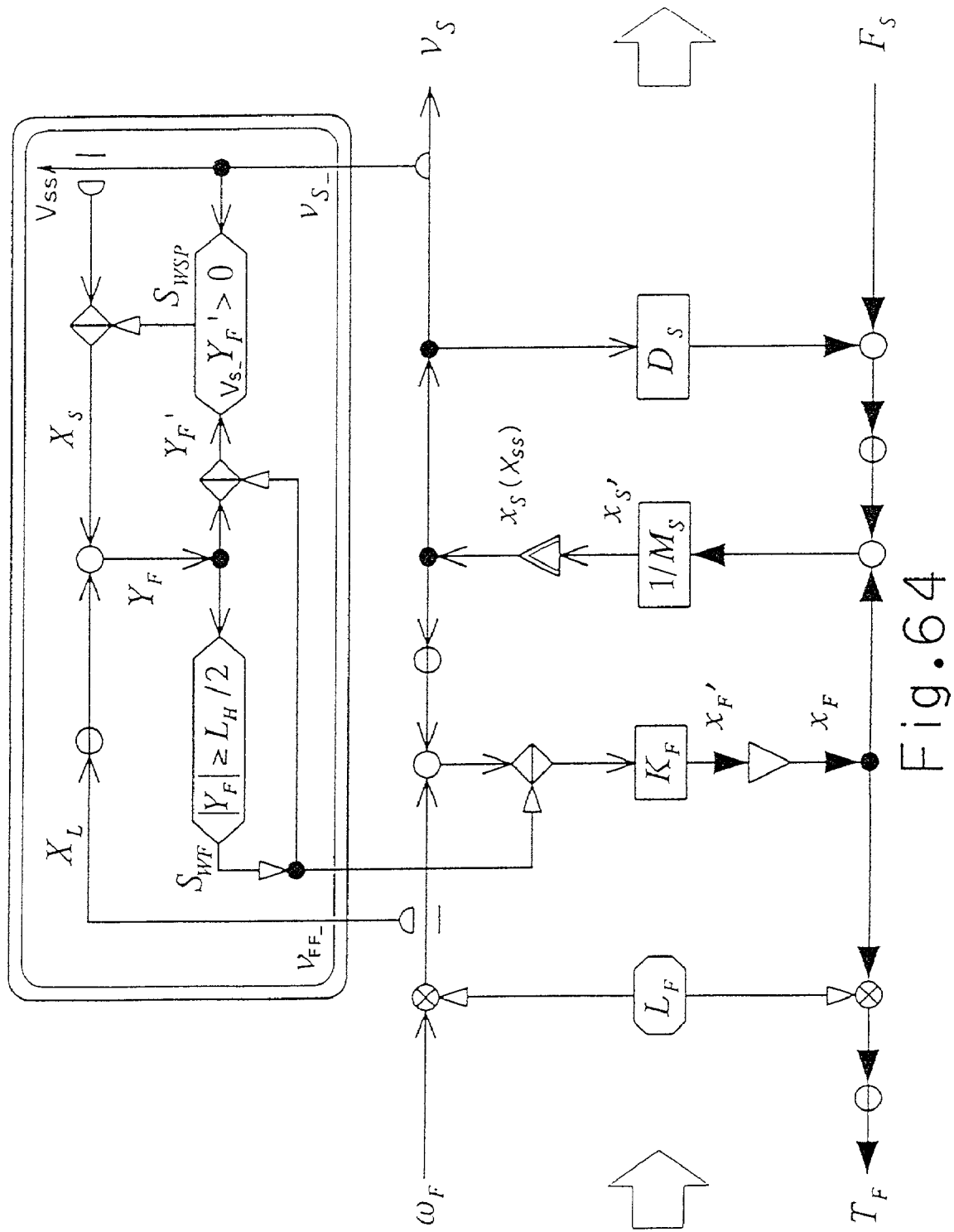
FIG. 64 is a view showing a functional model of a rattle device.

In FIG. 63, a lever driven by a motor penetrates an aperture having width $L_H$ provided on a slider and couples with the slider. In FIG. 63, $X_L$ denotes a moving quantity of the lever based on the lever stop position shown in FIG. 60; $X_S$ an estimated moving quantity of the slider; and $Y_F$ a relative distance between the lever and the slider. Where $X_L$ and $X_S$ are an estimated moving quantity. Incidentally, an operation of the rattle device will be described later. FIG. 64 shows the functional model of the rattle device in FIG. 63.

In FIG. 64, $K_F$ denotes a compression stiffness of a slider pressing side; $M_S$ mass of a slider; $D_S$ a coefficient of viscosity resistance; and $L_F$ a contact position of the slider with the lever shown in FIG. 60. Variation of $L_F$ due to the rotational angle of the lever is neglected. In FIG. 64, an angular velocity $\omega_F$ and a torque $T_F$ are coupled with a decelerator mechanism, and an output velocity $v_S$ and a load $F_S$ are connected with an external door latch mechanism. $x_S$ denotes an internal state quantity.

First, a government equation of FIG. 64 is expressed by the following equation.

$$\begin{bmatrix} 0 \\ 0 \\ v_S \\ T_F \\ v_{S\_} \end{bmatrix} = \begin{bmatrix} -M_S & 0 & D_S & 1 & -1 & 0 \\ 0 & -\frac{1}{K_F S_{WF}} & -1 & 0 & 0 & L_F \\ 0 & 0 & 1 & 0 & 0 & 0 \\ 0 & 0 & 0 & -L_F & 0 & 0 \\ S_{amp\_t} & 0 & 1 & 0 & 0 & 0 \end{bmatrix} \begin{bmatrix} x'_S \\ x'_F \\ x_S \\ x_F \\ F_S \\ \omega_F \end{bmatrix} \quad (89)$$

$$\begin{bmatrix} 0 \\ v_{SS\_} \end{bmatrix} = \begin{bmatrix} 0 & -1 & 1 & 0 \\ S^2_{amp\_t} & 0 & S_{amp\_t} & 1 \end{bmatrix} \begin{bmatrix} x'_S \\ x'_{SS} \\ x_S \\ x_{SS} \end{bmatrix}$$

The upper part of eq. (89) shows a government equation wherein the first and the second lines denote state equations, the third and the fourth lines denote input and output equations respectively, and the third line denotes an estimated observation. In eq. (89), the lower part shows an equation of an estimated storage difference quantity of mass $M_S$ wherein the first line denotes an internal storage observation quantity $x_{SS}$, and the second line denotes an estimated moving quantity $V_{SS}$ of a slider. Incidentally, $S_{amp\_t}$ is a sampling period.

A mathematical model of the functional model appearing at the upper side of FIG. 64 is introduced as follows.

First, an estimated observation quantity $V_{FF\_}$ of a lever position is derived from a rotational angle of a deceleration function in accordance with the following equation.

$$v_{FF\_} = L_F \theta_{F\_} \quad (90)$$

Next, with respect to a moving quantity $X_S$ of a slider, since a difference system of mass $M_S$ includes a moving distance $V_{SS}$, the moving quantity $X_S$ is expressed by $X_S = V_{SS}$. A moving quantity $X_L$ of a lever is expressed by eq. (90). From the moving distance $V_{SS}$ and the eq. (90), the relative position between the lever and the slider is expressed by the following equation.

$$Y_F = X_S - X_L \quad (91)$$

FIG. 63 shows the rattle device in the state that the slider is in a state of an unlock side, and the lever is pushed to a lock side. In FIG. 63, a view of the top shows the state that the lever starts to be pushed, a view of the middle shows the state that the lever stop position is located at the center of width $L_H$ of an aperture, and a view of the bottom shows the state that the lever is completely pushed to the lock side. From FIG. 63, it is understood that when the absolute value $|Y_F|$ of eq. (91) is within the range $L_H$, the lever rattles and thus the slider does not move. The condition decision $S_{WF}$ of the rattle is expressed by the following equation.

$$\text{if } \left(|Y_F| \geq \frac{L_H}{2}\right) \text{ then } S_{WF} = 1 \text{ else } S_{WF} = 0 \tag{92}$$

Finally, from eq. (92), on the condition establishment of $S_{WF}=1$, the lever pushes the slider, and on condition failure of $S_{WF}=0$, the lever rattles. The moving quantity $X_S$ of the slider at that time determines directions of push and rattle in accordance with an estimated velocity $v_{S\_}$ of the slider and the relative position $Y_F$. The condition decision $S_{WP}$ is expressed by the following equation.

$$\text{if } (v_{S\_} Y_F > 0) \text{ then } S_{WP} = 1 \text{ else } S_{WP} = 0 \tag{93}$$

Figure 65:
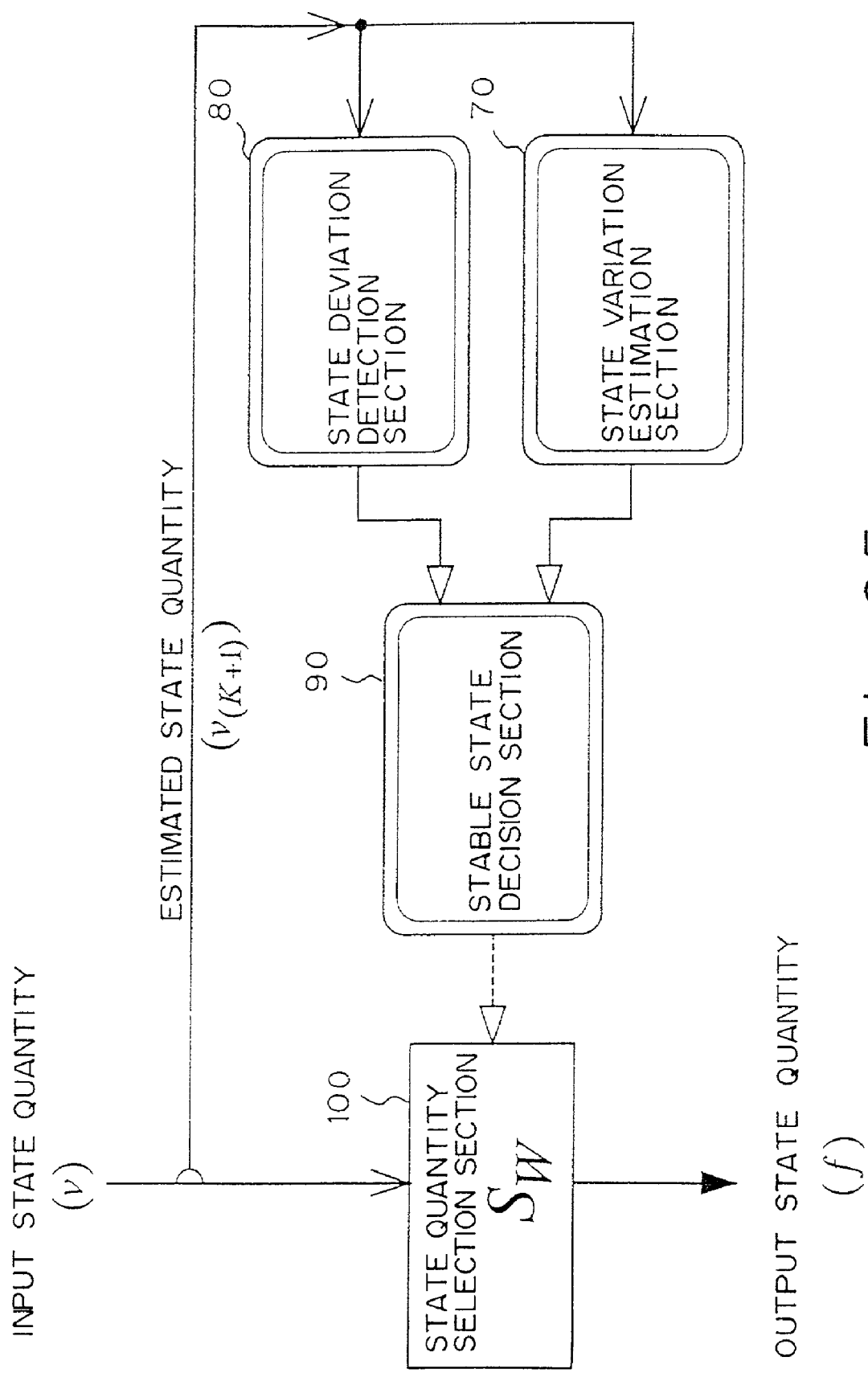
FIG. 65 is a block diagram of a fourth non-linear characteristic reproducing apparatus according to an embodiment of the present invention.
Figure 66:
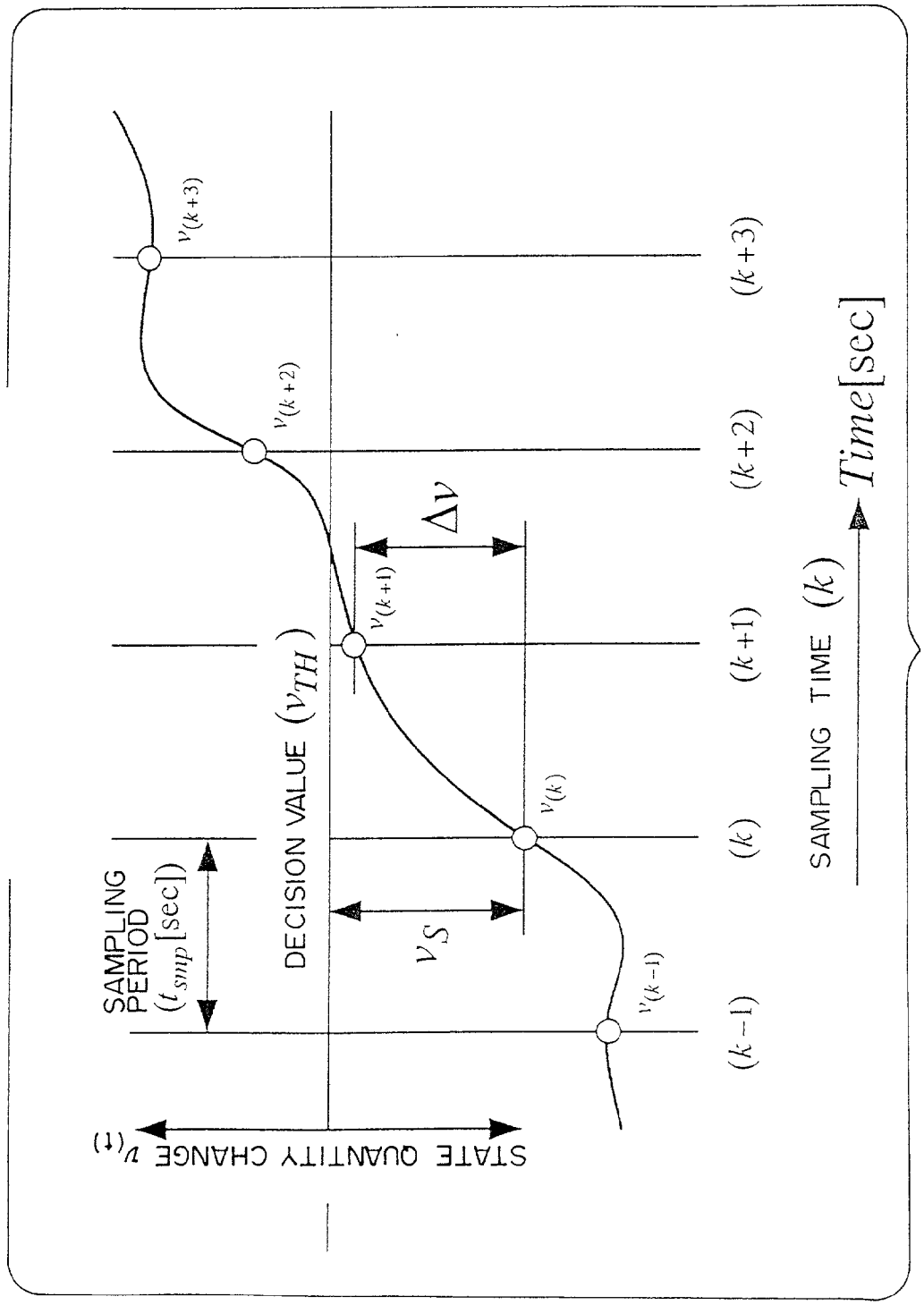
FIG. 66 is a view useful for understanding a determination state of the non-linear characteristic reproducing apparatus shown in FIG. 65.

FIG. 65 is a block diagram of a fourth non-linear characteristic reproducing apparatus according to an embodiment of the present invention. FIG. 66 is a view useful for understanding a determination state of the non-linear characteristic reproducing apparatus shown in FIG. 65. In both the figures, regarding variables, (k−1) denotes the previous sampling time; (k) the present sampling time; and (k+1) the subsequent sampling time. +n represents n-order subsequent sampling time from the present time to the future. State quantity v taking k as the suffix represent is representative of observation quantity of the respective time. In the figures, Δv denotes a variation width of the estimated observation quantity between the present sampling time and the subsequent sampling time; $V_s$ deviation between the present observation quantity $v_{(k)}$ and the decision value $V_{TH}$; $t_{smp}$ a sampling period. In FIG. 65, a stable state decision section provides such a decision that when deviation $V_s$ is smaller than the variation width Δv, the decision value is given with 1, and when deviation $V_s$ is larger than the variation width Δv, the decision value is given with 0.

According to the prior art, the decision is made through a matter that observation quantity is within a range of the designated stable width (dead zone). For this reason, variation of sampling period and observation quantity notable in variation causes a stability decision to be unstable. To the contrary, according to the decision method proposed here, wherein no stable width (dead zone) is provided, it is possible to prevent non-stability due to variations of the sampling period and the state quantity.

Figure 67:
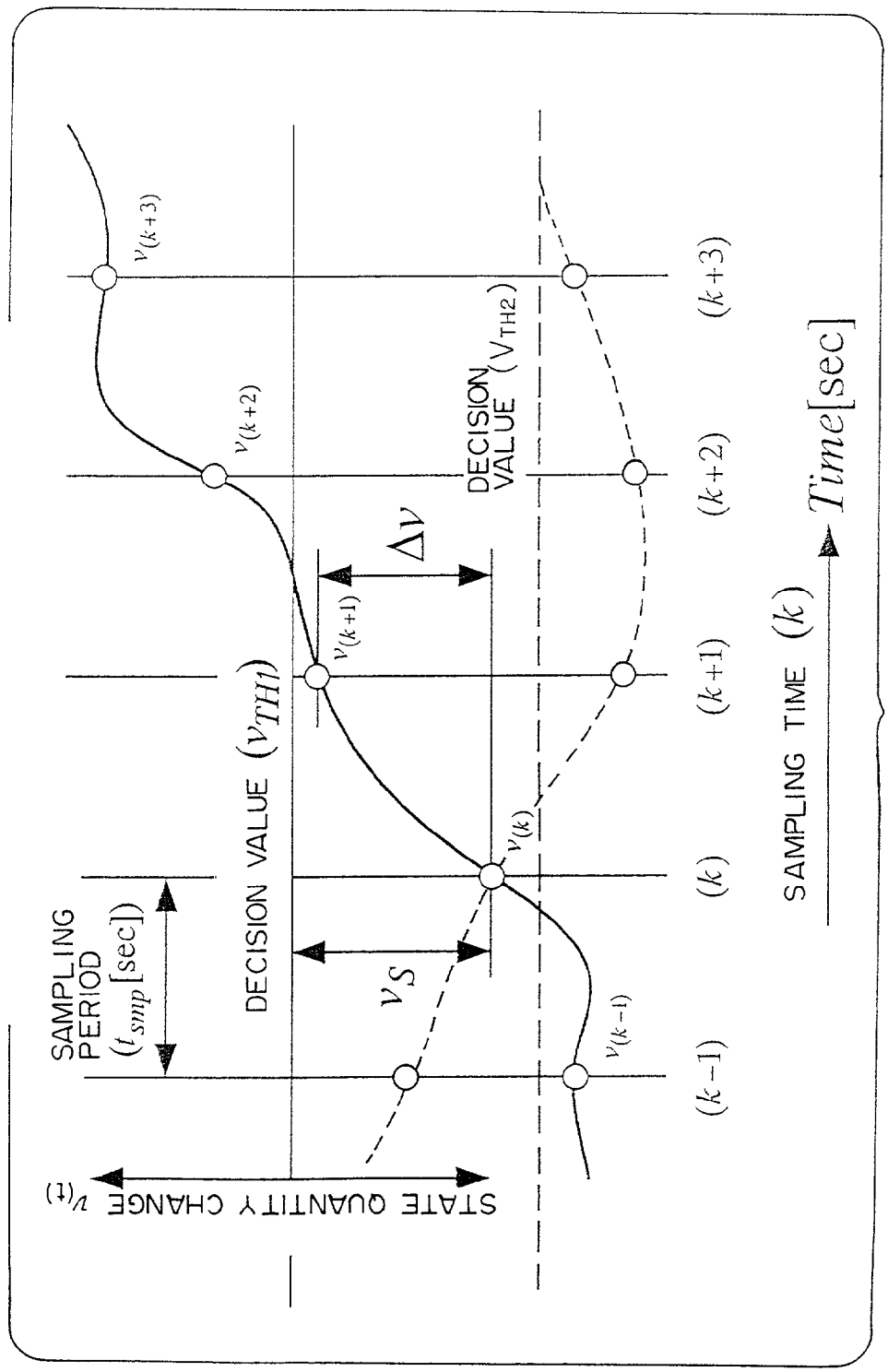
FIG. 67 is a view useful for understanding a determination state of the non-linear characteristic reproducing apparatus shown in FIG. 65, wherein a hysteresis is added.

As shown in FIG. 67, an adoption of a decision value $V_{TH1}$ for rising and a decision value $V_{TH2}$ for going down may establish a hysteresis for rising and going down of the state quantity, so that the more stable decision can be expected.

Figure 68:
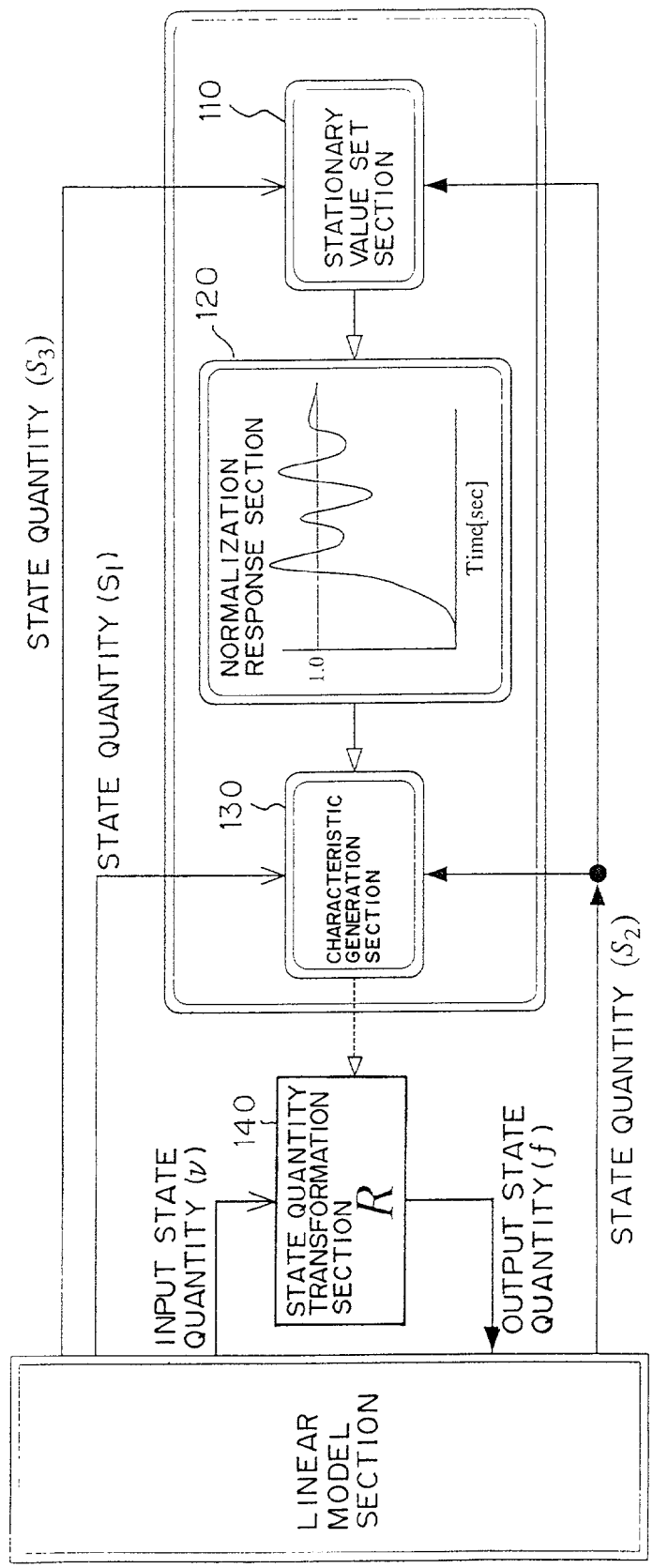
FIG. 68 is a principle explanatory view of a fifth non-linear characteristic reproducing apparatus according to an embodiment of the present invention.

FIG. 68 is a principle explanatory view of a fifth non-linear characteristic reproducing apparatus according to an embodiment of the present invention. Incidentally, FIG. 68 is a view useful for easily understanding a principle the fifth non-linear characteristic reproducing apparatus according to an embodiment of the present invention, and the fifth non-linear characteristic reproducing apparatus according to an embodiment of the present invention is not confined to FIG. 68 and the associated description.

In FIG. 68, a stationary state of variation value, which is generated in accordance with state quantities $S_2$ and $S_3$, is fed to a normalization response section having a response range of 0 to 1 in which the stationary state of variation value is reproduced in form of a non-linear response value varying on a time basis in accordance with a non-linear response characteristic of the normalization response section. A result of reproduction is fed to a characteristic generation section in which it is transformed to a variation of characteristic R of a state quantity transformation section and substituted, so that a slow response characteristic is reproduced (reflected) in the whole system of linear model.

The use of the apparatus for reproducing the time history of response makes it possible to remove an inherent value dominating an influence of the temperature rise due to the energy loss concerned with the slow behavior and an influence for variations of the environment such as the outside air temperature and the atmospheric pressure, from an inherent value dominating a complicated transient characteristic of the linear model of the whole system. Here, the range of the removable slow transient response is restricted to the range in which inherent values of an electric system and a mechanical system are not stimulated.

(Explanation of Example)

13. Example of Modeling for Temperature Rise

Here, let us try to establish modeling in which a relatively slow transient change is reproduced in form of a non-linearity.

(1) Normalized Primary Response Model

In many case, it happens that many of characteristics varying with the passage of time is expressed in form of primary or secondary response characteristic. For this reason, there is used a discrete equation in which the primary and the secondary response delays are normalized in a range of 0 to 1 and are considered as factors for non-unit quantities. The general equation of the primary response is expressed by the following equation.

$$\left. \begin{array}{l} z_{1(k+1)} = p_1 z_{1(k)} + q_1 u_{1(k)} \\ y_{(k)} = c_1 z_{1(k)} + d_1 u_1 \end{array} \right\} \tag{94}$$

$$P_1 = \exp\left(-\frac{t_{smp}}{\tau_1}\right) \tag{95}$$

In eq. (94), $P_1$ denotes an inherent of a discrete primary delay, which converges in a range of 0~1 and disperses in a range of more than 1. And $\tau_1$ denotes a time constant of the system; $t_{smp}$ a sampling period on a discrete basis; and suffix k a sampling time.

In eq. (94), $z_{1(k+1)}$ and $z_{1(k)}$ denote internal state quantities; $u_{1(k)}$ and $y_{1(k)}$ input and output state quantities; $q_1$ a coefficient of input state quantity; and $C_1$ a coefficient of output state quantity. In the stationary state of eq. (94), $z_{1(k+1)}=z_{1(k)}=u_{1(k)}$ are given, and thus there is generated no difference between the input state quantity and the output state quantity. Therefore, the state equation of the upper side of eq. (94) can be normalized when the coefficient $q_1$ of input state quantity is expressed by the following equation.

$$q_1 = (1 - P_1) \tag{96}$$

The primary response (normalized) of the subsequent sampling period, wherein eq. (96) is substituted for $q_1$ of eq.

(94), the coefficients of the output equation are given with $c_1=1 \cdot d_1=0$, and the output equation is omitted, is expressed by the following equation.

$$z_{1(k+1)} = p_1 z_{1(k)} + (1-P_1)u_1 \qquad (97)$$

(2) Normalized Secondary Response Model

Likely, when the secondary response is regarded also as an interference of two primary responses and is rearranged, the secondary response is expressed by the following equation. Incidentally, the rearranging process is omitted.

$$\left. \begin{array}{l} z_{a(k+1)} = p_a z_{a(k)} + (1-p_a)(1-g_{ab})u_{1(k)} \\ z_{b(k+1)} = p_b z_{b(k)} + (1-p_b)(1-g_{ab})u_{1(k)} \\ y_{2(k)} = (z_{a(k)} + z_{b(k)})/2 \end{array} \right\} \qquad (98)$$

Where $p_a$ and $p_b$ denote inherent values associated with eq. (95), and $g_{ab}$ denotes a coefficient indicative of a degree of the interference between two primary responses. They are expressed by the following equation.

$$\left. \begin{array}{l} p_a = \exp\{-t_{smp}/\tau_a\} \\ p_b = \exp\{-t_{smp}/\tau_b\} \\ g_{ab} = (\tau_a + \tau_b)/(\tau_a - \tau_b) \end{array} \right\} \qquad (99)$$

In eq. (99), $\tau_a$ and $\tau_b$ denote tie constant, and $t_{smp}$ denotes a sampling period.

(3) Temperature Rising Model

By way of example, a temperature dependency of a winding resistance of a motor is subjected to a modeling. Application of an electric power to a motor causes a temperature to rise owing to self-heating by the consumed power $P_M$. The temperature rise $T_U$ is expressed by the following equation, where $\delta_M$ is a coefficient of heat radiation of the motor.

$$T_U = \frac{1}{\delta_M} P_M \qquad (100)$$

From eq. (100) the temperature rise $T_U$ is determined by the consumed power of coil resistance $P_M$. As the temperature rises and the current is reduced, the consumed power is reduced. And as a result, the mechanical output is reduced. When the motor current is denoted by $I_M$ and the coil resistance is denoted by $R_M$, the consumed power $P_M$ is expressed bt the following equation.

$$P_M = R_M I_M^2 \qquad (101)$$

It is known that a process wherein the temperature generated in eq. (100) becomes a stationary state offers a primary delay of response. Thus, the response of the temperature rise wherein the temperature rise of eq. (100) is set up to the target value is expressed by the following equation in accordance with eqs. (97) and (100). Where $\tau_M$ in the equation denotes a thermal time constant.

$$\left. \begin{array}{l} T_{x(k+1)} = P_M T_{x(k)} + (1 - P_M) T_U \\ P_M = \exp\left\{-\dfrac{t_{smp}}{\tau_M}\right\} \end{array} \right\} \qquad (102)$$

Next, a coil resistance $R_M$ in coil temperature $T_x$ having characteristics of a temperature coefficient $\alpha_W$, relation between a reference temperature $T_{MS}$ and a reference resistance $R_{MS}$ is expressed by the following equation. Where $T_x$ denotes the estimated temperature $T_{x(K+1)}$ represented by eq. (102).

$$R_M = R_{MS}\{1 + \alpha_W(T_{x(k+1)} - T_{MS})\} \qquad (103)$$

Equation (103) gives a coil resistance value of the subsequent sampling time. When a atmospheric temperature is considered, the atmospheric temperature is added in the term of the temperature of eq. (103).

(4) Functional Model

Figure 69:
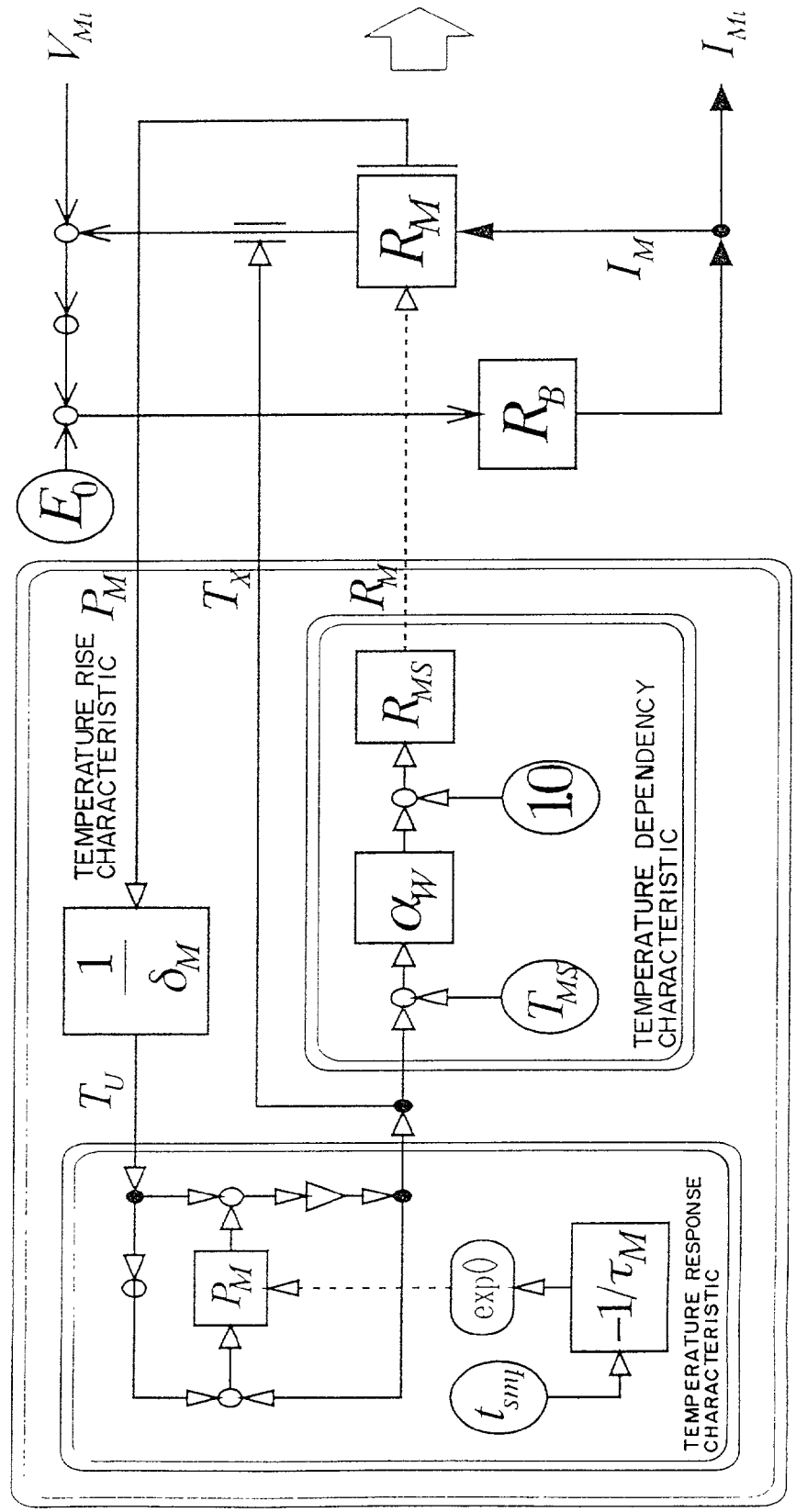
FIG. 69 is a view showing a functional model of a coil temperature rise.

FIG. 69 shows a functional model incorporating thereinto a mechanistic model in which the above-mentioned relation is rearranged to establish a modeling.

The functional model of FIG. 69 is a combination of a supply element and a basic functional element of a fluid loss properties. The functional model supplies the consumed power $P_M$ of a coil resistance of a motor to the mechanistic model and feeds from the mechanistic model an alteration value of a coil resistance $R_M$ due to the temperature rise to the functional model. The output difference quantity of the coil resistance $R_M$ stores the temperature rise $T_x$ in form of a temperature energy.

The functional model of FIG. 69 is expressed by the following government equation.

$$\begin{bmatrix} I_{MO} \\ V_{MO} \end{bmatrix} = \begin{bmatrix} -\dfrac{1}{R_B} & \dfrac{E_0}{R_B} \\ 1 & E_0 \end{bmatrix} \begin{bmatrix} V_{Mi} \\ 1 \end{bmatrix} \qquad (104)$$

(5) Result of Simulation

Figure 70:
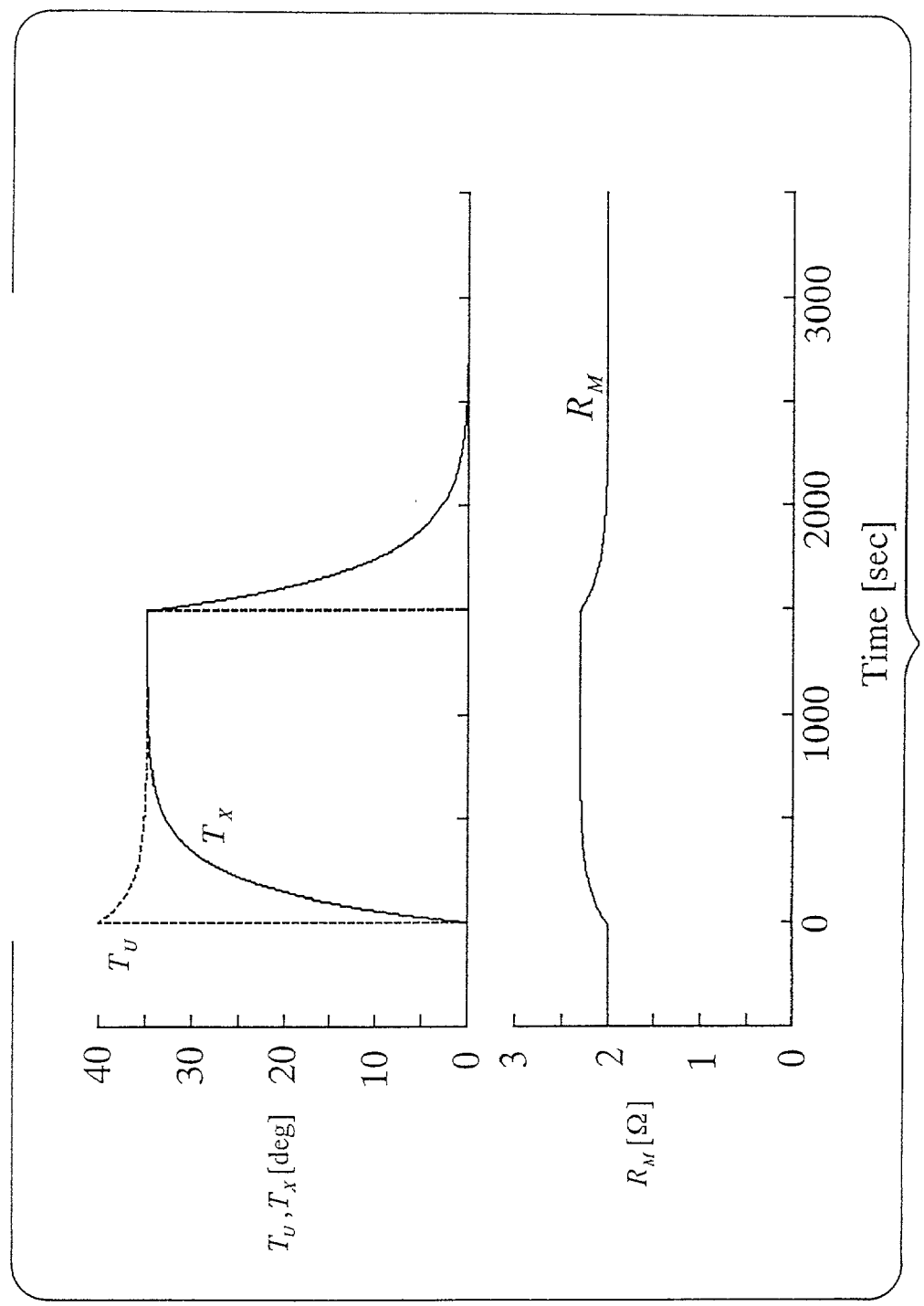
FIG. 70 is a view showing a simulation result of a coil temperature rise.

FIG. 70 shows a result of simulation on the functional model of FIG. 69 in accordance with the characteristics of table 11.

In the simulation, the voltage of 12 [V] is applied at 0 [sec], and at 1500 [sec] it is turned off. At the later time, assuming a lock state in which a rotation of the motor is fixed, an input voltage $V_{Mi}$ is set to 0 [V]. The reason why in FIG. 70, the target value $T_U$ is lowered owing to the temperature rise after the power source is turned on is that the temperature rise involves the increment of the resistance value of the coil and the consumed power is lowered. With the passage of time $T_U$ and $T_X$ are coincident with each other and it offers a stationary state wherein heating and heat radiation are balanced.

TABLE 11

Characteristic table of coil temperature rise

| Characteristic name | Symbol | unit | Characteristic value |
| --- | --- | --- | --- |
| Coil resistance of reference temperature | $R_{MS}$ | [Ω] | 2.0 |
| Reference temperature of coil resistance | $T_{MS}$ | [° C.] | 25.0 |
| Coefficient of coil temperature | $\alpha_W$ | [sec] | 4.3 × 10$^{-3}$ |
| Thermal time constant of motor coil | $\tau_M$ | [W/deg] | 200.2 |
| Coefficient of heat radiation of motor coil | $\Omega_M$ | | 1.8 |
| Source voltage | $E_0$ | [V] | 12.0 |
| Internal resistance of source | $R_B$ | [Ω] | 0.001 |

14. Positive Characteristic Thermistor

(1) Outline of Overload Protection Function

Figure 71:
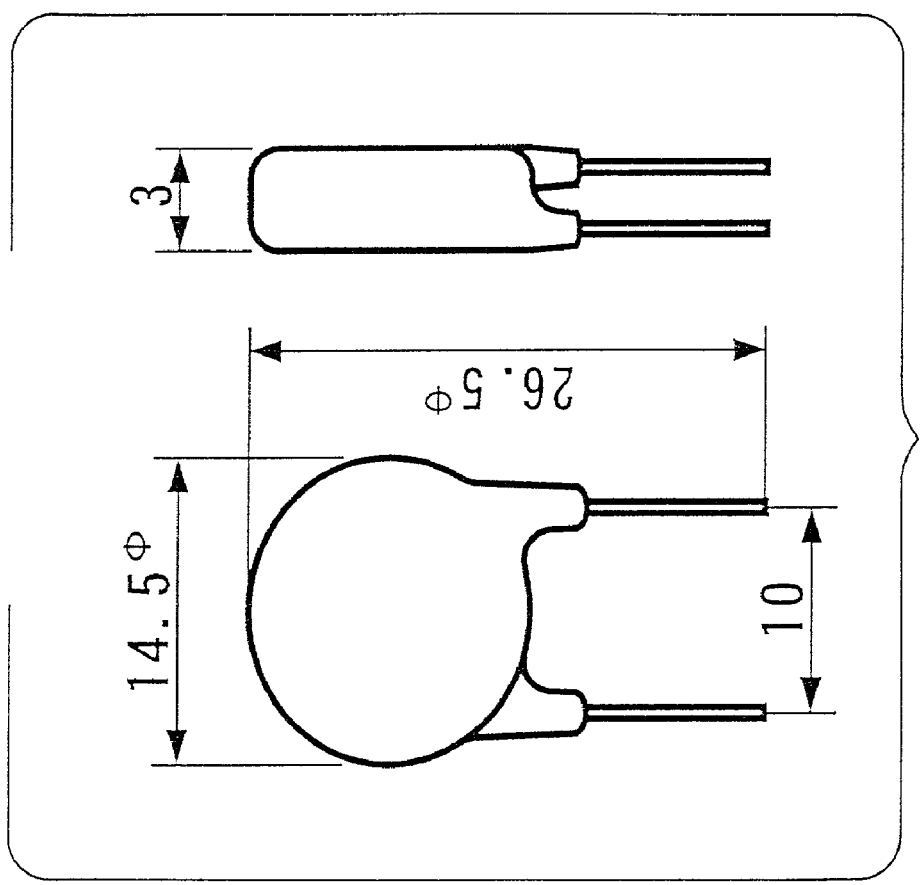
FIG. 71 is a perspective view of a positive characteristic thermistor.

A motor is subjected to an overload and a compulsory stop by an equipment connected to an output of a mechanical system. At that time an overcurrent nearly as large as the starting current conducts through a coil resistance of the motor. In the event that this state continues a long time, the motor is heated and burned. Regarding the overload, since torque and current of the motor is in proportion to a motor constant $M_M$, a provision of the function for detecting and suppressing overcurrent makes it possible to prevent such a burning of the motor. As methods for protection of the motor from burning, there are many ways such as the simple use of a fuse fused by an overcurrent and a complicated way on an electronic basis. Here, there will be considered a method of preventing burning in such a way that a single positive characteristic resistance device, which is usually used in a miniature motor for a car, is adopted to detect the overcurrent. Here, the positive characteristic resistance device is referred to as a positive characteristic thermistor. FIG. 71 is a perspective view of the positive characteristic thermistor.

The positive characteristic thermistor has such a non-linear characteristic that when a temperature is low, a resistance value is small, and when the temperature is high, the resistance value is large. According to such a characteristic, when the motor current is within a range of tolerance, the resistance value of the positive characteristic thermistor is small, and when the motor is in an overload state, the resistance value is increased owing to self-heating due to the overcurrent so that the current is suppressed. This working is implemented by a contactless switch in which the non-linear resistance characteristic of the positive characteristic thermistor having temperature dependency properties is utilized to perform detection and blocking of the overcurrent.

(2) Functional Model of an Overload Protection

Figure 72:
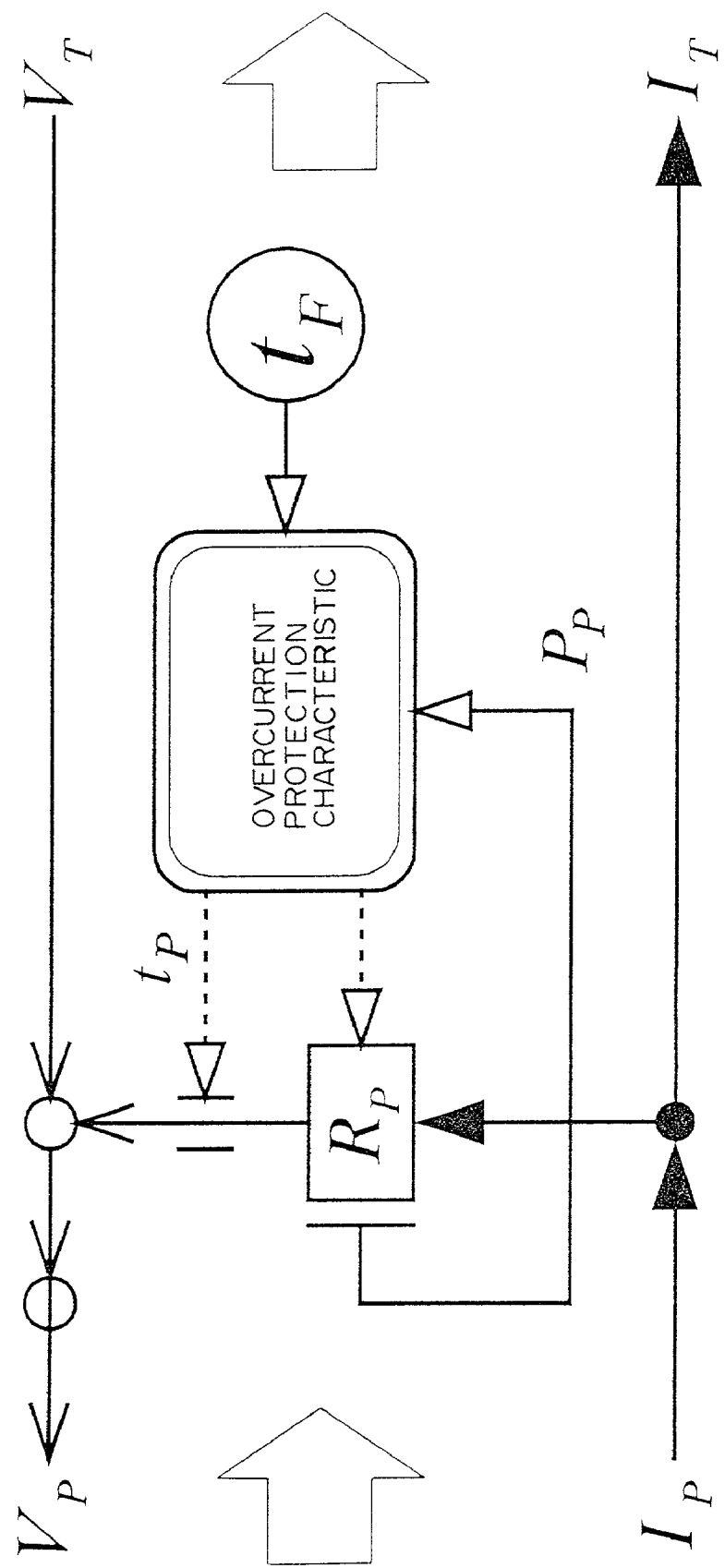
FIG. 72 is a view showing a functional model of an overload protection.

FIG. 72 is a view showing a functional model of an overload protection in which the positive characteristic thermistor is connected in series to the motor so that motor current $I_M(I_T)$ directly conducts.

In FIG. 72, a resistance $R_P$ denotes a non-linear resistance of a positive characteristic thermistor; $t_P$ a temperature of a static characteristic thermistor; and $t_F$ an ambient temperature. According to the mechanistic model of the overload protection characteristic, there is generated a non-linear resistance in which the positive characteristic thermistor detects an overcurrent to be suppressed, and the non-linear resistance thus generated is substituted for $R_P$. Further, according to this mechanistic model, $V_T$ and $I_T$ are connected to the motor, and $V_P$ and $I_P$ are connected to the operational switch at the power supply side.

The functional model of the overload protection shown in FIG. 72 is expressed by the following government equation.

$$\begin{bmatrix} V_P \\ I_T \end{bmatrix} = \begin{bmatrix} -R_P & -1 \\ 1 & 0 \end{bmatrix} \begin{bmatrix} I_P \\ V_T \end{bmatrix} \tag{105}$$

(3) Mechanistic Model of a Positive Characteristic Resistance Element

Figure 73:
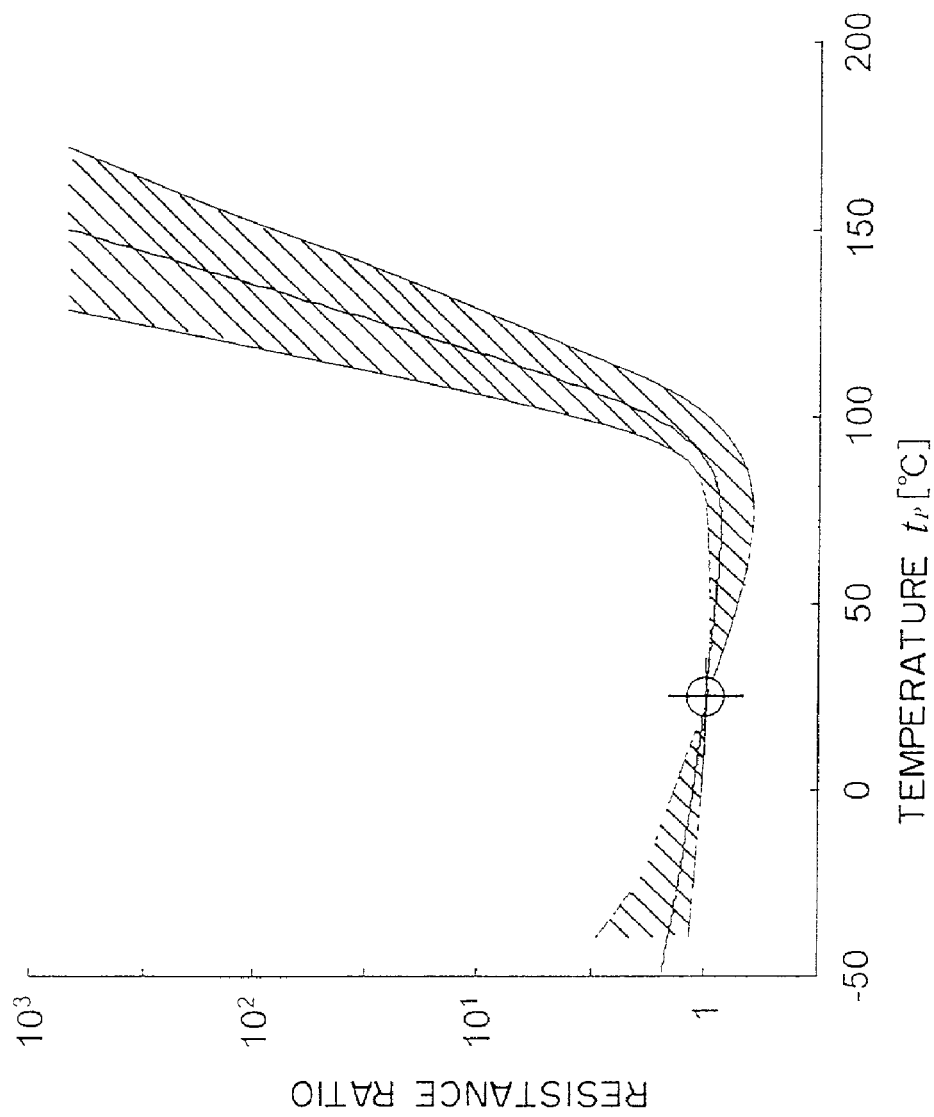
FIG. 73 is a view showing resistance ratio characteristic of a positive characteristic thermistor.

A non-linear resistance characteristic of a positive characteristic thermistor for performing an overload protection of the motor can be represented by temperature-resistance ratio characteristics shown in FIG. 73.

In FIG. 73, with respect to the relation between the temperature $t_P$ of the positive characteristic thermistor and the resistance ratio, the resistance ratio is represented by logarithms, since variations at the high temperature side are remarkable as compared with the low temperature side. The characteristic is defined in such a manner that the resistance ratio of the reference temperature of 25[° C.] is given as 1, and a temperature, wherein the resistance ratio becomes twice, is given as a resistance critical point. In FIG. 73, an area shown with a hatching portion denotes a tolerance of the positive characteristic thermistor to be used. At that time, the temperature characteristic of the positive characteristic thermistor offers, as shown in FIG. 73, such a compound characteristic that at the low temperature side a negative characteristic appears and at the high temperature above the resistance critical point or so a positive characteristic appears. To establish modeling, the modeling is expressed by an approximation equation in which the compounded two characteristics are combined.

The resistance ratio at the low temperature side is expressed by the following equation from the general equation of the negative characteristic thermistor represented by the inverse of the temperature.

$$\psi_{P\_L} = \exp\left\{ B_{PL}\left(\frac{1}{273+t_X} - \frac{1}{273+T_{PL}}\right)\right\} \tag{106}$$

The resistance ratio at the high temperature side is expressed by the following equation which is an approximation equation of the positive characteristic wherein the temperature term shown in eq. (106) is replaced by a proportion from an inverse proportion.

$$\psi_{P\_H} = \exp\left\{\frac{1}{B_{PH}}(t_P - T_{PH})\right\} \tag{107}$$

From eqs. (106) and (107), the approximation equation of the non-linear resistance of the positive characteristic thermistor is expressed by the following equation.

$$R_P = R_{PS}(\psi_{P\_L} + \psi_{P\_H}) \tag{108}$$

where $t_P$: a temperature [° C.] of the positive characteristic thermistor $R_P$: a resistance value [Ω] at a temperature $t_X$ $R_{PS}$: a reference resistance value at the reference temperature 25[° C.]

$\Psi_{P\_L}$, $\Psi_{P\_H}$ resistance ratios at the low temperature side and the high temperature side, respectively $T_{PL}$ a reference temperature [° C.] in which the resistance ratio is 1

$T_{PH}$: a temperature [° C.] at the critical point of resistance of a transition to the high temperature side $B_{PL}$: a constant [K] corresponding to B-characteristic of the negative characteristic thermistor $B_{PH}$: a constant [K] corresponding to B-characteristic of the positive characteristic thermistor Table 12 shows characteristic values of the positive characteristic thermistor which some device maker opens to the public. The resistance characteristic applied to eqs. (106) and (107) is indicated with the hatching heavy line in FIG. 73.

TABLE 12

SPECIFICATION AND CHARACTERISTIC OF POSITIVE CHARACTERISTIC THERMISTOR

| CHARACTERISTIC NAME | SIMBOL | UNIT | CHARACTERISTIC VALUE | CONDITION |
|---|---|---|---|---|
| REFERENCE TEMPERATURE | $T_{PL}$ | [° C.] | 25.1 | |
| REFERENCE RESISTANCE | $R_{PS}$ | [Ω] | 0.5 | TOLERANCE ±20 [%] |
| RESISTANCE TRANSFORMATION POINT TEMPERATURE | $T_{PH}$ | [° C.] | 100.0 | TOLERANCE ±5 [° C.] |
| NEGATIVE B-CONSTANT | $B_{PL}$ | [K] | 400.0 | |
| POSITIVE CHARACTERISTIC B-CONSTANT | $P_{PH}$ | [K] | 7.6 | |

In FIG. 73, a resistance variation is small up to 100[° C.] or so of the resistance critical point in which the motor coil is not damaged, and a low resistance appears. When the overload current conducts through the motor, a consumed power $P_P$ of the positive characteristic thermistor resistance is increased, so that a self-heating occurs owing to Joule heat. The self-heating involves further temperature rise $t_{PU}$ of the positive characteristic thermistor, so that the resistance value rapidly increases at the resistance critical point or so and whereby the heating further advances. On the other hand, the rapid increment of the resistance value serves to decrease the motor current, so that the temperature stabilizes at the balanced point of heating and heat radiation of the positive characteristic thermistor and settles down at a temperature $t_P$. At that time, the current maintains a smaller value with respect to the upper limit in which the motor is subjected to burning.

Figure 74:
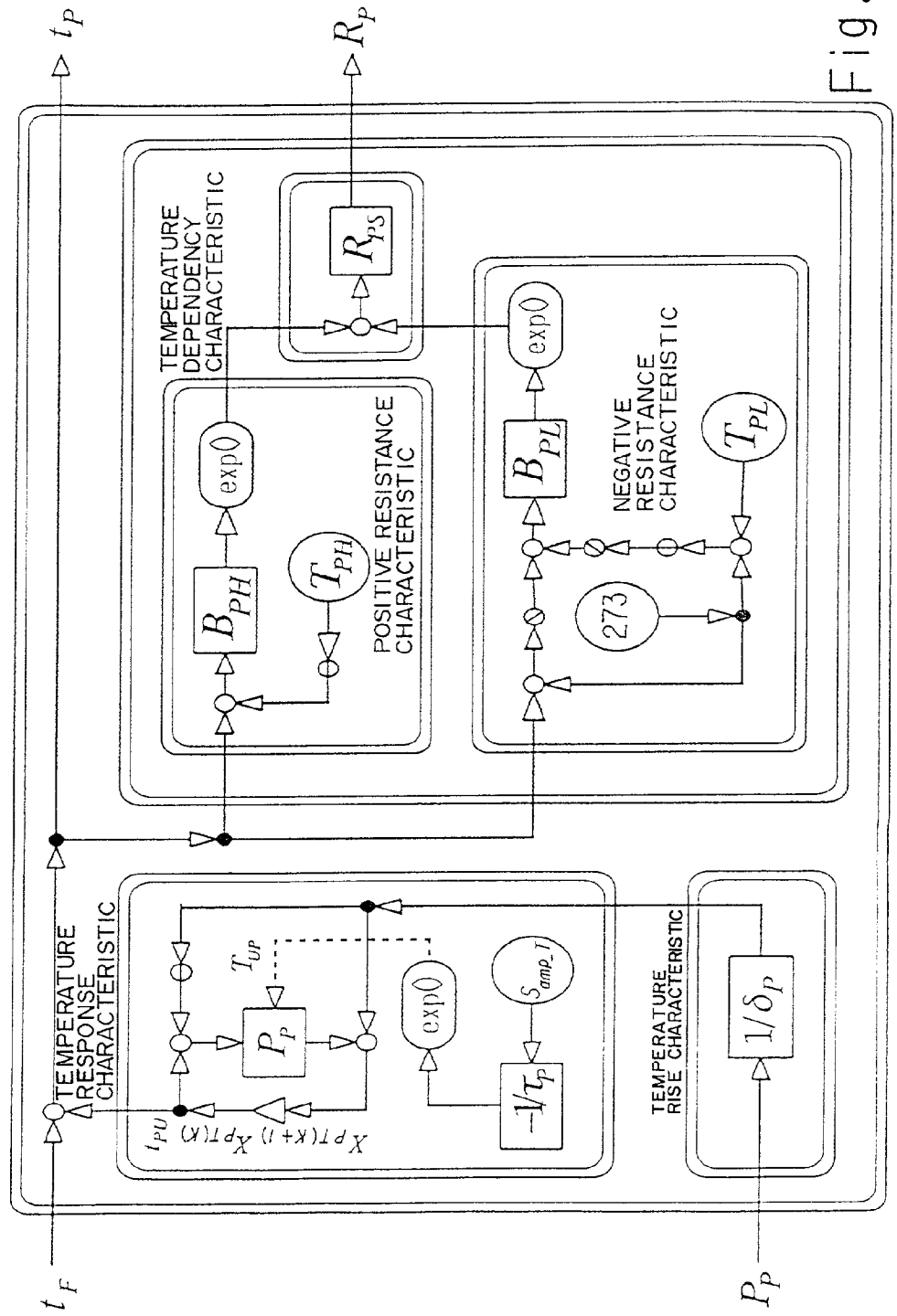
FIG. 74 is a view showing a functional model of a positive characteristic thermistor.

With respect to the self-heating and heat radiation of the positive characteristic thermistor which dominates the overload protection, in a similar fashion to that of the above-mentioned motor coil, the temperature rise $t_{PU}$ [deg] is determined the heat radiation constant $\delta_P$ [W/deg]. The temperature rise $t_{PU}$ [deg] still in progress is determined in accordance with the thermal constant $\tau_p$ of the positive characteristic thermistor. One in which the ambient temperature $t_F$ [° C.] is added to the temperature rise $t_{PU}$ [deg] is a temperature $t_P$ [° C.] to be stored in the positive characteristic thermistor. $t_F$ denotes the atmosphere temperature [° C.]. FIG. 74 shows a relation of those in form of the mechanistic model.

(4) Stationary functional model of a motor-lock state

Figure 75:
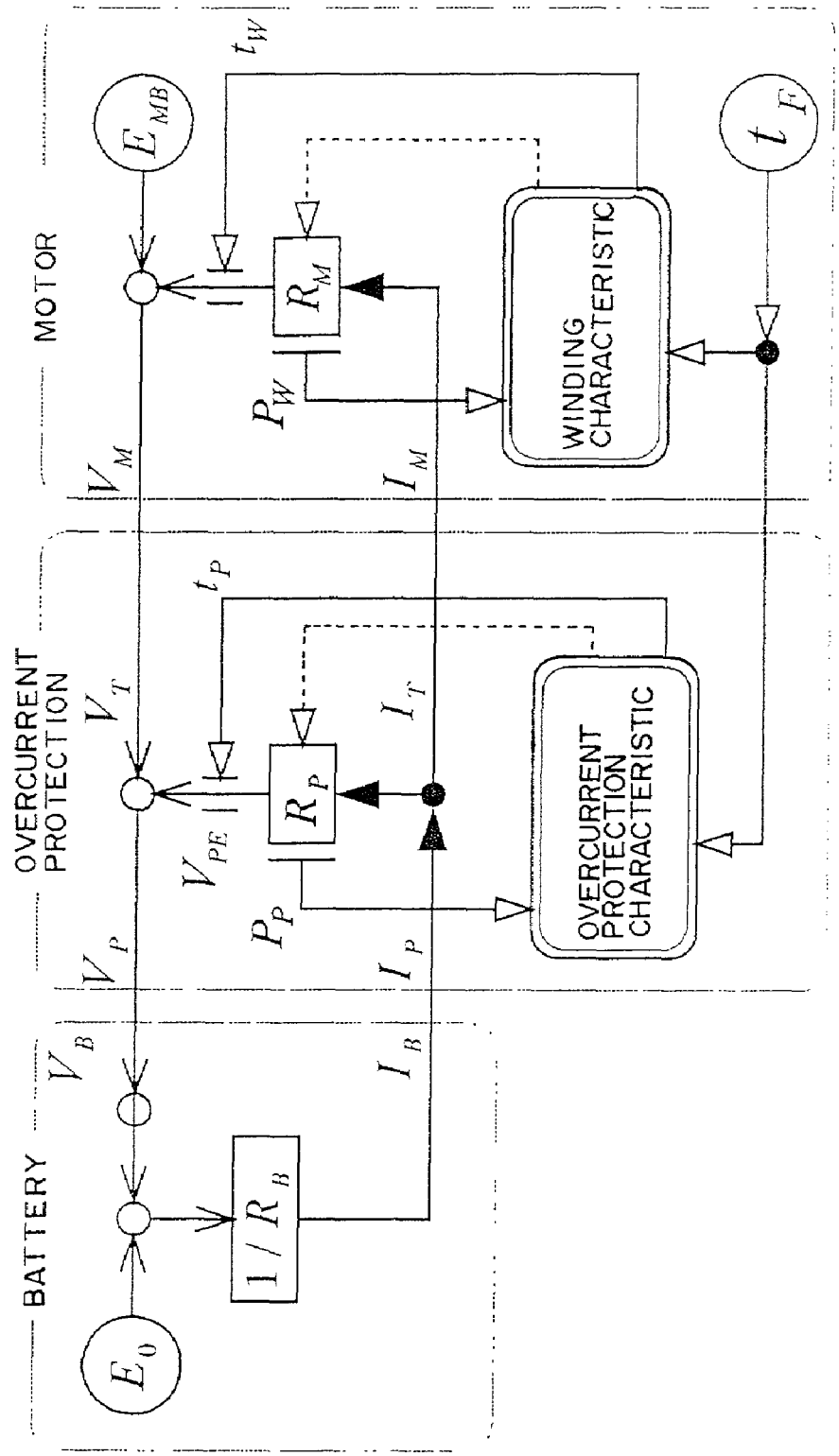
FIG. 75 is a view showing a functional model of a motor lock.

Now let us consider an overcurrent of the motor-lock state and the behavior of the positive characteristic thermistor in the event that a rotation of the motor is compulsively stopped, and verify the utility of the overload protection characteristic. FIG. 75 shows a stationary functional model in which the condition of the motor-lock state is incorporated.

In FIG. 75, $R_P \cdot R_M$ are varied in resistance value by self-heating by a lock current $I_{0\_L}$, but not varied in another. In FIG. 75, with respect to the brush potential drop $E_{MB}$, since the motor is in the stop state, $E_{MB}=0$ is to be set up. However, in view of the fact that even in the stop state the armature is associated with the micro vibration, the brush potential drop is considered. Further, in FIG. 75, since the induced voltage $V_\omega$ is not generated, electric resistance elements, which are connected in series with each other, are directly connected to the battery, so that very large current $I_{0\_L}$ conducts through the motor.

The mathematical model of the functional model of FIG. 75 is expressed by the following equation.

$$I_{0\_L} = \frac{E_0 - E_{MB}}{R_B + R_P + R_M} \qquad (109)$$

In eq. (109), since the power supply is in the state of turn-on, the operational switches set up as $S_{WE}=S_{WA}=1$.

(5) Result of Simulation

Figure 76:
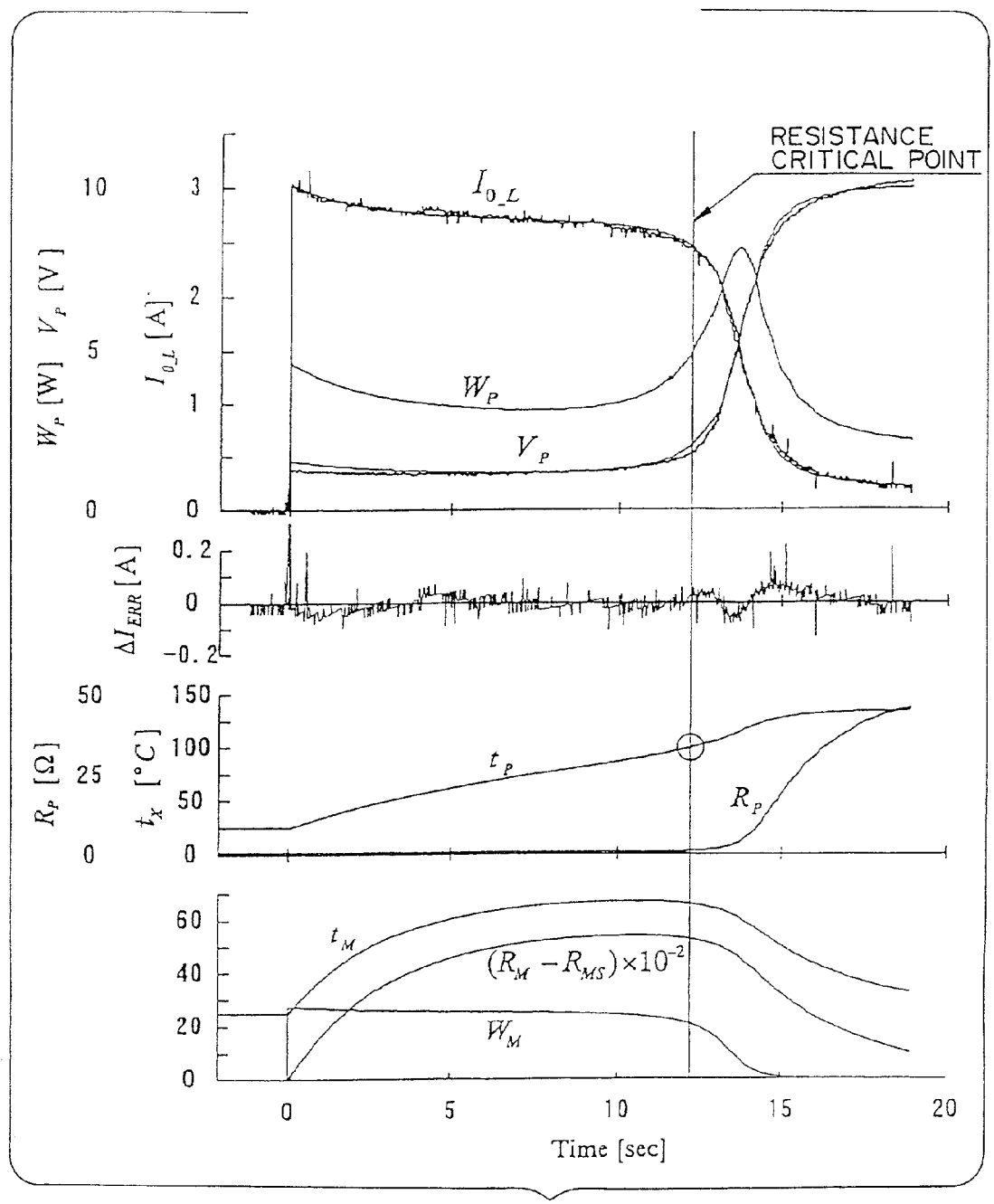
FIG. 76 is a view showing a simulation result of a motor lock.

FIG. 76 shows a result of a simulation which is performed on the functional model of FIG. 75 and the respective mechanistic models using parameters of Table 13. Incidentally, in Table 13, an efficient $\delta_M$ of heat radiation of a motor coil resistance, a thermal time constant $\tau_M$ of the motor coil resistance, a coefficient $\delta_P$ of heat radiation of a positive characteristic thermistor, and a thermal time constant $\tau_P$ of the positive characteristic thermistor are determined in accordance with an identification putting emphasis on an accuracy of a motor current.

TABLE 13

THERMAL CHARACTERISTIC OF POSITIVE CHARACTERISTIC THERMISTOR AND MOTOR

| CHARACTERISTIC NAME | SIMBOL | UNIT | CHARACTERISTIC VALUE |
|---|---|---|---|
| THERMAL TIME CONSTANT OF POSITIVE CHARACTERISTIC THERMISTOR | $\tau_P$ | [SEC] | 25.5 |
| COEFFICIENT OF HEAT RADIATION OF POSITIVE CHARACTERISTIC THERMISTOR | $\delta_P$ | [W/deg] | 0.018 |
| REFERENCE TEMPERATURE OF COIL RESISTANCE | $T_{MS}$ | [° C.] | 25.0 |
| COEFFICIENT OF TEMPERATURE OF COIL | $\alpha_{CU}$ | | $43.0 \times 10^{-3}$ |
| THERMAL TIME CONSTANT OF MOTOR COIL | $\tau_M$ | [sec] | 3.2 |
| COEFFICIENT OF HEAT RADIATION OF MOTOR COIL | $\delta_M$ | [W/deg] | 0.58 |

In the top portion of FIG. 76 current $I_{0\_L}$ [A] and voltage $V_P$ [V] of a positive characteristic thermistor are shown, wherein measurement data are denoted as fine, thick line and calculation results are denoted as thick, weak line, and further a calculation result of a consumed power $W_P$ [W] is added. The second portion shows the measurement value of the motor-lock current $I_{o\_L}$ [A] and the current deviation $\Delta I_{ERR}$ [A] of the calculation result. The third portion is the calculation result of the temperature $t_P$ [° C.] and the resistance $R_P[\Omega]$ of the positive characteristic thermistor. The fourth portion is the calculation result of coil temperature $t_M$ [° C.], coil resistance $R_M[\Omega]$, and the consumed power $W_M$ of the motor. Regarding the coil resistance $R_M[\Omega]$, it is represented by a difference from the resistance $R_{MS}[\Omega]$ at the reference temperature 25[° C.]. In FIG. 76, a vertical dotted line denotes a resistance critical point of $t_p=100$[° C.], and at this point or so the respective characteristics change suddenly. From this result, it would be understood that the identification results of the non-linear model are well coincident with the measurement data.

Further to the result of FIG. 76, as seen therefrom, the behavior of the positive characteristic thermistor reaches the resistance critical point at 14.5 [sec], and from this point the current suddenly goes down, while the voltage goes up. This means that the overcurrent of the motor starts to be blocked at the boundary of the resistance critical point. At that time, the block state (values of the right side) offers current $I_{o\_L}=0.21$ [A], voltage $V_P=9.65$ [V], and resistance $R_P=45.9$ [$\Omega$], and this increases about 92 times. With respect to the consumed power $W_P$, while the current decreases, the voltage is high. Thus, a power $W_P=2.14$ [W] is supplied to maintain the temperature $t_P=134.2$[° C.] of the positive characteristic thermistor. With respect to the state of the coil, it is understood that the highest temperature of the coil is $t_M=71.7$[° C.] and in the block area of the right side with respect to the resistance critical point it is lowered to the temperature $t_M=32.7$[° C.] and consumed power $W_M=0.144$ [W], so that burning of the coil is prevented.

Identification of coefficient of heat radiation $\delta_M$, thermal time constant $\tau_M$, coefficient of heat radiation $\delta_P$ and thermal time constant $\tau_P$ performed in a similar fashion to that of the above-mentioned motor characteristic. This identification is outlined as follows.

The reason why the lock current $I_{o\_L}$ in FIG. 76 is gradually decreased after the compulsory stop is owing to an influence of coefficient $\delta_M$ of heat radiation and thermal time constant $\tau_M$ of the motor coil. Time up to the resistance critical point is strongly dominated by coefficient $\delta_P$ of heat radiation and thermal time constant $\tau_P$ of the positive characteristic thermistor. Times up to the resistance critical point, where both are varied by ±10[%], are given with $\delta_P$:15.8(+9.2%)~13.1 (−9.4%) [sec], $\tau_P$: 16.24(+12.3%)~12.8(−11.5%) [sec]. By way of example, in case of the motor coil, $\delta_M$ is 14.36(−0.7%)~14.56(+0.7%), and $\tau_M$ is 14.16(−2.1%)~14.84(2.6%) [sec]. From this, it is understood that the influence on the resistance critical point is little. Incidentally, ( ) is % value for time 14.5 [sec].

The identification here performed implies that for the identification of the above-mentioned functional model the identification of the mechanistic model for determining the internal characteristic is performed. This method implies it is possible to identify individually the functional and mechanistic models including the non-linear elements in form of independent model.

(Processing Procedure of a Functional Model Including the Non-Linearity)

The above-mentioned contents are rearranged, and there will be described simply a basic procedure to execute a simulation by a functional model and a mechanistic model incorporated into the functional model.

Figure 77:
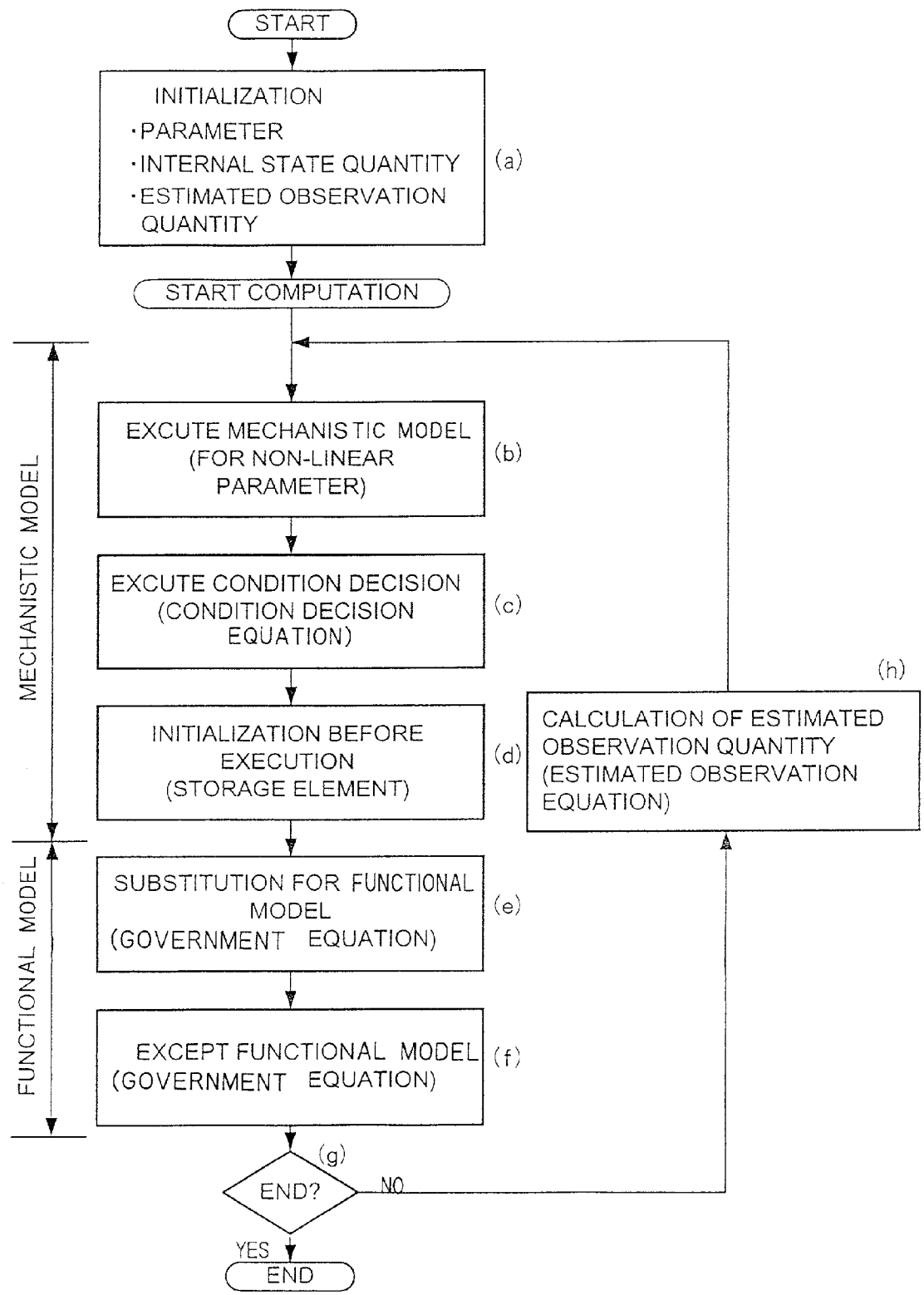
FIG. 77 is a view showing an execution sequence of functional and mechanistic models.

First, a non-linear parameter, incorporated into a linear functional model (a government equipment) and a mechanistic model (a mathematical model), are previously calculated and the result is substituted and renewed. Consequently, regarding the processing procedure, first, the mechanistic model is executed to determine a substitution quantity, and then the linear functional model is executed. FIG. 77 shows an execution sequence of the functional and mechanistic models.

FIG. 77 shows a flowchart of a basic process in the event that a government equation of a small scale of functional model is given in the discrete form to be executed. In FIG. 77, a repetition of the process from the computation start to the end is performed in unit of a sampling period in which a prediction computation for an estimated observation quantity. As an actually used computer software, a whole system of functional and mechanistic models module is incorporated into a software module of the standard execution environment on a telescopic system basis. At that time, regarding the respective mechanistic models, modules for the mechanistic models prepared in form of the standard function are selectively called in accordance with an object of the use to be executed.

In this flowchart, first, after execution of the initialization as a preparation of execution of a computation, the computation is started (step a).

According to the computation, the computation is performed on the mechanistic model for the non-linear parameter and the switch element for the subsequent sampling time. Specifically, a computation is carried out on the mechanistic model for derivation of the non-linear parameter (step b), a condition decision is carried out (step c), and the initialization before execution of the linear functional model, such as the storage element, is performed (step d).

Next, the non-linear parameter and the state of the switch element, which are determined in accordance with the above-mentioned manner, are substituted for the functional model (step e). With regard to the subsequent sampling time, the functional model is executed (step f).

In the event that the subsequent sampling period is further continued (step g), the process goes to a step h in which a prediction computation for an estimated observation quantity of the subsequent sampling period is performed in accordance with the result of computation of the sampling period now obtained, and the newly determined estimated observation quantity is transferred to the mechanistic model.

In the mechanistic model, a computation for the non-linear parameter and the like related to the sampling time associated with the estimated observation quantity is carried out in accordance with the estimated observation quantity, and a result of computation thus obtained is transferred to the functional model.

Repetition of those processes make it possible to perform a reproduction (a simulation) of the system including a non-linearity.

(Reference)

1. Symbols for Modeling (1) Symbols for a Linear Model

Regarding a block diagram representative of a model, a rule of the general block diagram is adopted, and a modeling is implemented by adding symbols shown in FIG. 78. Symbols shown in FIG. 78 are used mainly for a linear model.

(2) Symbols for a Non-Linear Model

For modeling of a non-linearity of various types, there are known the associated various expressions. In effect, any expression that rule and way of establishing modeling for content, nature and operation of a non-linearity are clarified to be understood on a visual basis, and it is possible to be transformed to a mathematical model satisfies an object of the modeling. FIG. 79 shows typical symbols used for modeling of a non-linearity.

(3) Signals for a Non-Linearity (1) Quantity of Operation

Quantity of operation denotes transformed physical quantities such as absolute value, sign and square of state quantity other than the potential and the flow quantities; and logical signals such as 0 (False) and 1 (True) operating switch operators and the like. However, in the event that the switch element of the functional model is operated with the associated mechanistic model having a nesting structure, it is preferable to represent it with the subsequent substitution quantity. In some case, it happens that position and displacement wherein velocity is integrated are also represented by the same.

(2) Substitution Quantity

Substitution quantity denotes a line to substitute a value for a parameter from the mechanistic model. Name of a signal line may adopt the same name as the variable name for the non-linear parameter. The substitution quantity makes it possible that the mechanistic model is independent of the functional model. Selection of the substitution quantity permits the non-linear parameter and the mechanistic model to be telescopic system.

(4) Logical Operator

A logical operator is used for a switch element, and condition decision and estimated observation quantity are used for this operation.

(a) Estimated Observation Quantity

There is a symbol for observing a state quantity of a sampling period preceding by one for a condition decision and the like. Regarding the state quantity designated with such a symbol, after execution of the government equation of the present time (k), the estimated observation equation is carried out again through substitution of a dependent variable to an independent variable of the internal state quantity, so that the state quantity of the subsequent sampling time (k+1) is estimated. This estimated observation quantity is one of concepts necessary for implementing a modeling of a non-linear element in accordance with a modeling scheme now proposed.

(b) Logical Operator

A logical operator used for the switch element will be described in detail later. Here, a switch operator is referred to as the switch element.

(5) Non-Linear Operator

A non-linear operator is a symbol for performing a modeling of a mechanistic model which is to be incorporated into a functional model, and is used mainly for transformation of the observation quantity or the operating quantity.

(a) Absolute Value

The absolute value is derived, by excepting sign of the state quantity and the operating quantity. In the mathematical model, it is described in expression of b=abs(A) or the like.

(b) Sign

Sign of positive or negative (±) is derived from the state quantity and the operating quantity. In the mathematical model, it is described in expression of b=sign (a) or the like.

(c) Square

An operating quantity of a value of the state quantity and the operating quantity squared is derived. This symbol is the same as the symbol for the multiplication of two or more inputs.

(d) Initialization (Integration)

In the initialization, a value of the integration symbol is initialized through a condition decision or a switch element. The initialization is performed before execution of the mechanistic model and switch element. However, in some case, it happens that the initialization is performed after execution of the mechanistic model and switch element. FIG. 80 shows a typical way of initialization. In FIG. 80, when condition of part (a) of FIG. 80 is not applied, the integration value x is reset to zero; when condition of part (b) of FIG. 80 is applied, the integration value x is initialized to B; and when condition of part (c) of FIG. 80 is not applied, the integration value x is initialized to B. Those mathematical models are expressed as follows.

$$\left. \begin{array}{ll} \text{if } (A \neq 0) \quad \text{then } (\ldots) & \text{else } (x = 0) \\ \text{if } (A = 0) \quad \text{then } (S_{WA} = 1, x = B) & \\ \text{if } (A \neq 0) \quad \text{then } (S_{WA} = 1) & \text{else } (S_{WA} = 0, x = B) \end{array} \right\} \quad (110)$$

In the model for initialization, it is inhibited that a model, such as an addition symbol which cannot be operated in the condition decision, is incorporated between the integration symbol and the condition decision of the part (a) or the switch symbols of the parts (b) and (c).

(e) Condition Decision

Condition decision is an observation quantity at the subsequent sampling time, which is observed with the symbol of the estimated observation quantity shown in FIG. 79, and a symbol for generating an operational quantity of the switch element from the operational quantity generated within the mechanistic model. For the condition decision equation, there is used an operator dealing with relations such as large, small, equivalent etc. and executing logical operations. As a result of the operation, when it is applied, the operational quantity of 1 (true) is outputted, and when it is not applied, the operational quantity of 0 (false) is outputted. In this case, operational variable names are applied for outline arrows on a colored background indicative of the operational-quantity or the substitution quantity. Here, the mathematical model of the condition decision is described in the IF sentence such as C-language, which is generally used.

(6) Functional Equation

Functional equation serves to perform a designation to derive functional values of the state quantity and the operational quantity in form of the operational quantity. For example, a designation that A is inputted into the parenthesis of the functional name sin ( ) and B is outputted implies a mathematical model of B=sin (A).

(7) Operation

A signal to operate a model from the exterior is generated. For example, there is an operation of a switch.

(8) ON-OFF Switch

Figure 81:
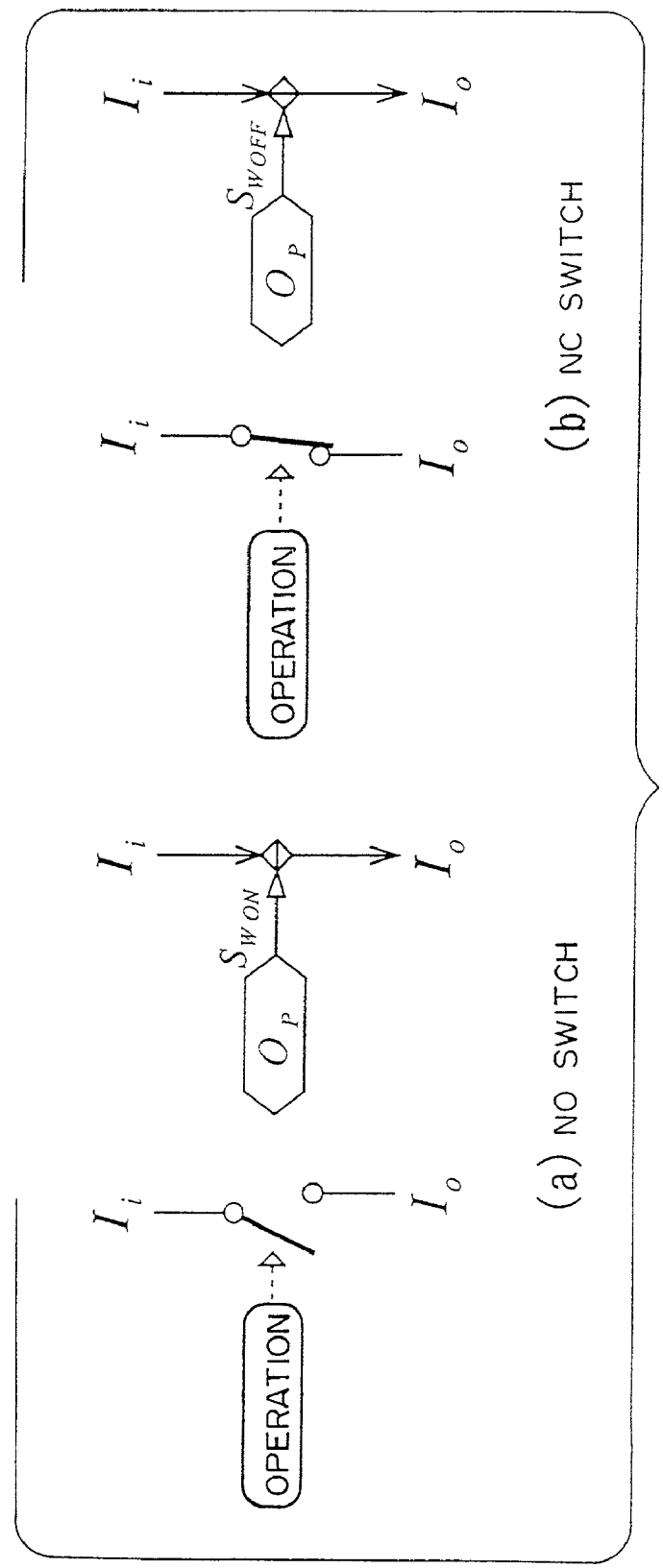
FIG. 81 is a view showing an ON-OFF switch.

FIG. 81 shows a general ON-OFF switch in association with a contact type of switch which is used in the electric system.

In FIG. 81, an NO switch (Normal Open Switch) shown in part (a) of FIG. 81 is a switch of normally turning off, and an N C switch (Normal close Switch) shown in part (b) of FIG. 81 is a switch of normally turning on. The mathematical model of the NO switch element shown in part (a) of FIG. 81 is expressed by the following equation.

$$\left.\begin{array}{l} f(O_p) \text{ then } (S_{WON} = 0) \quad \text{else } (S_{WON} = 1) \\ I_o = I_i S_{WON} \end{array}\right\} \quad (111)$$

The mathematical model of the NO switch element shown in part (b) of FIG. 81 is expressed by the following equation.

$$\left.\begin{array}{l} f(O_p) \text{ then } (S_{WOFF} = 1) \quad \text{else } (S_{WOFF} = 0) \\ I_o = I_i S_{WOFF} \end{array}\right\} \quad (112)$$

The upper sides of eqs. (111) and (112) denote the condition decision equations, and the lower sides denote the equations of the switch element for operating the state quantity. The NO switch of eq. (111) turns on, when the condition decision equation $O_P$ is applied so that the switch element $S_{WON}$ is 1, and turns off, when the condition decision equation $O_P$ is not applied so that the switch element $S_{WON}$ is 0. On the other hand, the NC switch of the equation (112) turns on, when the condition decision equation $O_P$ is not applied so that the switch element $S_{WOFF}$ is 1, and turns off, when the condition decision equation $O_P$ is applied so that the switch element $S_{WON}$ is 0.

(9) Logical Product and Logical Sum

Figure 82:
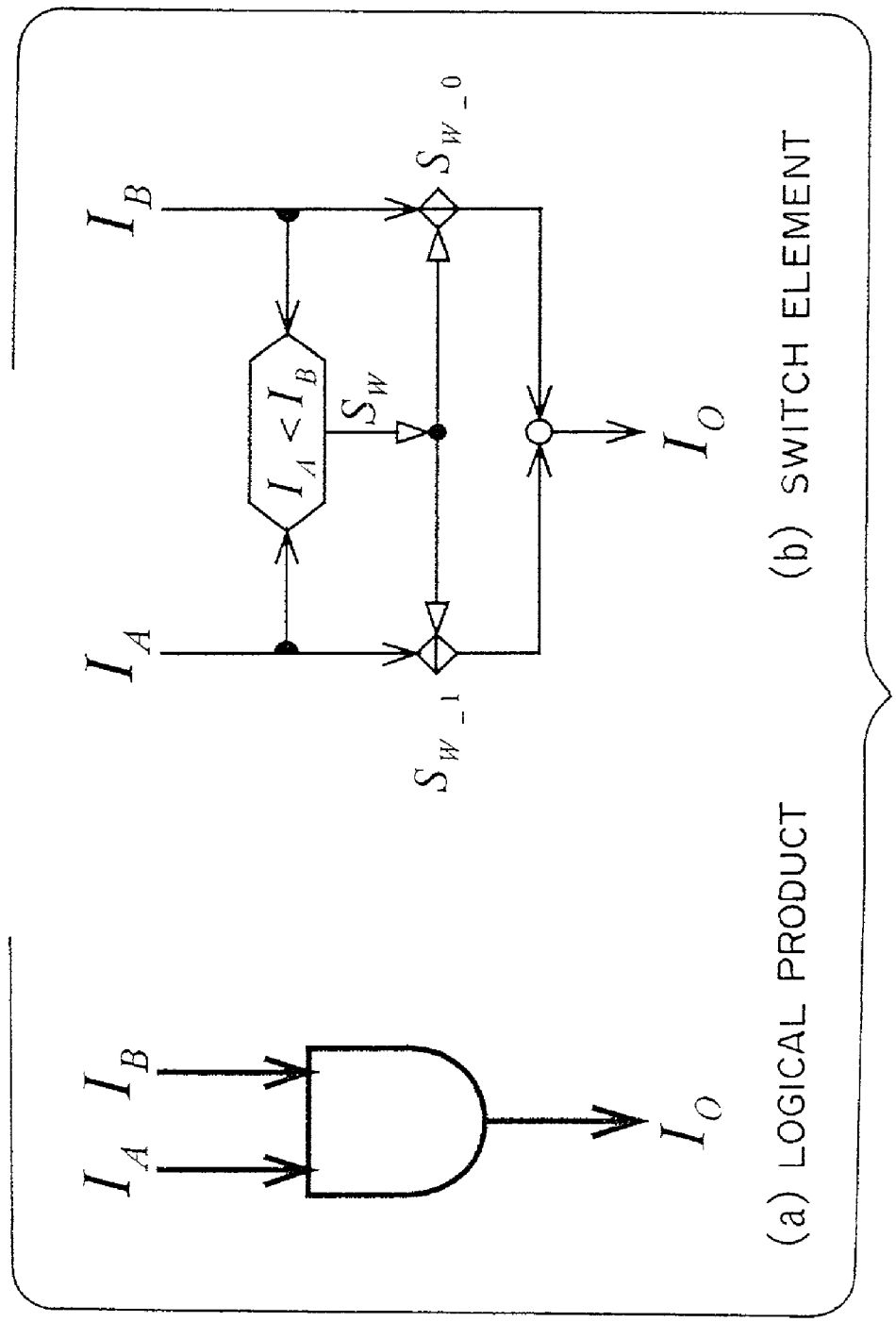
FIG. 82 is a view showing a model of a logical product.
Figure 83:
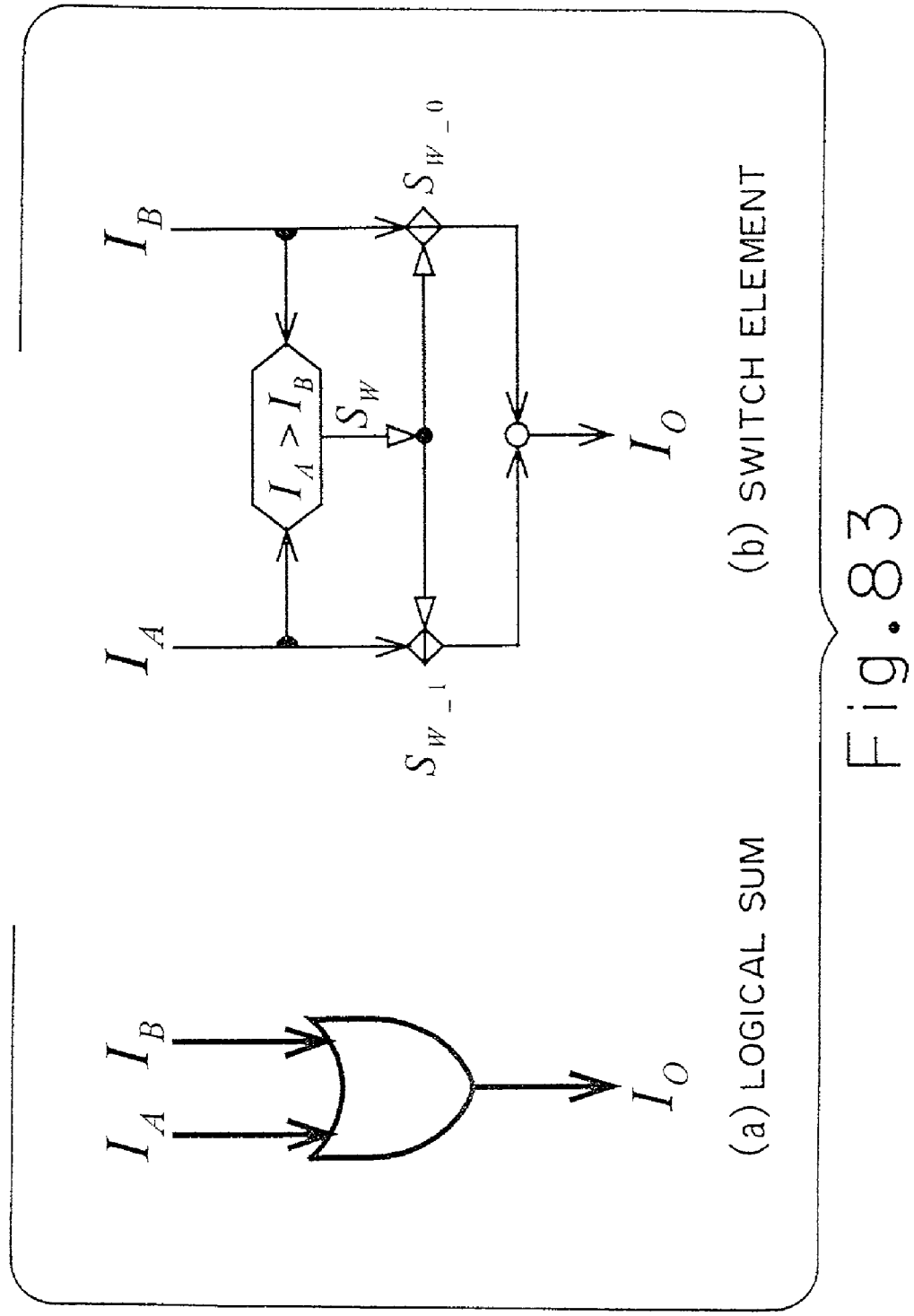
FIG. 83 is a view showing a model of a logical summation.

Logical product (AND) and Logical sum (OR) are a logical operation associated with the logical product and the logical sum of Mini-Max method for the fuzzy operation. The logical product denotes a symbol having a function of selecting and outputting the minimum value of the entered state quantity. FIGS. 82 and 83 show a logical product and a logical sum in comparison with the switch elements, respectively.

In FIG. 82, the inside of the logical product has NO switch elements common in their outputs and a condition decision to select the minimum state quantity. In FIG. 83, the logical sum has a condition decision to select the maximum state quantity. Both the logical product and the logical sum are the same model except for the decision equation for the condition decision.

The mathematical model of the logical product of FIG. 82(b) is expressed by the following equation.

$$\text{if } (I_A < I_B) \text{ then } (S_{W\_0}=0, S_{W\_1}=1) \text{ else } (S_{W\_0}=1, S_{W\_1}=0) I_O = I_A S_{W\_1} + I_B S_{W\_0} \quad (113)$$

The mathematical model of the logical sum of FIG. 83(b) is expressed by the following equation.

$$\text{if}(I_A > I_B) \text{ then } (S_{W\_0}=0, S_{W\_1}=1) \text{ else } (S_{W\_0}=1, S_{W\_1}=0) I_O = I_A S_{W\_1} + I_B S_{W\_0} \quad (114)$$

2. Basic Function Element of Linear Model (1) State Quantity

The state quantity is divided into the subsequent flow and potential quantities.

① The potential quantity indicates a state quantity indicative of a translation quantity of medium carrying energy such as voltage, velocity and rate of flow.

② The flow indicates a state quantity indicative of strength and quantity of energy of medium in unit quantity such as current, power, fluid pressure.

The flow and the potential quantity are used in their combination to form energy. For example, it is utilized for modeling that the product of voltage and current is an electric power, and the product of velocity and power is a working factor. This implies that the base of the functional model is an energy principle, and it is possible that the model of the system is represented by the potential quantity and the flow quantity, so that all the physical laws related to the potential quantity and the flow quantity are represented on a model.

In the potential quantity and the flow quantity, the integrated value is expressed in form of the storage quantity of amount and strength of energy. The potential quantity and the flow quantity correspond to, for example, translation position and power product of the mechanical system. Further, as the internal energy constituting entropy of the thermodynamics, the temperature related to thermal energy for compression of gas and resistance loss is also the storage quantity. Here, those are referred to as a storage state quantity in a general term. A system connected with the potential quantity and the storage quantity is referred to as a potential system, and likely a system for the flow quantity is referred to as a flow system. Both the systems are in a duality. Those systems form the base of the mechanical and the electric engineerings. According to the mechanical engineering, velocity of the potential system or distance of the associated integration quantity (position) are dealt with as a result in accordance with the force (pressure) of the flow system. On the other hand, according to the electric engineering, the current of the flow system is dealt with as a result in accordance with the voltage of the potential system. According to the modeling scheme here described, the potential system and the flow system are dealt with on an equivalent basis and the duality between the potential and the flow systems is utilized, so that theories and laws of the fields of the respective engineering are mutually accepted to remove the barrier.

(2) Parameter (a) Characteristic

Characteristic is to associate the flow quantity with the potential quantity and represents properties of a system. The characteristic is divided into two sorts of a storage characteristic of storing an energy and a loss characteristic involving an energy loss such as an electric resistance and a viscosity damping. Such a characteristic generates an energy (motion energy) represented by product of the potential and the flow quantities, and also generates an energy for heat and position generated inside. The internal energy is translated into the temperature and the distance so that it may be expressed in form of the output state quantity. Incidentally, the characteristic placed in the multidimensional space has coordinate information designating an operational direction inside.

① The storage characteristic is classified into two types in one of which change of the flow quantity is stored in form of an energy, as in the inductance and stiffness of a spring, and is changed into the potential quantity, and in another of which change of the potential quantity is stored in form of an energy, as in the electric capacity and mass, and is changed into the flow quantity.

② The loss characteristic is classified into two types in one of which loss depending on the potential quantity, as in the leakage resistance of the electric capacity and the viscosity resistance by fluid, is changed into the flow quantity, and in another of which loss depending on the flow quantity, as in the electric resistance and the internal attenuation due to the material compression, is changed into the potential quantity.

(b) Coefficient

Coefficient denotes numeral and quantity giving association between flow quantity to flow quantity or potential quantity to potential quantity. The factor is classified into the following four types.

① Non-unit quantity associating the same physical unit systems with one another, such as the ratio of winding number of coils of an electric transformer and the ratio of gear wheels. In case of the factor that the value appearing on the mathematical model is 1, it means a direct coupling between the elements.

② Unit quantity associating the mutually different physical unit systems, such as torque constant and velocity constant of a motor, radius of a tire, and cross-sectional area of a piston. In the event that mutually different physical unit systems such as rotation and translational motion perpendicularly intersects one another, it is necessary for the physical factor to have a function of coordinate transformation.

③ Non-unit quantity for transforming a coordinate system of the state quantity of a link mechanism moving in a multidimensional coordinate space and a motion of a car.

④ Non-unit quantity involving increment and decrement of an energy in which a factor is multiplied by one side of a pair of potential and flow quantities, such as a loss factor and a gain of a control system.

With respect to the factors of the above-mentioned ①~③, the same factor is multiplied by both the potential and the flow quantities of a pair, and the transformation is performed in such a manner that no increment and decrement of energy is involved. The concept of a transformation factor for an application of a factor having meaning common to the potential and the flow quantities is an aspect of the functional model. This concept is one of reasons that make it possible to implement modeling exceeding the physical unit system and to permit the mutually different physical unit systems to exist in the same model. The factor serves as a weight factor effecting on a square basis for the storage characteristic an the loss characteristic.

(c) Switch Element

A switch element is a logical element for connecting and disconnecting the state quantity inside the functional model. The functional model into which the switch element is incorporated is a non-linear model for varying a model structure. It is considered that a factor value of the switch element is a non-unit quantity of 1 (true) and 0 (false) or 1·0·−1, and is a special use of factor for providing the state quantity on a discrete basis.

(d) Attached Load

An attached load serves as generation and absorption of the state quantity inside the mode. The side load is concerned to two types associated with the potential and the flow quantities. The side load has such a meaning that all single potential or flow quantities of no pair are regarded as the side load, and the state quantity not restricted is excluded form the inside of the system.

① One corresponding to the potential quantity such as an internal voltage of a battery, a voltage drop of a diode, and an ambient temperature of an equipment.

② One corresponding to the flow quantity such as a frictional torque, a transmission torque of a clutch, and a current source for supplying a constant current.

③ A work of the side load is divided into a generating source for generating the state quantity, such as the internal voltage of the battery, and an absorption source for absorbing the state quantity, such as a frictional torque. Both the generating source and the absorption source are determined in work of generation or absorption through incorporation into a model.

④ As the especial use, there is a case where driver's operation and instruction are indicated in form of a signal.

What is claimed is:

1. A non-linear characteristic reproducing apparatus wherein upon receipt of a predetermined first state quantity for reproducing a behavior of an entity, a non-linear transformation processing is applied to the entered first state quantity so that a second state quantity is generated and outputted, the non-linear characteristic reproducing apparatus comprising:
   a state quantity transformation unit for linear-transforming the first state quantity to the second state quantity every sampling time in accordance with a transformation parameter, which reproduces a physical property of an entity, set up; and
   a non-linear characteristic reproducing unit for determining a transformation parameter to transform the first state quantity to the second state quantity at a subsequent sampling time in accordance with an estimated state quantity at the subsequent sampling time derived from at least one state quantity of the first state quantity and the second state quantity or a variation of the one state quantity to set the determined transformation parameter to the state quantity transformation unit.

2. A non-linear characteristic reproducing apparatus according to claim 1, wherein said non-linear characteristic reproducing unit receives the estimated state quantity and one or more external operation variables as well, and determines the transformation parameter in accordance with the estimated state quantity and one or more variables thus received.

3. A non-linear characteristic reproducing apparatus according to claim 1, wherein said non-linear characteristic reproducing unit determines in form of the transformation parameter a normalized estimation value in which an estimation value of the second state quantity at the subsequent sampling time is normalized with the estimated state quantity.

4. A non-linear characteristic reproducing apparatus according to claim 3, wherein in said non-linear characteristic reproducing unit, the estimation value of the second state quantity at the subsequent sampling time is multiplied or divided with an absolute value of the estimated state quantity of the first state quantity, so that the transformation parameter independent of the sign of the first state quantity is determined.

5. A non-linear characteristic reproducing apparatus according to claim 1, wherein said non-linear characteristic reproducing apparatus is an apparatus for reproducing characteristics of a non-linear spring,
   said state quantity transformation unit performs a transformation between a velocity difference on both ends of the non-linear spring and a variation of load of the non-linear spring, and
   said non-linear characteristic reproducing unit determines a transformation parameter for performing transformation between the velocity difference on both ends of the non-linear spring as an object of a characteristic reproduction and the variation of load of the non-linear spring at a subsequent sampling time in accordance with an estimated state quantity at the subsequent sampling time of the velocity difference on both ends of the non-linear spring to set the determined transformation parameter to said state quantity transformation unit.

6. A non-linear characteristic reproducing apparatus according to claim 1, wherein said non-linear characteristic reproducing apparatus is an apparatus for reproducing characteristics of an air spring said state quantity transformation unit performs a transformation between a deformation velocity of the air spring and a variation of an internal pressure of the air spring, and said non-linear characteristic reproducing unit determines a transformation parameter for performing transformation between the deformation velocity of the air spring as an object of a characteristic reproduction and the variation of the internal pressure of the air spring at a subsequent sampling time in accordance with an estimated state quantity at the subsequent sampling time of the deformation velocity of the air spring to set the determined transformation parameter to said state quantity transformation unit.

7. A non-linear characteristic reproducing apparatus according to claim 1, wherein said non-linear characteristic reproducing apparatus is an apparatus for reproducing characteristics of a link mechanism, said state quantity transformation unit transforms a value of velocity or angular velocity of a supporting point portion of the link mechanism, and said nonlinear characteristic reproducing unit determines a transformation parameter for transforming the value of velocity or angular velocity of the supporting point portion of the link mechanism as an object of a characteristic reproduction at a subsequent sampling time in accordance with an estimated state quantity at the subsequent sampling time of velocity or angular velocity applied to the supporting point portion of the link mechanism to set the determined transformation parameter to said state quantity transformation unit.

8. A non-linear characteristic reproducing apparatus according to claim 7, wherein said state quantity transformation unit transforms a value of velocity or angular velocity of the supporting point portion of the link mechanism, and also a value of force or torque applied to the supporting point portion, using the same parameter as that used for transformation of the value of velocity or angular velocity of the supporting point portion of the link mechanism, said parameter being set by said non-linear characteristic reproducing unit.

9. A non-linear characteristic reproducing apparatus according to claim 1, wherein said non-linear characteristic reproducing apparatus is an apparatus for reproducing characteristics of an object moving while involving a friction, said state quantity transformation unit performs a transformation between a force applied to the object and a moving velocity of the object and said non-linear characteristic reproducing unit determines a transformation parameter for performing transformation between the force applied to the object as an object of a characteristic reproduction and the moving velocity of the object at a subsequent sampling time in accordance with an estimated state quantity at the subsequent sampling time of the moving velocity of the object to set the determined transformation parameter to said state quantity transformation unit.

10. A non-linear characteristic reproducing apparatus according to claim 9, wherein said non-linear characteristic reproducing unit determines a frictional force applied to the object in form of the transformation parameter to set the determined transformation parameter to said state quantity transformation unit, and said state quantity transformation unit performs a transformation between the force applied to the object and the moving velocity of the object, in a case where a force, in which the frictional force set by said state quantity transformation unit is subtracted from the force applied to the object, is applied to an object in which an effect of the frictional force is neglected.

11. A non-linear characteristic reproducing apparatus according to claim 10, wherein said non-linear characteristic transformation unit comprises: a kinetic friction generating unit for determining a kinetic frictional force applied to the object as an object of a characteristic reproduction at a subsequent sampling time in accordance with an estimated state quantity at the subsequent sampling time of the moving velocity of the object; a static friction generating unit for determining a static frictional force applied to the object as an object of a characteristic reproduction at a subsequent sampling time in accordance with an estimated state quantity at the subsequent sampling time of the force applied to the object; and a frictional force selection unit for selecting one frictional force between the kinetic frictional force generated in said kinetic friction generating unit and the static frictional force generated in said static friction generating unit in accordance with the estimated state quantity at the subsequent sampling time of the moving velocity of the object to set the selected frictional force to said state quantity transformation unit.

12. A non-linear characteristic reproducing apparatus according to claim 11, wherein said kinetic friction generating unit determines a kinetic frictional force different in value in accordance with an estimated state quantity at the subsequent sampling time of the moving velocity of the object.

13. A non-linear characteristic reproducing apparatus according to claim 1, wherein said non-linear characteristic reproducing apparatus is an apparatus for reproducing characteristics of a variable inertia moment mechanism in which an inertia moment is varied in accordance with an angular velocity, said state quantity transformation unit performs a transformation between a torque applied to the variable inertia moment mechanism and an angular velocity of the variable inertia moment mechanism, and said non-linear characteristic reproducing unit determines a transformation parameter for performing transformation between the torque applied to the variable inertia moment mechanism as an object of a characteristic reproduction and an angular acceleration velocity of the variable inertia moment mechanism at a subsequent sampling time in accordance with an estimated state quantity at the subsequent sampling time of the angular velocity of the variable inertia moment mechanism to set the determined transformation parameter to said state quantity transformation unit.

14. A non-linear characteristic reproducing apparatus according to claim 13, wherein said variable inertia moment mechanism as an object of a characteristic reproduction has a translational member translating in a radius direction in accordance with a centrifugal force, and said non-linear characteristic reproducing unit comprises; a rotational translation transformation unit for determining a centrifugal force applied to the translational member in accordance with an estimated state quantity at a subsequent sampling time of the angular velocity of the variable inertia moment mechanism; and a translational motion reproducing unit for reproducing a translational motion of the translational member by the centrifugal force determined by said rotational translation transformation unit, and said non-linear characteristic reproducing unit determines a transformation parameter according to the translational motion of the translational member reproduced by said translational motion reproducing unit to set the determined transformation parameter to said state quantity transformation unit.

15. A non-linear characteristic reproducing apparatus comprising a linear model unit for reproducing characteristics of a linear system, and a non-linear model unit for determining, upon receipt of an estimated state quantity at a subsequent sampling time of at least one state quantity of a first state quantity and a second state quantity, which are in a relation of mutually non-linear transformation, or a state quantity derived from said one state quantity, from said linear model unit, a transformation parameter used for a linear transformation at the subsequent sampling time between the first state quantity and the second state quantity, wherein an operation of determining the transformation parameter at the subsequent sampling time in said non-linear model unit and a linear operation including a linear transformation between the first state quantity and the second state quantity using the transformation parameter at the subsequent sampling time determined in said non-linear model unit, in said linear model unit are alternatively repeated.

16. A non-linear characteristic reproducing apparatus according to claim 15, wherein said non-linear model unit has a plurality of non-linear transformation units for determining, upon receipt of an estimated state quantity at a subsequent sampling time of at least one state quantity of a first state quantity and a second state quantity, which are in a relation of mutually non-linear transformation and at least one of which is different in type, or a state quantity derived from said one state quantity, a transformation parameter used for a linear transformation at the subsequent sampling time between the first state quantity and the second state quantity.

17. A nonlinear characteristic reproducing apparatus according to claim 15, wherein said non-linear characteristic reproducing apparatus is an apparatus for reproducing characteristics of Geneva mechanism, said linear model unit performs linear transformations including a linear transformation of angular velocity-to-angular velocity between master section and slave section of the Geneva mechanism, and a linear transformation of torque-to-torque between master section and slave section of the Geneva mechanism, and said non-linear model unit has a non-linear transformation unit for determining a transformation parameter including information as to whether master section and slave section of the Geneva mechanism are connected to one another at the subsequent sampling time, said information being used for both the linear transformation of angular velocity-to-angular velocity between master section and slave section of the Geneva mechanism and the linear transformation of torque-to-torque between master section and slave section of the Geneva mechanism, at a subsequent sampling time of an angle of the master section of the Geneva mechanism, in accordance with an estimated state quantity at the subsequent sampling time.

18. A non-linear characteristic reproducing apparatus according to claim 15, wherein said non-linear characteristic reproducing apparatus is an apparatus for reproducing characteristics of a liquid residue warning lamp in which a lamp and a thermistor are connected in series, said linear model unit performs linear transformations including a transformation between a voltage applied to the lamp and a current conducting through the lamp and a transformation between a voltage applied to the thermistor and a current conducting through the thermistor, and said non-linear model unit has a first non-linear transformation unit for determining a resistance of the thermistor at a subsequent sampling time of a consumed power of the thermistor in accordance with an estimated state quantity at the subsequent sampling time.

19. A non-linear characteristic reproducing apparatus comprising:

a state quantity selecting unit for reproducing characteristics of a linear system, and a non-linear model unit for determining, upon receipt of an estimated state quantity at a subsequent sampling time of at least one state quantity of a first input state quantity and a second output state quantity, which are in a relation of mutually non-linear transformation, or a state quantity derived from said one state quantity, from the state quantity selecting unit, a transformation parameter used for a transformation or connection at the subsequent sampling time between the first input state quantity and the second output state quantity;

a logical decision unit for receiving one or more variables, and determining a logical value at a subsequent sampling time, selected among from a plurality of discrete values in accordance with one or more variables input to the non-linear model unit; and a state quantity selecting unit for receiving a predetermined input state quantity and outputting at the subsequent sampling time an output state quantity in which a relation of transformation or connection between the input state quantity and the output state quantity is changed over to a relation according to the logical value at the subsequent sampling time determined by said logical decision unit.

20. A non-linear characteristic reproducing apparatus according to claim 19, wherein said state quantity selecting unit outputs at the subsequent sampling time an output state quantity in which a relation between the input state quantity and the output state quantity is changed over to a connection relation according to the logical value at the subsequent sampling time determined by said logical decision unit.

21. A non-linear characteristic reproducing apparatus according to claim 19, wherein said state quantity selecting unit integrates the input state quantity and outputs as an output state quantity, and in a case where the logical value at the subsequent sampling time determined by said logical decision unit into which the output state quantity is inputted is a predetermined logical value, said state quantity selecting unit outputs an output state quantity which is changed over to an initial value at the subsequent sampling time.

22. A non-linear characteristic reproducing apparatus according to claim 19, wherein said logical decision unit determines a logical value at a subsequent sampling time, selected among from a plurality of discrete values in accordance with an estimated state quantity at the subsequent sampling time of a plurality of input state quantities, and said state quantity selecting unit receives the plurality of input state quantities and outputs at the subsequent sampling time in form of an output state quantity an input state quantity selected in accordance with the logical value at the subsequent sampling time determined by said logical decision unit.

23. A non-linear characteristic reproducing apparatus according to claim 19, wherein said non-linear characteristic reproducing apparatus is an apparatus for reproducing characteristics of a mechanism including two members having a relative movement possible state and a relative movement impossible state, said logical decision unit determines a logical value representing whether said two members are in the relative movement possible state or the relative movement impossible state in accordance with an estimated state quantity at a subsequent sampling time of a relative position of said two members or a state quantity derived from the relative position of said two members, and said state quantity selecting unit changes over a relation between a relative moving velocity and a distribution of force of said two members.

24. A non-linear characteristic reproducing apparatus according to claim 19, wherein said non-linear characteristic reproducing apparatus is an apparatus for reproducing characteristics of a clutch mechanism including two members having a relatively slid sliding state and a mutually connected connecting state, said logical decision unit determines a logical value representing whether said two members are in the sliding state or the connecting state in accordance with an estimated state quantity at a subsequent sampling time of a relative angular velocity of said two members, and said state quantity selecting unit changes over a relation between a relative angular velocity and a distribution of torque of said two members.

25. A non-linear characteristic reproducing apparatus according to claim 19, wherein said non-linear characteristic reproducing apparatus is an apparatus for reproducing characteristics of a brake mechanism for applying a braking energy to a driving shaft, said logical decision unit determines a logical value representing whether the driving shaft is in a rotating state or a stationary state in accordance with an estimated state quantity at a subsequent sampling time of a torque which a brake receives from the driving shaft, and said state quantity selecting unit changes over a braking torque to be applied to the driving shaft.

26. A non-linear characteristic reproducing apparatus according to claim 19, wherein said non-linear characteristic reproducing apparatus is an apparatus for reproducing characteristics of an automatic-reset mechanism in which a spring is effected on a movable member, and when application of an external force to the movable member is removed, the movable member is automatically reset to an initial state by an effect of the spring, said automatic-reset mechanism having a stopper to limit a movable range of the movable member, said logical decision unit determines a logical value representing whether the movable member interferes with the stopper in accordance with an estimated state quantity at a subsequent sampling time of a moving position of the movable member, and said state quantity selecting unit changes over a relation between velocity or angular velocity of the movable member and force or torque to be applied to the movable member.

27. A non-linear characteristic reproducing apparatus wherein upon receipt of a predetermined first state quantity, a second state quantity changed over to a non-linearity according as the received first state quantity is in a predetermined state is generated, said non-linear characteristic reproducing apparatus comprising:

a state variation estimation unit for predicting a state quantity variation width during a period from a present sampling time to a subsequent sampling time of the first state quantity;

a state deviation detection unit for determining a deviation between a value at the present sampling tine of the first state quantity and a decision value for deciding whether the first state quantity is in a predetermined state;

a stable state decision unit for determining a logical value to be selected from among a plurality of discrete values, predicting a non-linear variation at a subsequent sampling time in accordance with a comparison of the state quantity variation width predicted by said state variation estimation unit with the deviation determined in said state deviation detection unit; and a state quantity selecting unit for outputting the second state quantity changed over in accordance with the logical value determined in said stable state decision unit.

28. A non-linear characteristic reproducing apparatus according to claim 27, wherein said state deviation detection unit determines a deviation between a value at the present sampling time of the first state quantity and a decision value for deciding whether the first state quantity is in a predetermined state, said decision value being varied in accordance with positive or negative of the state quantity variation width predicted in said state variation estimation unit.

29. A non-linear characteristic reproducing apparatus comprising:

a linear model unit for reproducing characteristics of a linear system, including a state quantity transformation unit for linear-transforming a first observation state quantity to a second observation state quantity in accordance with a transformation parameter set up; and a non-linear model unit for generating, upon receipt of an estimated state quantity at a subsequent sampling time of a predetermined first observation state quantity inputted to a state quantity transformation unit from said linear model unit, the transformation parameter in accordance with the received estimated state quantity and setting the generated transformation parameter on said state quantity transformation unit, wherein said non-linear model unit comprises:

a slow change reproducing unit for receiving from said linear model an observation quantity or an estimated observation value of a predetermined second observation state quantity identical to or different from the first observation state quantity, to generate a slow change state quantity reflecting characteristic of a first non-linear system such as temperature increase or the like offering a relatively slow behavior change in accordance with the observation quantity or the estimated observation value of the second observation state quantity; and a characteristic generating unit for generating a transformation parameter reflecting characteristic of a second non-linear system offering a relatively rapid behavior change in accordance with the estimated observation value at a subsequent sampling time of the first observation state quantity derived from said linear model unit and the slow change state quantity generated in said slow change reproducing unit and setting up the generated transformation parameter on said state quantity transformation unit.

30. A non-linear characteristic reproducing apparatus according to claim 29, wherein said slow change reproducing unit comprises:
   a stationary value setting up unit for determining a stationary value, after passage of an infinite time, of the slow change state quantity assuming that a state of said linear model unit is maintained, generated in accordance with the observation quantity or the estimated observation value of the second observation state quantity; and
   a normalization response unit for generating the slow change state quantity reflecting characteristic of the first non-linear system which is to be transferred to said characteristic generating unit, in accordance with a stationary value of the slow change state quantity determined in said stationary value setting up unit, and a known normalized time change characteristic of the slow change state quantity in the first non-linear system.

31. A non-linear characteristic reproducing apparatus according to claim 30, wherein said non-linear characteristic reproducing apparatus is an apparatus for reproducing characteristics of a system having an element which is varied in a resistance value in accordance with a temperature variation,
   said state quantity transformation unit sets up a transformation parameter representative of the resistance value and performs a transformation between a voltage applied to the element having the resistance value and a current conducting through the element,
   said stationary value setting up unit determines a stationary value, after passage of an infinite time, of a temperature of the element assuming that an energy to be consumed in the element is maintained, in accordance with the estimated state quantity at a subsequent sampling time of the energy to be consumed in the element,
   said normalization response unit determines a temperature of the element in accordance with a stationary value of the temperature of the element determined in said stationary value setting up unit, and a known normalized step response curve representative of a time variation of the temperature of the element to a variation of an energy to be consumed in the element, and
   said characteristic generating unit generates a transformation parameter representative of the resistance value of the element in accordance with the temperature determined in said normalization response unit and sets up the generated transformation parameter on said state quantity transformation unit.

32. A non-linear characteristic reproducing apparatus according to claim 31, wherein said normalization response unit determines a temperature of the element in accordance with an observation quantity of an ambient temperature.

33. A non-linear characteristic reproducing program storage medium storing a non-linear characteristic reproducing program which causes a computer to operate as a non-linear characteristic reproducing apparatus wherein upon receipt of a predetermined first state quantity, a non-linear transformation processing is applied to the entered first state quantity so that a second state quantity is generated and outputted,
   wherein said non-linear characteristic reproducing program storage medium stores a non-linear characteristic reproducing program comprising:
      a state quantity transformation unit for linear-transforming the first state quantity to the second state quantity every sampling time in accordance with a transformation parameter set up; and
      a non-linear characteristic reproducing unit for determining a transformation parameter for transformation at a subsequent sampling time in accordance with an estimated state quantity at the subsequent sampling time of at least one state quantity of the first state quantity and the second state quantity or a state quantity derived from said one state quantity to set the determined transformation parameter to said state quantity transformation unit.

34. A non-linear characteristic reproducing program storage medium storing a non-linear characteristic reproducing program which causes a computer to operate as a non-linear characteristic reproducing apparatus for reproducing characteristics of a system including a non-linear system,
   wherein said non-linear characteristic reproducing program storage medium stores a non-linear characteristic reproducing program comprising:
      a linear model unit for reproducing characteristics of a linear system, and a non-linear model unit for determining, upon receipt of an estimated state quantity at a subsequent sampling time of at least one state quantity of a first state quantity and a second state quantity, which are in a relation of mutually non-linear transformation, or a state quantity derived from said one state quantity, from said linear model unit, a transformation parameter used for a linear transformation at the subsequent sampling time between the first state quantity and the second state quantity,
   wherein an operation of determining the transformation parameter at the subsequent sampling time in said non-linear model unit and a linear operation including a linear transformation between the first state quantity and the second state quantity using the transformation parameter at the subsequent sampling time determined in said non-linear model unit, in said linear model unit are alternatively repeated.

35. A non-linear characteristic reproducing program storage medium storing a on-linear characteristic reproducing program which causes a computer to operate as a nonlinear characteristic reproducing apparatus for reproducing characteristics of a system including a non-linear system, wherein said non-linear characteristic reproducing program storage medium stores a non-linear characteristic reproducing program comprising:
   a logical decision unit for receiving one or more variables, and determining a logical value at a subsequent sampling time, selected among from a plurality of discrete values in accordance with the received one or more variables; and
   a state quantity selecting unit for receiving a predetermined input state quantity and outputting at the subsequent sampling time an output state quantity in which a relation between the input state quantity and the output state quantity is changed over to a relation according to the logical value at the subsequent sampling time determined by said logical decision unit.

36. A non-linear characteristic reproducing program storage medium storing a non-linear characteristic reproducing program which causes a computer to operate as a non-linear characteristic reproducing apparatus wherein upon receipt of a predetermined first state quantity, a second state quantity changed over to a non-linearity according as the received first state quantity is in a predetermined state is generated, wherein said non-linear characteristic reproducing program storage medium stores a non-linear characteristic reproducing program comprising:

a state variation estimation unit for predicting a state quantity variation width during a period from a present sampling time to a subsequent sampling time of the first state quantity;

a state deviation detection unit for determining a deviation between a value at the present sampling time of the first state quantity and a decision value for deciding whether the first state quantity is in a predetermined state;

a stable state decision unit for determining a logical value to be selected from among a plurality of discrete values, predicting a non-linear variation at a subsequent sampling time in accordance with a comparison of the state quantity variation width predicted by said state variation estimation unit with the deviation determined in said state deviation detection unit; and a state quantity selecting unit for outputting the second state quantity changed over in accordance with the logical value determined in said stable state decision unit.

37. A non-linear characteristic reproducing program storage medium storing a non-linear characteristic reproducing program which causes a computer to operate as a non-linear characteristic reproducing apparatus for reproducing characteristics of a system including a non-linear system, wherein said non-linear characteristic reproducing program storage medium stores a non-linear characteristic reproducing program comprising:

a linear model unit for reproducing characteristics of a linear system; including a state quantity transformation unit for linear-transforming a first observation state quantity to a second observation state quantity in accordance with a transformation parameter set up; and a non-linear model unit for generating, upon receipt of an estimated state quantity at a subsequent sampling time of a first observation state quantity from said linear model unit the transformation parameter in accordance with the received estimated state quantity and setting the generated transformation parameter on said state quantity transformation unit, wherein said non-linear model unit comprises:

a slow change reproducing unit for receiving from said linear model an observation quantity or an estimated observation value of a predetermined second observation state quantity identical to or different from the first observation state quantity, to generate a slow change state quantity reflecting characteristic of a first non-linear system offering a relatively slow behavior change in accordance with the observation quantity or the estimated observation value of the second observation state quantity; and a characteristic generating unit for generating a transformation parameter reflecting characteristic of a second non-linear system offering a relatively rapid behavior change in accordance with the estimated observation value at a subsequent sampling time of the first observation state quantity derived from said linear model unit and the slow change state quantity generated in said slow change reproducing unit and setting up the generated transformation parameter on said state quantity transformation unit.

\* \* \* \* \*